US012391714B2

(12) United States Patent
Kwon et al.

(10) Patent No.: US 12,391,714 B2
(45) Date of Patent: Aug. 19, 2025

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Ohyun Kwon, Seoul (KR); Virendra Kumar Rai, Hwaseong-si (KR); Bumwoo Park, Yongin-si (KR); Sangdong Kim, Seongnam-si (KR); Hyungjun Kim, Suwon-si (KR); Myungsun Sim, Suwon-si (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 830 days.

(21) Appl. No.: 17/552,573

(22) Filed: Dec. 16, 2021

(65) Prior Publication Data

US 2022/0185834 A1 Jun. 16, 2022

(30) Foreign Application Priority Data

Dec. 16, 2020 (KR) ........................ 10-2020-0176596

(51) Int. Cl.

*C07F 15/00* (2006.01)
*H10K 85/30* (2023.01)
(Continued)

(52) U.S. Cl.

CPC ....... *C07F 15/0033* (2013.01); *H10K 85/342* (2023.02); *H10K 50/11* (2023.02);
(Continued)

(58) Field of Classification Search

CPC ... C07F 15/0033; C07F 19/00; H10K 85/342; H10K 85/6572
See application file for complete search history.

(56) References Cited

U.S. PATENT DOCUMENTS 9,490,437 B2 * 11/2016 Hwang .............. H10K 85/6572
9,522,895 B2 * 12/2016 Boerner ............... C07D 277/66
(Continued)

FOREIGN PATENT DOCUMENTS

CN 1696137 A 11/2005
CN 101679856 A 3/2010
(Continued)

OTHER PUBLICATIONS

Office Action issued Sep. 19, 2024 of KR Patent Application No. 10-2020-0176596.
(Continued)

*Primary Examiner* — Michael M Dollinger
(74) *Attorney, Agent, or Firm* — CANTOR COLBURN LLP

(57) ABSTRACT

An organometallic compound represented by Formula 1:

$$M_1(Ln_1)_{n1}(Ln_2)_{n2} \qquad \text{Formula 1}$$

(Continued)

wherein $Ln_1$ is a ligand represented by Formula 1A, $Ln_2$ is a ligand represented by Formula 1B, n1 is 0, 1, or 2, n2 is 1, 2, or 3, provided that the sum of n1 and n2 is at least 3, Formula 1A

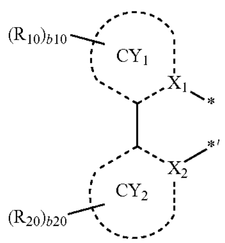

Formula 1B

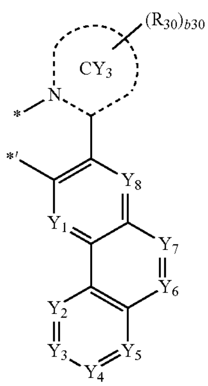

wherein $CY_1$, $CY_2$, $CY_3$, $R_{10}$, $R_{20}$, $R_{30}$, $X_1$, $X_2$, $Y_1$ to $Y_8$, and b10 to b30 are as described herein, and wherein * and *' each indicate a binding site to $M_1$.

20 Claims, 1 Drawing Sheet

(51) Int. Cl.

| | |
|---|---|
| *H10K 50/11* | (2023.01) |
| *H10K 101/10* | (2023.01) |
| *H10K 101/30* | (2023.01) |
| *H10K 101/40* | (2023.01) |

(52) U.S. Cl.

CPC ..... *H10K 2101/10* (2023.02); *H10K 2101/30* (2023.02); *H10K 2101/40* (2023.02)

(56) References Cited

U.S. PATENT DOCUMENTS

| | | | | |
|---|---|---|---|---|
| 9,923,154 | B2 | 3/2018 | Oshiyama et al. | |
| 11,731,994 | B2 * | 8/2023 | Hwang | C07F 15/0033 428/690 |
| 2010/0127215 | A1 | 5/2010 | Boerner et al. | |
| 2016/0164012 | A1 | 6/2016 | Lee et al. | |
| 2017/0012226 | A1 | 1/2017 | Hwang et al. | |
| 2019/0002629 | A1 | 1/2019 | Islam et al. | |
| 2019/0252619 | A1 | 8/2019 | Tsai et al. | |
| 2020/0087334 | A1 | 3/2020 | Ji et al. | |
| 2020/0181184 | A1 | 6/2020 | Hwang et al. | |
| 2023/0100639 | A1 * | 3/2023 | Yamada | H10K 85/342 257/40 |

FOREIGN PATENT DOCUMENTS

| | | | |
|---|---|---|---|
| CN | 105461754 | A | 4/2016 |
| CN | 108290915 | A | 7/2018 |
| CN | 110128479 | A | 8/2019 |
| CN | 110903324 | A | 3/2020 |
| CN | 111978355 | A | 11/2020 |
| JP | 2010118381 | A | 5/2010 |
| JP | 2014152151 | A | 8/2014 |
| JP | 2015090939 | A * | 5/2015 |
| JP | 2016219490 | A | 12/2016 |
| KR | 1020200068447 | A | 6/2020 |
| WO | 2012111548 | A1 | 8/2012 |
| WO | 2016056562 | A1 | 4/2016 |
| WO | 2017103584 | A1 | 6/2017 |

OTHER PUBLICATIONS

Extended European Search Report issued dated May 3, 2022 of EP Patent Application No. 21213971.1.

Office Action issued Apr. 24, 2023 of EP Patent Application No. 21213971.1.

Office Action issued Jun. 4, 2025 of CN Patent Application No. 202111534549.5.

* cited by examiner

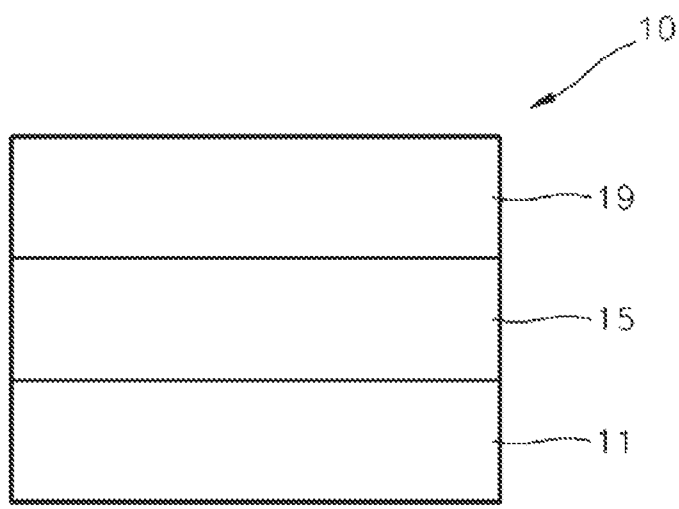
10
19
15
11

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2020-0176596, filed on Dec. 16, 2020, in the Korean Intellectual Property Office, and all benefits accruing therefrom under 35 U.S.C. § 119, the content of which is incorporated by reference herein in its entirety.

BACKGROUND

1. Field

One or more embodiments described herein relate to an organometallic compound, an organic light-emitting device including the same, and a diagnostic composition including the organometallic compound.

2. Description of the Related Art

Organic light-emitting devices (OLEDs) are self-emission devices that have improved characteristics compared to conventional devices, including having wider viewing angles, faster response time, excellent brightness, driving voltage, and response speed. In addition, OLEDS can produce full-color images with these enhanced properties.

In an example, an organic light-emitting device includes an anode, a cathode, and an organic layer located between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons may recombine in the emission layer to produce excitons. These excitons may transition from an excited state to a ground state to thereby generate light, for example, visible light.

SUMMARY

One or more embodiments described herein relate to an organometallic compound, an organic light-emitting device including at least one organometallic compound, and a diagnostic composition including at least one organometallic compound.

Additional aspects will be set forth in part in the detailed description, which follows and, in part, will be apparent from the detailed description, or may be learned by practice of the presented exemplary embodiments of the disclosure.

According to one or more embodiments, an organometallic compound is represented by Formula 1.

$$M_1(Ln_1)_{n1}(Ln_2)_{n2} \quad \text{Formula 1}$$

In Formula 1, $M_1$ is a transition metal, $Ln_1$ is a ligand represented by Formula 1A, $Ln_2$ is a ligand represented by Formula 1B, n1 is 0, 1, or 2, and n2 is 1, 2, or 3, Formula 1A

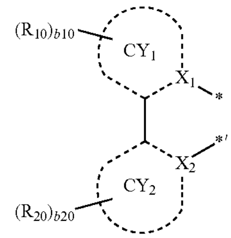

Formula 1B

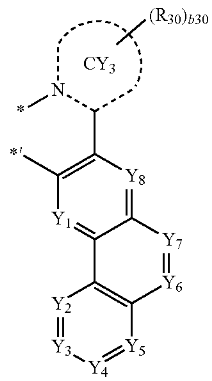

In Formulae 1A and 1B, $X_1$ is C or N, and $X_2$ is C or N, $Y_1$ is $C(R_{41})$ or N, $Y_2$ is $C(R_{42})$ or N, $Y_3$ is $C(R_{43})$ or N, $Y_4$ is $C(R_{44})$ or N, $Y_5$ is $C(R_{45})$ or N, $Y_6$ is $C(R_{46})$ or N, $Y_7$ is $C(R_{47})$ or N, $Y_8$ is $C(R_{48})$ or N, $CY_1$ and $CY_2$ are each independently a $C_5$-$C_{30}$ carbocyclic group or a $C_1$-$C_{30}$ heterocyclic group, $CY_3$ is a $C_1$-$C_{30}$ heterocyclic group including nitrogen, $R_{10}$, $R_{20}$, and $R_{41}$ to $R_{48}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, —Ge($Q_1$)($Q_2$)($Q_3$), —N($Q_4$)($Q_5$), —B($Q_6$)($Q_7$), —P($Q_8$)($Q_9$), or —P(═O)($Q_8$)($Q_9$), $R_{30}$ is hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_8$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_3$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Ge($Q_1$)($Q_2$)($Q_3$), —N($Q_4$)($Q_5$), —B($Q_6$)($Q_7$), —P($Q_8$)($Q_9$), or —P(═O)($Q_8$)($Q_9$), two or more of a plurality of $R_{10}$(s) are optionally linked to each other to form a substituted or unsubstituted $C_5$-$C_{30}$ carbocyclic group or a substituted or unsubstituted $C_1$-$C_{30}$ heterocyclic group, two or more of a plurality of $R_{20}$(s) are optionally linked to each other to form a substituted or unsubstituted $C_5$-$C_{30}$ carbocyclic group or a substituted or unsubstituted $C_1$-$C_{30}$ heterocyclic group, two or more of a plurality of $R_{30}$(s) are optionally linked to each other to form a substituted or unsubstituted $C_5$-$C_{30}$ carbocyclic group or a substituted or unsubstituted $C_1$-$C_{30}$ heterocyclic group, two or more neighboring substituents of $R_{10}$, $R_{20}$, $R_{30}$, and $R_{41}$ to $R_{48}$ are optionally linked to each other to form a substituted or unsubstituted $C_5$-$C_{30}$ carbocyclic group or a substituted or unsubstituted $C_1$-$C_{30}$ heterocyclic group, b10, b20, and b30 are each independently 1, 2, 3, 4, 5, 6, 7, 8, 9, or 10, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_8$-$C_{60}$ aryl alkyl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_3$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), —B($Q_{16}$)($Q_{17}$), —P($Q_8$)($Q_9$), or —P(═O)($Q_{18}$)($Q_{19}$), a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P($Q_{28}$)($Q_{29}$), or —P(=O)($Q_{28}$)($Q_{29}$), or —Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), —P($Q_{28}$)($Q_{29}$), or —P(=O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and wherein * and *' each indicate a binding site to $M_1$.

According to one or more embodiments, an organic light-emitting device includes a first electrode, a second electrode, and an organic layer located between the first electrode and the second electrode, wherein the organic layer includes an emission layer, and wherein the organic layer includes at least one of the organometallic compound represented by Formula 1.

According to one or more embodiments, the organometallic compound may be included in the emission layer of the organic layer, and the organometallic compound included in the emission layer may act as a dopant.

According to one or more embodiments, a diagnostic composition includes at least one organometallic compound represented by Formula 1.

BRIEF DESCRIPTION OF THE DRAWING

The above and other aspects, features, and advantages of certain embodiments of the disclosure will be more apparent from the following description taken in conjunction with the accompanying drawing, in which The FIGURE shows a schematic cross-sectional view of an organic light-emitting device according to one or more embodiments.

DETAILED DESCRIPTION

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

According to an aspect of the present disclosure, one or more embodiments describe an organometallic compound represented by Formula 1:

$$M_1(Ln_1)_{n1}(Ln_2)_{n2} \qquad \text{Formula 1}$$

$M_1$ in Formula 1 is a transition metal.

For example, $M_1$ may be a Period 1 transition metal, a Period 2 transition metal, or a Period 3 transition metal.

In one or more embodiments, $M_1$ may be iridium (Ir), platinum (Pt), osmium (Os), titanium (Ti), zirconium (Zr), hafnium (Hf), europium (Eu), terbium (Tb), thulium (Tm), or rhodium (Rh).

In one or more embodiments, $M_1$ may be Ir, Pt, Os, or Rh.

In one or more embodiments, $M_1$ may be Ir.

In Formula 1, n1 is 1 or 2, and n2 may be 1, 2, or 3.

In one or more embodiments, the sum of n1 and n2 may be 2 or 3.

In one or more embodiments, $M_1$ may be Ir and the sum of n1 and n2 may be 3.

In one or more embodiments, $M_1$ may be Pt and the sum of n1 and n2 may be 2.

$Ln_1$ in Formula 1 is a ligand represented by Formula 1A.

Formula 1A

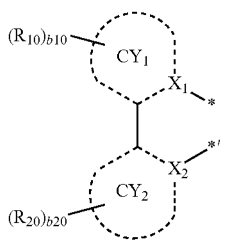

$Ln_2$ in Formula 1 is a ligand represented by Formula 1B.

Formula 1B

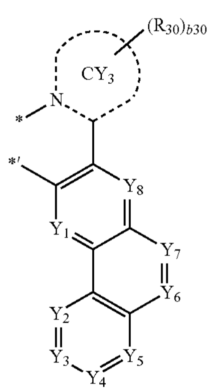

In Formula 1A, $X_1$ is C or N, and $X_2$ is C or N.

In Formula 1B, $Y_1$ is $C(R_{41})$ or N, $Y_2$ is $C(R_{42})$ or N, $Y_3$ is $C(R_{43})$ or N, $Y_4$ is $C(R_{44})$ or N, $Y_5$ is $C(R_{45})$ or N, $Y_6$ is $C(R_{46})$ or N, $Y_7$ is $C(R_{47})$ or N, and $Y_8$ is $C(R_{48})$ or N.

$CY_1$ and $CY_2$ in Formula 1A are each independently be a $C_5$-$C_{30}$ carbocyclic group or a $C_1$-$C_{30}$ heterocyclic group.

$CY_3$ in Formula 1B is a $C_1$-$C_{30}$ heterocyclic group including nitrogen.

In one or more embodiments, $CY_1$ and $CY_2$ may each independently be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, wherein the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a phenyl group, a pyridine group, a pyrimidine group, a pyrazine group, a pyridazine group, or a triazine group.

In one or more embodiments, $CY_1$ and $CY_2$ may each independently be a substituted or unsubstituted cyclopentane group, a substituted or unsubstituted cyclohexane group, a substituted or unsubstituted cycloheptane group, a substituted or unsubstituted cyclopentene group, a substituted or unsubstituted cyclohexene group, a substituted or unsubstituted cycloheptene group, a substituted or unsubstituted phenyl group, a substituted or unsubstituted naphthalene group, a substituted or unsubstituted 1,2,3,4-tetrahydronaphthalene group, a substituted or unsubstituted anthracene group, a substituted or unsubstituted phenanthrene group, a substituted or unsubstituted triphenylene group, a substituted or unsubstituted pyrene group, a substituted or unsubstituted chrysene group, a substituted or unsubstituted cyclopentadiene group, a substituted or unsubstituted thiophene group, a substituted or unsubstituted furan group, a substituted or unsubstituted indole group, a substituted or unsubstituted benzoborole group, a substituted or unsubstituted benzophosphole group, a substituted or unsubstituted indene group, a substituted or unsubstituted benzosilole group, a substituted or unsubstituted benzogermole group, a substituted or unsubstituted benzothiophene group, a substituted or unsubstituted benzoselenophene group, a substituted or unsubstituted benzofuran group, a substituted or unsubstituted carbazole group, a substituted or unsubstituted dibenzoborole group, a substituted or unsubstituted dibenzophosphole group, a substituted or unsubstituted fluorene group, a substituted or unsubstituted dibenzosilole group, a substituted or unsubstituted dibenzogermole group, a substituted or unsubstituted dibenzothiophene group, substituted or unsubstituted a dibenzoselenophene group, a substituted or unsubstituted dibenzofuran group, a substituted or unsubstituted dibenzothiophene 5-oxide group, a substituted or unsubstituted 9H-fluoren-9-one group, a substituted or unsubstituted dibenzothiophene 5,5-dioxide group, a substituted or unsubstituted azaindole group, a substituted or unsubstituted azabenzoborole group, a substituted or unsubstituted azabenzophosphole group, a substituted or unsubstituted azaindene group, a substituted or unsubstituted azabenzosilole group, a substituted or unsubstituted azabenzogermole group, a substituted or unsubstituted azabenzothiophene group, a substituted or unsubstituted azabenzoselenophene group, a substituted or unsubstituted azabenzofuran group, a substituted or unsubstituted azacarbazole group, a substituted or unsubstituted azadibenzoborole group, a substituted or unsubstituted azadibenzophosphole group, a substituted or unsubstituted azafluorene group, a substituted or unsubstituted azadibenzosilole group, a substituted or unsubstituted azadibenzogermole group, a substituted or unsubstituted azadibenzothiophene group, a substituted or unsubstituted azadibenzoselenophene group, a substituted or unsubstituted azadibenzofuran group, a substituted or unsubstituted azadibenzothiophene 5-oxide group, a substituted or unsubstituted aza-9H-fluoren-9-one group, a substituted or unsubstituted azadibenzothiophene 5,5-dioxide group, a substituted or unsubstituted pyridine group, a substituted or unsubstituted pyrimidine group, a substituted or unsubstituted pyrazine group, a substituted or unsubstituted pyridazine group, a substituted or unsubstituted triazine group, a substituted or unsubstituted quinoline group, a substituted or unsubstituted isoquinoline group, a substituted or unsubstituted quinoxaline group, a substituted or unsubstituted quinazoline group, a substituted or unsubstituted phenanthroline group, a substituted or unsubstituted pyrrole group, a substituted or unsubstituted pyrazole group, a substituted or unsubstituted imidazole group, a substituted or unsubstituted triazole group, a substituted or unsubstituted oxazole group, a substituted or unsubstituted isoxazole group, a substituted or unsubstituted thiazole group, a substituted or unsubstituted isothiazole group, a substituted or unsubstituted oxadiazole group, a substituted or unsubstituted thiadiazole group, a substituted or unsubstituted benzopyrazole group, a substituted or unsubstituted benzimidazole group, a substituted or unsubstituted benzoxazole group, a substituted or unsubstituted benzothiazole group, a substituted or unsubstituted benzoxadiazole group, a substituted or unsubstituted benzothiadiazole group, a substituted or unsubstituted 5,6,7,8-tetrahydroisoquinoline group, or a substituted or unsubstituted 5,6,7,8-tetrahydroquinoline group; or a group represented by Formulae 8-1 or 8-2:

Formula 8-1

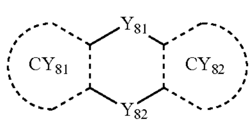

Formula 8-2

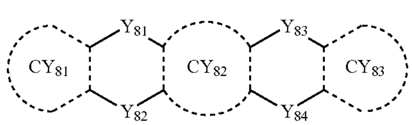

In Formulae 8-1 and 8-2, $Y_{81}$ to $Y_{84}$ may each independently be a single bond, O, S, $N(R_{81})$, $C(R_{81})(R_{82})$, $Si(R_{81})(R_{82})$, C(=O), S(=O), $S(=O)_2$, $B(R_{81})$, $P(R_{81})$, or $P(=O)(R_{81})$, $CY_{81}$ to $CY_{83}$ may each independently be a substituted or unsubstituted phenyl group, a substituted or unsubstituted naphthalene group, a substituted or unsubstituted 1,2,3,4-tetrahydronaphthalene group, a substituted or unsubstituted phenanthrene group, a substituted or unsubstituted pyridine group, a substituted or unsubstituted pyrimidine group, a substituted or unsubstituted pyrazine group, a substituted or unsubstituted triazine group, a substituted or unsubstituted quinoline group, a substituted or unsubstituted isoquinoline group, a substituted or unsubstituted quinoxaline group, a substituted or unsubstituted quinazoline group, a substituted or unsubstituted phenanthroline group, a substituted or unsubstituted benzofuran group, a substituted or unsubstituted benzothiophene group, a substituted or unsubstituted fluorene group, a substituted or unsubstituted carbazole group, a substituted or unsubstituted dibenzofuran group, a substituted or unsubstituted dibenzothiophene group, a substituted or unsubstituted dibenzosilole group, a substituted or unsubstituted azafluorene group, a substituted or unsubstituted azacarbazole group, a substituted or unsubstituted azadibenzofuran group, a substituted or unsubstituted azadibenzothiophene group, or a substituted or unsubstituted azadibenzosilole group.

$R_{81}$ and $R_{82}$ may each independently be as described in connection with $R_{10}$ and $R_{20}$.

In one or more embodiments, in Formulae 8-1 and 8-2, $Y_{81}$ to $Y_{84}$ may each independently be a single bond, O, S, $N(R_{81})$, $C(R_{81})(R_{82})$, or $Si(R_{81})(R_{82})$.

In one or more embodiments, $Y_{81}$ and $Y_{82}$ may not be a single bond at the same time, and $Y_{83}$ and $Y_{84}$ may not be a single bond at the same time. For example, in one or more embodiments, $Y_{81}$ and $Y_{82}$ are not both a single bond, and $Y_{83}$ and $Y_{84}$ are not both a single bond.

In one or more embodiments, $CY_{81}$ to $CY_{83}$ may be each independently a substituted or unsubstituted phenyl group, a substituted or unsubstituted naphthalene group, a substituted or unsubstituted pyridine group, or a substituted or unsubstituted pyrimidine group.

In one or more embodiments, $CY_{81}$ to $CY_{83}$ may each independently be a substituted or unsubstituted phenyl group or a substituted or unsubstituted naphthalene group.

In one or more embodiments, $CY_1$ and $CY_2$ may each independently be a substituted or unsubstituted phenyl group, a substituted or unsubstituted naphthalene group, a substituted or unsubstituted 1,2,3,4-tetrahydronaphthalene group, a substituted or unsubstituted phenanthrene group, a substituted or unsubstituted pyridine group, a substituted or unsubstituted pyrimidine group, a substituted or unsubstituted pyrazine group, a substituted or unsubstituted triazine group, a substituted or unsubstituted quinoline group, a substituted or unsubstituted isoquinoline group, a substituted or unsubstituted quinoxaline group, a substituted or unsubstituted quinazoline group, a substituted or unsubstituted phenanthroline group, a substituted or unsubstituted benzofuran group, a substituted or unsubstituted benzothiophene group, a substituted or unsubstituted fluorene group, a substituted or unsubstituted carbazole group, a substituted or unsubstituted dibenzofuran group, a substituted or unsubstituted dibenzothiophene group, a substituted or unsubstituted dibenzosilole group, a substituted or unsubstituted azafluorene group, a substituted or unsubstituted azacarbazole group, a substituted or unsubstituted azadibenzofuran group, a substituted or unsubstituted azadibenzothiophene group, or a substituted or unsubstituted azadibenzosilole group.

In one or more embodiments, $CY_1$ may be a substituted or unsubstituted pyridine group, a substituted or unsubstituted pyrimidine group, a substituted or unsubstituted pyrazine group, a substituted or unsubstituted triazine group, a substituted or unsubstituted quinoline group, a substituted or unsubstituted isoquinoline group, a substituted or unsubstituted quinoxaline group, or a substituted or unsubstituted quinazoline group.

In one or more embodiments, $CY_2$ may be a substituted or unsubstituted phenyl group, a substituted or unsubstituted naphthalene group, a substituted or unsubstituted pyridine group, a substituted or unsubstituted pyrimidine group, a substituted or unsubstituted pyrazine group, a substituted or unsubstituted triazine group, a substituted or unsubstituted quinoline group, a substituted or unsubstituted isoquinoline group, a substituted or unsubstituted quinoxaline group, a substituted or unsubstituted quinazoline group, a substituted or unsubstituted fluorene group, a substituted or unsubstituted carbazole group, a substituted or unsubstituted dibenzofuran group, a substituted or unsubstituted dibenzothiophene group, or substituted or unsubstituted a dibenzosilole group.

In one or more embodiments, $CY_3$ may be a substituted or unsubstituted pyridine group, a substituted or unsubstituted pyrimidine group, a substituted or unsubstituted pyrazine group, a substituted or unsubstituted triazine group, a substituted or unsubstituted quinoline group, a substituted or unsubstituted isoquinoline group, a substituted or unsubstituted quinoxaline group, or a substituted or unsubstituted quinazoline group.

$R_{10}$, $R_{20}$, and $R_{41}$ to $R_{48}$ in Formula 1 are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(Q_8)(Q_9)$, or —$P(=O)(Q_8)(Q_9)$.

b10, b20, and b30 in Formulae 1A and 1B are each independently 1, 2, 3, 4, 5, 6, 7, 8, 9, or 10.

In one or more embodiments, b10, b20, and b30 may each independently be 1, 2, 3, 4, 5, 6, 7, or 8.

In one or more embodiments, b10, b20, and b30 may each independently be 1, 2, 3, or 4.

In one or more embodiments, b10, b20, and b30 may each independently be 1 or 2.

In one or more embodiments, b10, b20, and b30 may each independently be 1.

In one or more embodiments, $R_{10}$, $R_{20}$, and $R_{41}$ to $R_{48}$ may each independently be:

hydrogen, deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with one or more of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or $—Si(Q_1)(Q_2)(Q_3)$, $—Ge(Q_1)(Q_2)(Q_3)$, $—N(Q_4)(Q_5)$, $—B(Q_6)(Q_7)$, $—P(Q_8)(Q_9)$, or $—P(=O)(Q_8)(Q_9)$.

In one or more embodiments, $R_{10}$, $R_{20}$, and $R_{41}$ to $R_{48}$ may each independently be:

hydrogen, deuterium, —F, —Cl, —Br, —I, $—CD_3$, $—CD_2H$, $—CDH_2$, $—CF_3$, $—CF_2H$, $—CFH_2$, a $C_1$-$C_{60}$ alkyl group, a $C_2$-$C_{60}$ alkenyl group, a $C_2$-$C_{60}$ alkynyl group, a $C_1$-$C_{60}$ alkoxy group, $—Si(Q_3)(Q_4)(Q_5)$, or $—Ge(Q_3)(Q_4)(Q_5)$; or a group represented by one of Formulae 9-1 to 9-61, 9-201 to 9-237, 10-1 to 10-141, or 10-201 to 10-350:

9-1
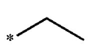
9-2
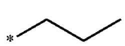
9-3
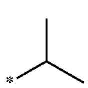
9-4
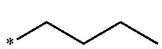
9-5
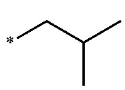

-continued 9-6
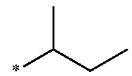
9-7
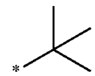
9-8
9-9
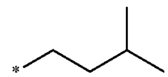
9-10
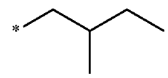
9-11
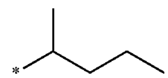
9-12
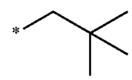
9-13
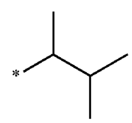
9-14
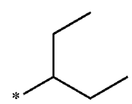
9-15
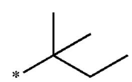
9-16
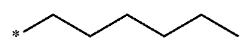
9-17
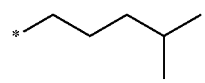
9-18
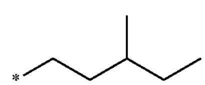
9-19
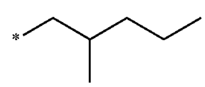
9-20
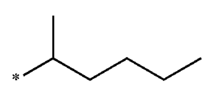
9-21
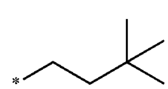
9-22
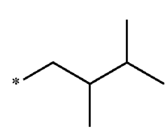
9-23
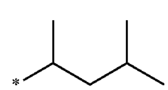

-continued
9-24
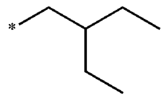
9-25
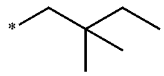
9-26
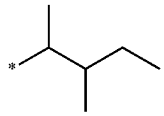
9-27
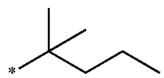
9-28
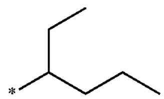
9-29
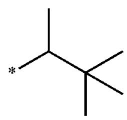
9-30
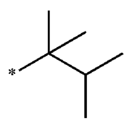
9-31
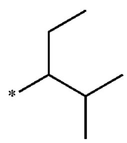
9-32
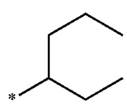
9-33
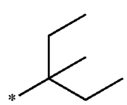
9-34
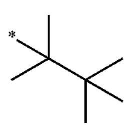
9-35
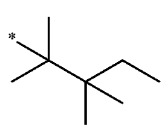
9-36
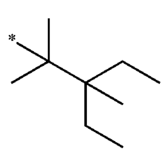
-continued
9-37
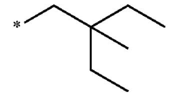
9-38
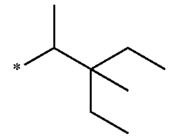
9-39
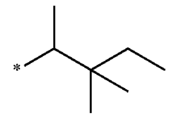
9-40
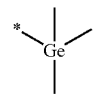
9-41
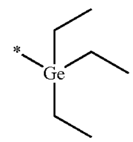
9-42
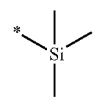
9-43
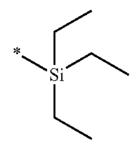
9-44
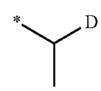
9-45
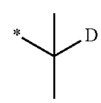
9-46
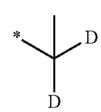
9-47
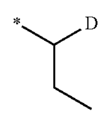
9-48
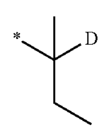
9-49
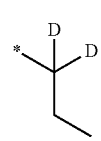

-continued
9-50
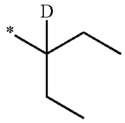
9-51
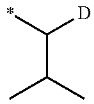
9-52
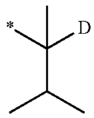
9-53
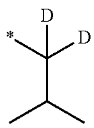
9-54
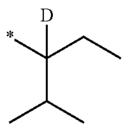
9-55
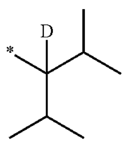
9-56
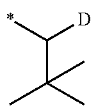
9-57
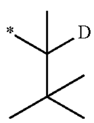
9-58
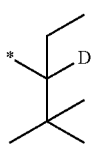
9-59
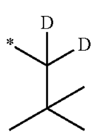
9-60
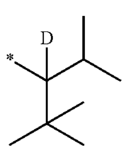
9-61
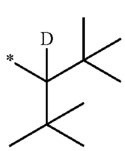
-continued
9-201
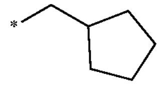
9-202
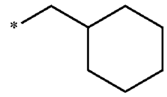
9-203
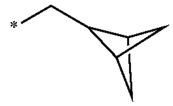
9-204
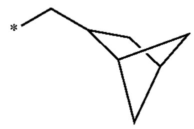
9-205
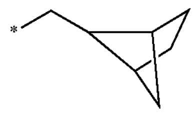
9-206
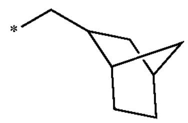
9-207
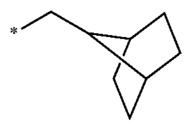
9-208
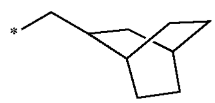
9-209
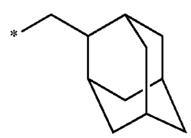
9-210
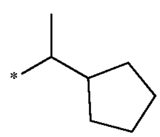
9-211
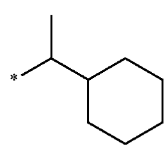
9-212
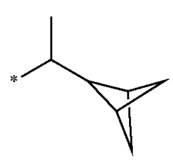

-continued
9-213
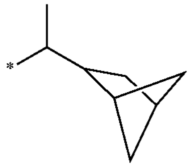
9-214
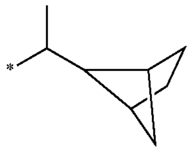
9-215
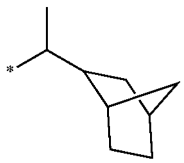
9-216
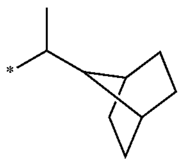
9-217
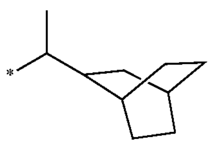
9-218
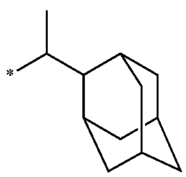
9-219
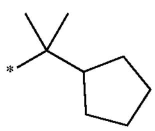
9-220
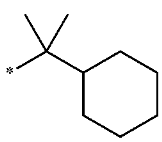
9-221
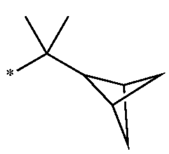
9-222
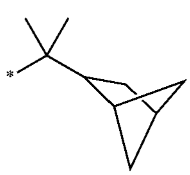
-continued
9-223
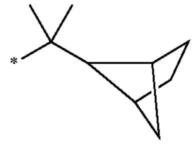
9-224
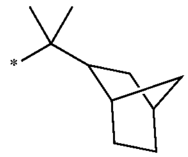
9-225
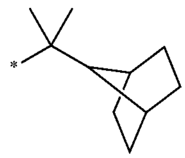
9-226
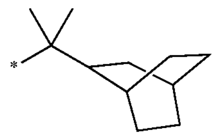
9-227
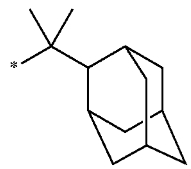
9-228
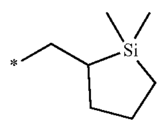
9-229
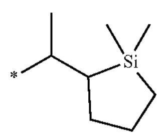
9-230
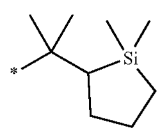
9-231
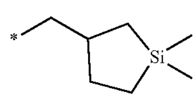
9-232
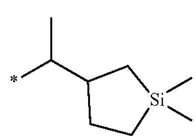
9-233
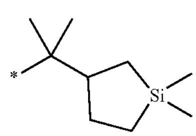

-continued
9-234
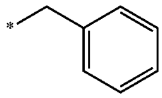
9-235
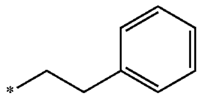
9-236
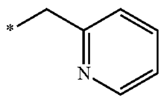
9-237
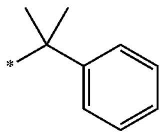
10-1
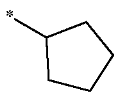
10-2
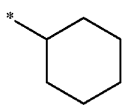
10-3
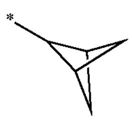
10-4
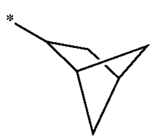
10-5
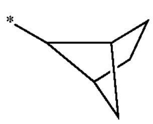
10-6
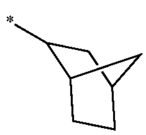
10-7
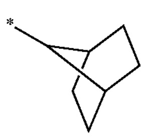
10-8
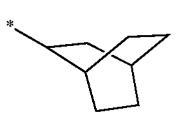
10-9
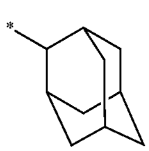
-continued
10-10
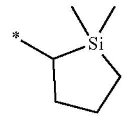
10-11
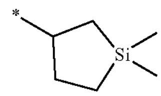
10-12
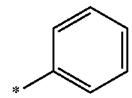
10-13
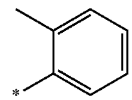
10-14
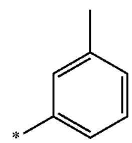
10-15
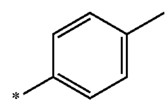
10-16
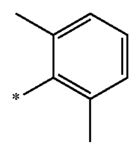
10-17
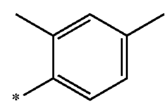
10-18
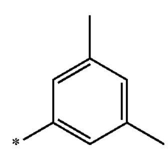
10-19
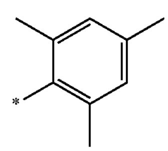
10-20
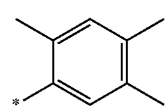
10-21
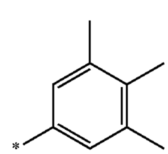

10-22
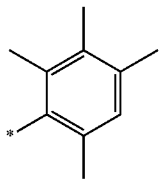
10-23
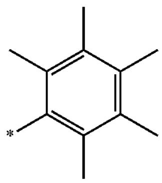
10-24
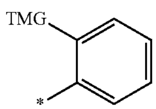
10-25
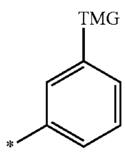
10-26
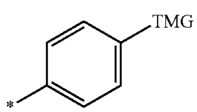
10-27
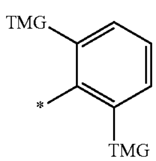
10-28
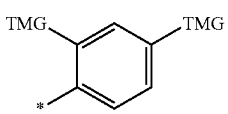
10-29
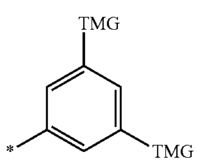
10-30
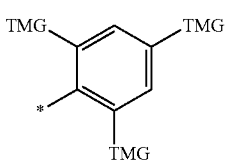
10-31
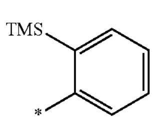
10-32
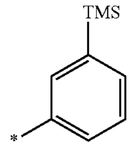
10-33
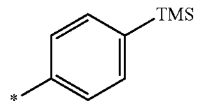
10-34
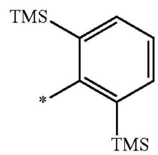
10-35
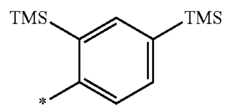
10-36
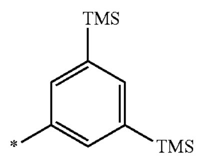
10-37
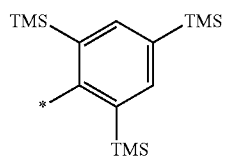
10-38
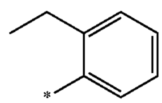
10-39
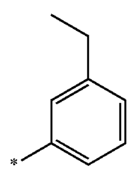
10-40
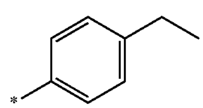
10-41
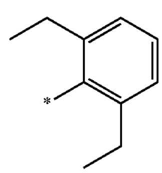
10-42
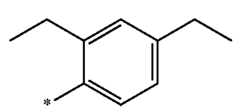

-continued
10-43
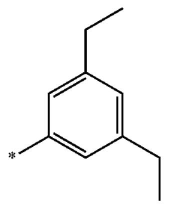
10-44
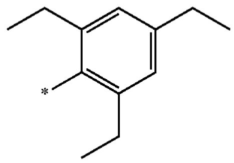
10-45
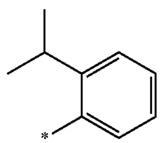
10-46
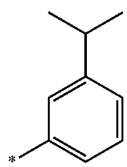
10-47
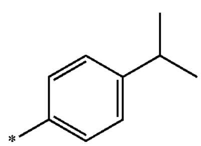
10-48
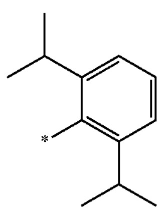
10-49
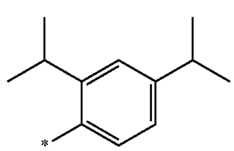
10-50
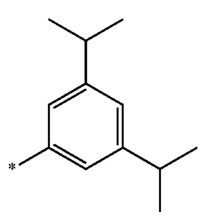
-continued
10-51
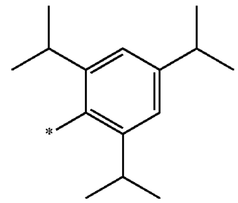
10-52
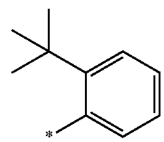
10-53
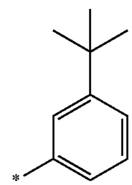
10-54
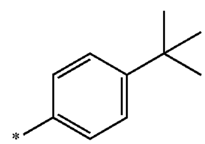
10-55
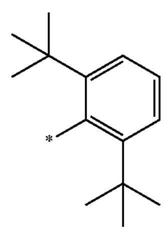
10-56
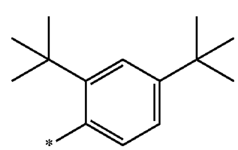
10-57
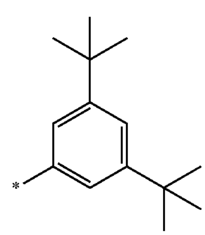
10-58
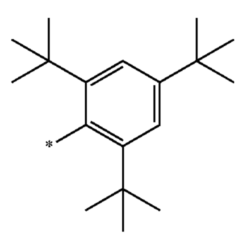

-continued
10-59
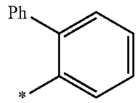
10-60
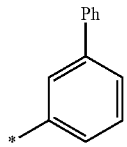
10-61
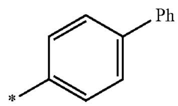
10-62
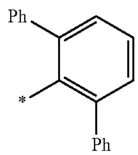
10-63
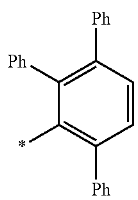
10-64
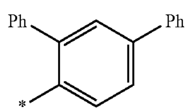
10-65
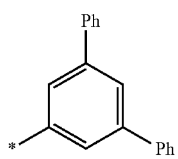
10-66
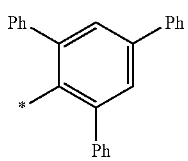
10-67
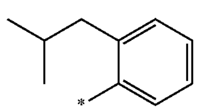
10-68
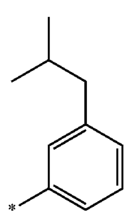
10-69
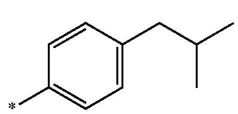
-continued
10-70
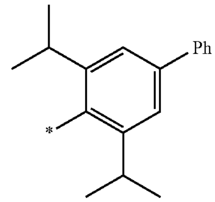
10-71
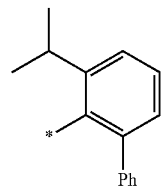
10-72
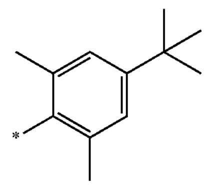
10-73
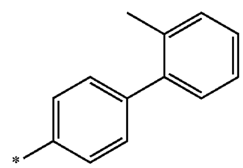
10-74
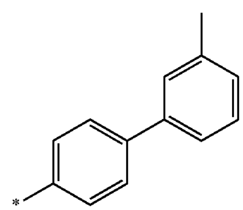
10-75
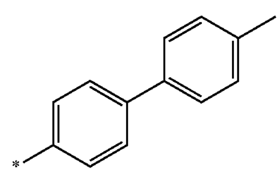
10-76
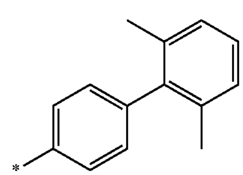
10-77
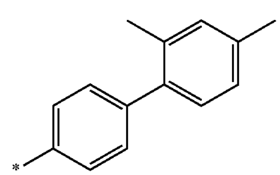

-continued
10-78
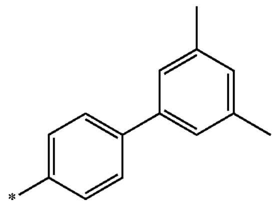
10-79
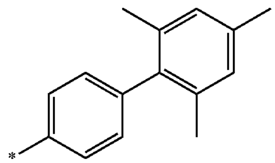
10-80
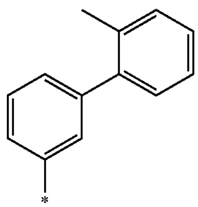
10-81
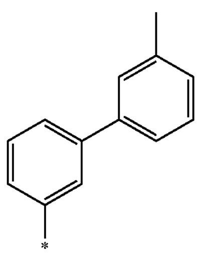
10-82
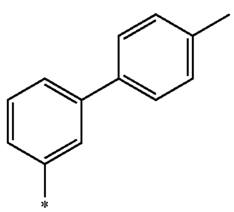
10-83
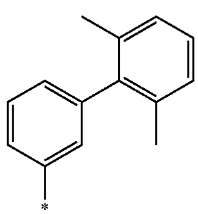
10-84
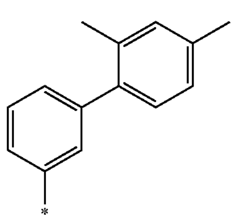
-continued
10-85
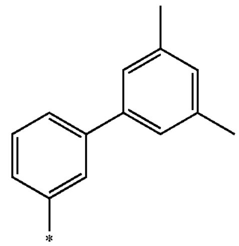
10-86
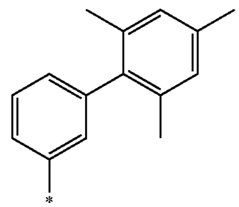
10-87
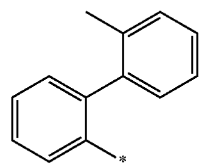
10-88
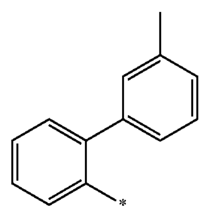
10-89
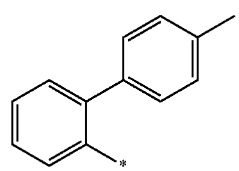
10-90
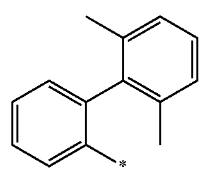
10-91
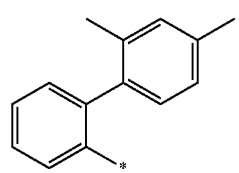
10-92
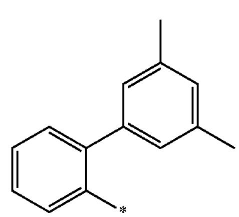

-continued
10-93
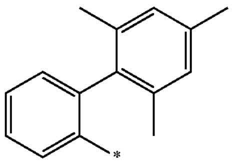
10-94
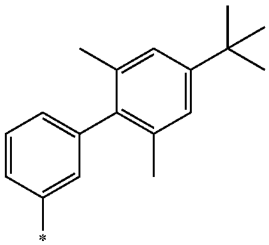
10-95
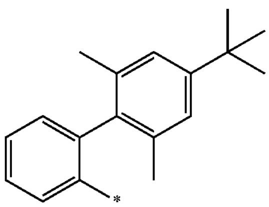
10-96
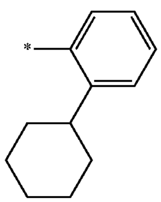
10-97
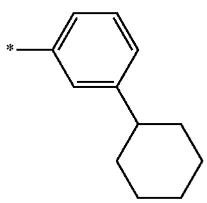
10-98
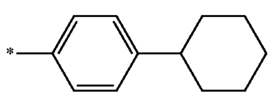
10-99
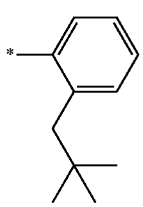
10-100
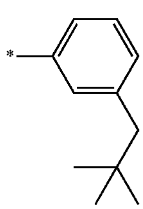
10-101
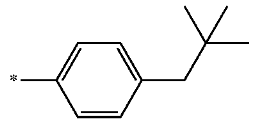
10-102
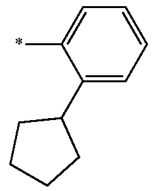
10-103
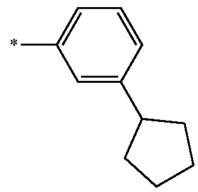
10-104
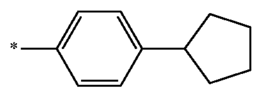
10-105
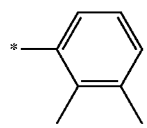
10-106
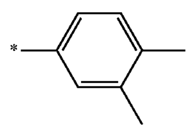
10-107
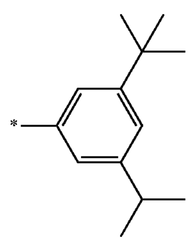
10-108
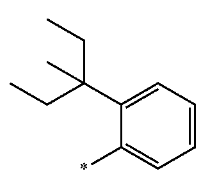
10-109
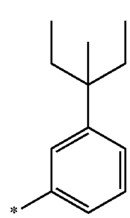

-continued
10-110
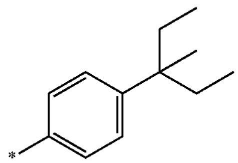
10-111
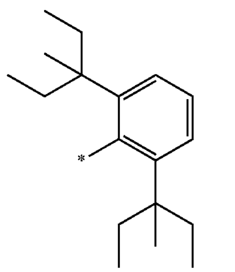
10-112
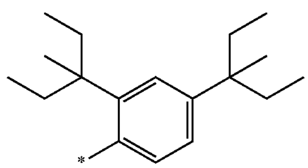
10-113
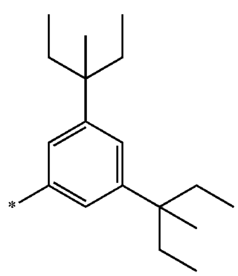
10-114
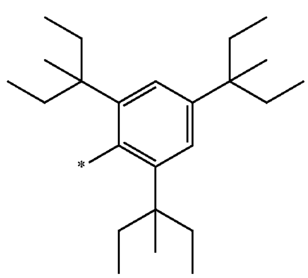
10-115
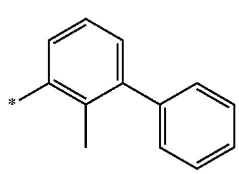
10-116
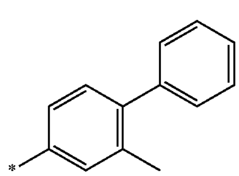
-continued
10-117
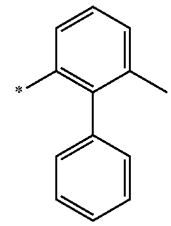
10-118
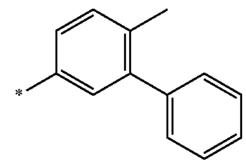
10-119
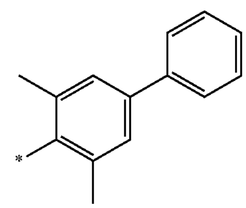
10-120
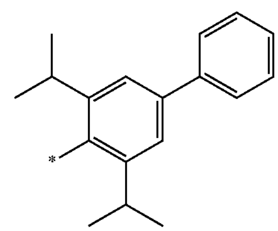
10-121
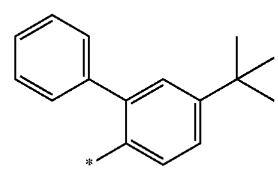
10-122
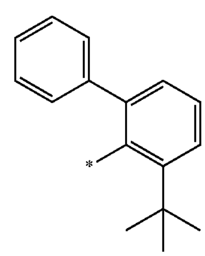
10-123
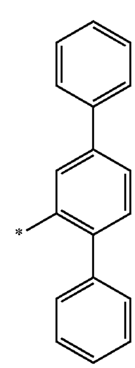

-continued
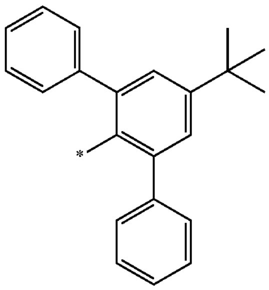
10-124
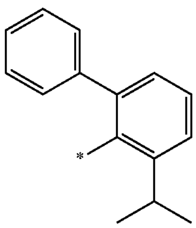
10-125
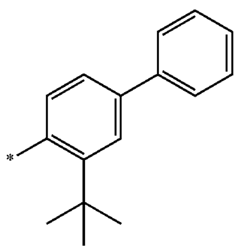
10-126
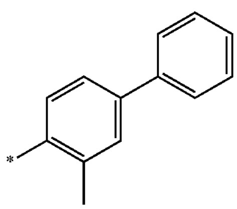
10-127
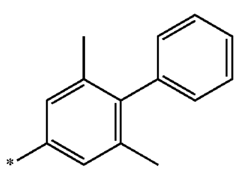
10-128
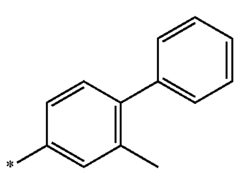
10-129
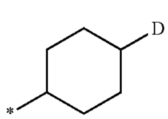
10-130
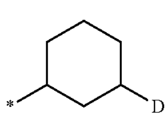
10-131
-continued
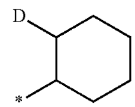
10-132
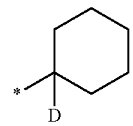
10-133
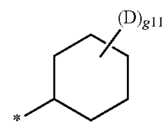
10-134
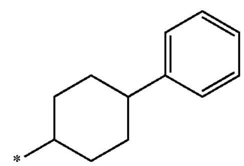
10-135
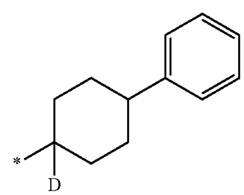
10-136
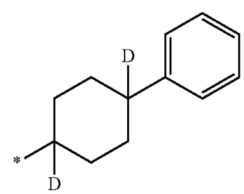
10-137
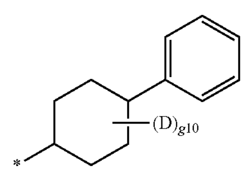
10-138
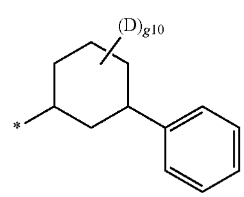
10-139
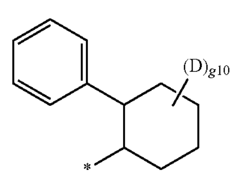
10-140
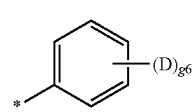
10-141

-continued
10-201
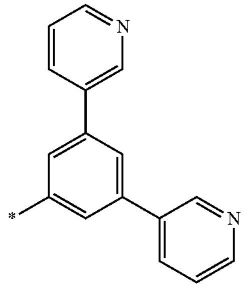
10-202
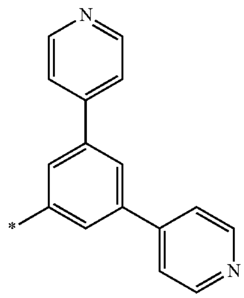
10-203
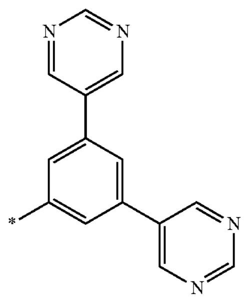
10-204
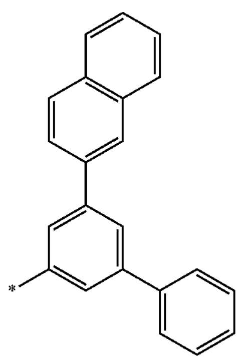
10-205
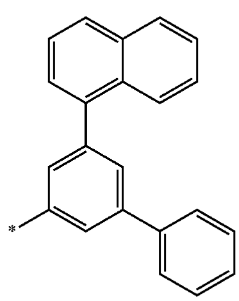
-continued
10-206
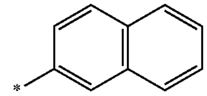
10-207
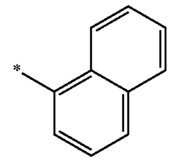
10-208
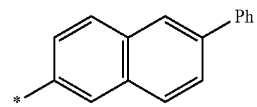
10-209
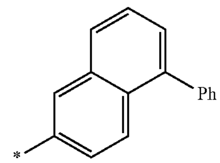
10-210
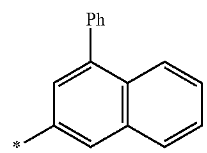
10-211
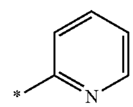
10-212
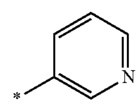
10-213
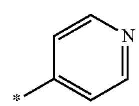
10-214
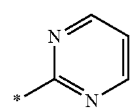
10-215
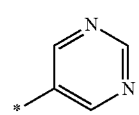
10-216
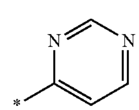
10-217
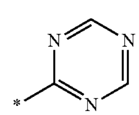

-continued
10-218
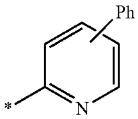
10-219
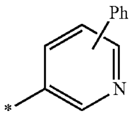
10-220
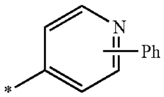
10-221
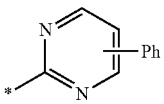
10-222
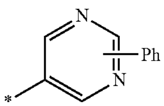
10-223
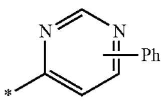
10-224
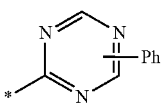
10-225
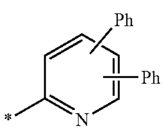
10-226
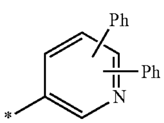
10-227
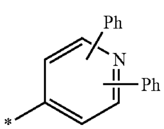
10-228
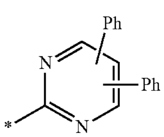
10-229
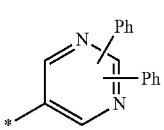
10-230
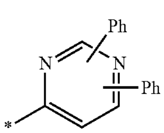
-continued
10-231
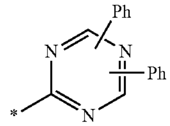
10-232
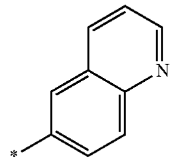
10-233
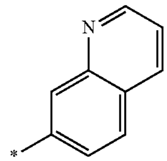
10-234
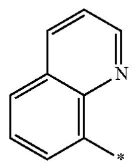
10-235
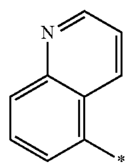
10-236
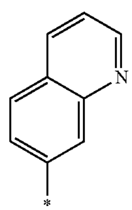
10-237
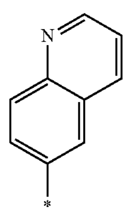
10-238
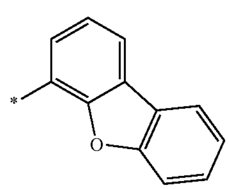
10-239
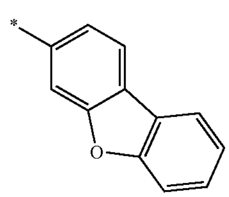

-continued
10-240
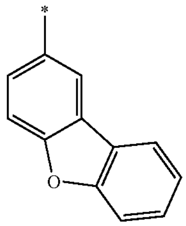
10-241
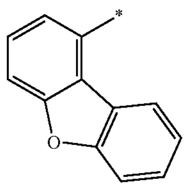
10-242
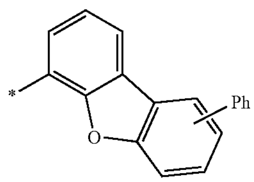
10-243
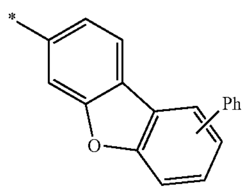
10-244
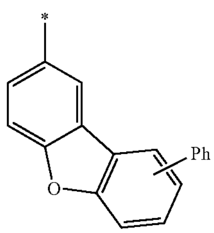
10-245
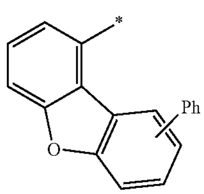
10-246
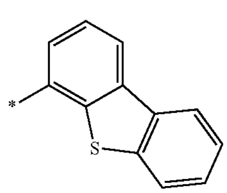
10-247
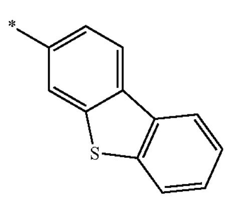
-continued
10-248
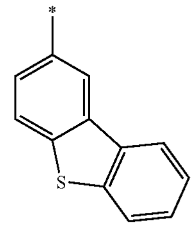
10-249
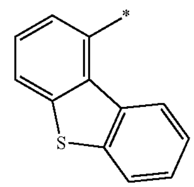
10-250
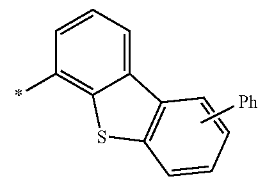
10-251
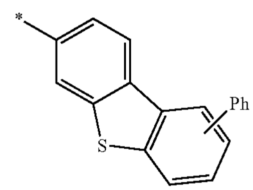
10-252
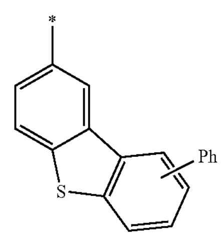
10-253
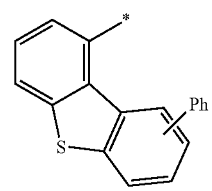
10-254
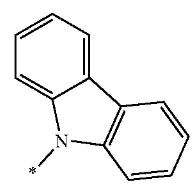
10-255
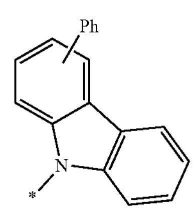

-continued
10-256
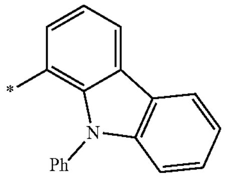
10-257
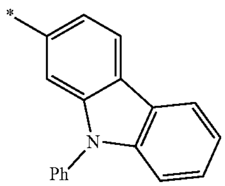
10-258
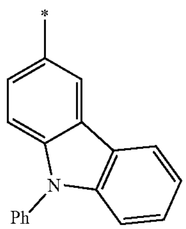
10-259
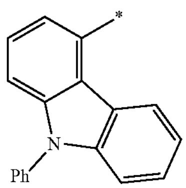
10-260
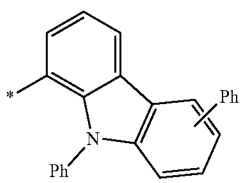
10-261
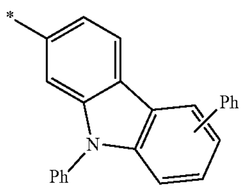
10-262
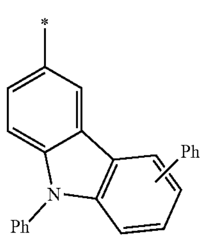
10-263
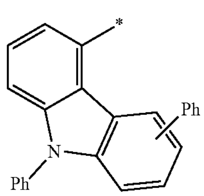
-continued
10-264
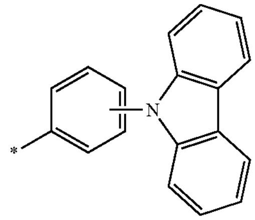
10-265
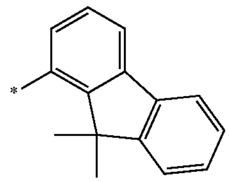
10-266
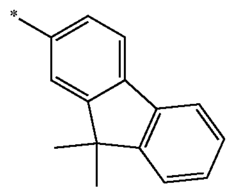
10-267
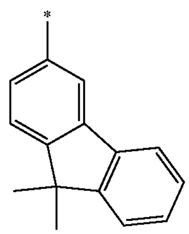
10-268
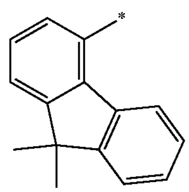
10-269
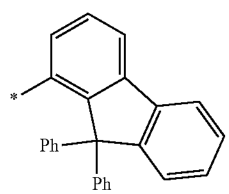
10-270
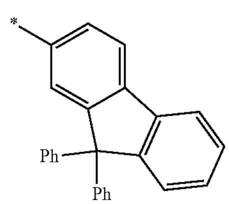

-continued
10-271
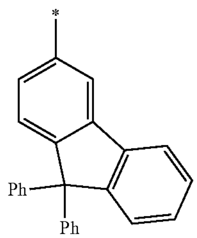
10-272
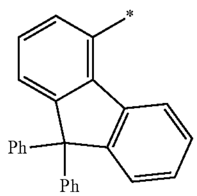
10-273
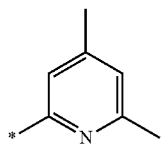
10-274
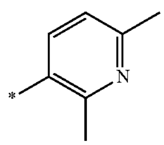
10-275
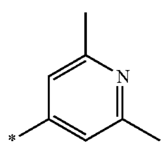
10-276
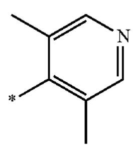
10-277
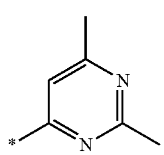
10-278
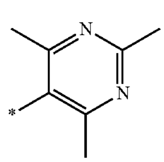
10-279
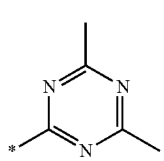
-continued
10-280
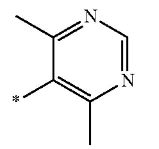
10-281
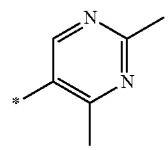
10-282
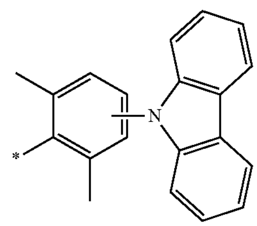
10-283
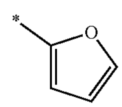
10-284
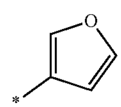
10-285
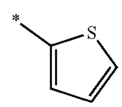
10-286
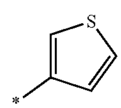
10-287
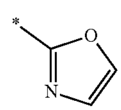
10-288
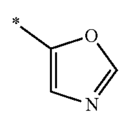
10-289
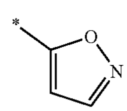
10-290
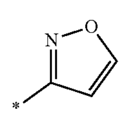
10-291
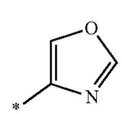

-continued
10-292
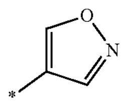
10-293
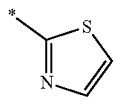
10-294
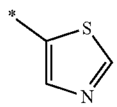
10-295
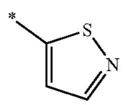
10-296
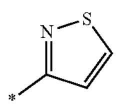
10-297
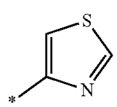
10-298
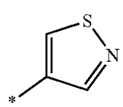
10-299
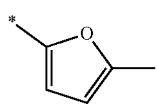
10-300
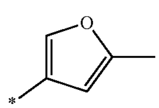
10-301
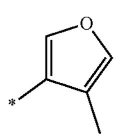
10-302
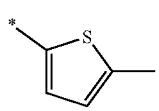
10-303
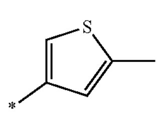
10-304
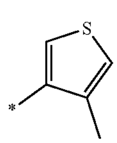
-continued
10-305
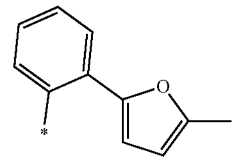
10-306
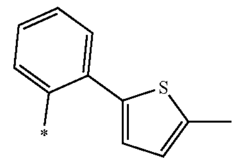
10-307
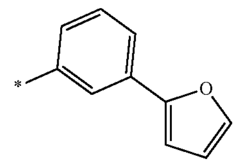
10-308
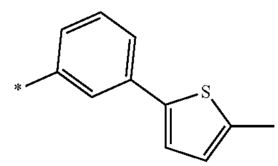
10-309
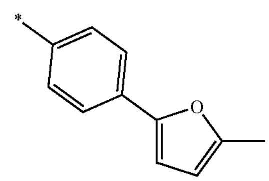
10-310
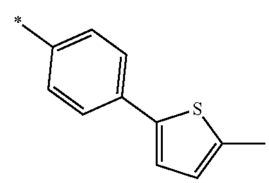
10-311
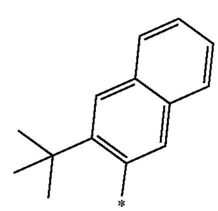
10-312
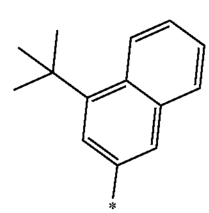

-continued
10-313
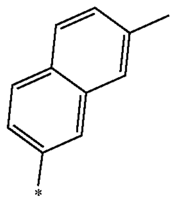
10-314
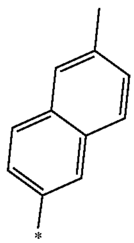
10-315
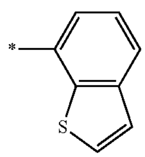
10-316
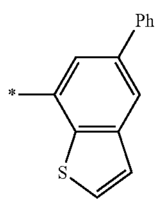
10-317
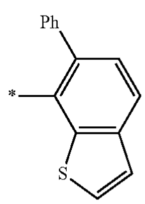
10-318
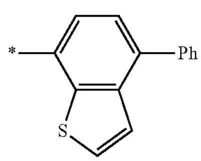
10-319
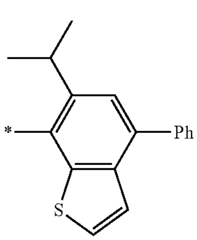
-continued
10-320
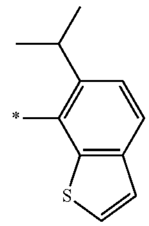
10-321
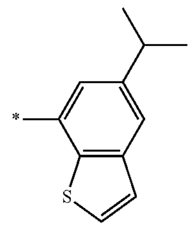
10-322
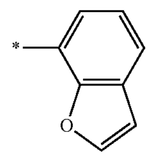
10-323
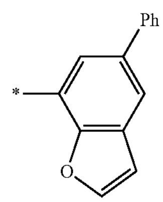
10-324
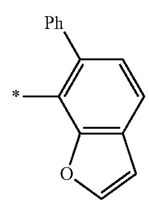
10-325
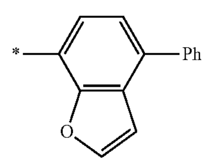
10-326
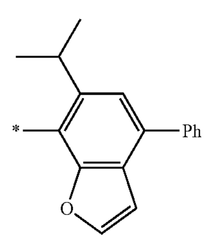

-continued
10-327
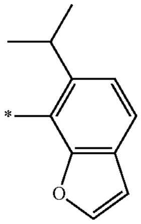
10-328
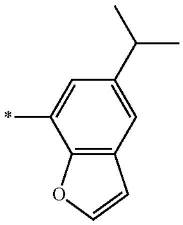
10-329
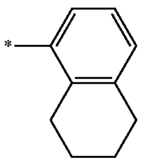
10-330
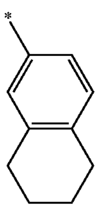
10-331
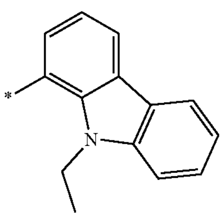
10-332
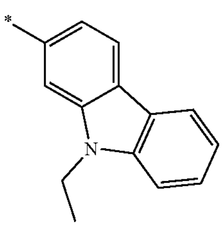
10-333
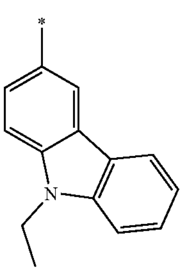
-continued
10-334
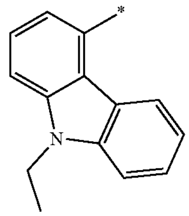
10-335
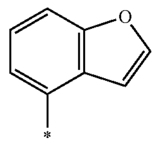
10-336
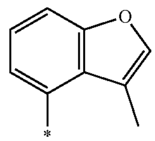
10-337
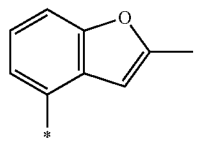
10-338
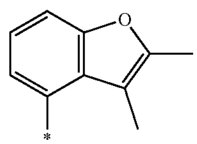
10-339
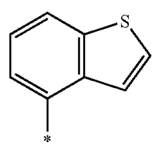
10-340
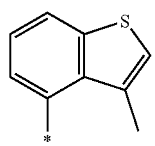
10-341
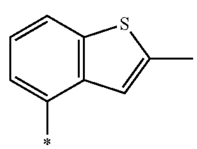
10-342
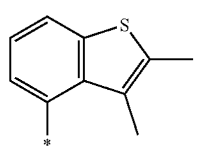

-continued 10-343

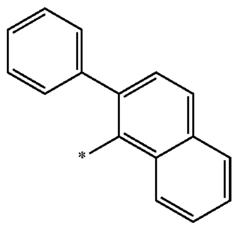

10-344

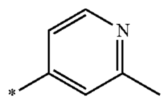

10-345

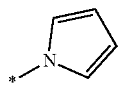

10-346

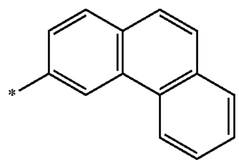

10-347

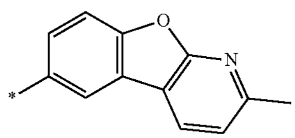

10-348

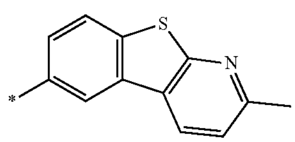

10-349

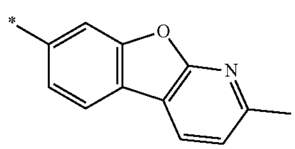

10-350

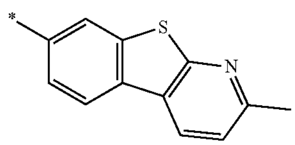

In Formulae 9-1 to 9-61, 9-201 to 9-237, 10-1 to 10-141, and 10-201 to 10-350,

* indicates a binding site to a neighboring atom,

Ph is a phenyl group,

TMS is a trimethylsilyl group,

TMG is a trimethylgermyl group, g5 may be an integer from 1 to 5, g10 may be an integer from 1 to 10, and g11 may be an integer from 2 to 11.

$R_{30}$ in Formula 1B is hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Ge($Q_1$)($Q_2$)($Q_3$), —N($Q_4$)($Q_5$), —B($Q_6$)($Q_7$), —P($Q_8$)($Q_9$), or —P(=O)($Q_8$)($Q_9$).

In one or more embodiments, $R_{30}$ may be:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_2$-$C_{20}$ alkyl group or a $C_1$-$C_{20}$ alkoxy group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with one or more of deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or $—Ge(Q_1)(Q_2)(Q_3)$, $—N(Q_4)(Q_5)$, $—B(Q_6)(Q_7)$, $—P(Q_8)(Q_9)$, or $—P(=O)(Q_8)(Q_9)$.

In one or more embodiments, $R_{30}$ may be:

hydrogen, deuterium, —F, —Cl, —Br, —I, a $C_2$-$C_{60}$ alkyl group, a $C_2$-$C_{60}$ alkenyl group, a $C_2$-$C_{60}$ alkynyl group, a $C_1$-$C_{60}$ alkoxy group, or $—Ge(Q_1)(Q_2)(Q_3)$, or a group represented by one of Formulae 9-1 to 9-61, 9-201 to 9-237, 10-1 to 10-141, or 10-201 to 10-350.

In one or more embodiments, $R_{30}$ may be:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, a $C_1$-$C_{20}$ alkoxy group, or a $C_1$-$C_{20}$ alkylthio group;

a $C_2$-$C_{20}$ alkyl group, a $C_1$-$C_{20}$ alkoxy group, or a $C_1$-$C_{20}$ alkylthio group, each substituted with one or more of deuterium, —F, —Cl, —Br, —I, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbomanyl group, a norbornenyl group, a cyclopentenyl group, a cyclohexenyl group, a cydoheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with one or more of —F, —Cl, —Br, —I, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric add group or a salt thereof, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbomanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group; or $—Ge(Q_1)(Q_2)(Q_3)$, $—N(Q_4)(Q_5)$, $—B(Q_6)(Q_7)$, $—P(Q_8)(Q_9)$, or $—P(=O)(Q_8)(Q_9)$.

In one or more embodiments, $R_{30}$ may be:

hydrogen, —F, —Cl, —Br, —I, a $C_2$-$C_{60}$ alkyl group, a $C_2$-$C_{60}$ alkenyl group substituted with deuterium, a $C_2$-$C_{60}$ alkynyl group, a $C_1$-$C_{60}$ alkoxy group, a $C_1$-$C_{20}$ alkylthio group, or $—Ge(Q_1)(Q_2)(Q_3)$, or a group represented by one of Formulae 9-1 to 9-61, 9-201 to 9-237, 10-1 to 10-141, or 10-201 to 10-350 as described herein.

In one or more embodiments, $R_{30}$ may be hydrogen, a $C_2$-$C_{60}$ alkyl group, a $C_2$-$C_{60}$ alkyl group substituted with deuterium, or $—Ge(Q_1)(Q_2)(Q_3)$.

$Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, and a substituted or unsubstituted monovalent non-aromatic condensed heteropolycyclic group.

In one or more embodiments, $Q_1$ to $Q_9$, $Q_{11}$ to $Q_{19}$, $Q_{21}$ to $Q_{29}$, and $Q_{31}$ to $Q_{39}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$, an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with one or more of deuterium, a $C_1$-$C_{10}$ alkyl group, or a phenyl group.

Two or more of a plurality of $R_{10}$(s) are optionally linked to each other to form a substituted or unsubstituted $C_5$-$C_{30}$ carbocyclic group or a substituted or unsubstituted $C_1$-$C_{30}$ heterocyclic group; two or more of a plurality of $R_{20}$(s) are optionally linked to each other to form a substituted or unsubstituted $C_5$-$C_{30}$ carbocyclic group or a substituted or unsubstituted $C_1$-$C_{30}$ heterocyclic group; two or more of a plurality of $R_{30}$(s) are optionally linked to each other to form a substituted or unsubstituted $C_5$-$C_{30}$ carbocyclic group or a substituted or unsubstituted $C_1$-$C_{30}$ heterocyclic group; and two or more neighboring substituents of $R_{10}$, $R_{20}$, $R_{30}$, and $R_{41}$ to $R_{48}$ are optionally linked to each other to form a substituted or unsubstituted $C_5$-$C_{30}$ carbocyclic group or a substituted or unsubstituted $C_1$-$C_{30}$ heterocyclic group.

In one or more embodiments, two or more of a plurality of $R_{10}$(s), two or more of a plurality of $R_{20}$(s); and/or two or more neighboring substituents of $Ar_1$, $R_1$, $R_2$, $R_{10}$, $R_{20}$, and $R_{41}$ to $R_{48}$ may optionally be linked to each other via a single bond, a double bond or first linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ (for example, a fluorene group, a xanthene group, an acridine group, etc.) unsubstituted or substituted with at least one $R_{10a}$. $R_{10a}$ is as described in connection with $R_{10}$.

In one or more embodiments, $CY_1$ in Formula 1A may be represented by one of Formulae 1-1 to 1-16:

1-1

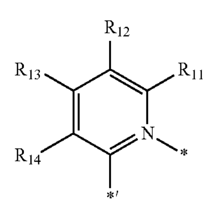

-continued
1-2
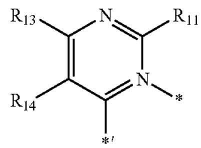
1-3
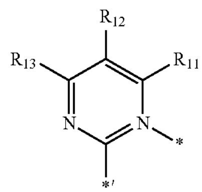
1-4
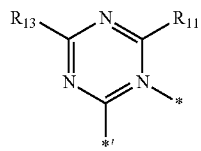
1-5
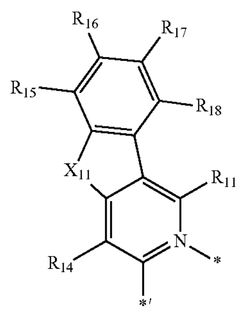
1-6
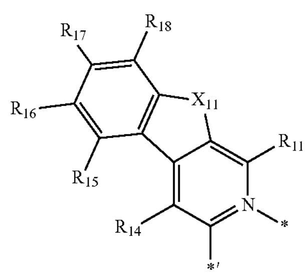
1-7
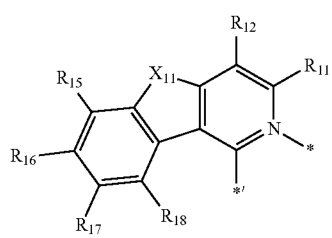
1-8
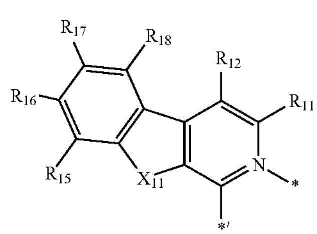
-continued
1-9
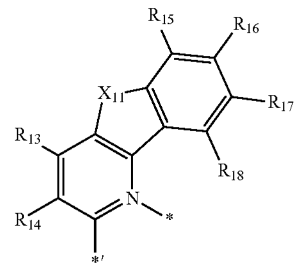
1-10
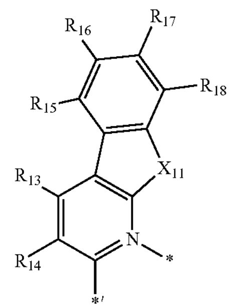
1-11
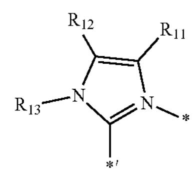
1-12
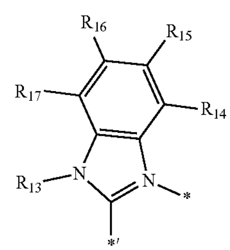
1-13
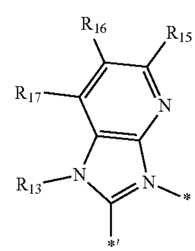
1-14
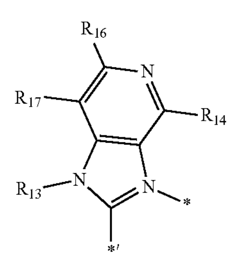

-continued 1-15

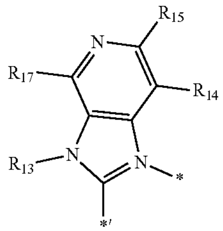

1-16

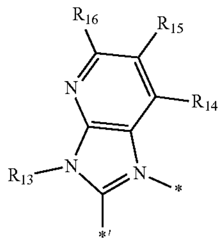

In Formulae 1-1 to 1-16, $X_{11}$ may be O, S, $N(R_{19a})$, $C(R_{19a})(R_{19b})$, or $Si(R_{19a})(R_{19b})$, $R_{11}$ to $R_{18}$, $R_{19a}$, and $R_{19b}$ are each independently as described in connection with $R_{10}$, two or more neighboring substituents of $R_{11}$ to $R_{18}$, $R_{19a}$, and $R_{19b}$ may optionally be linked to each other to form a substituted or unsubstituted $C_5$-$C_{30}$ carbocyclic group or a substituted or unsubstituted $C_1$-$C_{30}$ heterocyclic group, wherein, when $R_{11}$ to $R_{18}$, $R_{19a}$, or $R_{19b}$ is —$Si(Q_1)(Q_2)(Q_3)$ or —$Ge(Q_1)(Q_2)(Q_3)$, $Q_1$ to $Q_3$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with one or more of deuterium, a $C_1$-$C_{10}$ alkyl group, or a phenyl group,

* indicates a binding site to $M_1$, and

' indicates a binding site to ring $CY_2$.

In one or more embodiments, $CY_2$ in Formula 1A may be represented by one of Formulae 2-1 to 2-22:

2-1

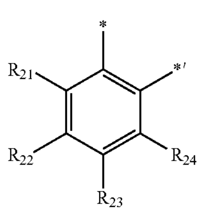

-continued 2-2

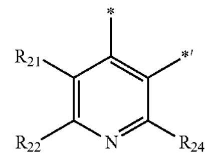

2-3

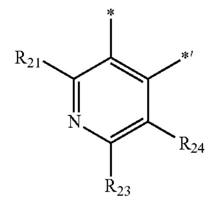

2-4

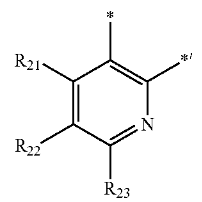

2-5

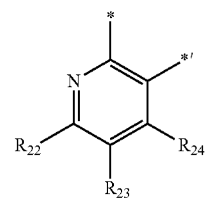

2-6

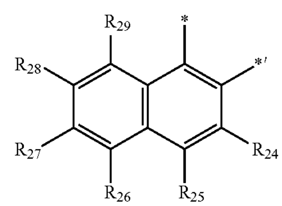

2-7

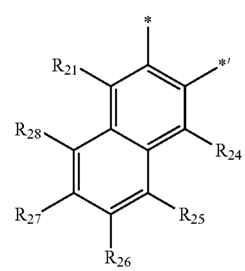

2-8

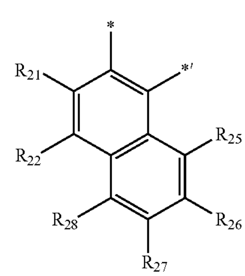

-continued
2-9
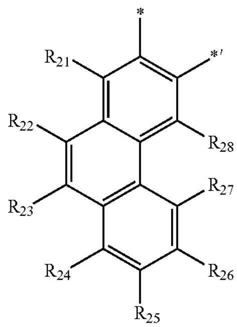
2-10
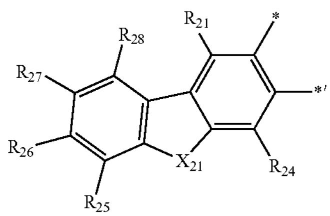
2-11
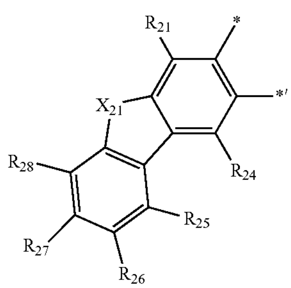
2-12
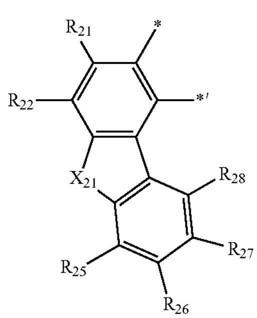
2-13
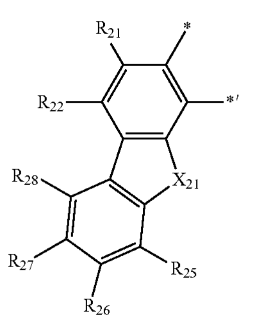
-continued
2-14
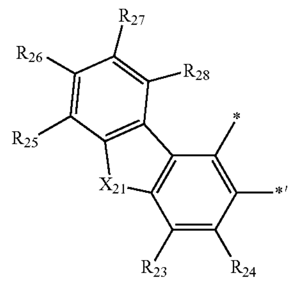
2-15
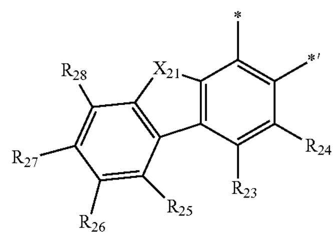
2-16
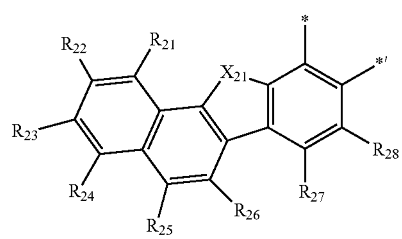
2-17
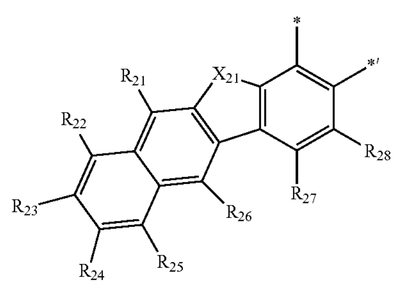
2-18
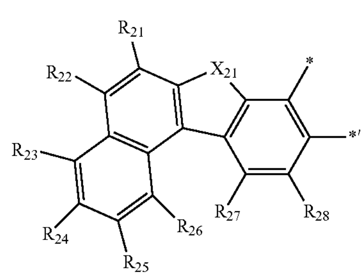
2-19
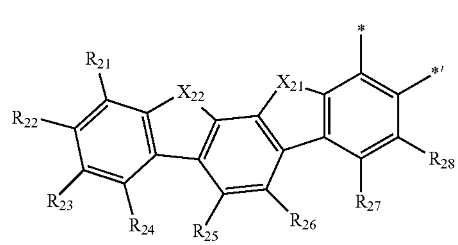

-continued 2-20

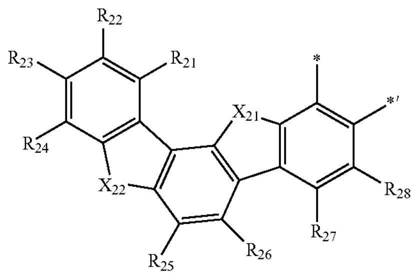

2-21

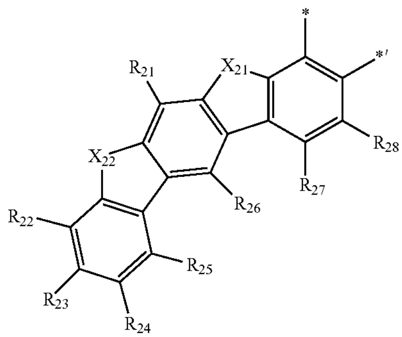

2-22

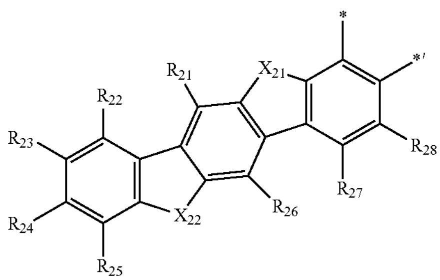

In Formulae 2-1 to 2-22, $X_{21}$ and $X_{22}$ may each independently be O, S, $N(R_{29a})$, $C(R_{29a})(R_{29b})$, or $Si(R_{29a})(R_{29b})$, $R_{21}$ to $R_{28}$, $R_{29a}$, and $R_{29b}$ are each independently as described in connection with $R_{20}$, and two or more neighboring substituents of $R_{21}$ to $R_{28}$, $R_{29a}$, and $R_{29b}$ may optionally be linked to each other to form a substituted or unsubstituted $C_5$-$C_{30}$ carbocyclic group or a substituted or unsubstituted $C_1$-$C_{30}$ heterocyclic group, wherein, when $R_{21}$ to $R_{28}$, $R_{29a}$, or $R_{29b}$ is —$Si(Q_1)(Q_2)(Q_3)$ or —$Ge(Q_1)(Q_2)(Q_3)$, $Q_1$ to $Q_3$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$, an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with one or more of deuterium, a $C_1$-$C_{10}$ alkyl group, or a phenyl group,

* indicates a binding site to ring $CY_1$, and

*' indicates a binding site to $M_1$.

In one or more embodiments, two or more neighboring substituents of $R_{11}$ to $R_{18}$, $R_{19a}$, and $R_{19b}$, or $R_{21}$ to $R_{28}$, $R_{29a}$, and $R_{29b}$ may be optionally linked to each other to form a $C_5$-$C_{30}$ carbocyclic group unsubstituted or substituted with at least one $R_{10a}$; or a $C_1$-$C_{30}$ heterocyclic group unsubstituted or substituted with at least one $R_{10a}$.

For example, two or more neighboring substituents of $R_{11}$ to $R_{18}$, $R_{19a}$, or $R_{19b}$, or $R_{21}$ to $R_{28}$, $R_{29a}$, or $R_{29b}$ may optionally be linked to each other to form a cyclopentane group, a cyclopentene group, a cyclopentadiene group, a furan group, a thiophene group, a pyrrole group, a silole group, an adamantane group, a norbornane group, a norbornene group, a cyclohexane group, a cyclohexene group, a phenyl group, a naphthalene group, an indene group, an indole group, a benzofuran group, a benzothiophene group, a benzosilole group, a fluorene group, a carbazole group, a dibenzofuran group, a dibenzothiophene group, or dibenzosilole group, each unsubstituted or substituted with at least one $R_{10a}$.

In one or more embodiments, $CY_3$ in Formula 1B may be represented by one of Formulae 3-1 to 3-16:

3-1

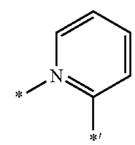

3-2

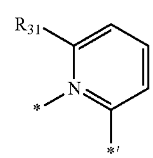

3-3

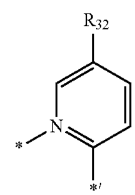

3-4

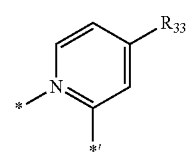

3-5

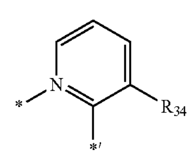

3-6

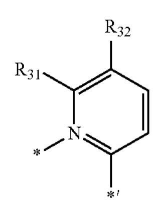

-continued 3-7

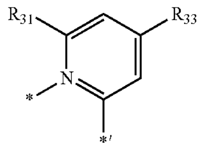

3-8

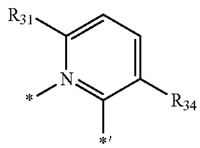

3-9

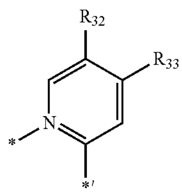

3-10

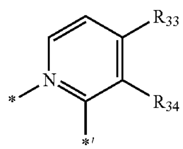

3-11

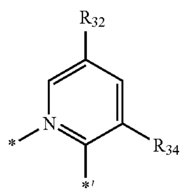

3-12

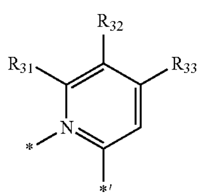

3-13

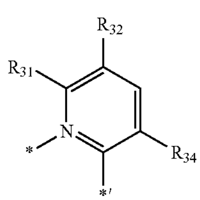

3-14

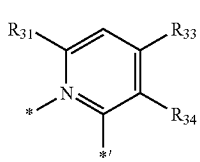

3-15

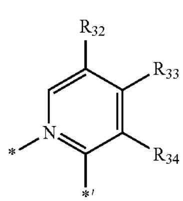

-continued 3-16

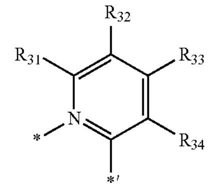

In Formulae 3-1 to 3-16, $R_{31}$ to $R_{34}$ may each independently be as described in connection with $R_{30}$,

* indicates a binding site to $M_1$, and

*' indicates a binding site to a neighboring atom.

In one or more embodiments, the organometallic compound may be a compound represented by Formula 11-1:

Formula 11-1

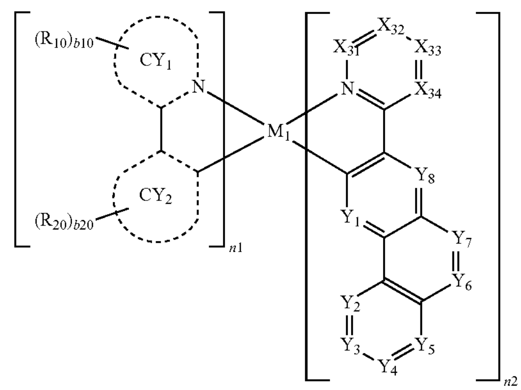

In Formula 11-1, $M_1$, n1, n2, $CY_1$, $CY_2$, $Y_1$ to $Y_8$, $R_{10}$, $R_{20}$, b10 and b20 each are as described herein, $X_{31}$ may be $C(R_{31})$ or N, $X_{32}$ may be $C(R_{32})$ or N, $X_{33}$ may be $C(R_{33})$ or N, and $X_{34}$ may be $C(R_{34})$ or N, $R_{31}$ to $R_{34}$ are each independently as described in connection with $R_{30}$, and two or more of $R_{31}$ to $R_{34}$ may optionally be linked to form a substituted or unsubstituted $C_5$-$C_{30}$ carbocyclic group or a substituted or unsubstituted $C_1$-$C_{30}$ heterocyclic group.

In one or more embodiments, two or more neighboring substituents of $R_{31}$ to $R_{34}$ are optionally linked to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

For example, two or more neighboring substituents of $R_{31}$ to $R_{34}$ may optionally be linked to each other to form a cyclopentane group, a cyclopentene group, a cyclopentadiene group, a furan group, a thiophene group, a pyrrole group, a silole group, an adamantane group, a norbornane group, a norbornene group, a cyclohexane group, a cyclohexene group, a phenyl group, a naphthalene group, an indene group, an indole group, a benzofuran group, a benzothiophene group, a benzosilole group, a fluorene group, a carbazole group, a dibenzofuran group, a dibenzothiophene group, or dibenzosilole group, each unsubstituted or substituted with at least one $R_{10a}$.

In one or more embodiments, examples of the "$C_5$-$C_{30}$ carbocyclic group unsubstituted or substituted with at least one $R_{10a}$, or a $C_1$-$C_{30}$ heterocyclic group unsubstituted or substituted with at least one $R_{10a}$" include a phenyl group, a naphthalene group, a cyclopentane group, a cyclopentene group, a cyclopentadiene group, a cyclohexane group, a cyclohexene group, a cycloheptane group, a cycloheptene group, a bicyclo[2.2.1]heptane group, a furan group, a thiophene group, a pyrrole group, a silole group, an indene group, a benzofuran group, a benzothiophene group, an indole group, or a benzosilole group, each unsubstituted or substituted with at least one $R_{10a}$. $R_{10a}$ may be as described in connection with $R_{10}$. The $C_5$-$C_{30}$ carbocyclic group and the $C_1$-$C_{30}$ heterocyclic group each may be as described herein.

In one or more embodiments, the organometallic compound may be a compound represented by Formula 12-1:

Formula 12-1

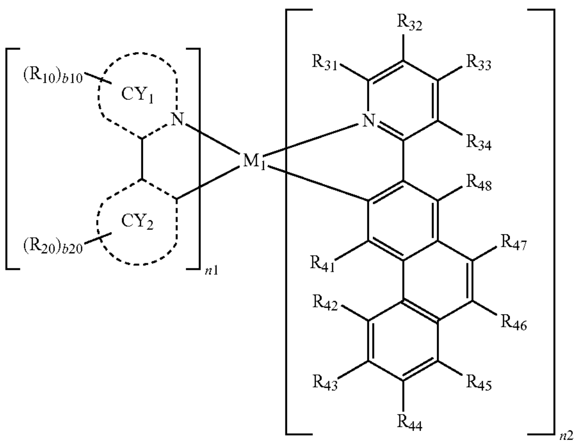

In Formula 12-1, $M_1$, n1, n2, $CY_1$, $CY_2$, $R_{10}$, $R_{20}$, b10, b20, and $R_{41}$ to $R_{48}$ each may be as described herein, and $R_{31}$ to $R_{34}$ each may be independently as described in connection with $R_{30}$.

In one or more embodiments, at least one of $R_{10}$(s) in the number of b10, $R_{20}$(s) in the number of b20, and $R_{30}$(s) in the number of b30 may be a substituted or unsubstituted $C_1$-$C_{60}$ alkyl group, a substituted or unsubstituted $C_3$-$C_{10}$ cycloalkyl group, —$Si(Q_1)(Q_2)(Q_3)$, or —$Ge(Q_1)(Q_2)(Q_3)$.

In one or more embodiments, at least one of $R_{10}$(s) in the number of b10, $R_{20}$(s) in the number of b20, and $R_{30}$(s) in the number of b30 may be a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a cyclopropyl group, a cyclobutyl group, a cyclopentyl group, a cyclohexyl group, a cycloheptyl group, a cyclooctyl group, a phenyl group, a biphenyl group, a $C_1$-$C_{20}$alkyl phenyl group, a naphthyl group, —$Si(Q_1)(Q_2)(Q_3)$, or —$Ge(Q_1)(Q_2)(Q_3)$.

In one or more embodiments, at least one of $R_{31}$ to $R_{34}$ in Formula 11-1 or Formula 12-1 may be a substituted or unsubstituted $C_2$-$C_{60}$ alkyl group, a substituted or unsubstituted $C_3$-$C_{10}$ cycloalkyl group, or —$Ge(Q_1)(Q_2)(Q_3)$.

In one or more embodiments, at least one of $R_{31}$ to $R_{34}$ in Formula 11-1 or Formula 12-1 may be a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, a cyclopropyl group, a cyclobutyl group, a cyclopentyl group, a cyclohexyl group, a cycloheptyl group, a cyclooctyl group, a phenyl group, a biphenyl group, a $C_1$-$C_{20}$ alkyl phenyl group, a naphthyl group, —$Si(Q_1)(Q_2)(Q_3)$, or —$Ge(Q_1)(Q_2)(Q_3)$.

In one or more embodiments, at least one of $R_{31}$ to $R_{34}$ in Formulae 3-1 to 3-16 may be a substituted or unsubstituted $C_2$-$C_{60}$ alkyl group, a substituted or unsubstituted $C_3$-$C_{10}$ cycloalkyl group, or —$Ge(Q_1)(Q_2)(Q_3)$.

In one or more embodiments, at least one of $R_{31}$ to $R_{34}$ in Formulae 3-1 to 3-16 may be an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, a phenyl group, a biphenyl group, a $C_1$-$C_{20}$ alkyl phenyl group, a naphthyl group, or —$Ge(Q_1)(Q_2)(Q_3)$.

In one or more embodiments, the organometallic compound may be electrically neutral.

In one or more embodiments, the organometallic compound may be one of Compounds 1 to 179:

1

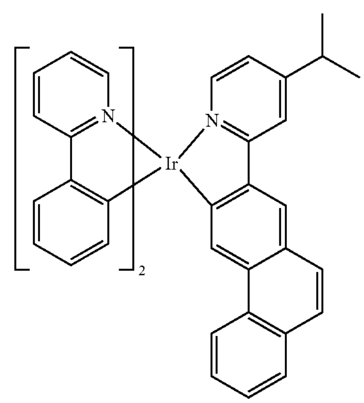

2

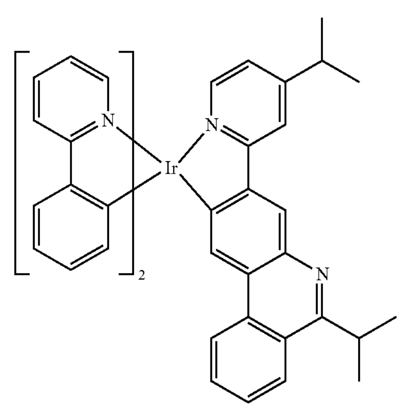

-continued
3
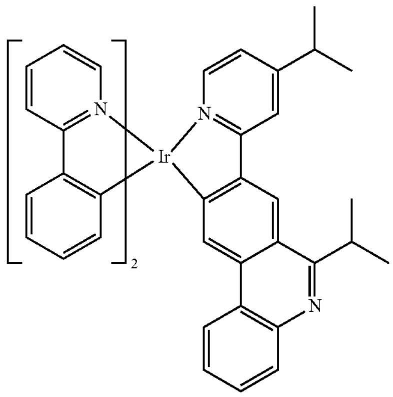
4
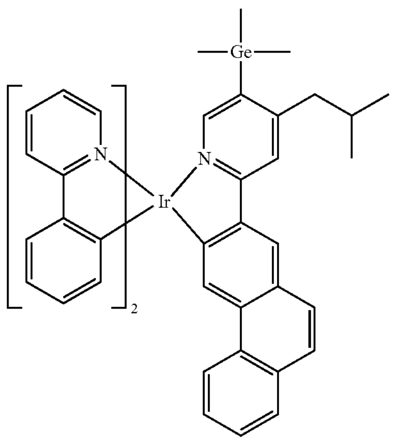
5
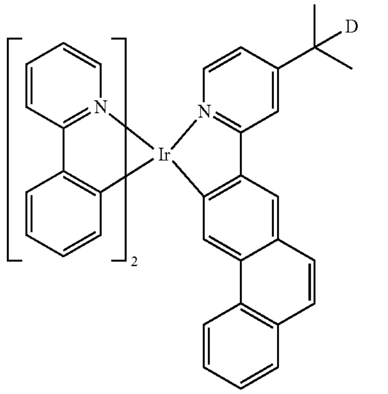
6
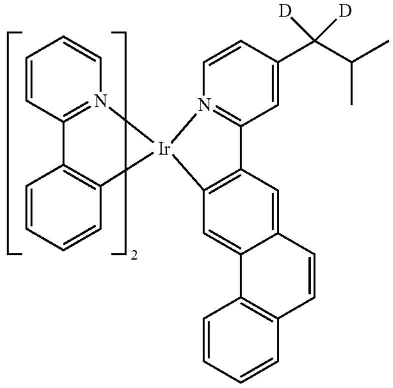
-continued
7
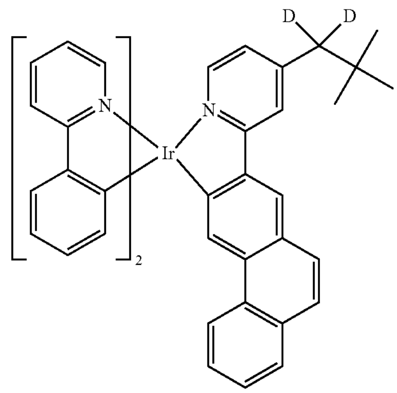
8
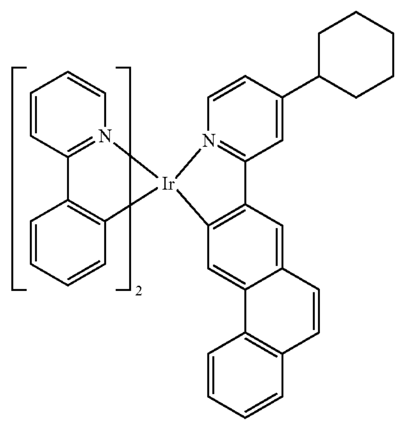
9
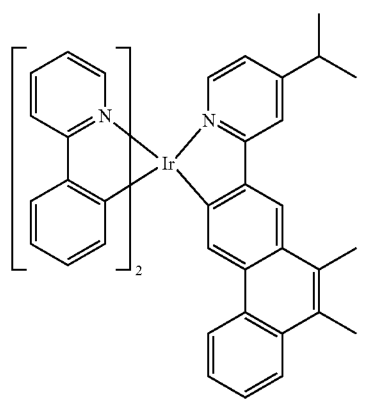
10
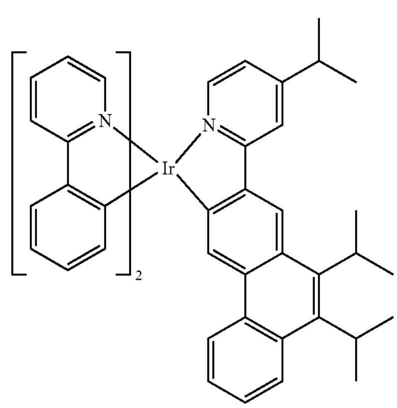

-continued
11
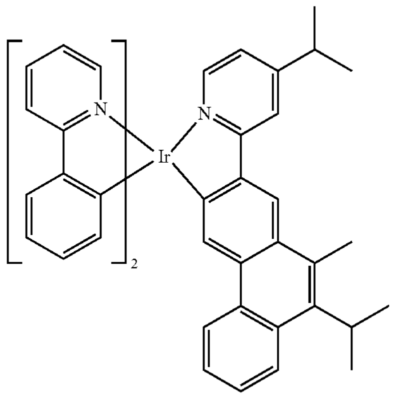
12
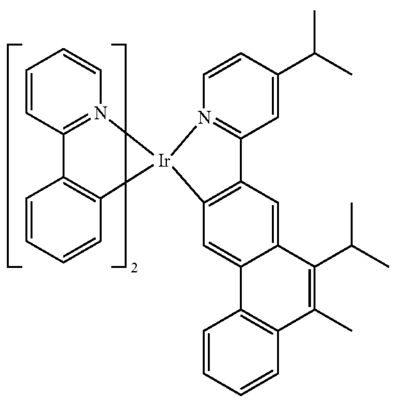
13
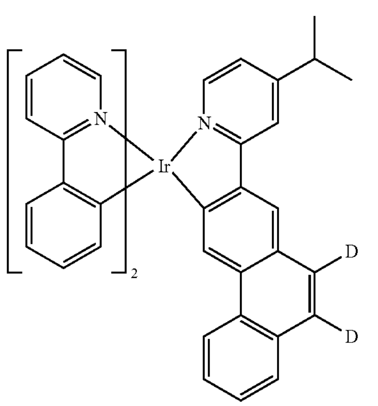
14
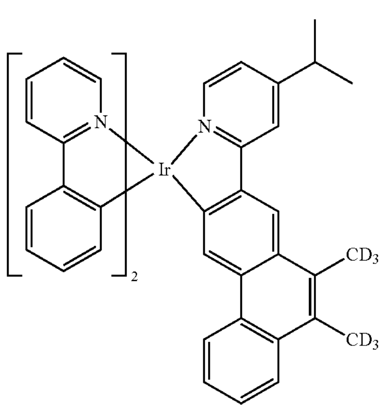
-continued
15
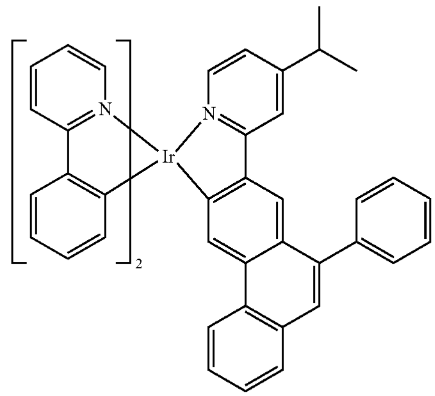
16
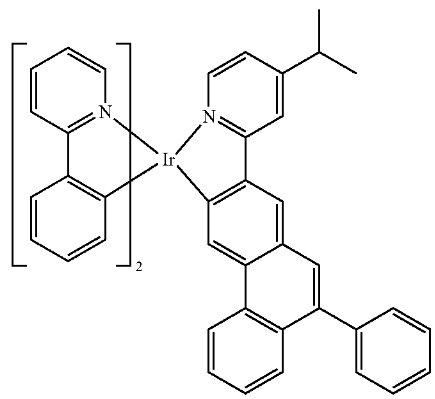
17
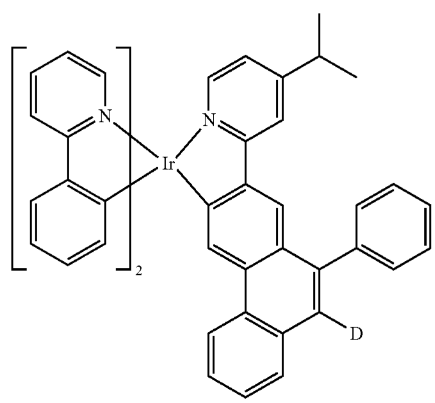
18
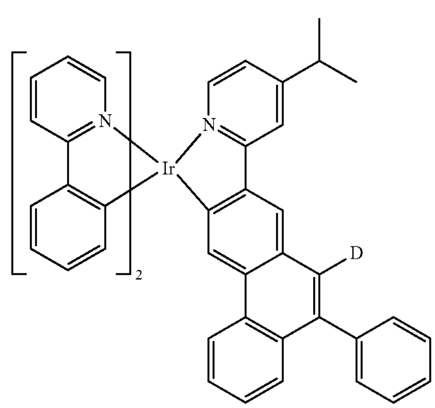

19
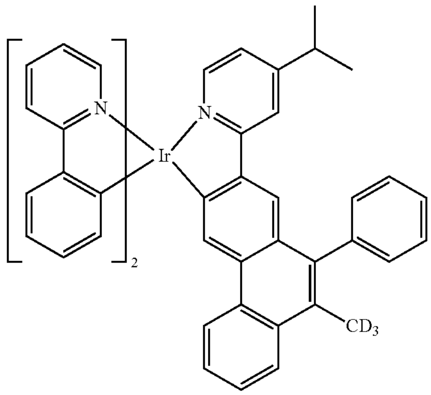
20
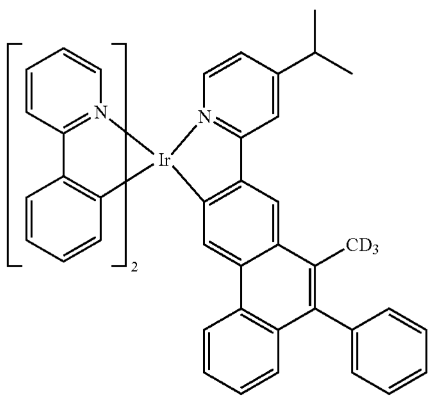
21
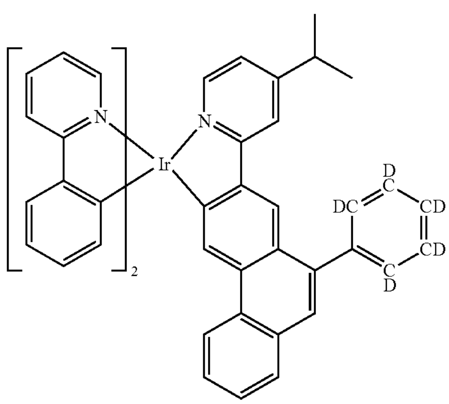
22
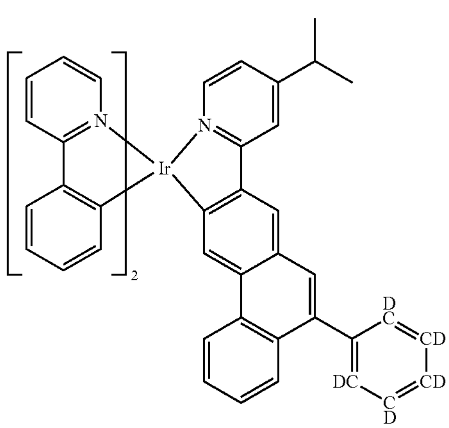
23
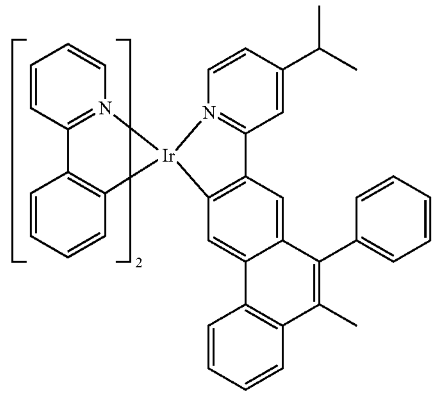
24
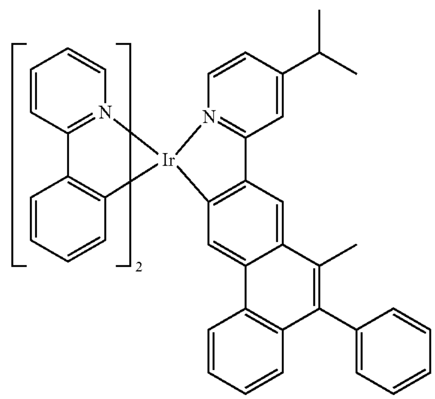
25
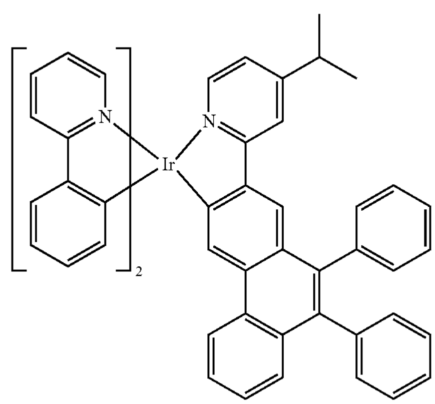
26
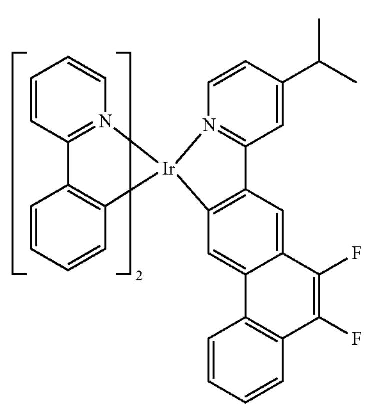

27
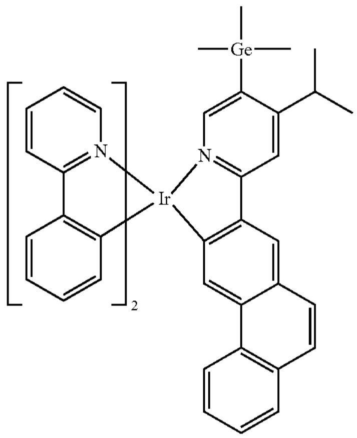
28
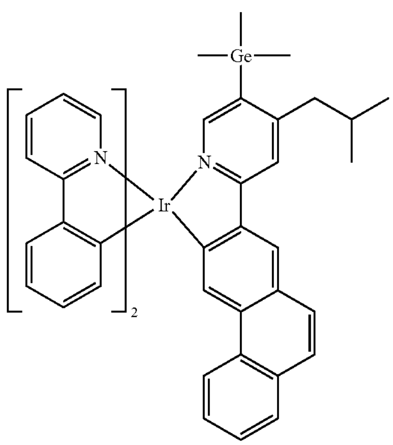
29
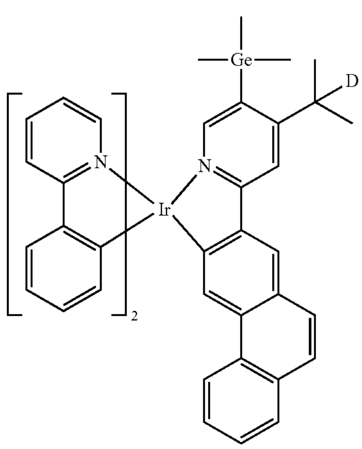
30
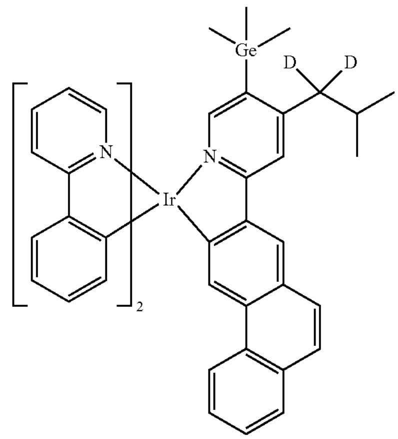
31
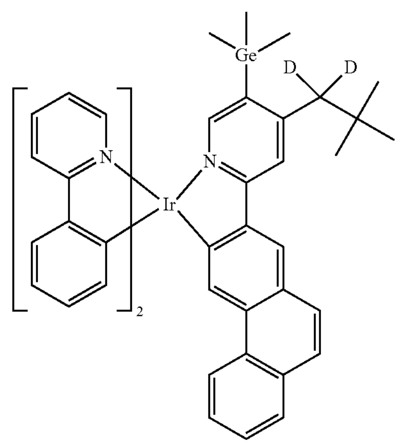
32
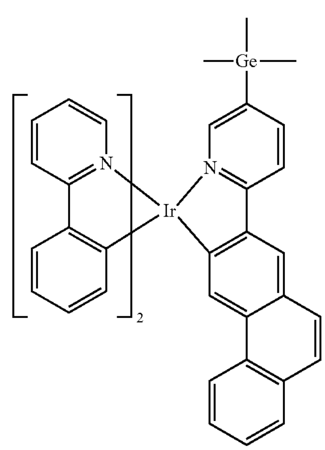

-continued
33
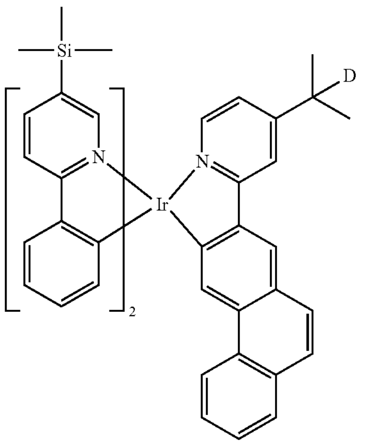
34
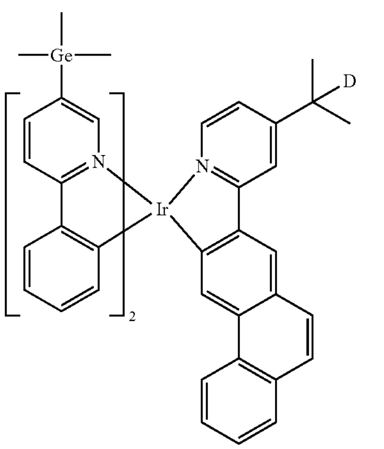
35
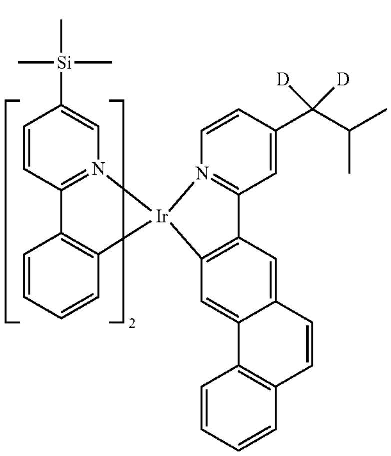
-continued
36
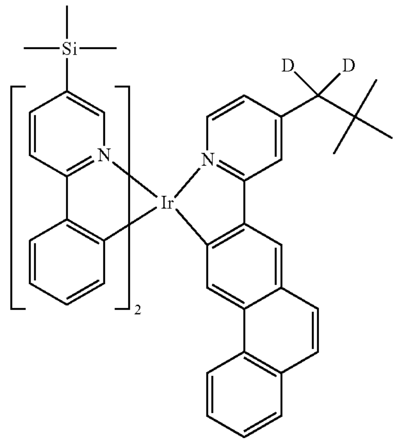
37
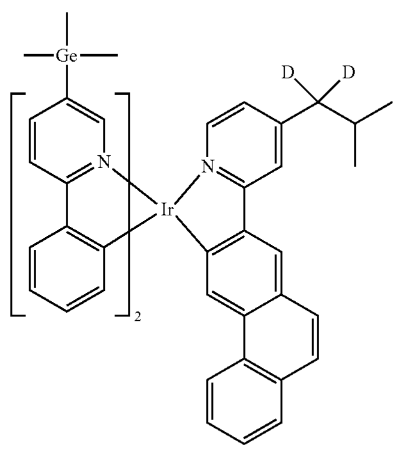
38
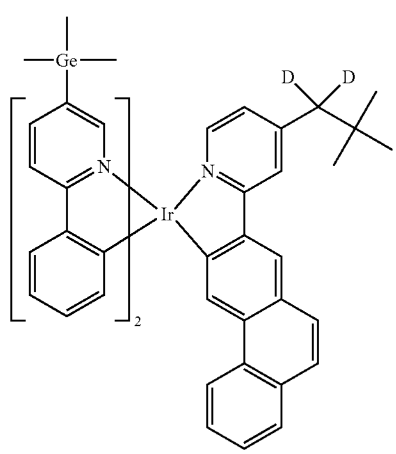

-continued
39
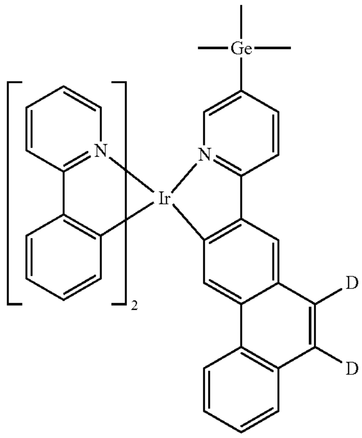
40
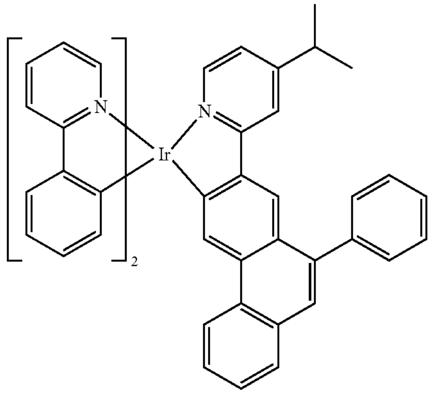
41
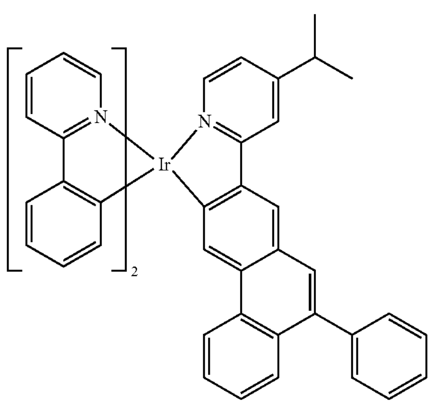
42
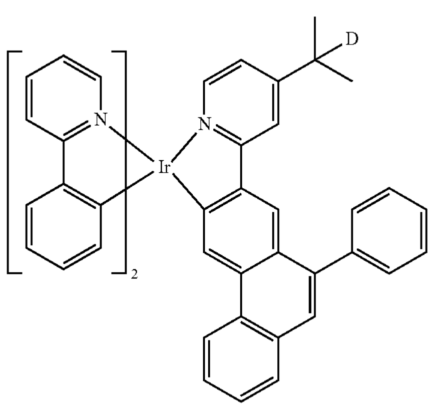
-continued
43
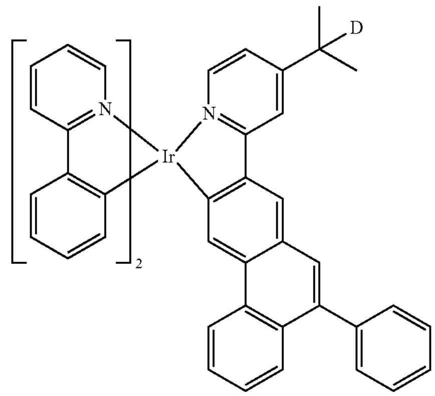
44
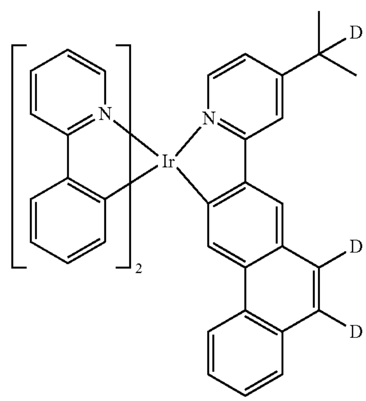
45
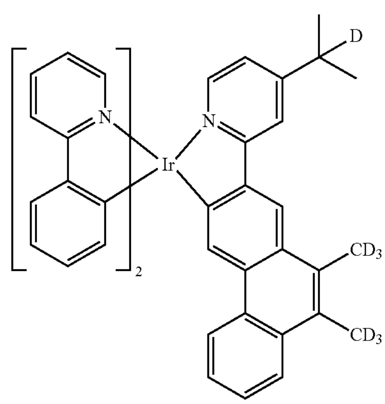
46
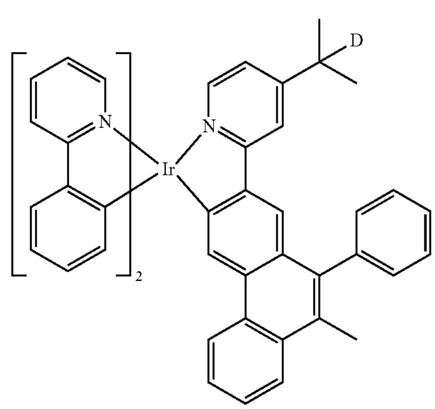

-continued
47
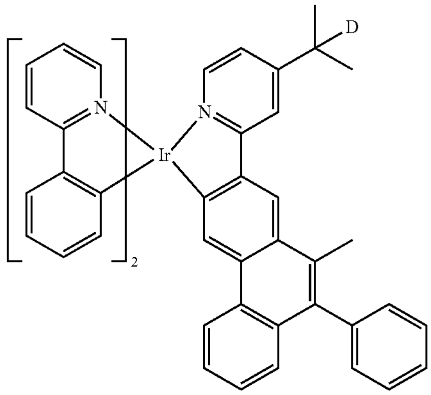
48
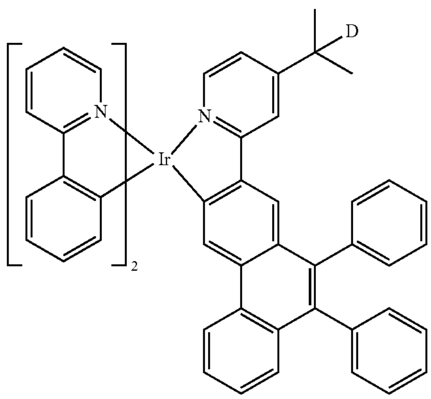
49
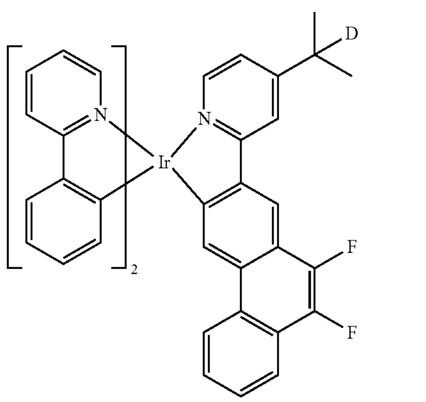
50
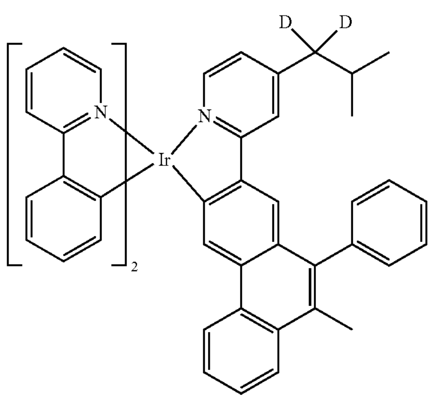
-continued
51
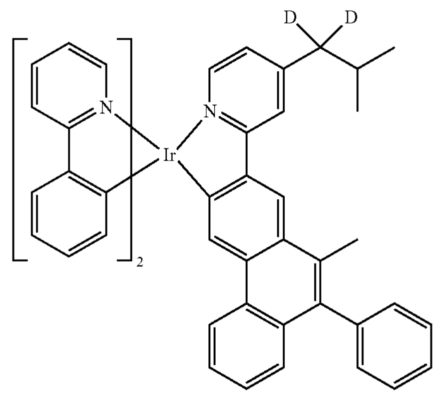
52
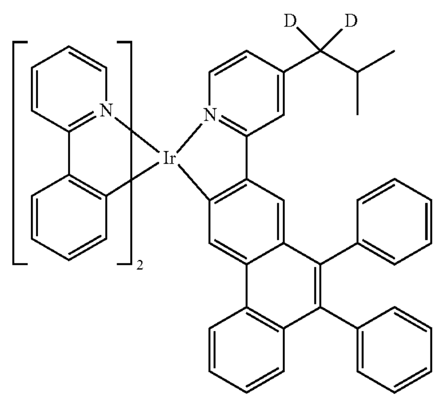
53
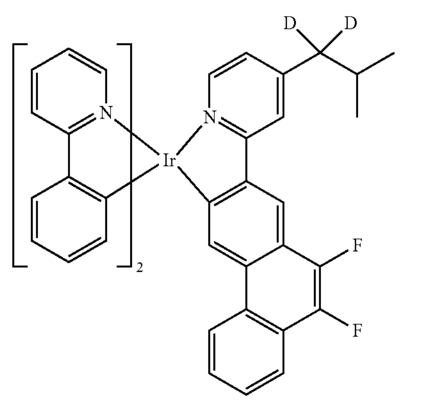
54
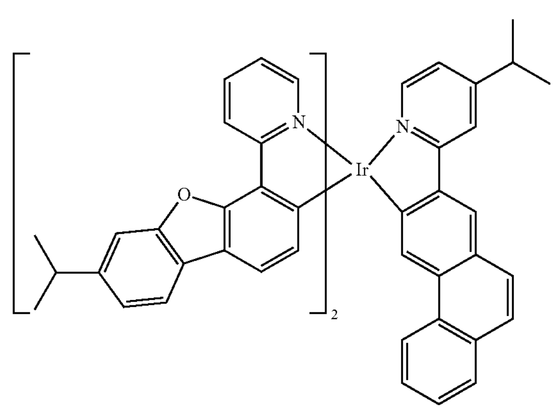

-continued
55
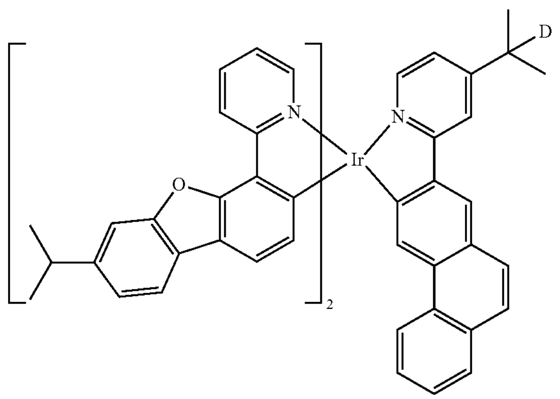
56
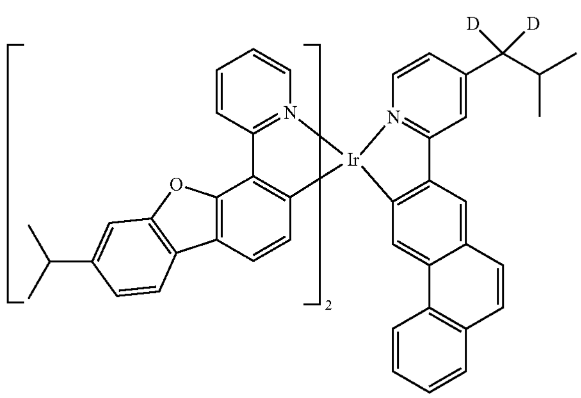
57
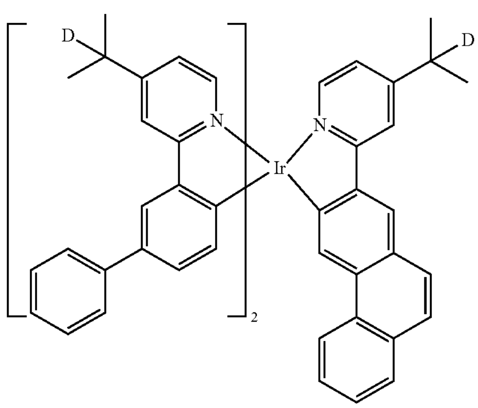
58
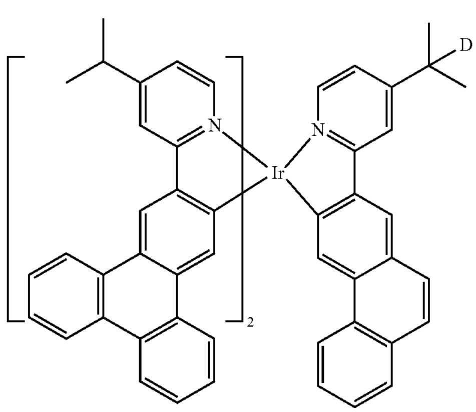
-continued
59
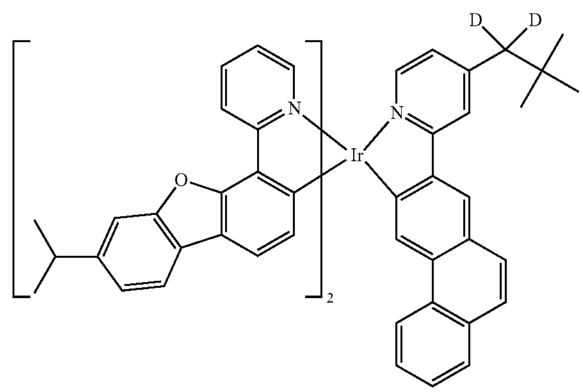
60
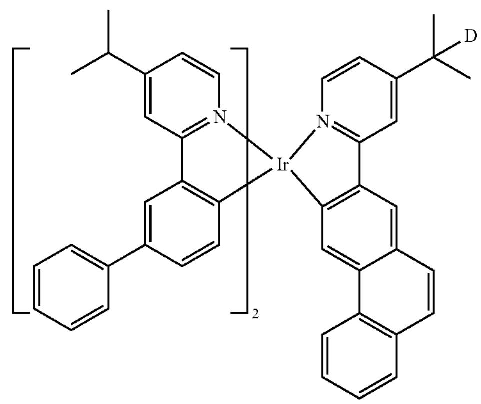
61
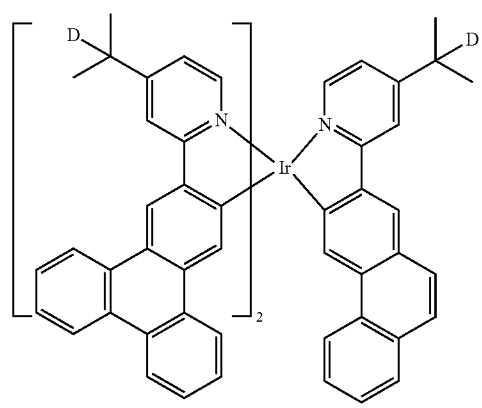
62
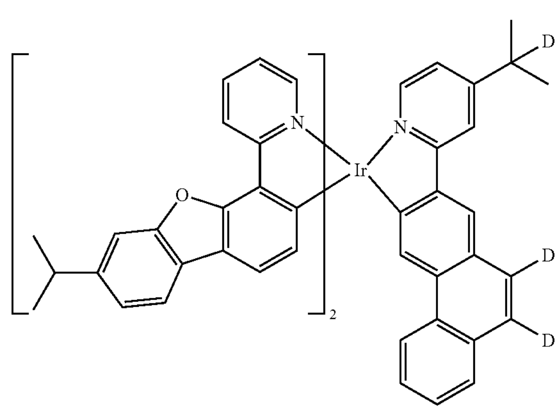

-continued
63
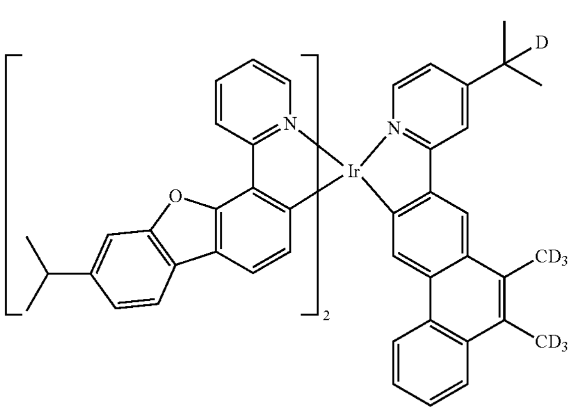
64
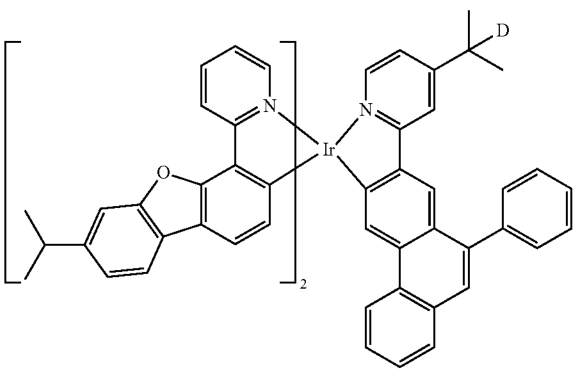
65
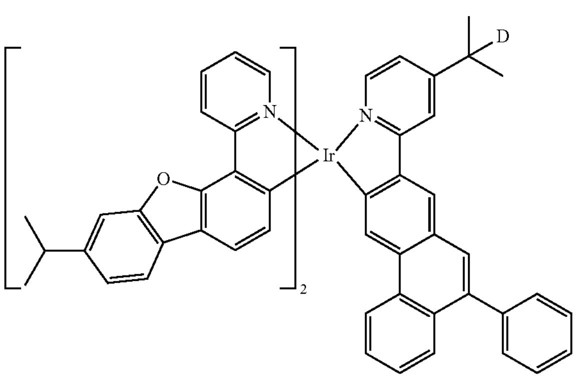
66
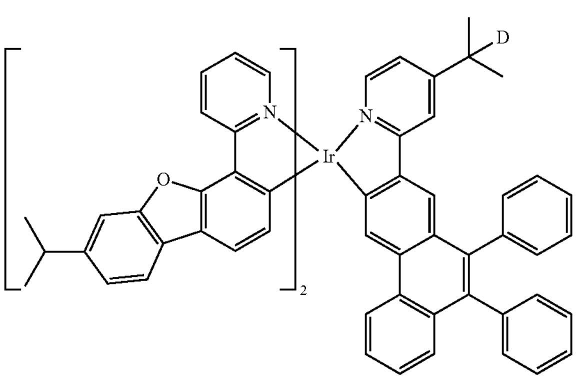
-continued
67
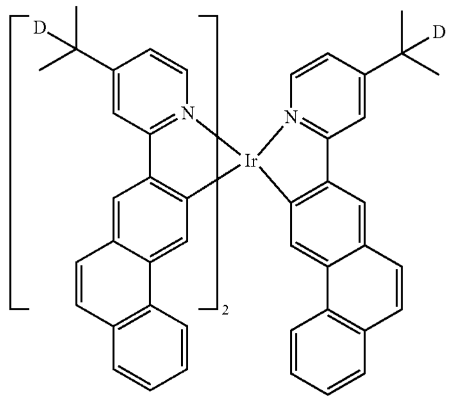
68
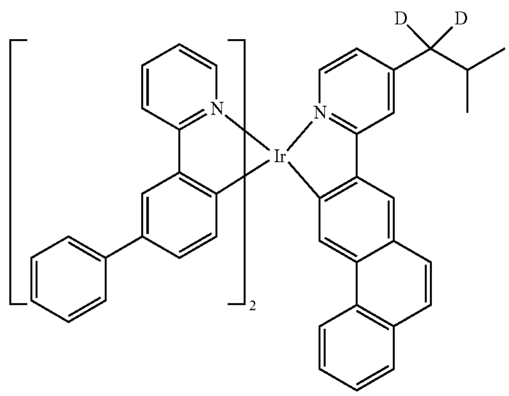
69
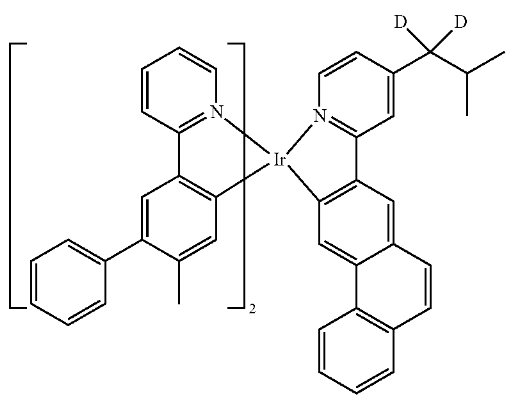
70
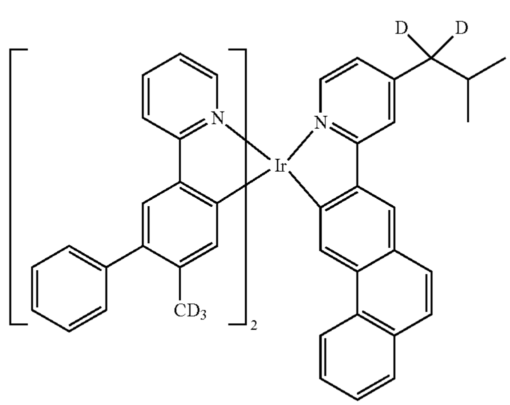

-continued
71
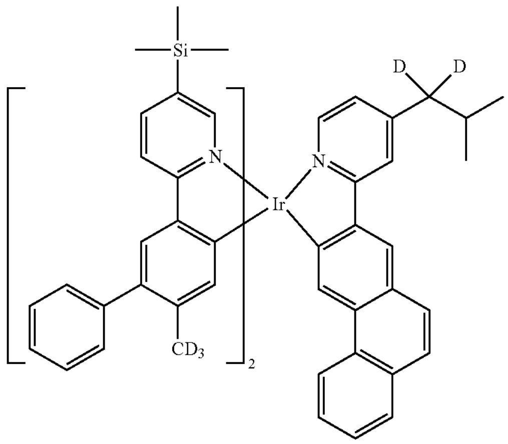
72
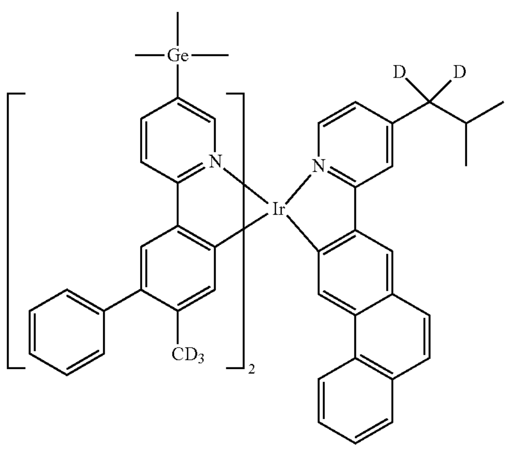
73
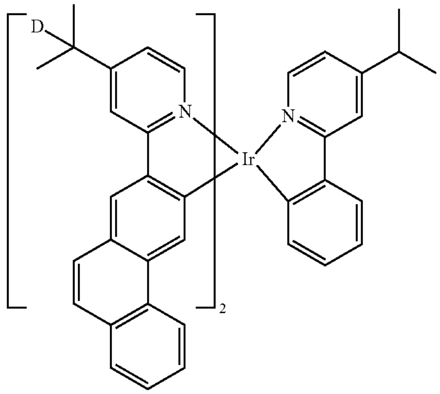
-continued
74
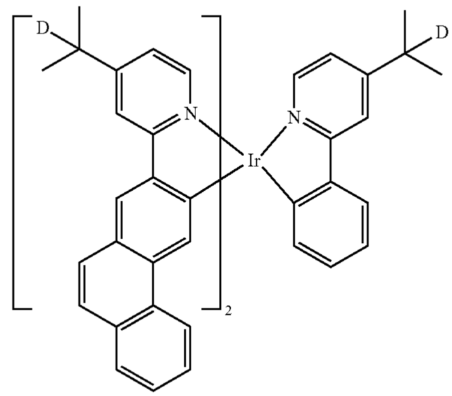
75
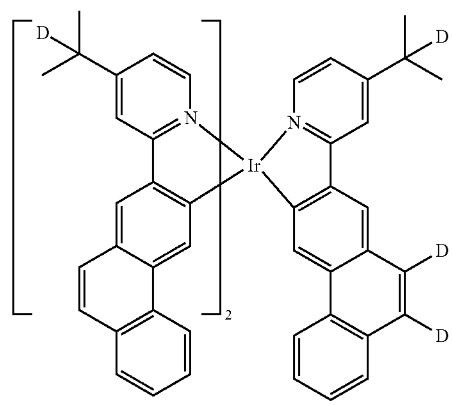
76
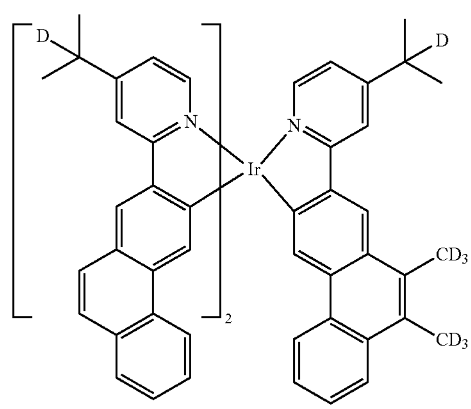
77
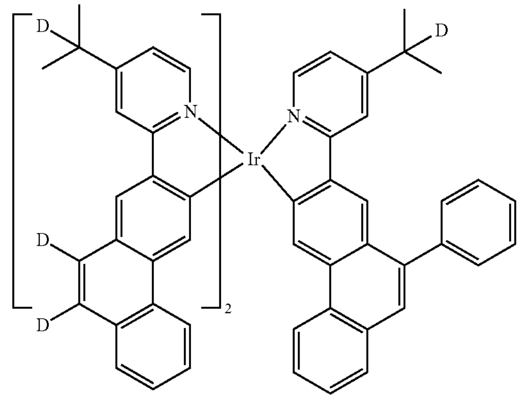

78
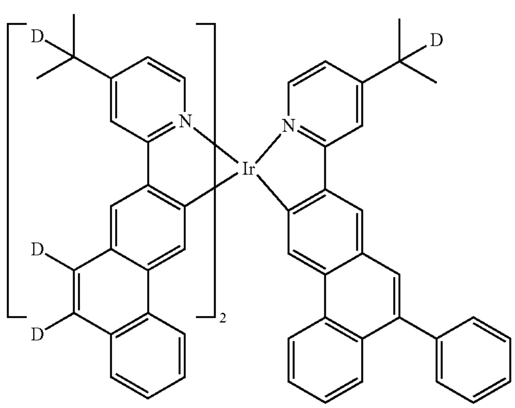
79
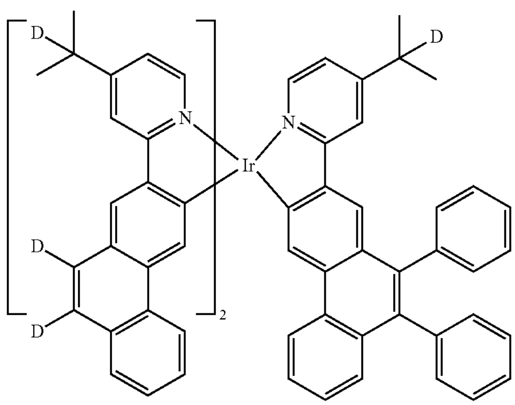
80
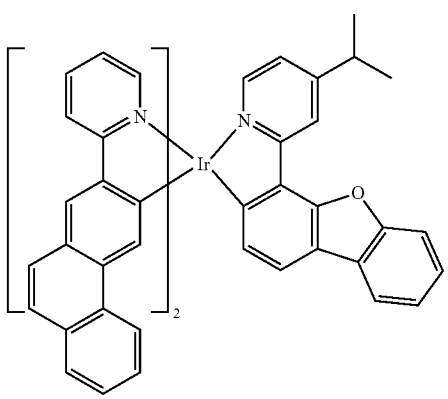
81
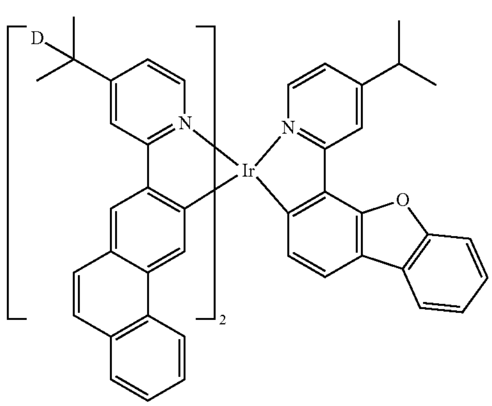
82
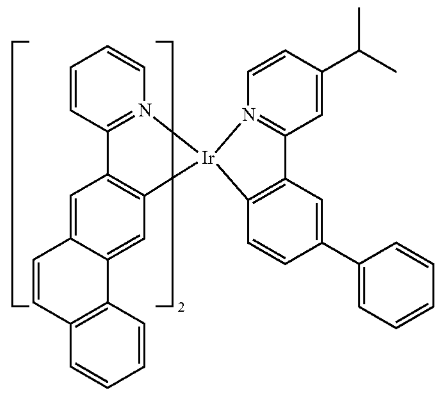
83
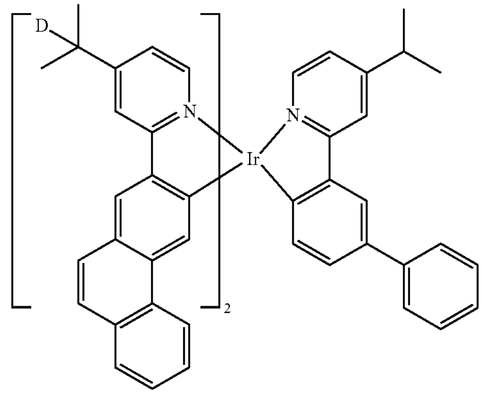
84
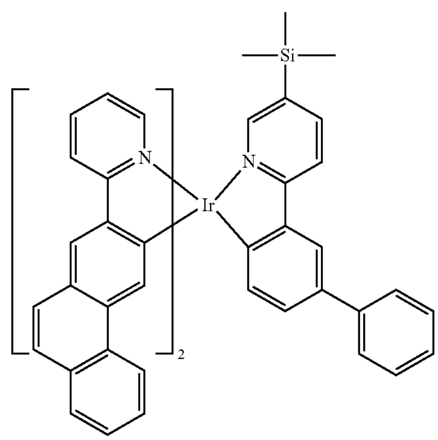
85
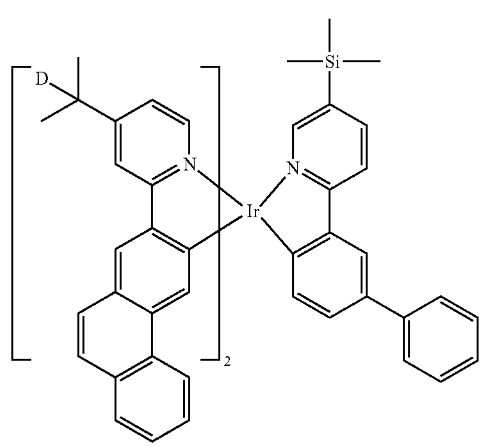

86
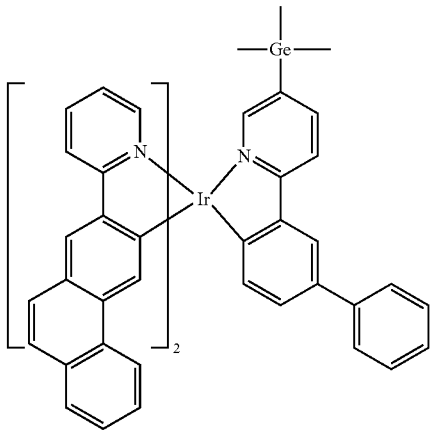
87
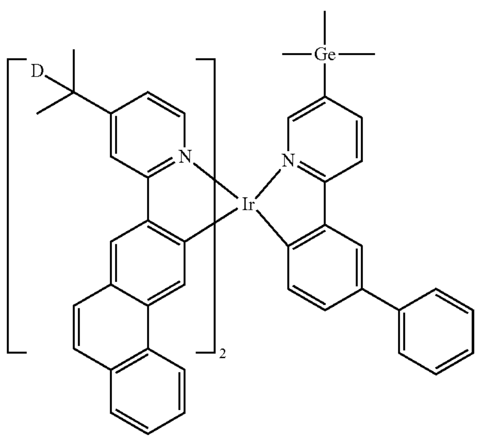
88
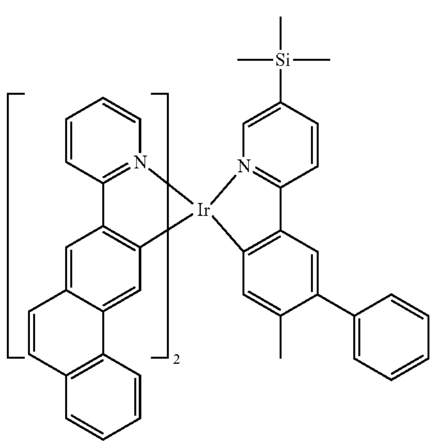
89
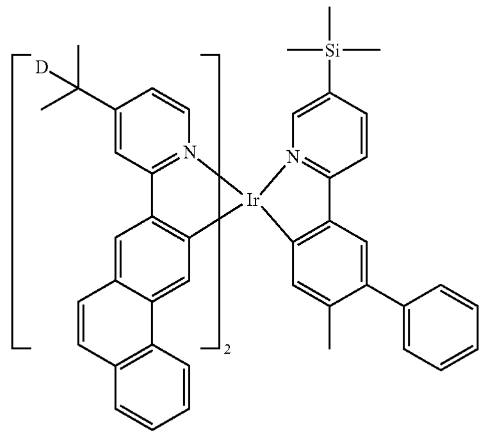
90
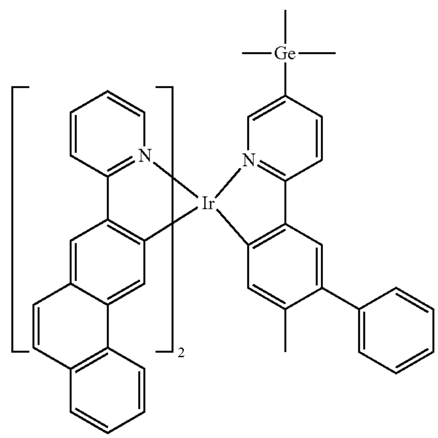
91
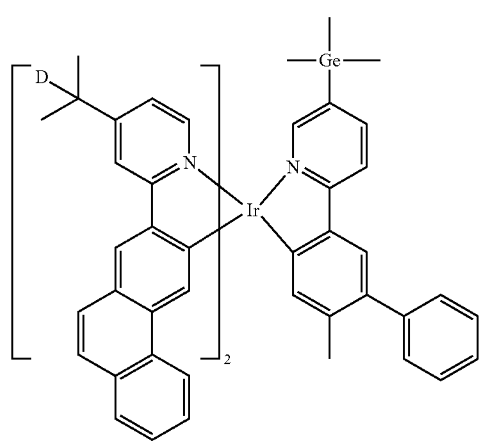

-continued
92
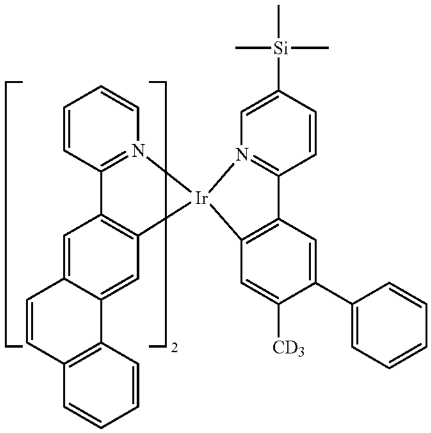
93
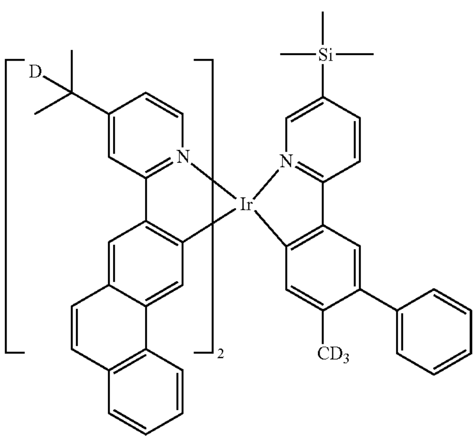
94
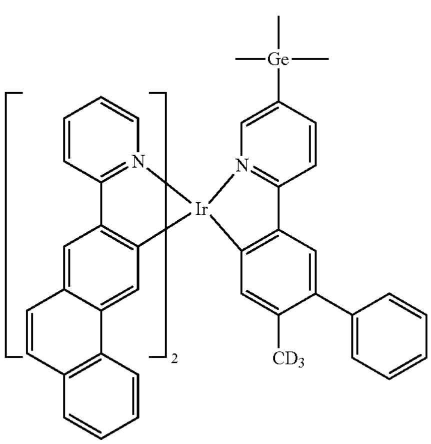
-continued
95
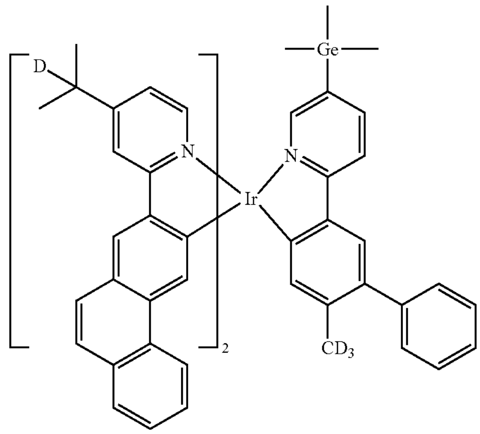
96
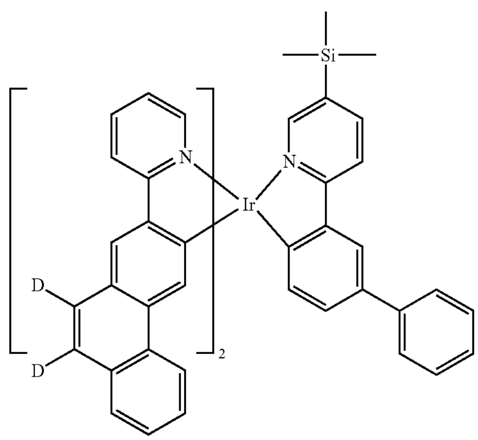
97
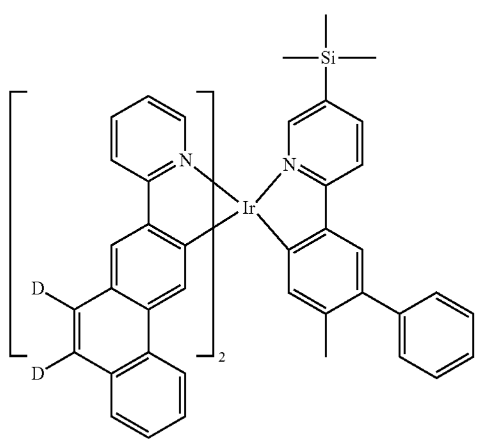

-continued
98
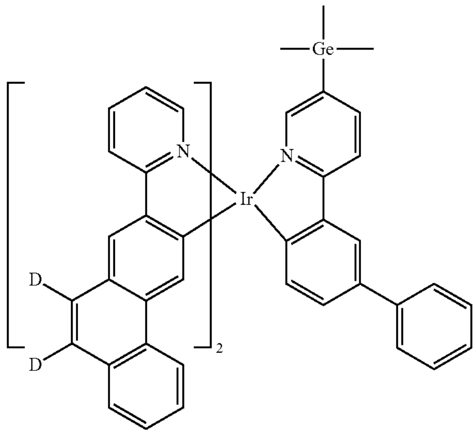
99
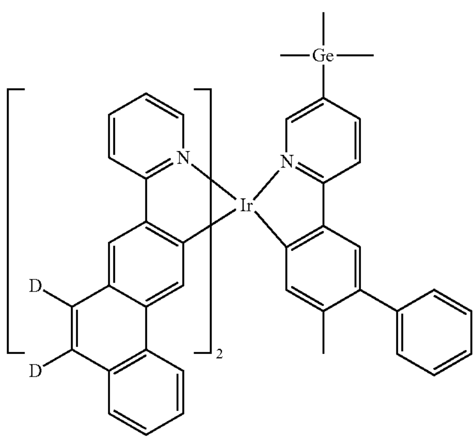
100
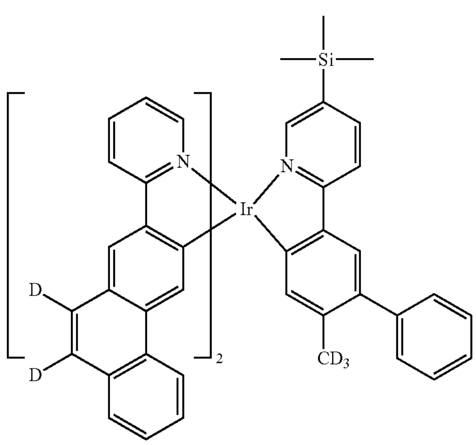
-continued
101
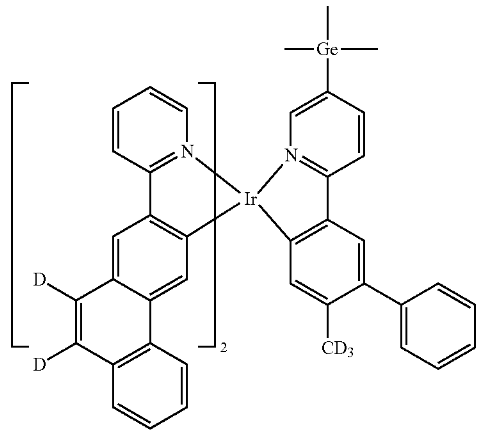
102
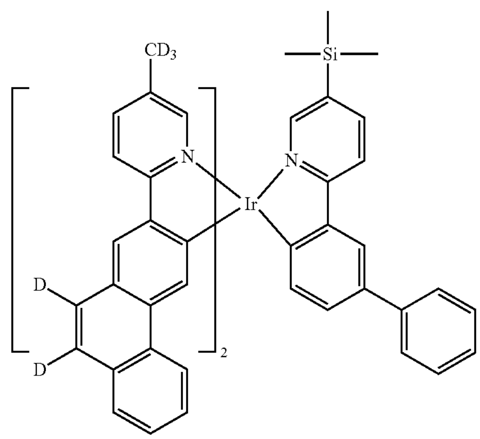
103
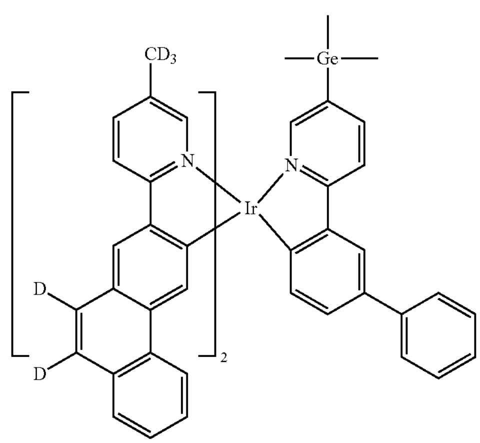

-continued
104
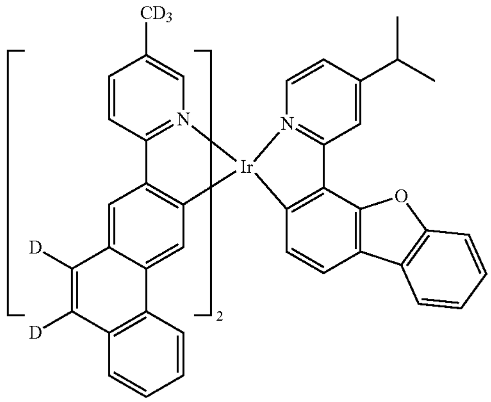
105
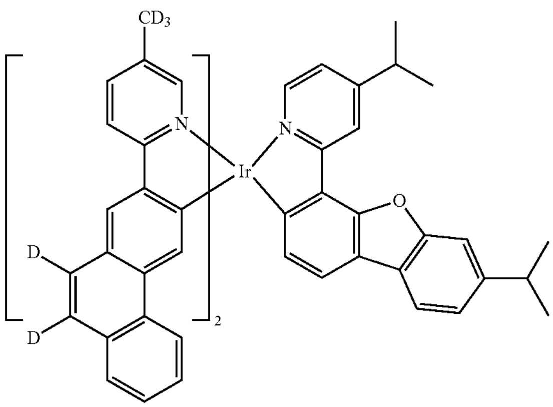
106
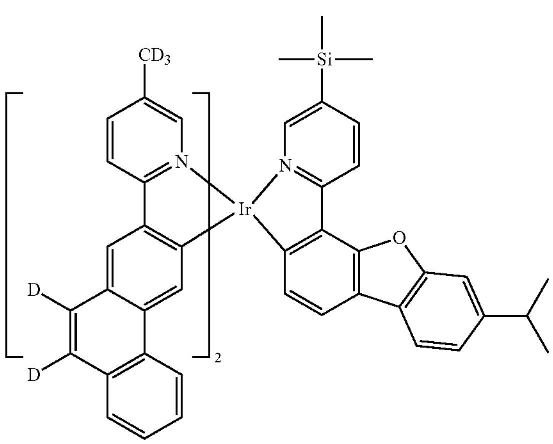
-continued
107
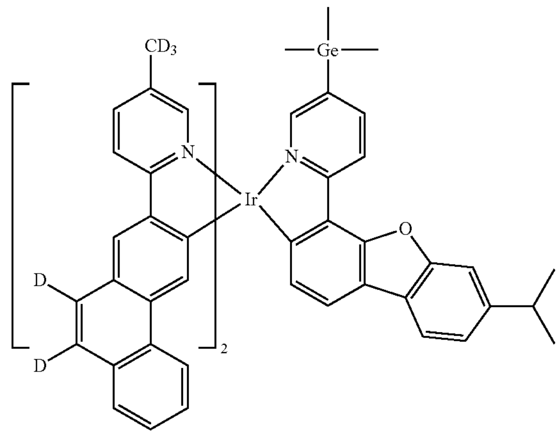
108
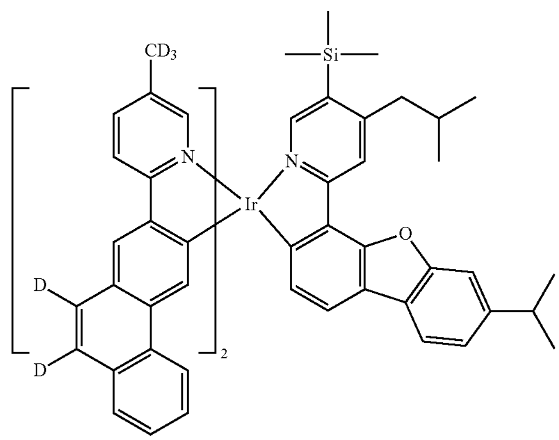
109
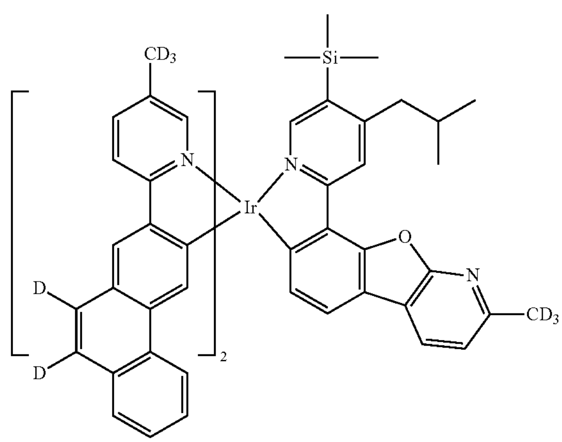

110
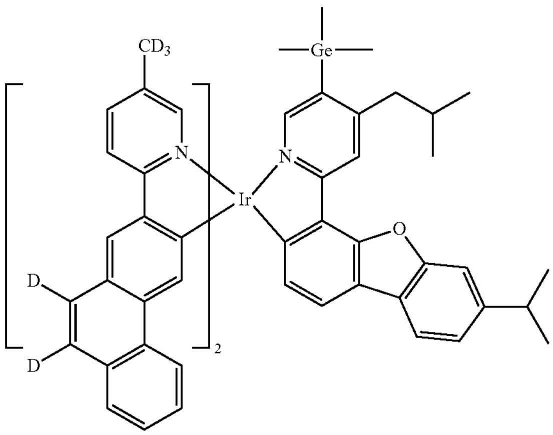
111
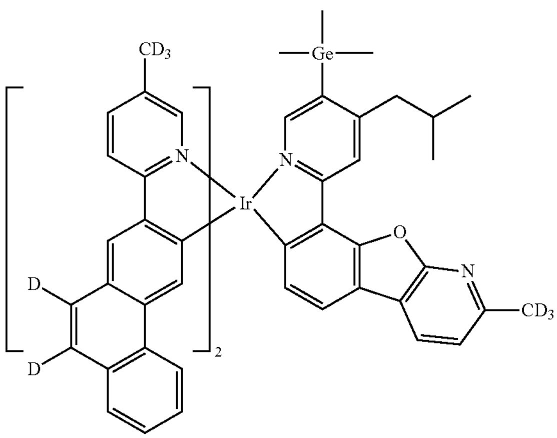
112
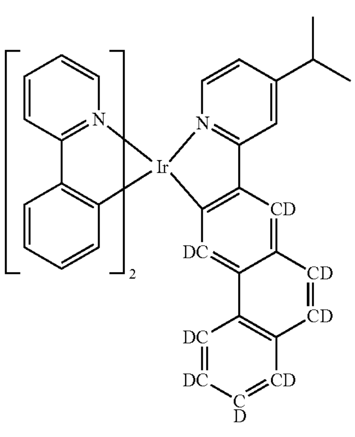
113
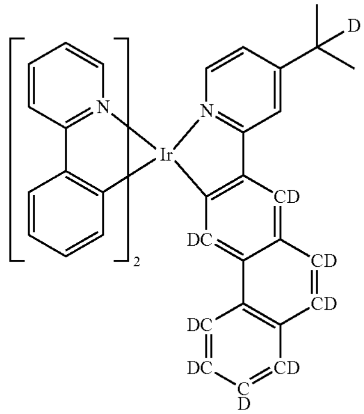
114
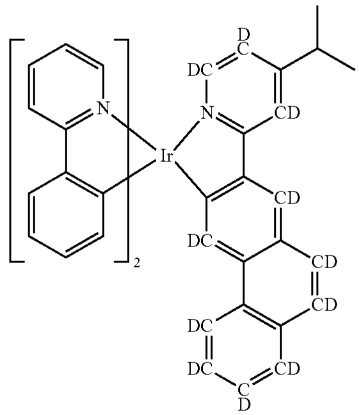
115
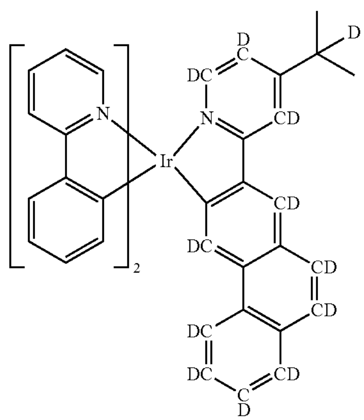
116
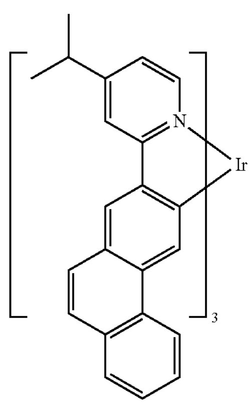

-continued
117
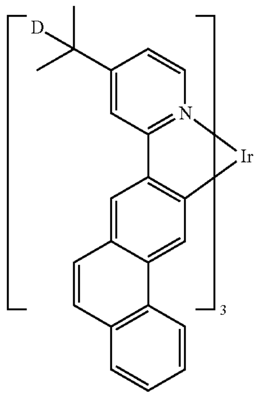
118
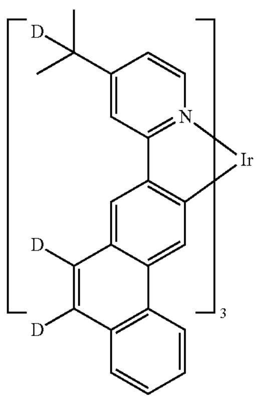
119
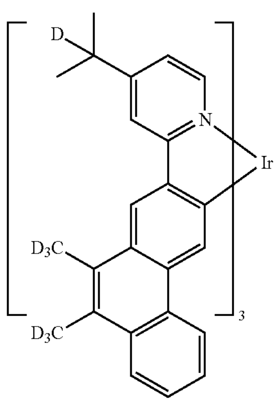
120
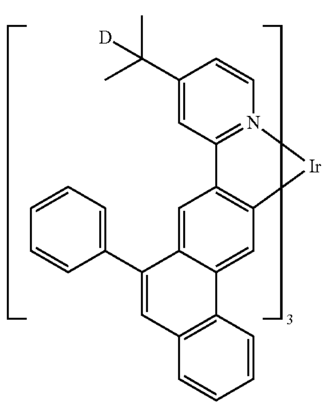
-continued
121
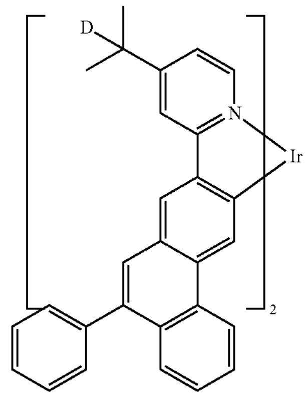
122
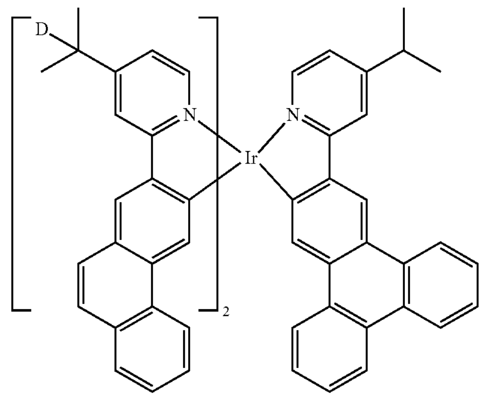
123
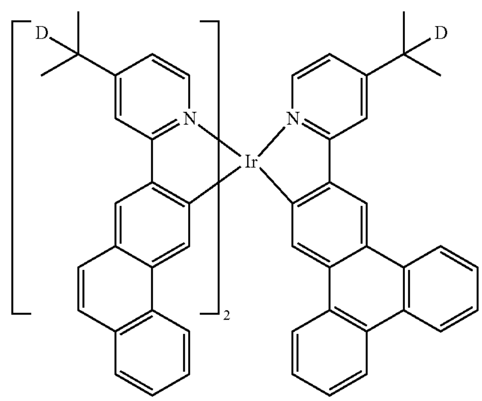
124
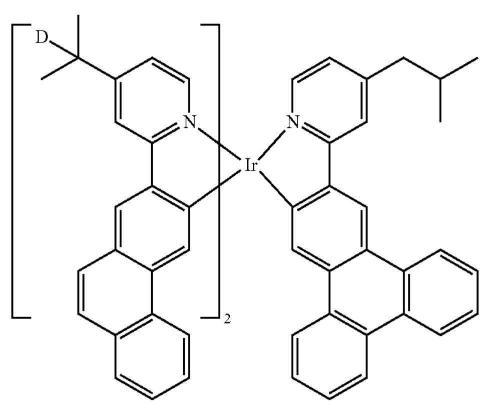

-continued
125
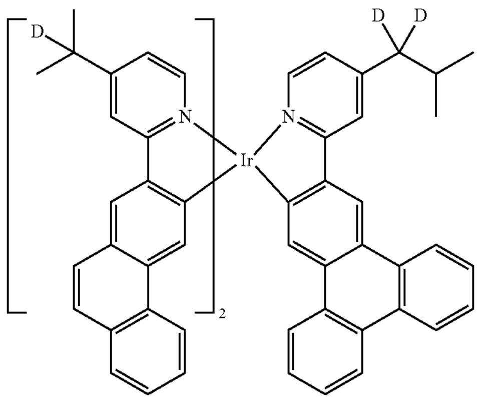
126
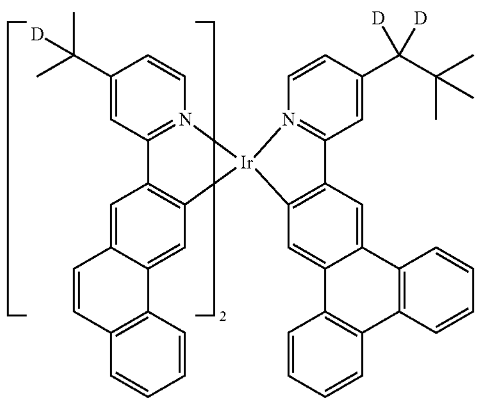
127
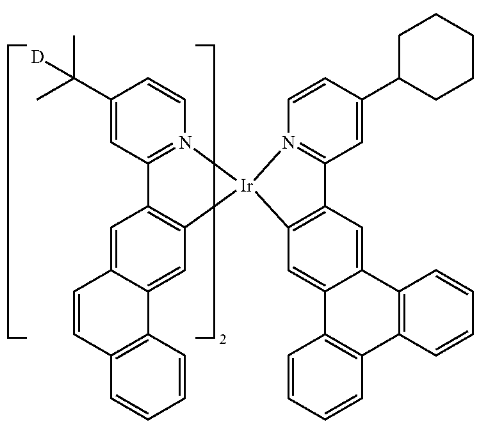
128
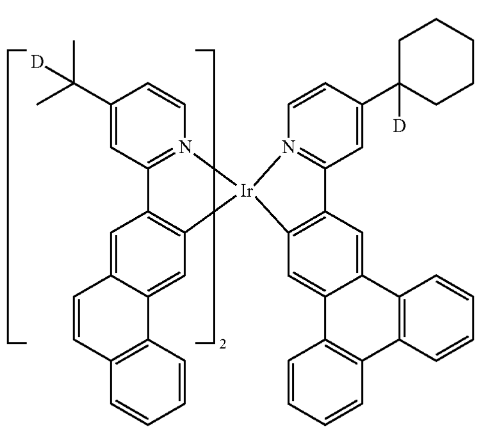
-continued
129
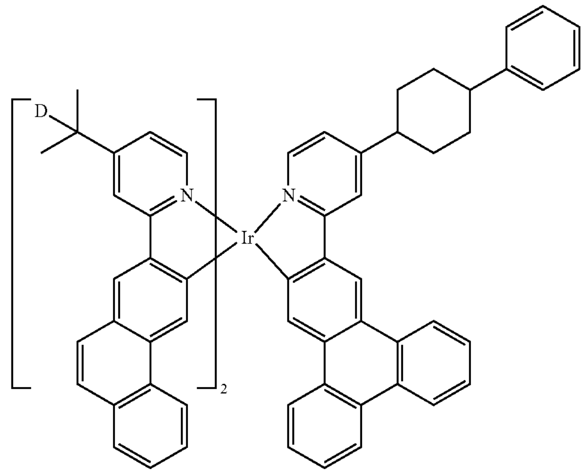
130
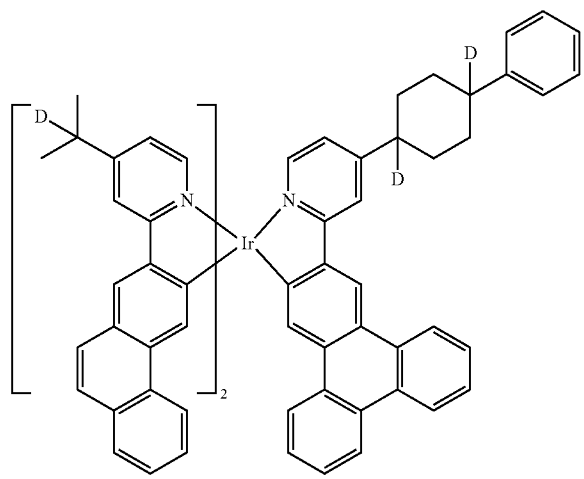
131
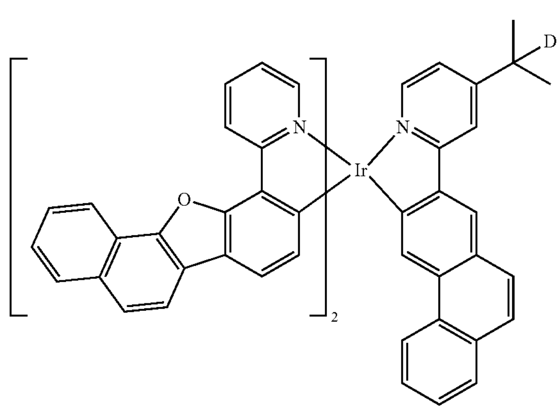

-continued
132
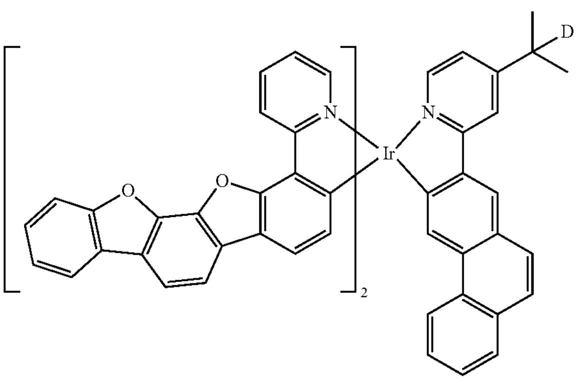
133
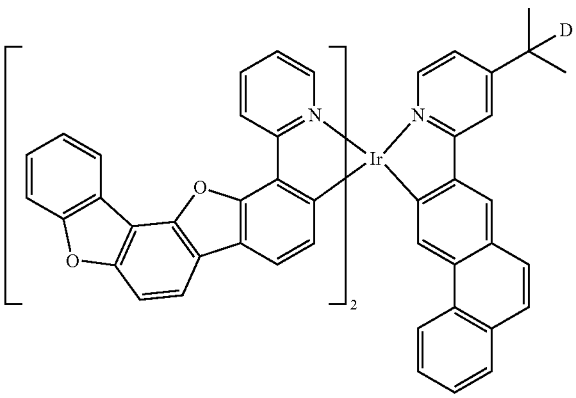
134
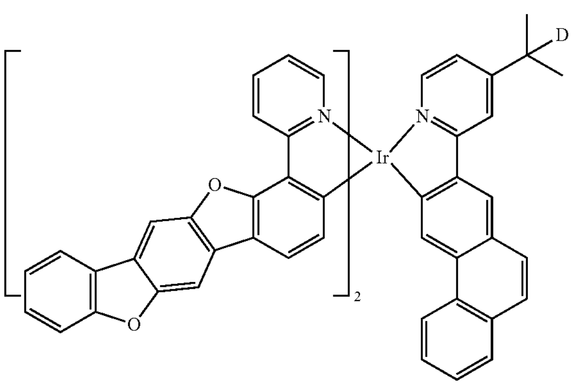
135
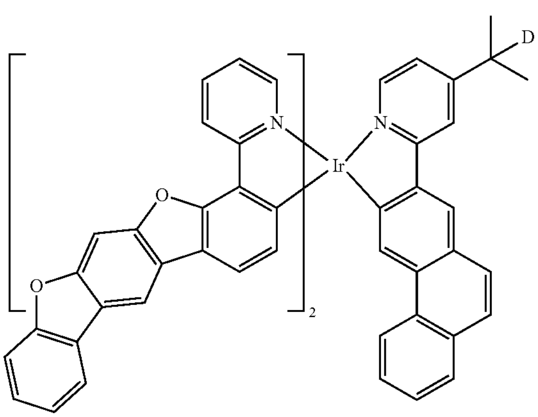
-continued
136
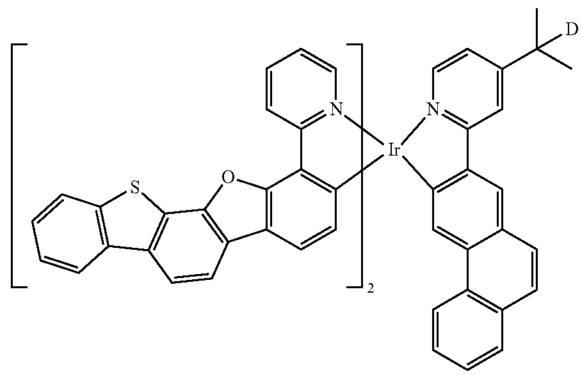
137
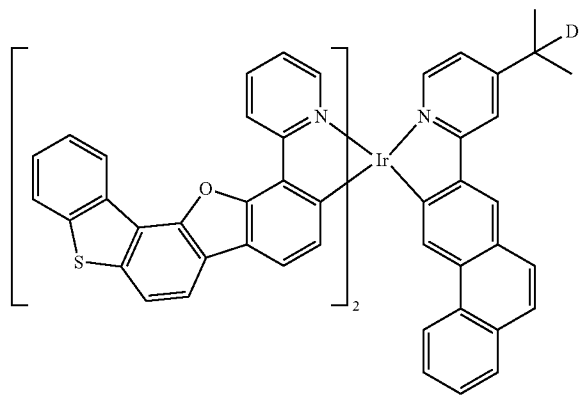
138
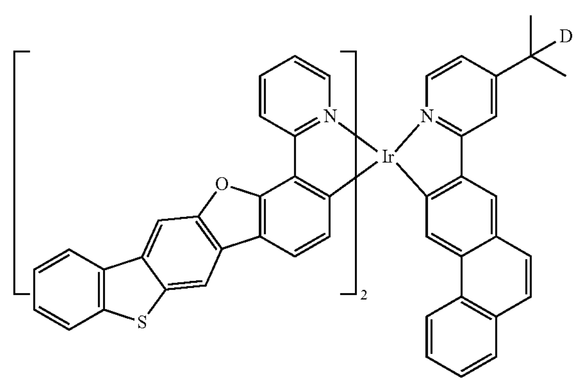
139
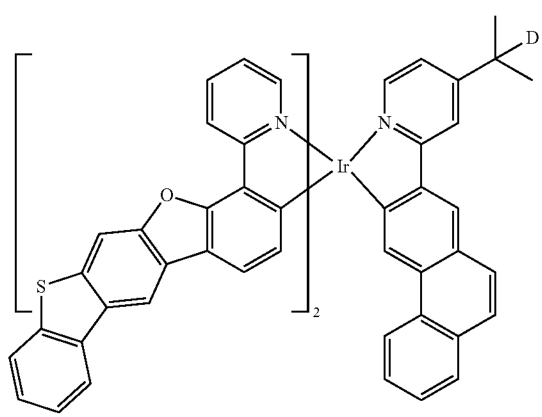

-continued
140
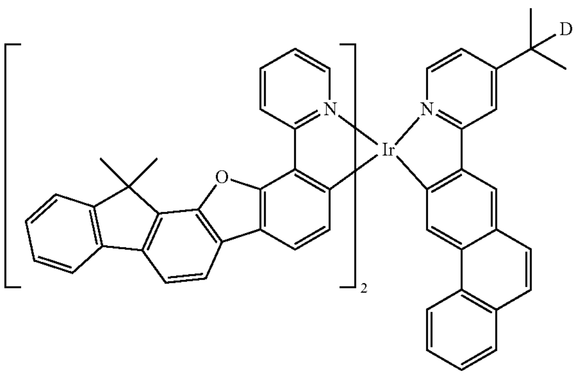
141
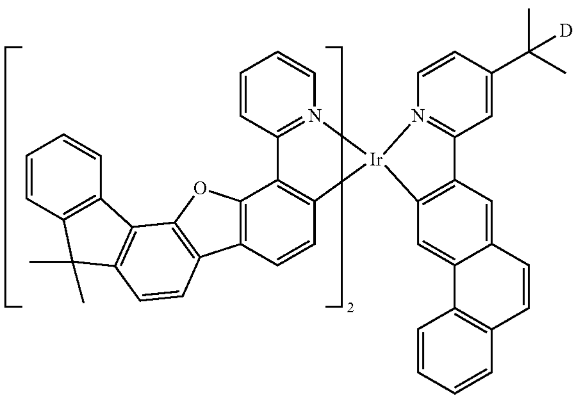
142
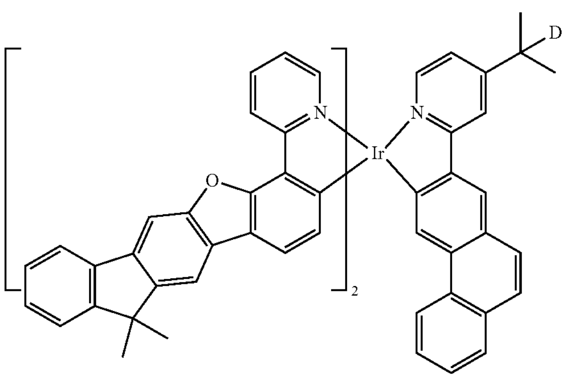
143
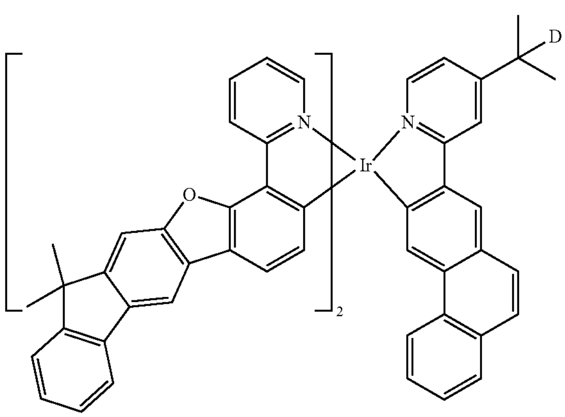
-continued
144
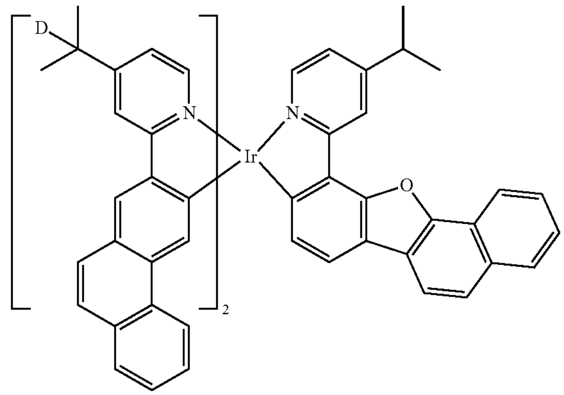
145
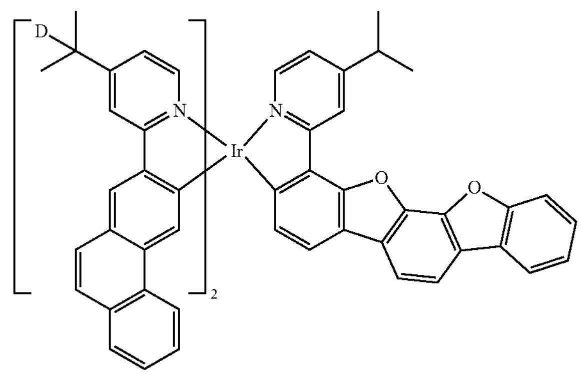
146
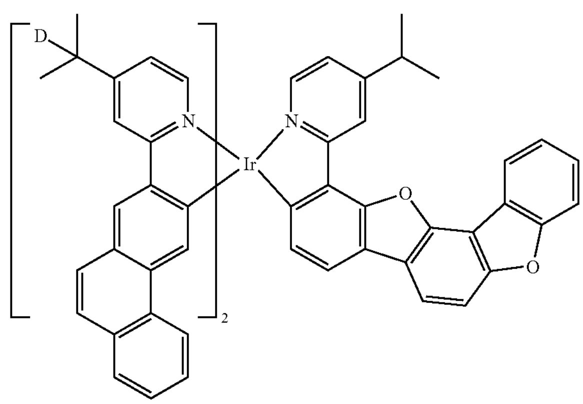
147
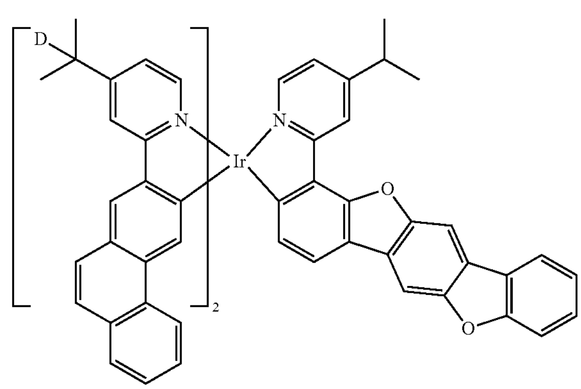

148
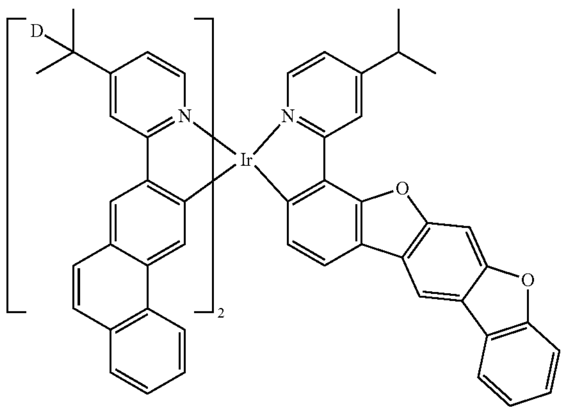
149
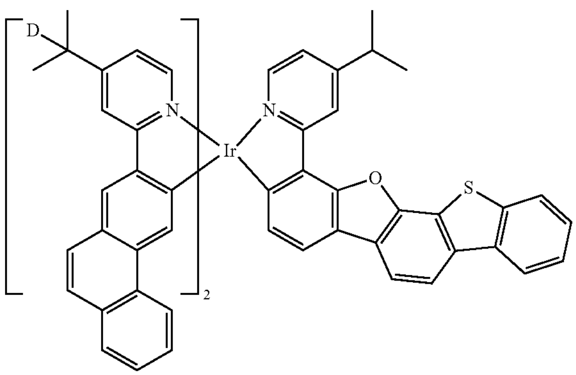
150
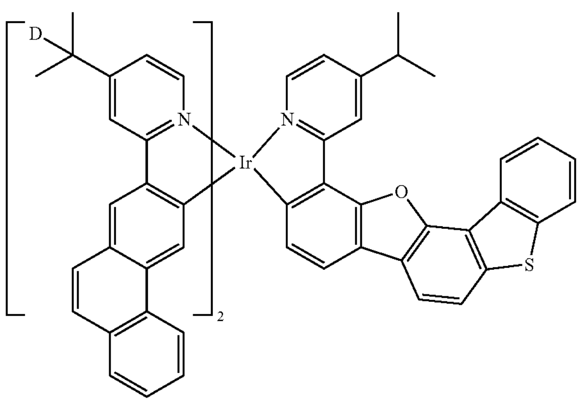
151
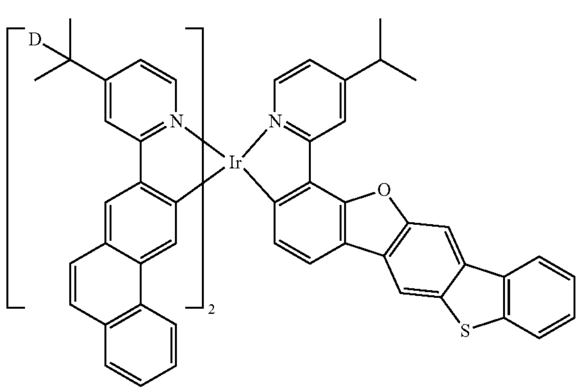
152
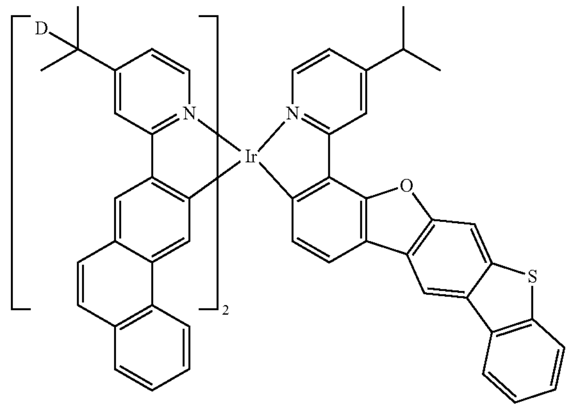
153
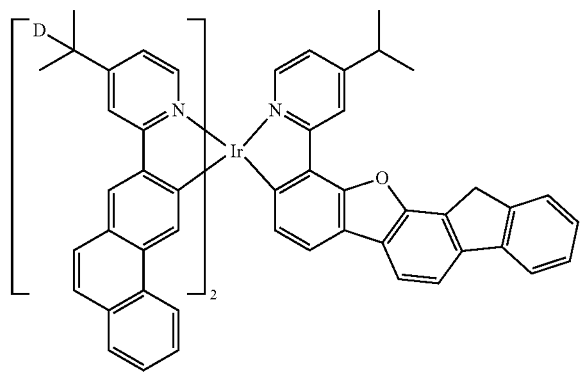
154
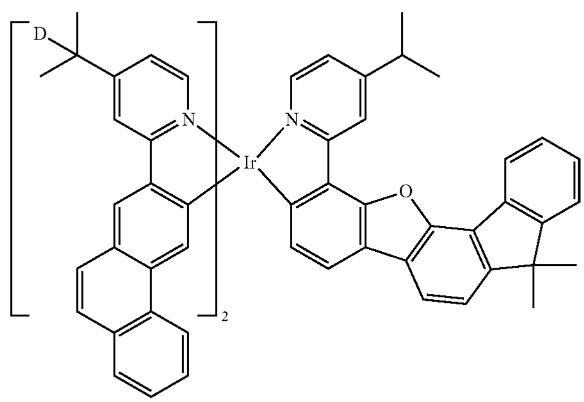
155
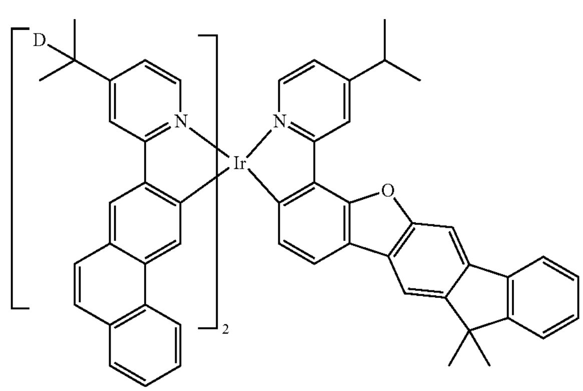

-continued
156
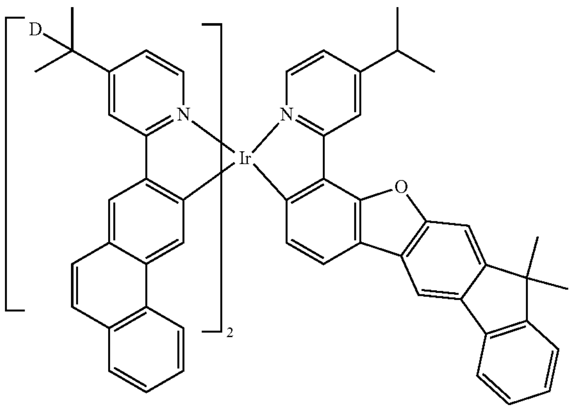
157
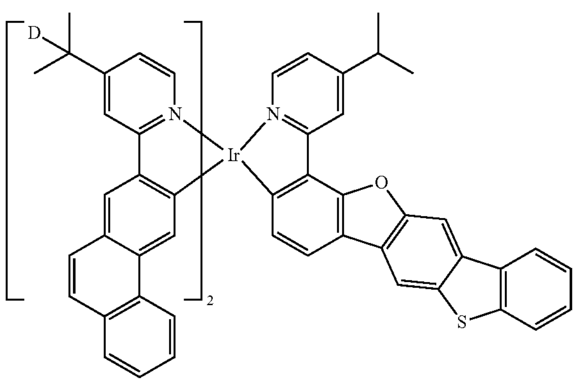
158
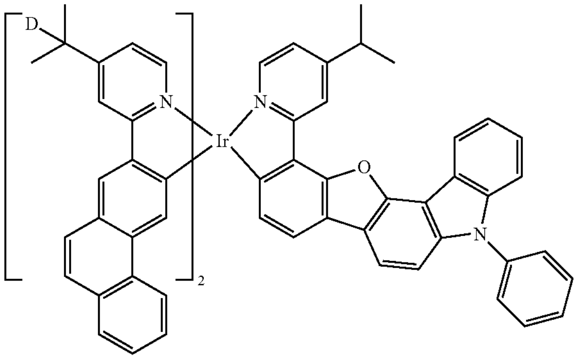
-continued
159
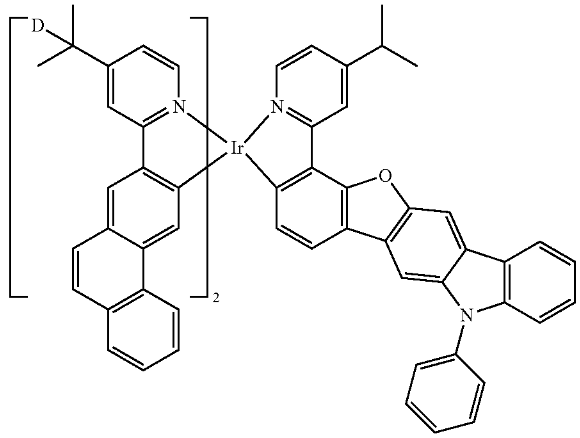
160
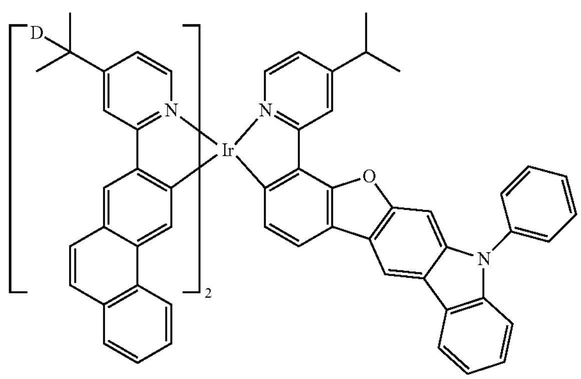
161
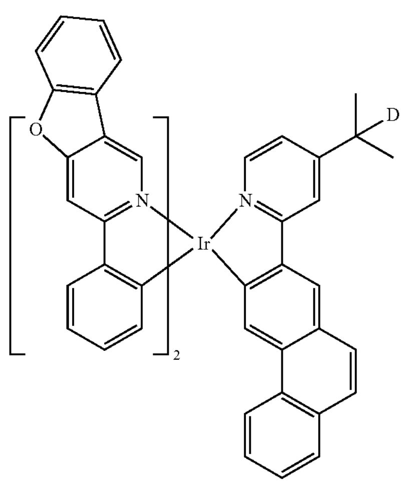

-continued
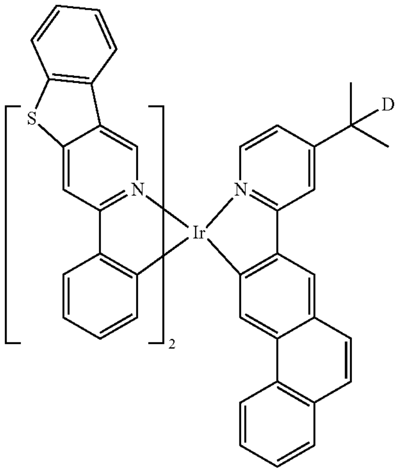
162
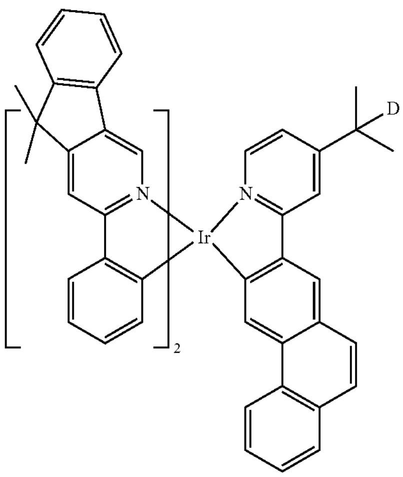
163
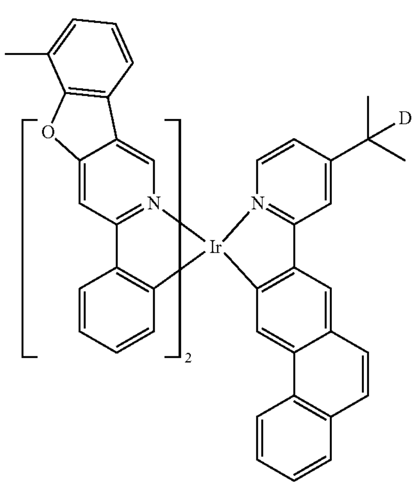
164
-continued
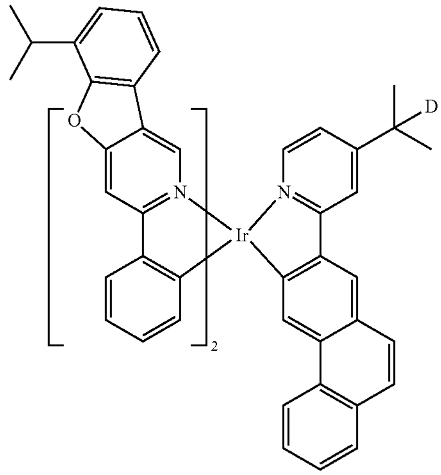
165
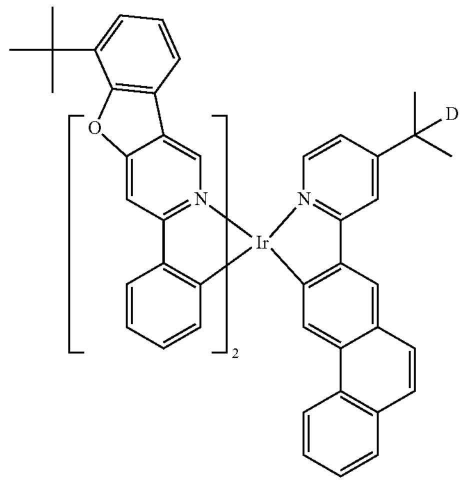
166
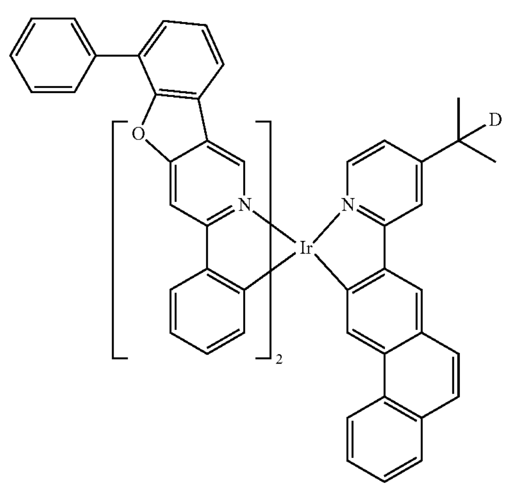
167

-continued
168
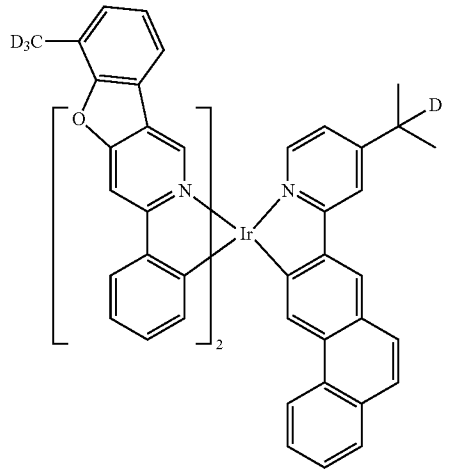
169
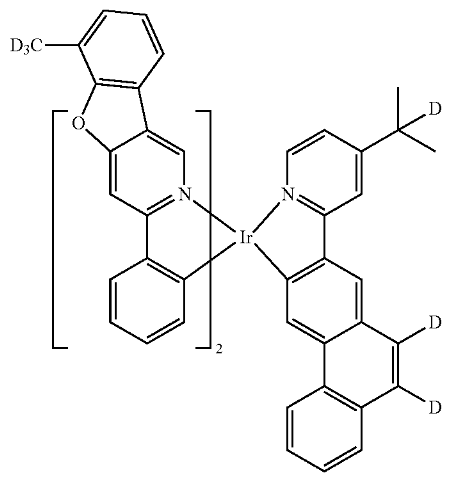
170
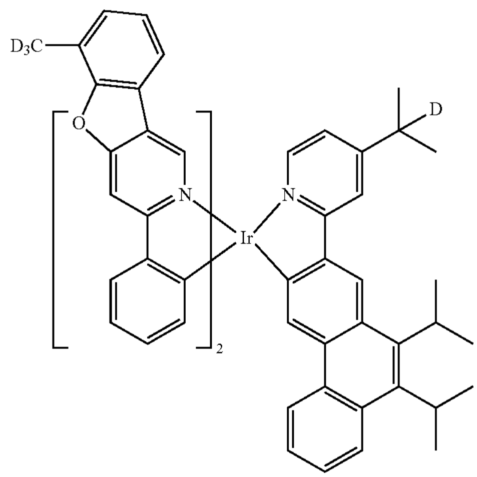
-continued
171
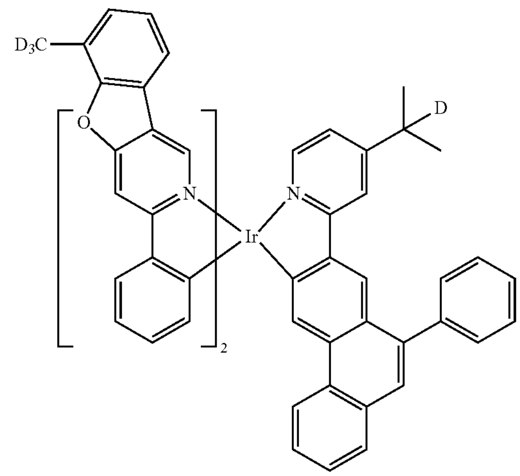
172
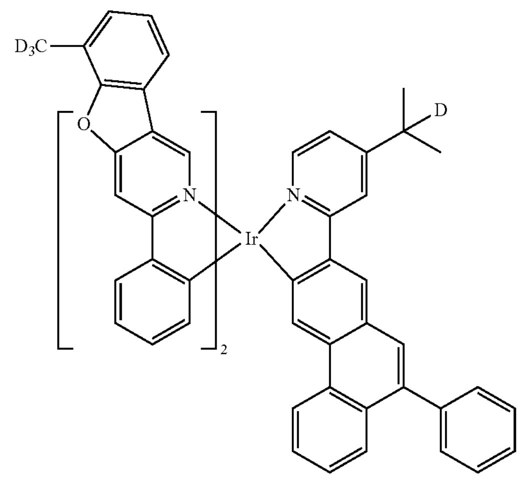
173
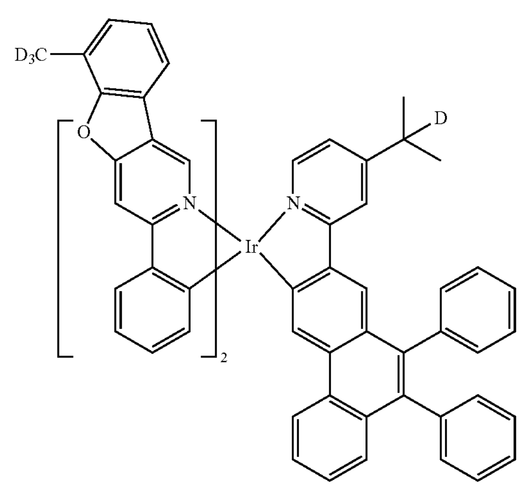

-continued

174

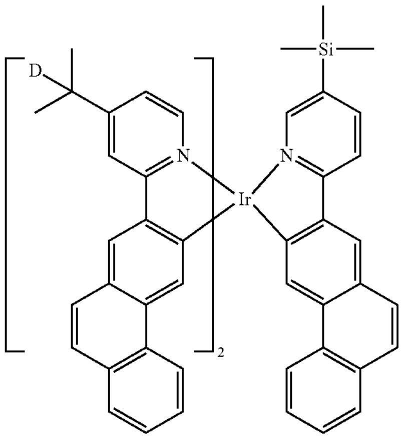

175

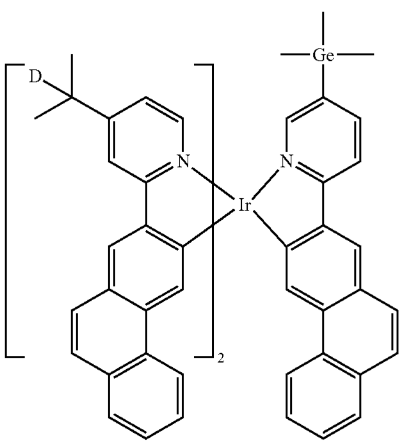

176

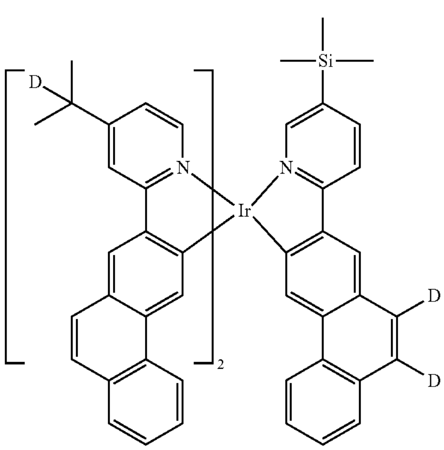

-continued

177

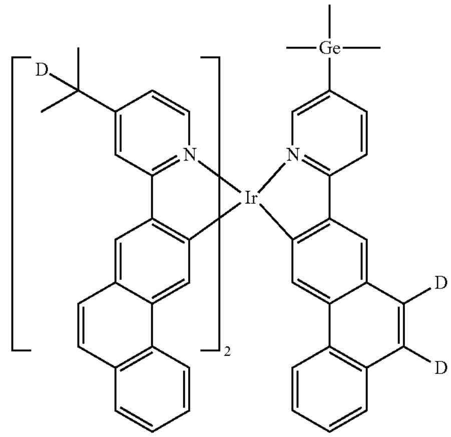

178

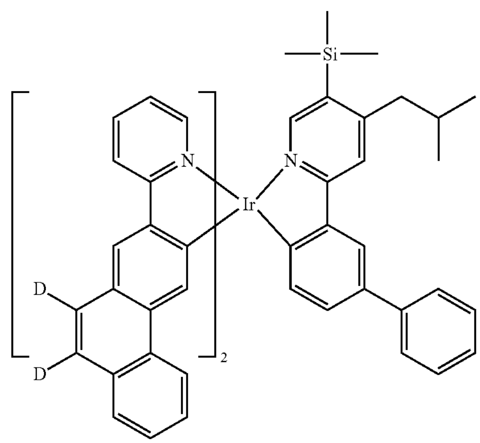

179

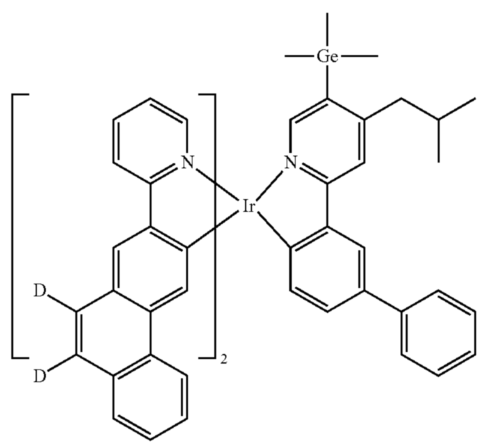

The organometallic compound represented by Formula 1 satisfies the structure of Formula 1 and includes at least one bidentate ligand represented by Formula 1B. In one or more embodiments, among the bidentate ligands represented by Formula 1B, a substituted or unsubstituted methyl group and silyl group are excluded from $R_{30}$, which is a substituent of ring $CY_3$. Due to this structure, the organometallic compound has excellent luminescence characteristics, and has such characteristics suitable for use as a luminescent material with high color purity by controlling the emission wavelength range. In this regard, it is to be understood that the "substituted methyl group" is differentiated from a $C_2$ or higher alkyl group. Accordingly, in Table 1 below, Formulae 1 to 3 are not considered to include a "substituted methyl group." Similarly, in Table 1 below, Formula B exemplifies the substituted methyl group as used in Table 1.

In one or more embodiments, the organometallic compound represented by Formula 1 may have excellent electrical mobility, and thus, electronic devices including the organometallic compound, for example, organic light-emitting devices including the organometallic compound may show low driving voltage, high efficiency, long lifespan, and reduced roll-off phenomenon.

In one or more embodiments, the photochemical stability of the organometallic compound represented by Formula 1 may be improved, and thus, electronic devices including the organometallic compound, for example, organic light-emitting devices including the organometallic compound, may show high emission efficiency, long lifespan, and high color purity.

The highest occupied molecular orbital (HOMO) energy level, lowest unoccupied molecular orbital (LUMO) energy level, energy gap (electron volts, eV), lowest excited triplet ($T_1$) energy level, and lowest excited singlet ($S_1$) energy level of selected organometallic compounds represented by Formula 1 were calculated using a density functional theory (DFT) method of the Gaussian 09 program with the molecular structure at the B3LYP level, and results thereof are shown in Table 1.

TABLE 1

| Compound No. | HOMO (eV) | LUMO (eV) | Energy gap (eV) | $S_1$ (eV) | $T_1$ (eV) |
|---|---|---|---|---|---|
| Compound 1 | −4.734 | −1.329 | 3.405 | 2.765 | 2.475 |
| Compound 2 | −4.820 | −1.362 | 3.458 | 2.796 | 2.519 |
| Compound 3 | −4.978 | −1.445 | 3.533 | 2.839 | 2.556 |
| Compound A | −4.727 | −1.369 | 3.358 | 2.729 | 2.450 |
| Compound B | −4.744 | −1.311 | 3.433 | 2.786 | 2.493 |
| Compound C | −4.760 | −1.523 | 3.237 | 2.583 | 2.386 |

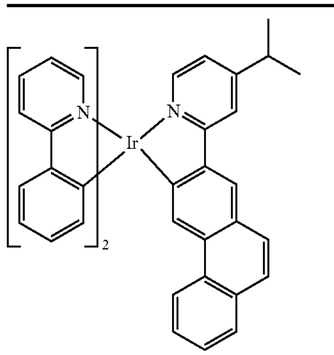

1

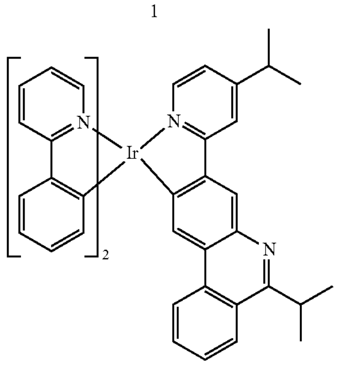

2

TABLE 1-continued

| Compound No. | HOMO (eV) | LUMO (eV) | Energy gap (eV) | $S_1$ (eV) | $T_1$ (eV) |
|---|---|---|---|---|---|

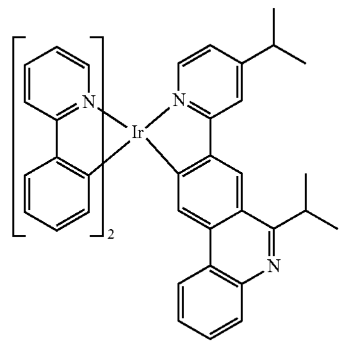

3

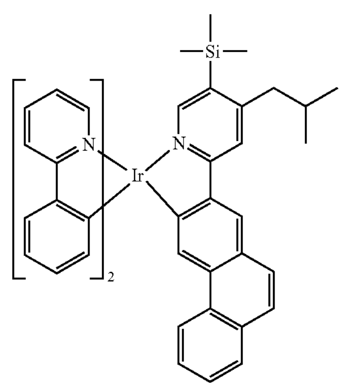

A

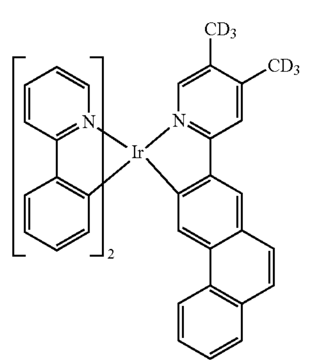

B

TABLE 1-continued

| Compound No. | HOMO (eV) | LUMO (eV) | Energy gap (eV) | $S_1$ (eV) | $T_1$ (eV) |
|---|---|---|---|---|---|

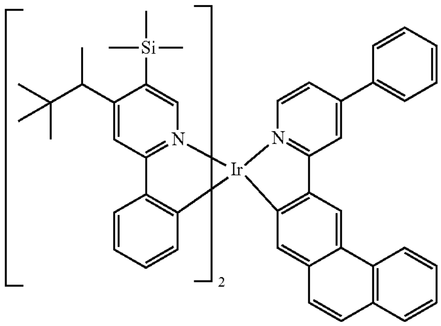

C

Referring to Table 1, it was confirmed that the organometallic compound represented by Formula 1 has electric characteristics that are desirable for a dopant in an electronic device, for example, an organic light-emitting device.

In one or more embodiments, the full width at half maximum (FWHM) of the emission peak of the emission spectrum or the electroluminescence spectrum of the organometallic compound may be 70 nanometers (nm) or less. For example, the FWHM of the emission peak of the emission spectrum or the electroluminescence spectrum of the organometallic compound may be from about 30 nm to about 65 nm, from about 40 nm to about 63 nm, or from about 45 nm to about 62 nm.

In one or more embodiments, the maximum emission wavelength (emission peak wavelength ($\lambda_{max}$), nm) of the emission peak of the emission spectrum or electroluminescence spectrum of the organometallic compound may be from about 500 nm to about 600 nm.

Synthesis methods of the organometallic compound represented by Formula 1 may be understood by a person having ordinary skill in the art by referring to Synthesis Examples provided herein.

The organometallic compound represented by Formula 1 is suitable for use in an organic layer of an organic light-emitting device, for example, for use as a dopant in an emission layer of the organic layer. Thus, another aspect provides an organic light-emitting device that includes a first electrode; a second electrode; and an organic layer located between the first electrode and the second electrode, wherein the organic layer includes an emission layer, and wherein the organic layer includes at least one organometallic compound represented by Formula 1.

As described herein, due to the inclusion of the organometallic compound represented by Formula 1 in the organic layer, the organic light-emitting device may have excellent characteristics in terms of driving voltage, current efficiency, power efficiency, external quantum efficiency (EQE), lifespan, and/or color purity. In addition, an organic light-emitting device may have a reduced roll-off phenomenon and a relatively narrow electroluminescent (EL) spectrum emission peak FWHM.

The organometallic compound represented by Formula 1 may be located between a pair of electrodes of an organic light-emitting device. For example, at least one organometallic compound represented by Formula 1 may be included in the emission layer. In this regard, the at least one organometallic compound may act as a dopant, and the emission layer may further include a host. In one or more embodiments, an amount of the organometallic compound represented by Formula 1 in the emission layer is less than an amount of the host in the emission layer.

In one or more embodiments, the emission layer may emit green light. For example, the emission layer may emit green light having a maximum emission wavelength of about 500 nm to about 600 nm.

The expression "(an organic layer) includes at least one of organometallic compounds" used herein may include a case in which "(an organic layer) includes a single organometallic compound represented by Formula 1" and a case in which "(an organic layer) includes two or more different organometallic compounds represented by Formula 1."

For example, the organic layer may include, as the organometallic compound, only a single Compound 1. In this embodiment, Compound 1 may be included in the emission layer of the organic light-emitting device. In one or more embodiments, the organic layer may include, as the organometallic compound, Compound 1 and Compound 2. In this regard, Compound 1 and Compound 2 may be in the same layer (for example, Compound 1 and Compound 2 both may be in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer may further include a hole transport region located between the first electrode and the emission layer, and an electron transport region located between the emission layer and the second electrode, the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" used herein refers to a single layer and/or a plurality of layers located between the first electrode and the second electrode of the organic light-emitting device. The "organic layer" may include, in addition to an organic compound, an organometallic complex including a metal.

The FIGURE is a schematic cross-sectional view of an organic light-emitting device 10 according to one or more embodiments. Hereinafter, the structure of an organic light-emitting device according to one or more embodiments of the present disclosure and a method of manufacturing an organic light-emitting device according to one or more embodiments of the present disclosure will be described in connection with the FIGURE. The organic light-emitting device 10 includes a first electrode 11, an organic layer 15, and a second electrode 19, which are sequentially stacked in this order.

A substrate may be additionally located under or beneath the first electrode 11 or above or on top of the second electrode 19. For use as the substrate, any substrate that is used in organic light-emitting devices, including those available in the art, may be used. In one or more embodiments, the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be chosen from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a structure with a single layer, the first electrode 11 may have a structure including two or more layers. For example, the first electrode 11 may have a three-layered structure of ITO/Ag/ITO, but the structure of the first electrode 11 is not limited thereto.

The organic layer 15 is located on the first electrode 11. The organic layer 15 may include a hole transport region, an emission layer, and an electron transport region.

The hole transport region may be located between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In one or more embodiments, the hole transport region may have a hole injection layer/hole transport layer structure, or a hole injection layer/hole transport layer/electron blocking layer structure, wherein, for each structure, each layer is sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 angstroms per second (Å/s) to about 100 Å/s. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

The conditions for forming the hole transport layer and the electron blocking layer may be the same as the conditions for forming the hole injection layer.

The hole transport region may include at least one of m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, or a compound represented by Formula 202:

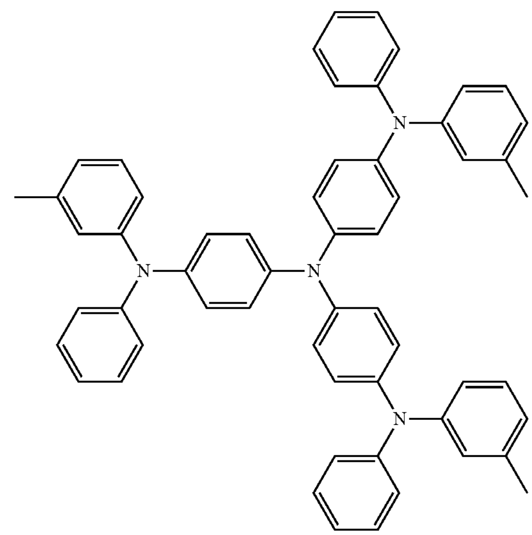

m-MTDATA

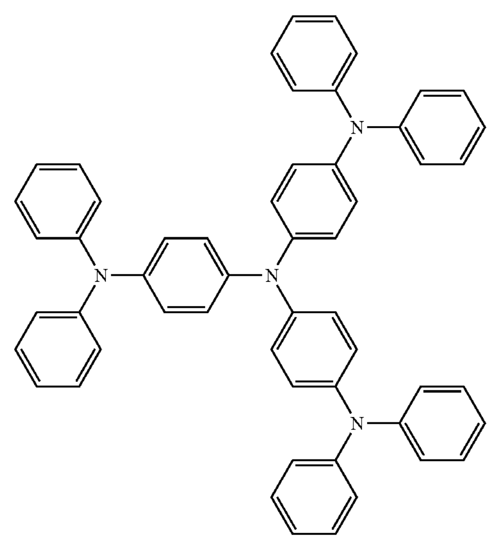

TDATA

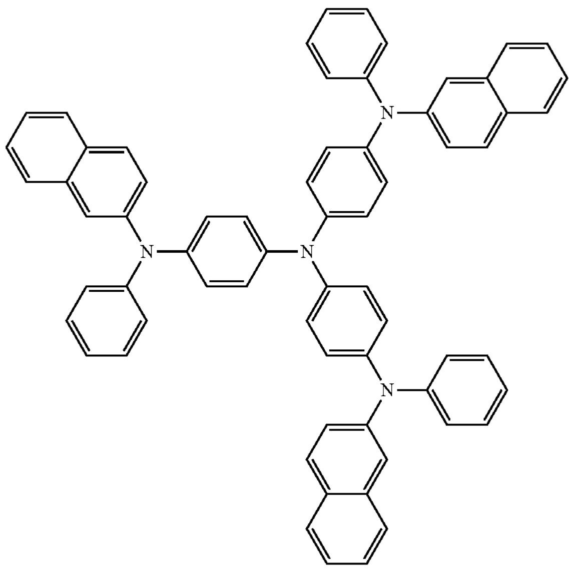
2-TNATA
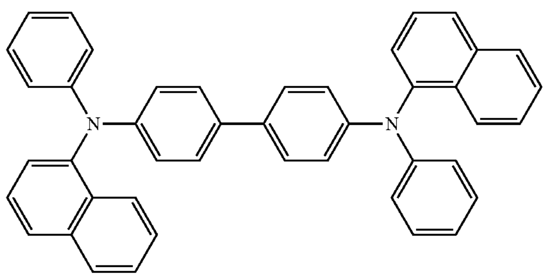
NPB
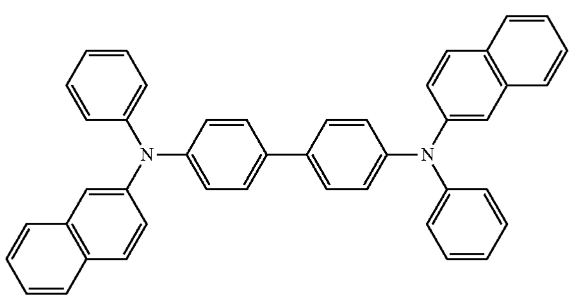
β-NPB
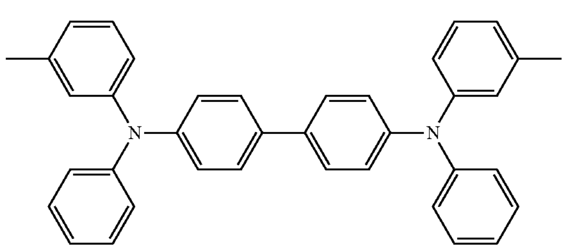
TPD
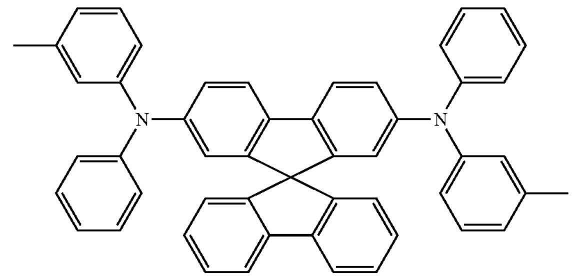
Spiro-TPD
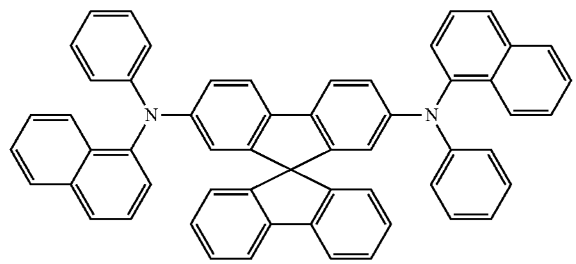
Spiro-NPB
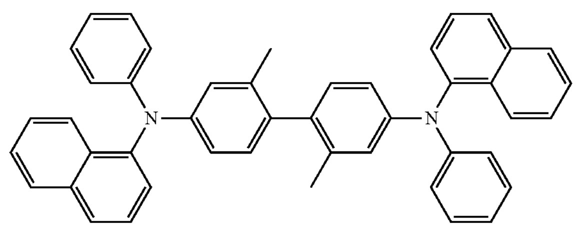
methylated NPB
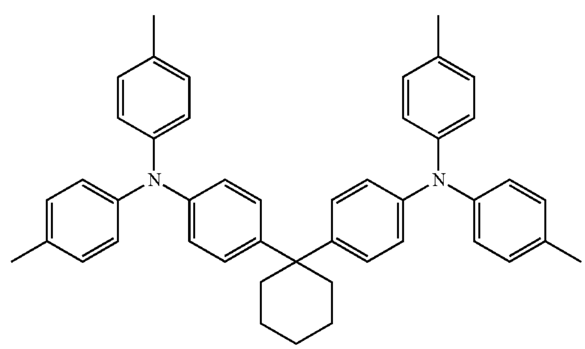
TAPC
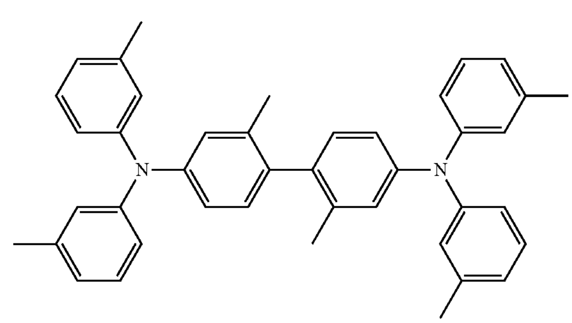
HMTPD -continued Formula 201

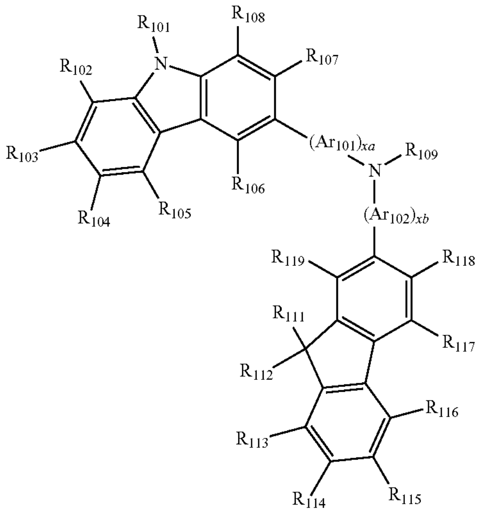

Formula 202

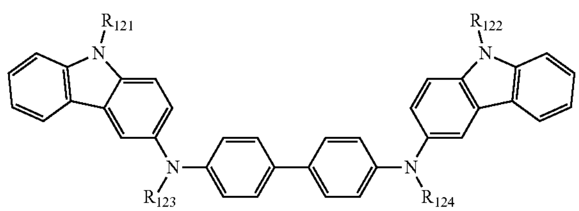

$Ar_{101}$ and $Ar_{102}$ in Formula 201 may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group.

xa and xb in Formula 201 may each independently be an integer from 0 to 5, or 0, 1, or 2. For example, xa may be 1 and xb may be 0, but xa and xb are not limited thereto.

$R_{101}$ to $R_{108}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments of the present disclosure are not limited thereto.

$R_{109}$ in Formula 201 may be:

a phenyl group, a naphthyl group, an anthracenyl group, or a pyridinyl group; or a phenyl group, a naphthyl group, an anthracenyl group, or a pyridinyl group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

According to one or more embodiments, the compound represented by Formula 201 may be represented by Formula 201A, but embodiments of the present disclosure are not limited thereto:

Formula 201A

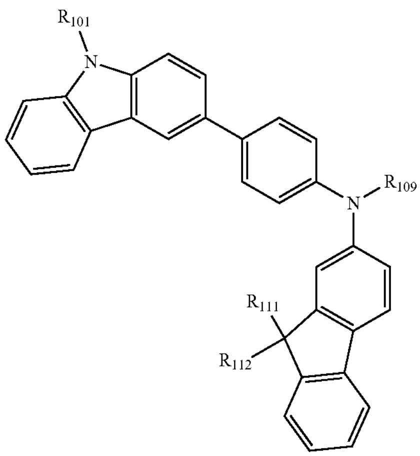

$R_{101}$, $R_{111}$, $R_{112}$, and $R_{109}$ in Formula 201A may be understood by referring to the description provided herein for these substituent groups.

For example, the compound represented by Formula 201, or the compound represented by Formula 202 may include one or more of Compounds HT1 to HT20, but are not limited thereto:

HT1

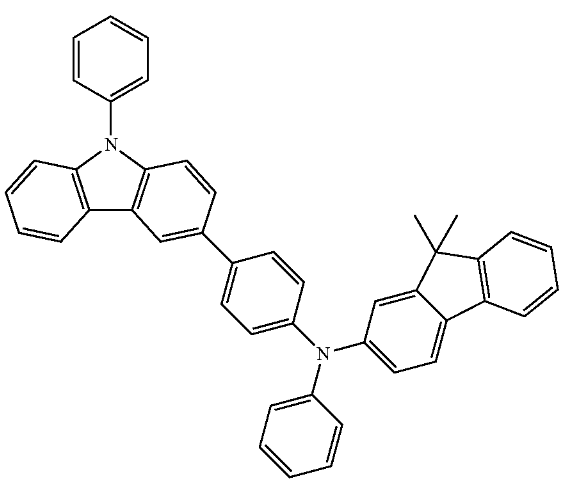

-continued

HT2

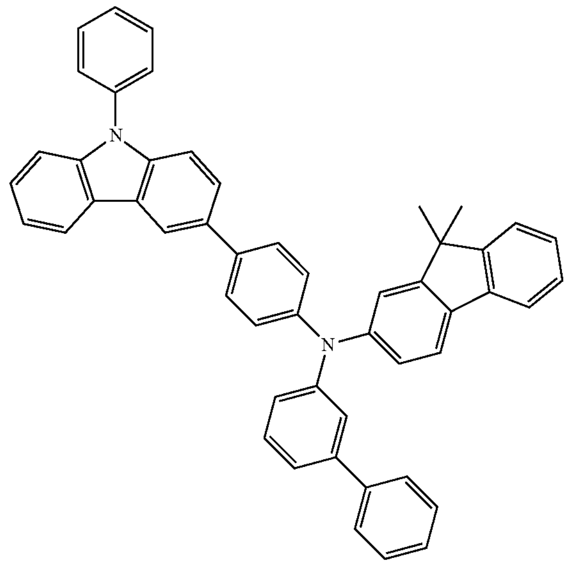

HT3

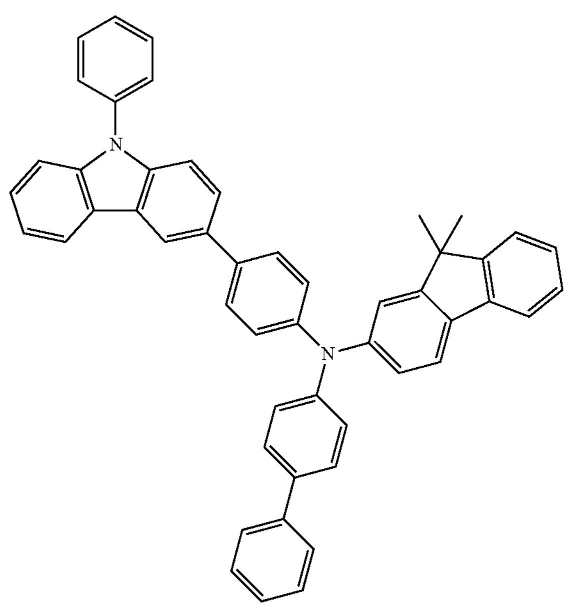

-continued
HT4
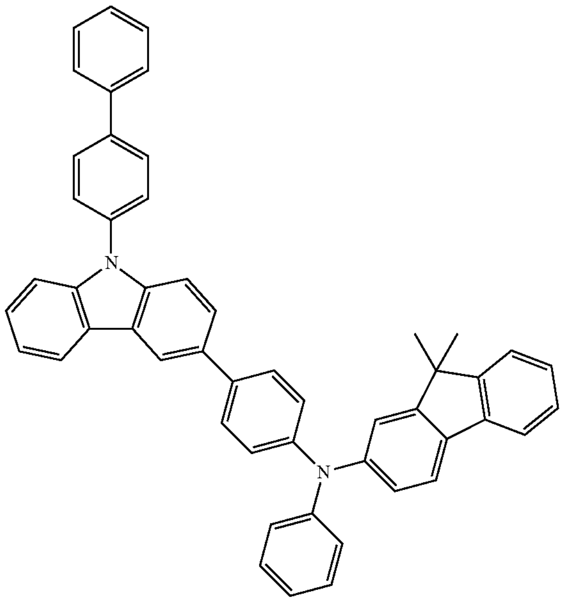
HT5
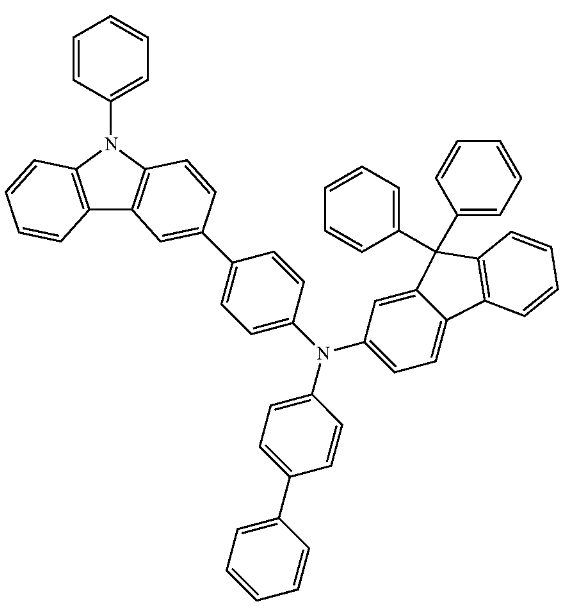
-continued
HT6
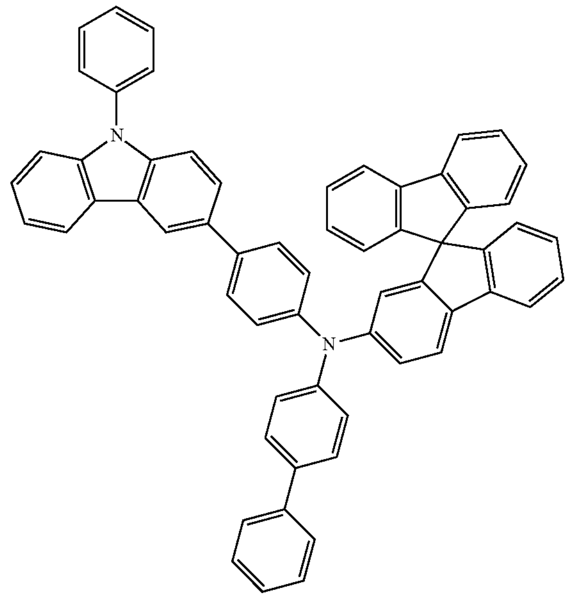
HT7
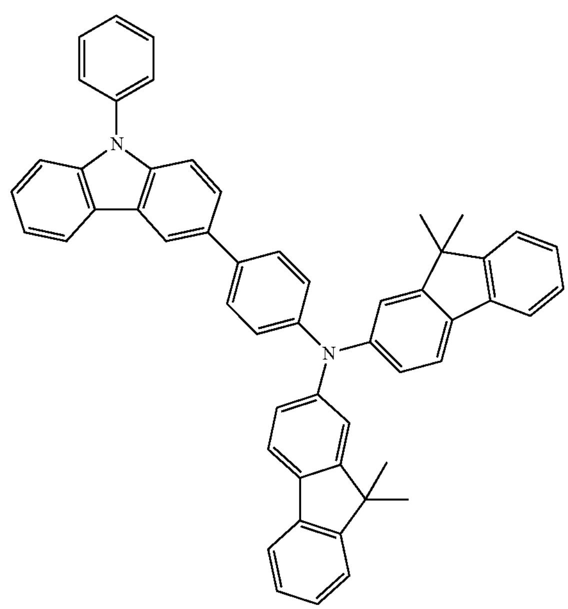

-continued
HT8
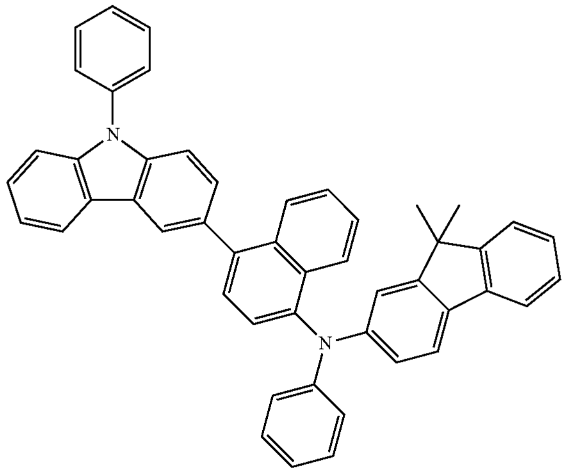
HT9
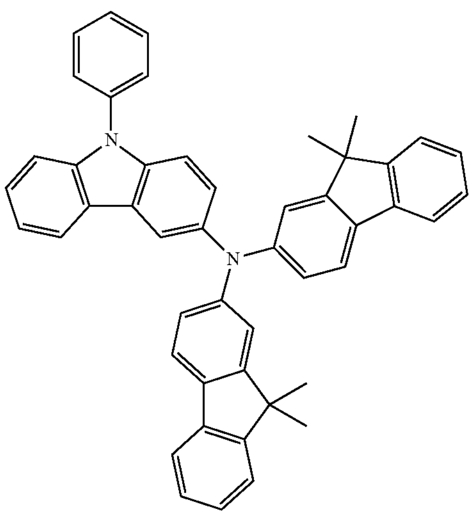
HT10
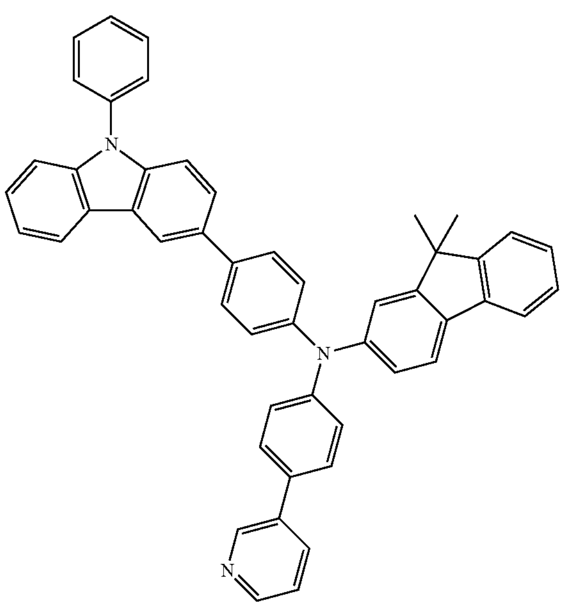
-continued
HT11
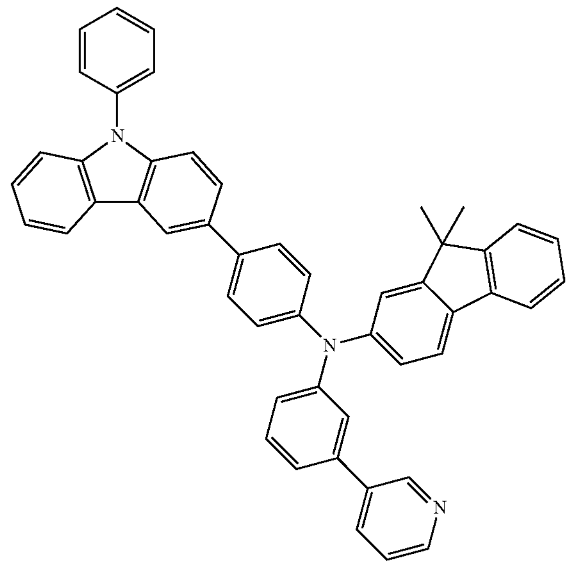
HT12
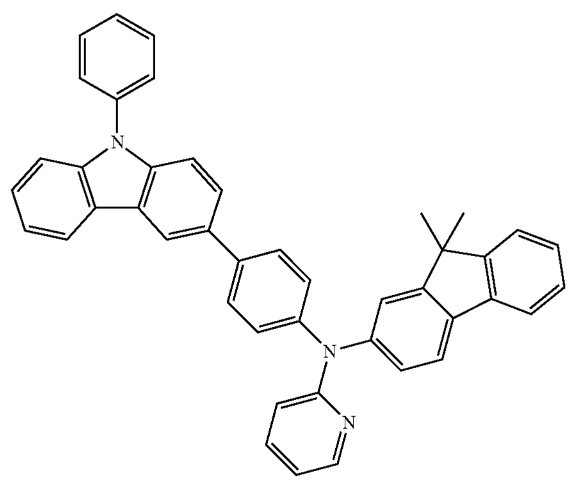
HT13
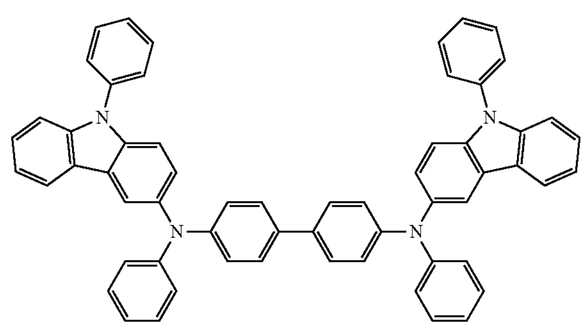

-continued

HT14

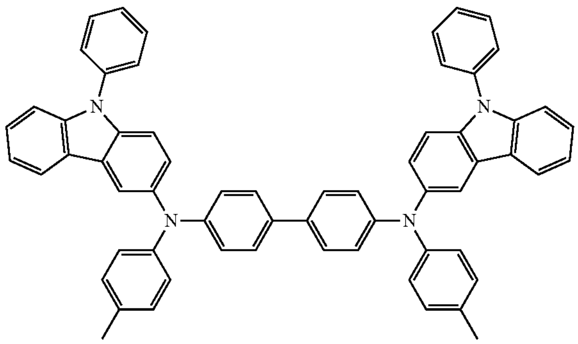

HT15

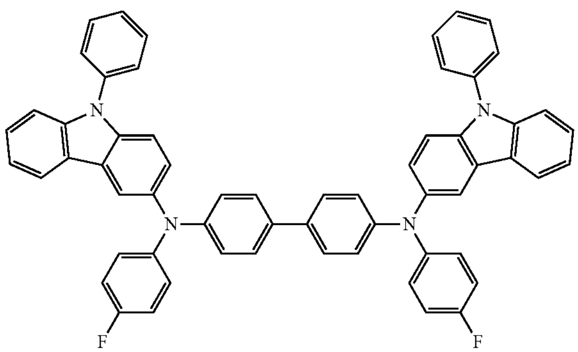

HT16

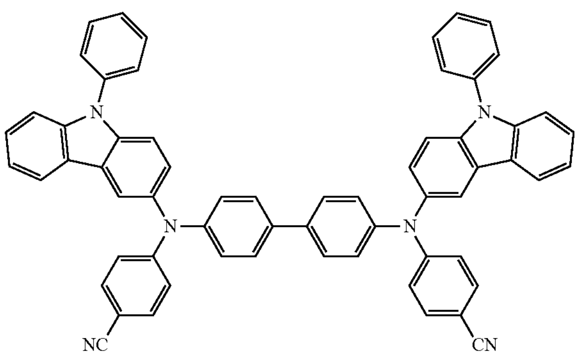

HT17

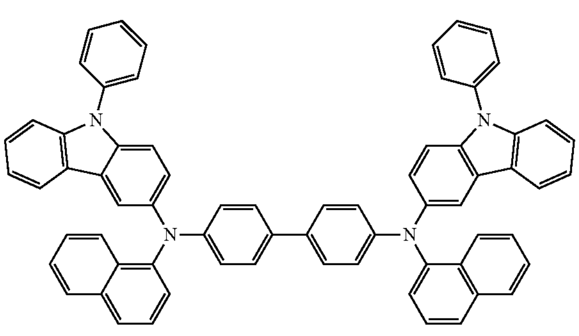

-continued

HT18

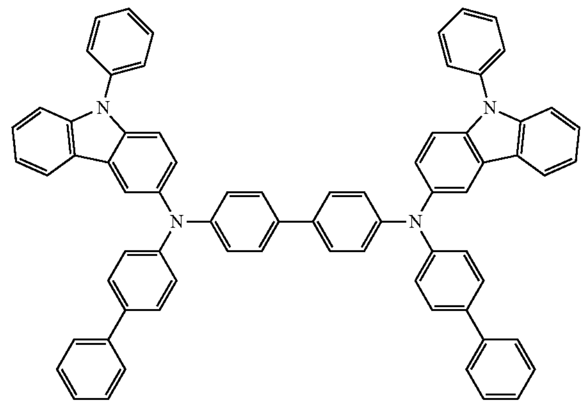

HT19

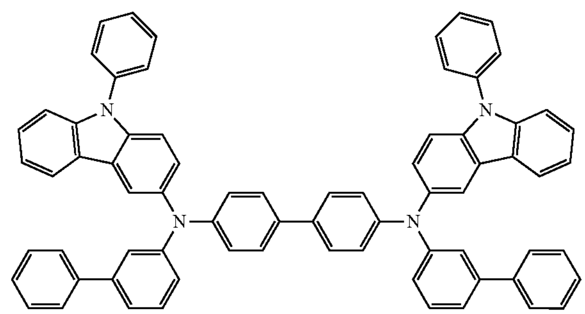

HT20

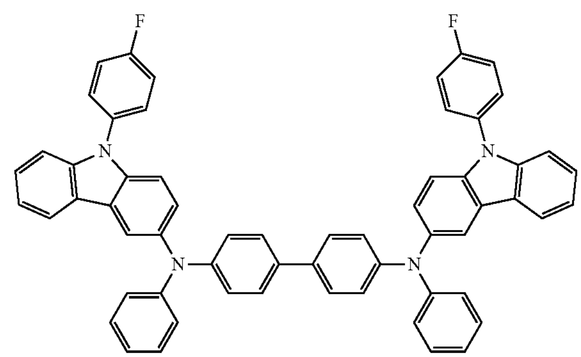

A thickness of the hole transport region may be in the range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. Without wishing to be bound to theory, when the thicknesses of the hole transport region, the hole injection layer, and the hole transport layer are within these ranges, satisfactory hole transport characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, or a cyano group-containing compound, but embodiments of the present disclosure are not limited thereto. Non-limiting examples of the p-dopant are a quinone derivative, for example, tetracyanoquinodimethane (TCNQ) or 2,3,5,6-tetrafluoro-tetracyano-1,4-benzoquinodimethane (F4-TCNQ); a metal oxide, for example, a tungsten oxide or a molybdenum oxide; or a cyano group-containing compound, such as one of Compounds HT-D1 or F12, but embodiments of the present description are not limited thereto.

HT-D1

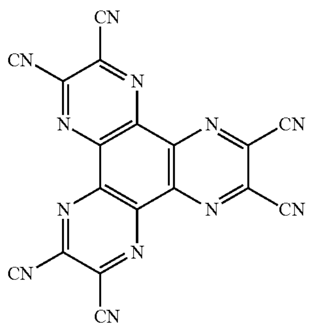

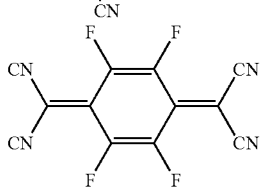

F4-TCNQ

F12

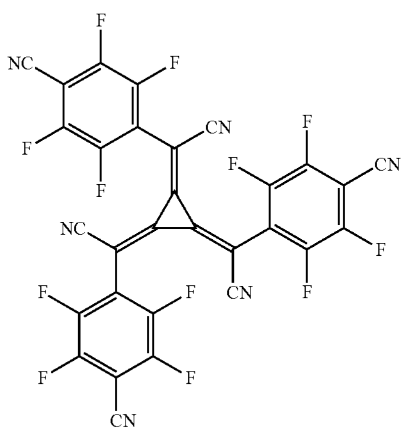

The hole transport region may include a buffer layer.

Without wishing to be bound to theory, the buffer layer may compensate for an optical resonance distance according to a wavelength of light emitted from the emission layer, and thus, the efficiency of a formed organic light-emitting device may be improved.

An emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the emission layer.

When the hole transport region includes an electron blocking layer, a material for the electron blocking layer may be a material for a hole transport region or a material for a host, as described herein. However, the material for the electron blocking layer is not limited thereto. For example, when the hole transport region includes an electron blocking layer, a material for the electron blocking layer may be mCP, as described herein in further detail.

The emission layer may include a host and a dopant, and the dopant may include at least one organometallic compound represented by Formula 1.

The host may include at least one of TPBi, TBADN, ADN (also referred to as "DNA"), CBP, CDBP, TCP, mCP, Compound H50, or Compound H51:

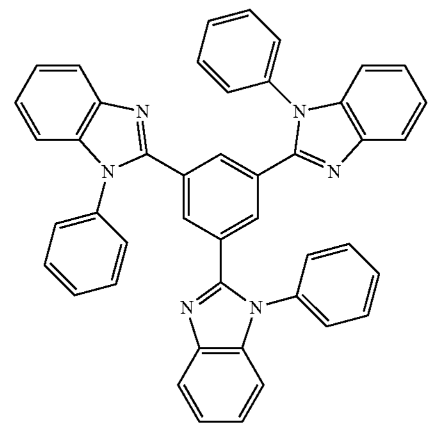

TPBi

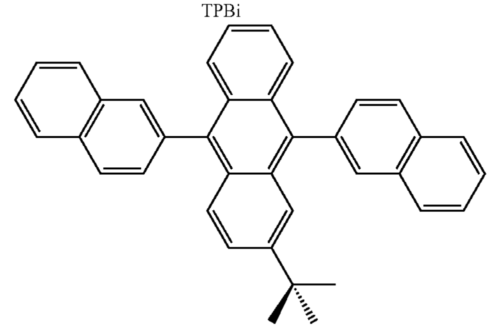

TBADN

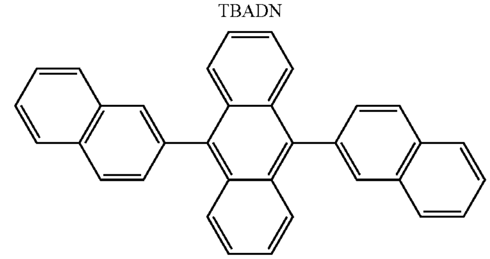

ADN

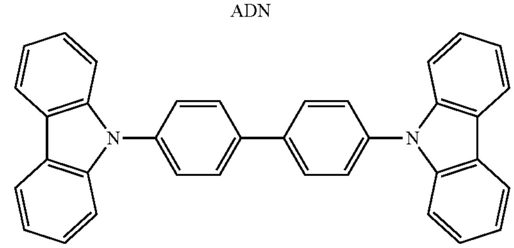

CBP

-continued

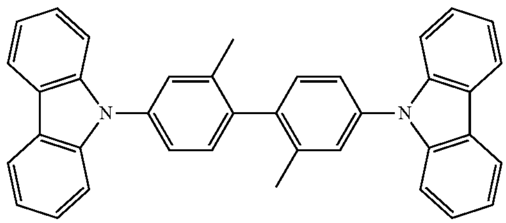

CDBP

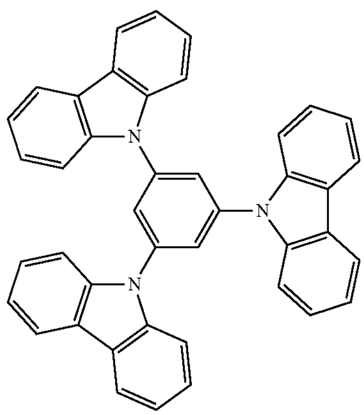

TCP

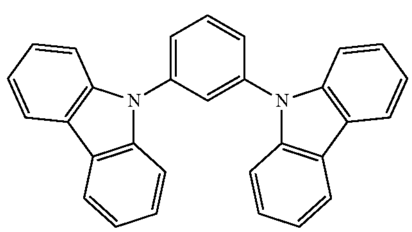

mCP

H50

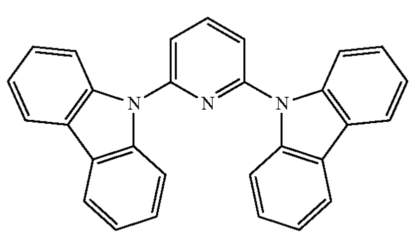

H51

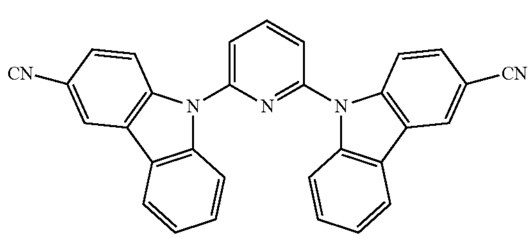

In one or more embodiments, the host may further include a compound represented by Formula 301:

Formula 301

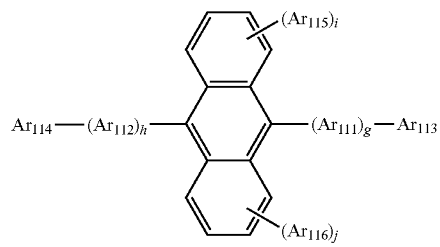

$Ar_{111}$ and $Ar_{112}$ in Formula 301 may each independently be:

a phenylene group, a naphthylene group, a phenanthrenylene group, or a pyrenylene group; or a phenylene group, a naphthylene group, a phenanthrenylene group, or a pyrenylene group, each substituted with one or more of a phenyl group, a naphthyl group, or an anthracenyl group.

$Ar_{113}$ to $Ar_{116}$ in Formula 301 may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with one or more of a phenyl group, a naphthyl group, or an anthracenyl group.

g, h, i, and j in Formula 301 may each independently be an integer from 0 to 4, and may be, for example, 0, 1, or 2.

$Ar_{113}$ and $Ar_{116}$ in Formula 301 may each independently be:

a $C_1$-$C_{10}$ alkyl group that may be substituted with one or more of a phenyl group, a naphthyl group, or an anthracenyl group;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each substituted with one or more of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a phenyl group, a naphthyl group, an anthracenyl group, a pyrenyl group, a phenanthrenyl group, or a fluorenyl group; or

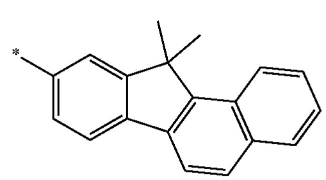

In one or more embodiments, the host may include a compound represented by Formula 302:

Formula 302

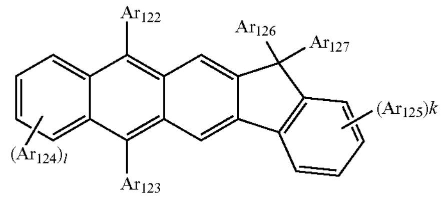

$Ar_{122}$ to $Ar_{125}$ in Formula 302 may be as described in further detail in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light. Other various embodiments are possible.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Then, an electron transport region may be located on the emission layer.

The electron transport region may include a hole blocking layer, an electron transport layer, an electron injection layer, or a combination thereof.

For example, the electron transport region may have a hole blocking layer/electron transport layer/electron injection layer structure or an electron transport layer/electron injection layer structure, and the structure of the electron transport region is not limited thereto. The electron transport layer may have a single-layered structure including a single material, or a multi-layered structure including two or more different materials.

Conditions for forming the hole blocking layer, the electron transport layer, and the electron injection layer, which constitute the electron transport region, may be understood by referring to the conditions described herein for forming the hole injection layer.

When the electron transport region includes a hole blocking layer, the hole blocking layer may include, for example, at least one of BCP, Bphen, or BAlq, but embodiments of the present disclosure are not limited thereto.

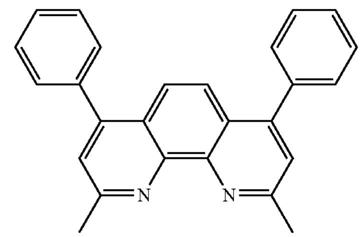

BCP

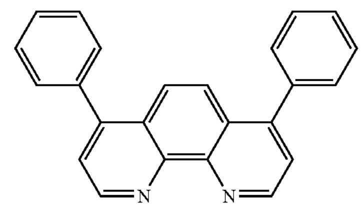

Bphen

A thickness of the hole blocking layer may be in a range of about 20 Å to about 1,000 Å, for example, about 30 Å to about 300 Å. When the thickness of the hole blocking layer is within these ranges, excellent hole blocking characteristics may be obtained without a substantial increase in driving voltage.

The electron transport layer may include at least one of BCP, Bphen, $Alq_3$, BAlq, TAZ, or NTAZ.

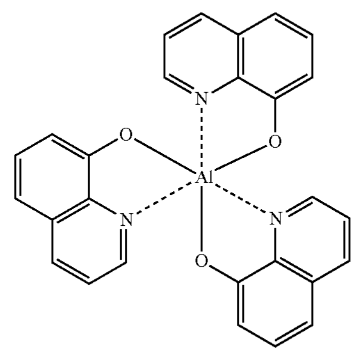

$Alq_3$

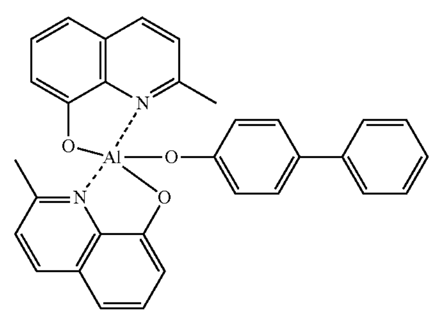

BAlq

-continued
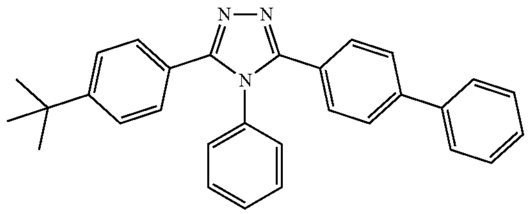
TAZ
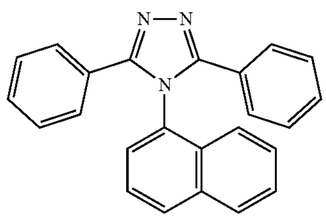
NTAZ
In one or more embodiments, the electron transport layer may include at least one of ET1 to ET25, but embodiments of the present description are not limited thereto:
ET1
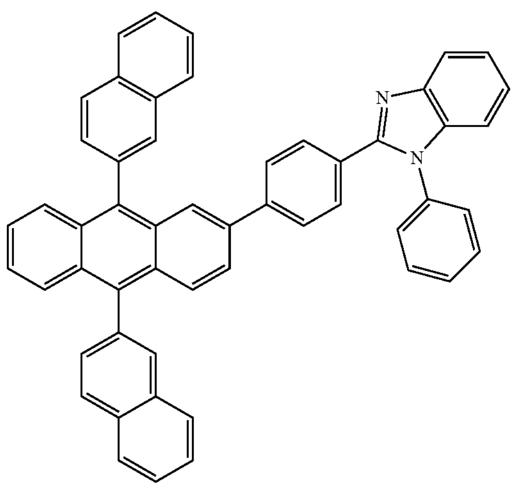
ET2
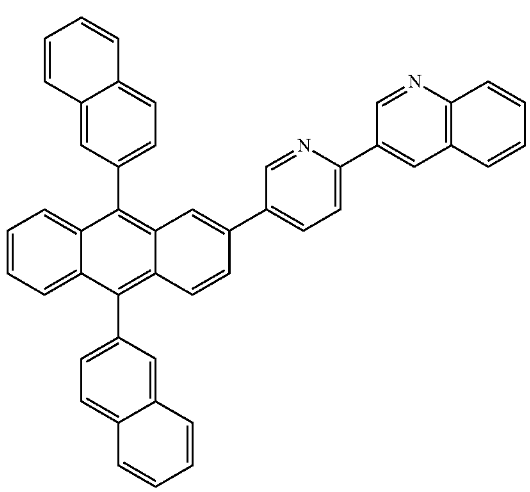
-continued
ET3
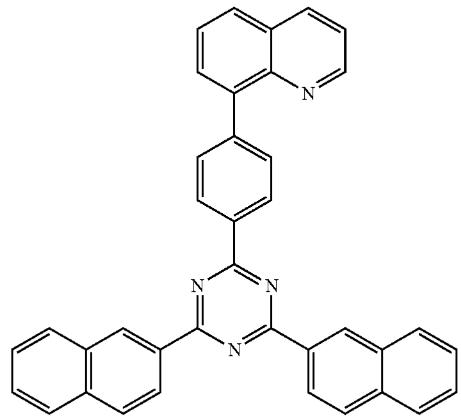
ET4
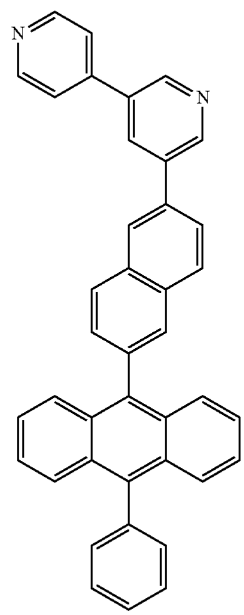
ET5
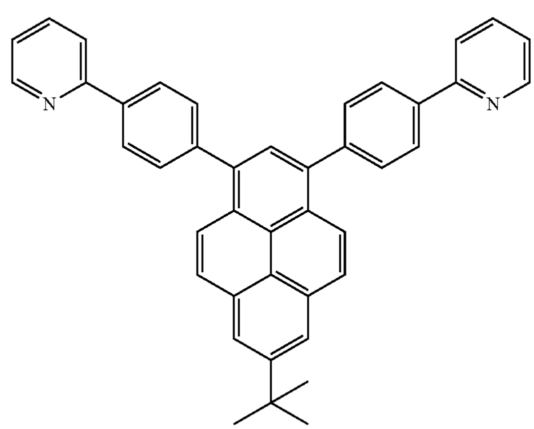

-continued
ET6
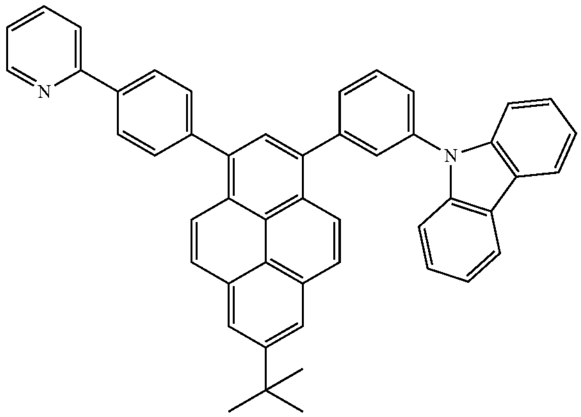
ET7
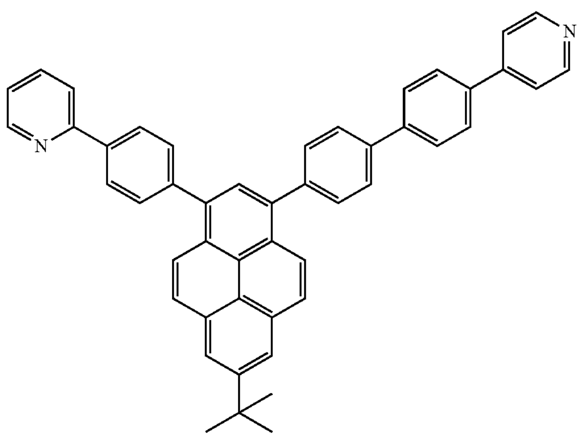
ET8
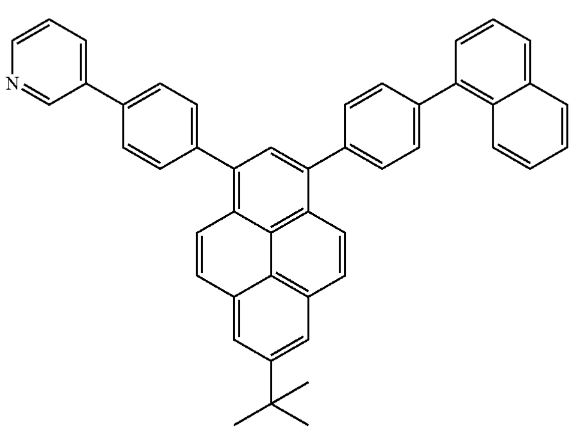
-continued
ET9
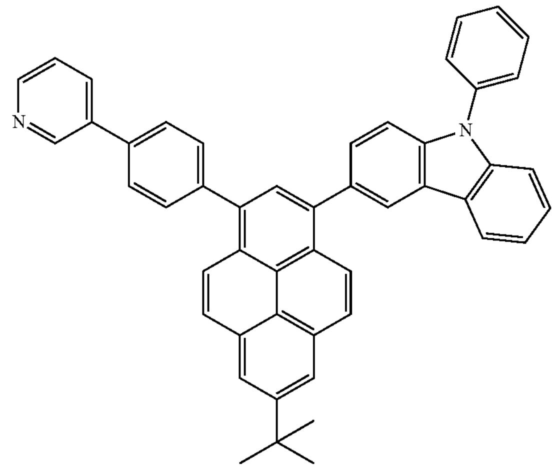
ET10
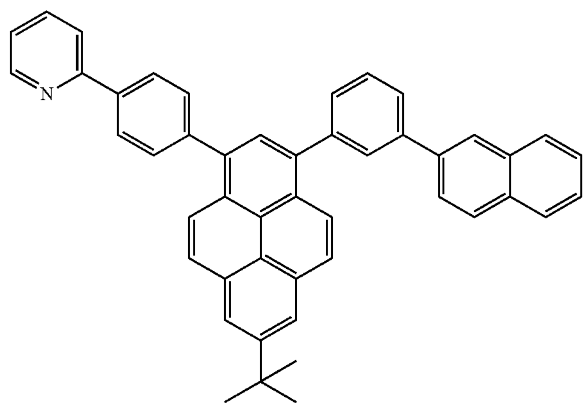
ET11
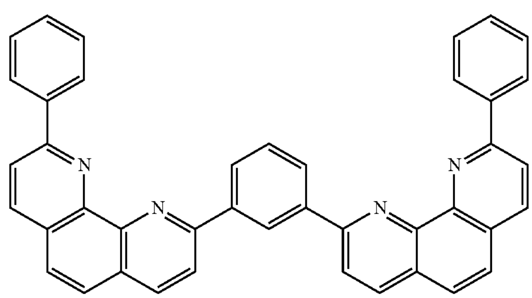
ET12
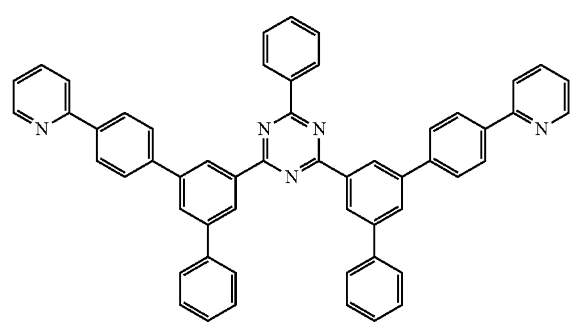

-continued
ET13
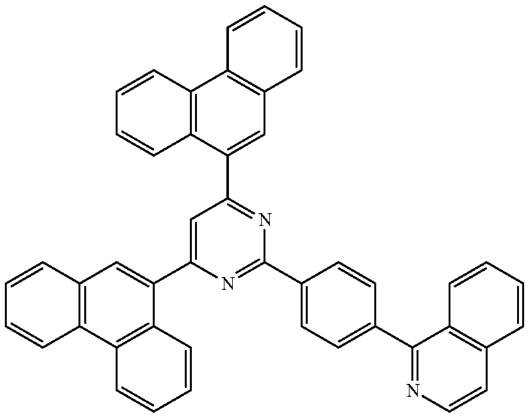
ET14
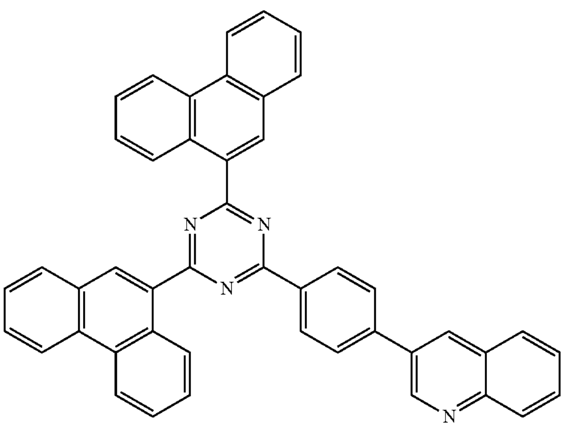
ET15
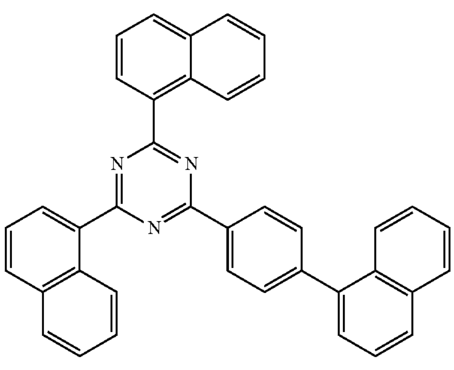
-continued
ET16
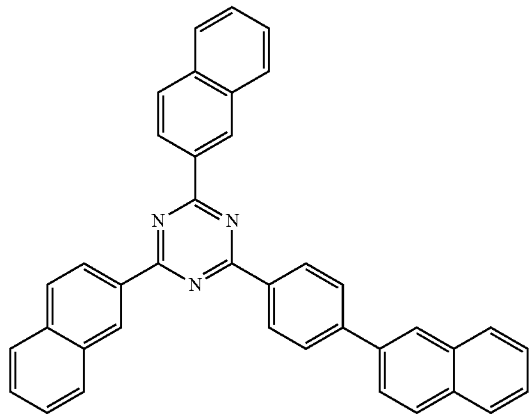
ET17
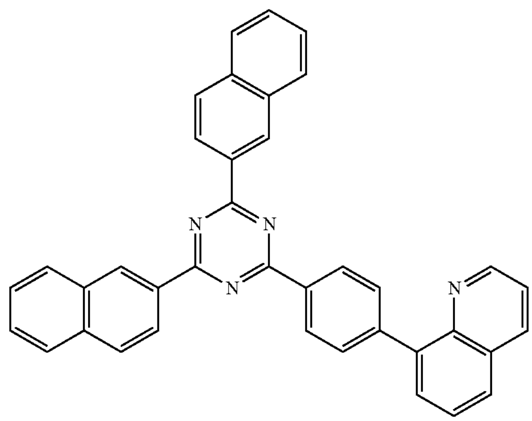
ET18
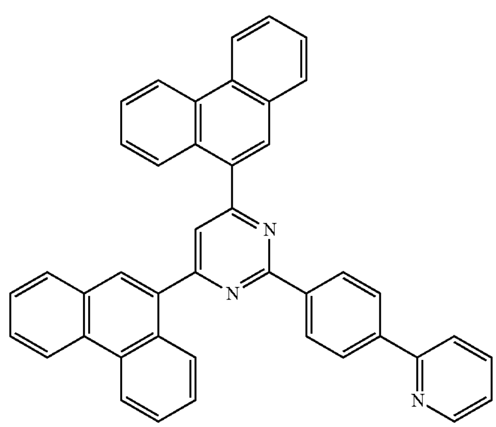

-continued
ET19
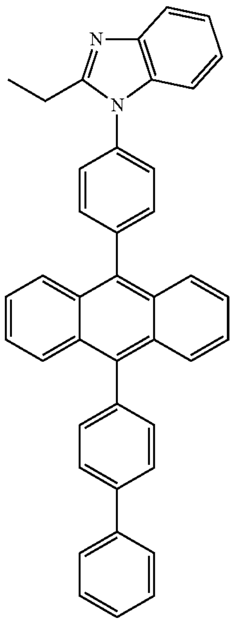
ET20
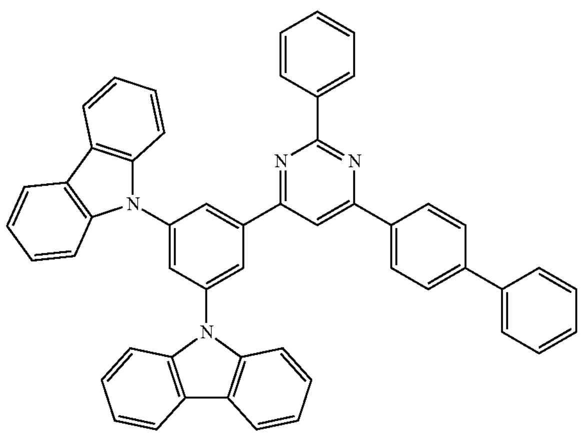
ET21
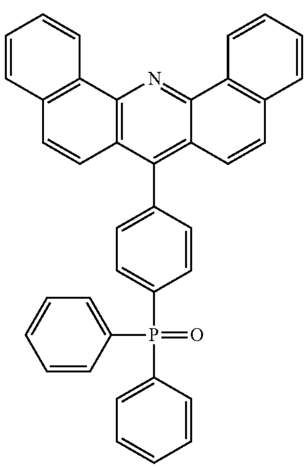
-continued
ET22
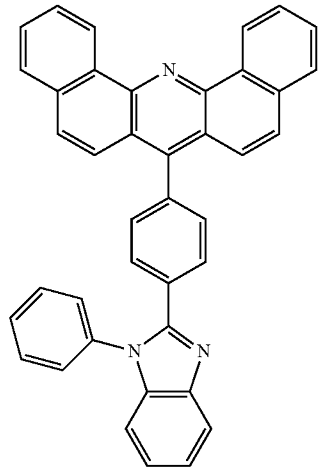
ET23
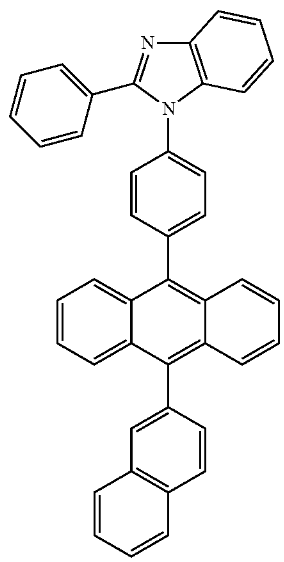
ET24
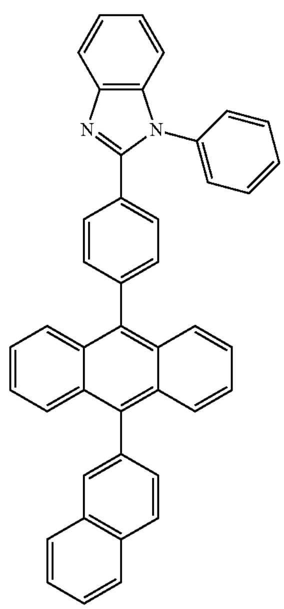

-continued

ET25

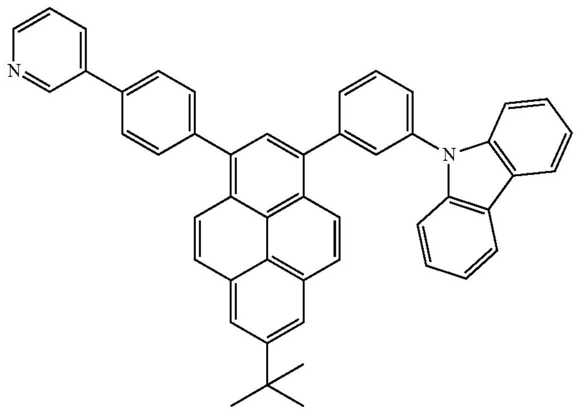

A thickness of the electron transport layer may be in the range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport layer may include a material including a metal in addition to the material as described hereinabove.

The material including a metal may be a Li complex. The Li complex may include, for example, Compound ET-D1 (lithium quinolate, LiQ) or ET-D2:

ET-D1

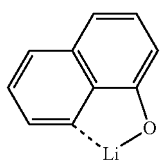

ET-D2

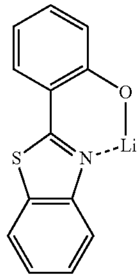

The electron transport region may include an electron injection layer that promotes the flow of electrons from the second electrode 19 thereinto.

The electron injection layer may include LiF, NaCl, CsF, $Li_2O$, BaO, or a combination thereof.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 19 is located on the organic layer 15. The second electrode 19 may be a cathode. A material for forming the second electrode 19 may be a metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom that is N, O, P, Si, or S as a ring-forming atom instead of at least one carbon atom, and 1 to 10 carbon atoms, and non-limiting examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom that is N, O, P, Si, or S as a ring-forming atom instead of at least one carbon, 2 to 10 carbon atoms, and at least one carbon-carbon double bond in its ring. Examples of the $C_2$-$C_{10}$ heterocycloalkenyl group are a 2,3-dihydrofuranyl group and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other. The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_1$-$C_{60}$ aryl group.

The term "$C_1$-$C_{60}$ heteroaryl group" as used herein refers to a monovalent group having a cyclic aromatic system that has at least one heteroatom that is N, O, P, Si, or S as a ring-forming atom instead of at least one carbon atom, and 1 to 60 carbon atoms. The term "$C_1$-$C_{60}$ heteroarylene group" as used herein refers to a divalent group having a carbocyclic aromatic system that has at least one heteroatom that is N, O, P, Si, or S as a ring-forming atom instead of at least one carbon, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other. The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$C_1$-$C_{60}$ heteroaryloxy group" as used herein refers to —$OA_{104}$ (wherein $A_{104}$ is a $C_1$-$C_{60}$ heteroaryl group), and the term "$C_1$-$C_{60}$ heteroarylthio group" as used herein refers to —$SA_{105}$ (wherein $A_{105}$ is the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, at least one heteroatom that is N, O, P, Si, or S instead of at least one carbon atom, as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom that is N, O, P, Si, or S instead of at least one carbon ring atom, and 1 to 30 carbon atoms. The $C_1$-$C_{30}$ heterocyclic group may be a monocyclic group or a polycyclic group.

The term "TMS" as used herein refers to —$Si(CH_3)_3$, and the term "TMG" as used herein refers to —$Ge(CH_3)_3$.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), —B($Q_{16}$)($Q_{17}$), —P($Q_{18}$)($Q_{19}$), or —P(═O)($Q_{18}$)($Q_{19}$), a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P($Q_{28}$)($Q_{29}$), or —P(═O)($Q_{28}$)($Q_{29}$), —Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), —P($Q_{28}$)($Q_{29}$), or —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a $C_1$-$C_{60}$ heteroaryloxy group, a $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

Hereinafter, a compound and an organic light-emitting device according to one or more embodiments are described in further detail with reference to Synthesis Example and Examples. However, the organic light-emitting device is not limited thereto. The wording "'B' was used instead of 'A'" used in describing Synthesis Examples means that an amount of 'A' used was identical to an amount of 'B' used, in terms of a molar equivalent.

EXAMPLES

Synthesis Example 1: Synthesis of Compound 1

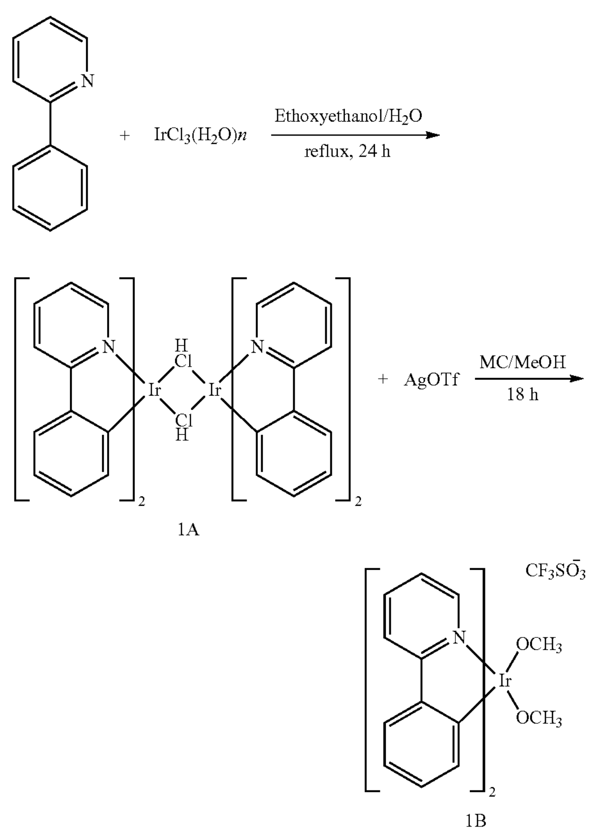

-continued

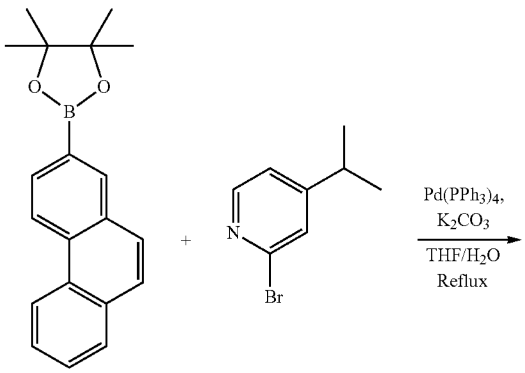

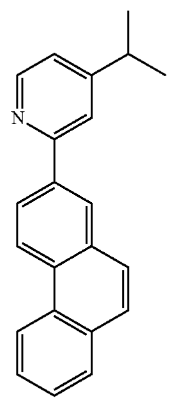

1C

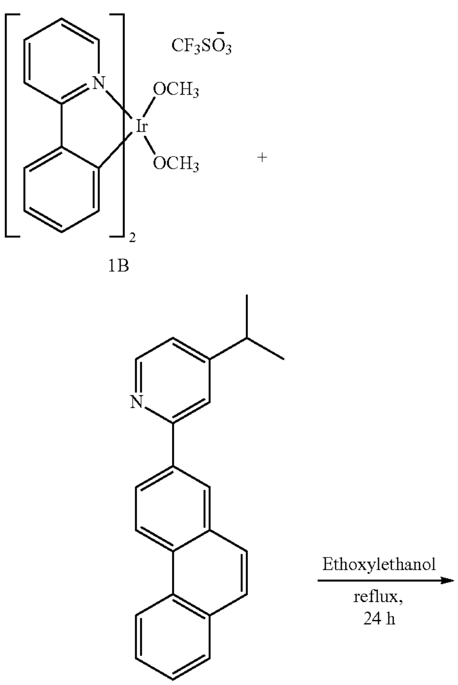

1B

1C

-continued

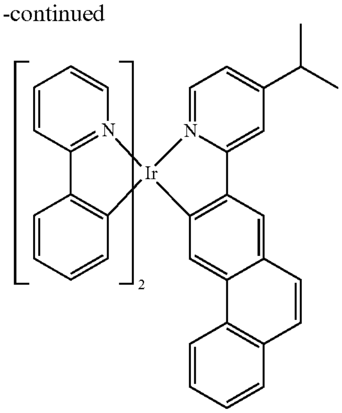

1

(1) Synthesis of Compound 1A

In a reaction vessel, 2-phenylpyridine (5.2 grams (g), 33.2 millimoles (mmol)) and iridium chloride (5.2 g, 14.7 mmol) were mixed with 120 milliliters (mL) of ethoxyethanol and 40 mL of deionized (DI) water, and the resultant mixture was stirred a reflux for 24 hours, and then, the temperature was allowed to cool to room temperature. The resulting solid was separated by filtration, washed sufficiently with water, methanol, and hexane, in this stated order, and then dried in a vacuum oven to obtain 8.2 g (yield of 92%) of Compound 1A.

(2) Synthesis of Compound 1B

In a reaction vessel, Compound 1A (1.6 g, 1.5 mmol) and 45 mL of methylene chloride (MC) were mixed, and then, silver trifluoromethanesulfonate (silver triflate, AgOTf) (0.8 g, 3.1 mmol) was added thereto after being mixed with 15 mL of methanol (MeOH). Thereafter, the mixture was stirred for 18 hours at room temperature while light was excluded from the interior of the reaction vessel with aluminum foil, and then the mixture was filtered through a diatomaceous earth plug to remove the resulting solid, and the filtrate was subjected to reduced pressure to obtain a solid (Compound 1B). Compound 1B was used in the next reaction without an additional purification process.

(3) Synthesis of Compound 1C

In a reaction vessel under a nitrogen environment, 4,4,5,5-tetramethyl-2-(phenanthrene-2-yl)-1,3,2-dioxaborolane (3.7 g, 12.0 mmol) and 2-bromo-4-isopropyl-pyridine (2.0 g, 10.0 mmol) were dissolved in 140 mL of tetrahydrofuran (THF). Then, potassium carbonate ($K_2CO_3$) (3.2 g, 29.9 mmol) was dissolved in 25 mL of DI water, and then, the resultant solution was added to the tetrahydrofuran solution to form a reaction mixture, and a palladium catalyst ($Pd(PPh_3)_4$) (1.2 g, 1.2 mmol) was added thereto. Then, the reaction mixture was stirred at reflux at 100° C. for a period of time. After being allowed to cool to room temperature, a product was obtained by extraction and separated by filtration and the obtained solid was subjected to column chromatography (eluent: methylene chloride (MC) and hexane) to obtain 2.8 g (yield of 94%) of Compound 1C (4-isopropyl-2-(phenanthrene-2-yl)pyridine). The obtained compound was identified by high resolution mass spectrometry (HRMS, using matrix assisted laser desorption ionization, MALDI) and HPLC analysis.

HRMS (MALDI) calcd for $C_{22}H_{19}N$: m/z: 297.40 Found: 298.15

(4) Synthesis of Compound 1

In a reaction vessel, Compound 1B (1.5 g, 2.1 mmol) and Compound 1C (4-isopropyl-2-(phenanthrene-2-yl)pyridine) (0.7 g, 2.3 mmol) were mixed with 100 mL of 2-ethoxy-ethanol, the resultant mixture was stirred at reflux for 24 hours, and then, the temperature was allowed to cool to room temperature. The obtained mixture was subjected to a reduced pressure, and the obtained solid was then subjected to column chromatography (eluent: methylene chloride (MC) and hexane) to obtain 0.75 g (yield of 45%) of Compound 1. The obtained compound was identified by HRMS and HPLC analysis.

HRMS (MALDI) calcd for $C_{44}H_{34}IrN_3$: m/z: 796.99 Found: 798.24

Synthesis Example 2: Synthesis of Compound 2

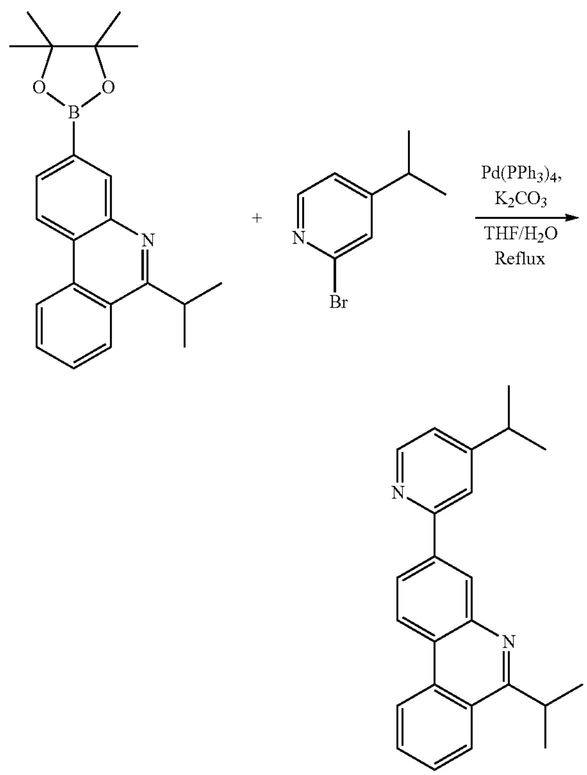

2C

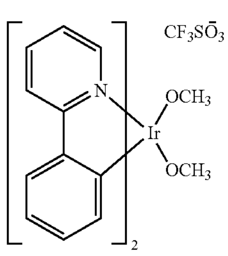

1B

-continued

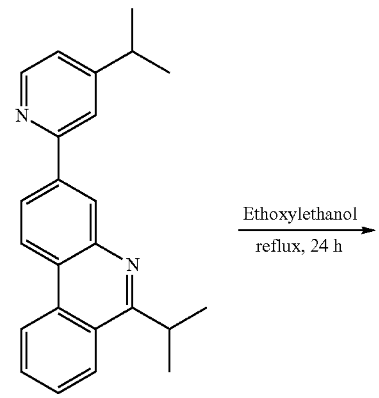

2C

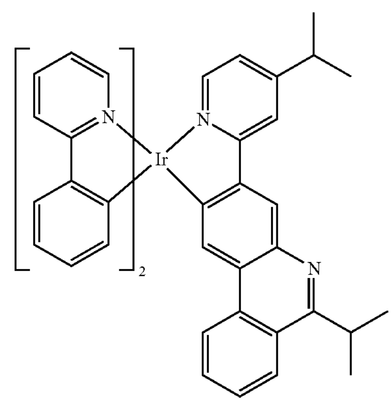

2

(1) Synthesis of Compound 2C 2.7 g (yield of 79%) of Compound 2C (6-isopropyl-3-(4-isopropyl-pyridin-2-yl) phenanthridine) was obtained using a method similar to the method of synthesizing Compound 1C in Synthesis Example 1, except that, when synthesizing Compound 1C, 6-isopropyl-3-(4,4,5,5-tetramethyl-1,3,2-dioxoborolan-2-yl)phenanthridine (4.2 g, 12.0 mmol) was used instead of 4,4,5,5-tetramethyl-2-(phenanthrene-2-yl)-1,3,2-dioxaborolane. The obtained compound was identified by HRMS and HPLC analysis.

HRMS (MALDI) calcd for $C_{24}H_{24}N_2$: m/z: 340.47 Found: 341.19

(2) Synthesis of Compound 2

0.68 g (yield of 38%) of Compound 2 was obtained using a method similar to the method of synthesizing Compound 1 in Synthesis Example 1, except that Compound 2C (0.8 g, 2.3 mmol) was used instead of Compound 1C. The obtained compound was identified by HRMS and HPLC analysis.

HRMS (MADI) calcd for $C_{46}H_{39}IrN_4$: m/z: 840.06 Found: 841.28

Synthesis Example 3: Synthesis of Compound 3

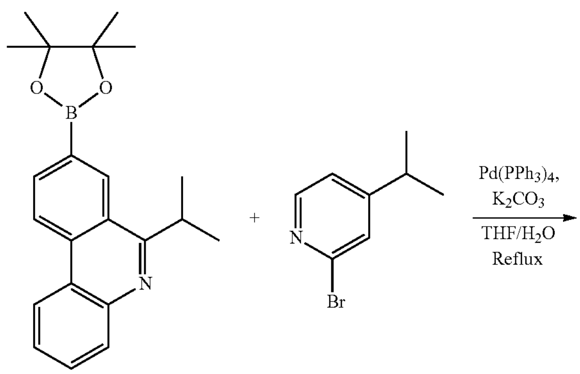

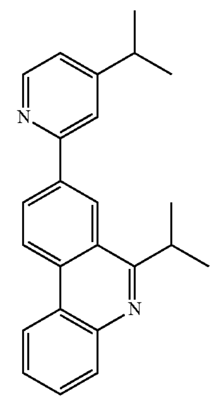

3C

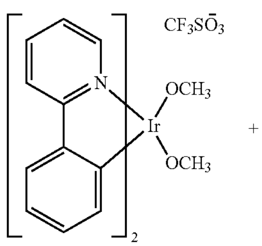

1B

-continued

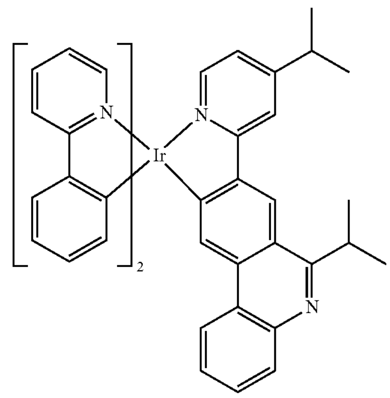

3

(1) Synthesis of Compound 3C 2.9 g (yield of 85%) of Compound 3C (6-isopropyl-8-(4-isopropylpyridin-2-yl)phenanthridine) was obtained using a method similar to the method of synthesizing Compound 1C in Synthesis Example 1, except that, when synthesizing Compound 1C, 6-isopropyl-8-(4,4,5,5-tetramethyl-1,3,2-dioxoborolan-2-yl)phenanthridine (4.2 g, 12.0 mmol) was used instead of 4,4,5,5-tetramethyl-2-(phenanthrene-2-yl)-1,3,2-dioxaborolane. The obtained compound was identified by HRMS and HPLC analysis.

HRMS (MALDI) calcd for $C_{24}H_{24}N_2$: m/z: 340.47 Found: 341.62

(2) Synthesis of Compound 3

0.80 g (yield of 45%) of Compound 2 was obtained using a method similar to the method of synthesizing Compound 1 in Synthesis Example 1, except that Compound 3C (0.8 g, 2.3 mmol) was used instead of Compound 1C. The obtained compound was identified by HRMS and HPLC analysis.

HRMS (MADI) calcd for $C_{46}H_{39}IrN_4$: m/z: 840.06 Found: 841.65

Synthesis Example 4: Synthesis of Compound 4

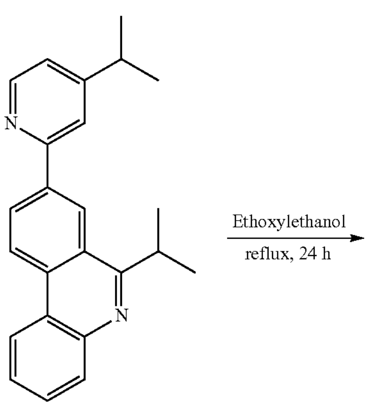

3C

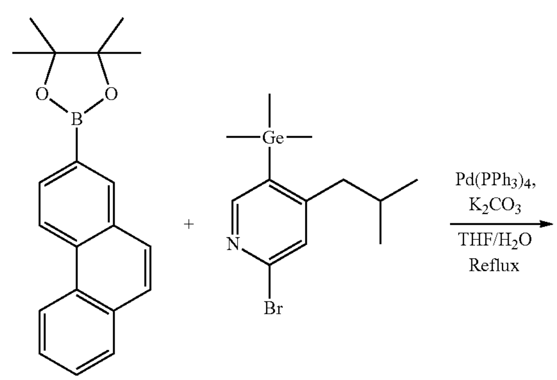

-continued

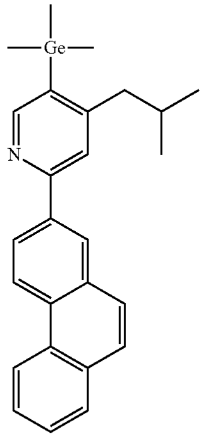

4C

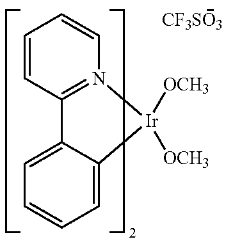

1B

+

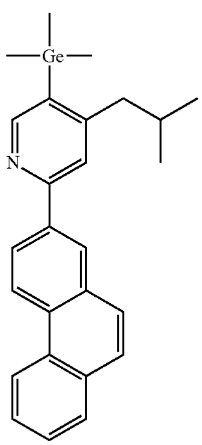

4C

Ethoxylethanol reflux, 24 h

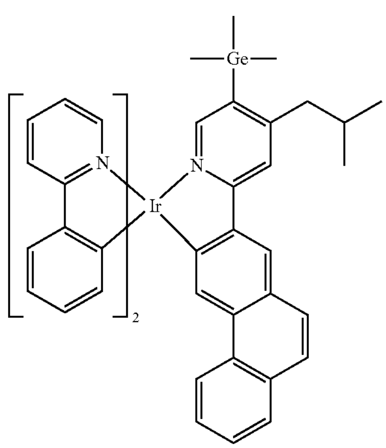

4

(1) Synthesis of Compound 4C 2.2 g (yield of 85%) of Compound 4C (4-isobutyl-2-(phenanthrene-2-yl)-5-(trimethylgermyl)pyridine) was obtained using a method similar to the method of synthesizing Compound 1C in Synthesis Example 1, except that, when synthesizing Compound 1C, 2-bromo-4-isobutyl-5-(trimethylgermyl)pyridine (2.0 g, 6.0 mmol) was used instead of 2-bromo-4-isopropyl-pyridine. The obtained compound was identified by HRMS and HPLC analysis.

HRMS (MALDI) calcd for $C_{26}H_{29}GeN$: m/z: 428.16 Found: 430.11

(2) Synthesis of Compound 4

0.72 g (yield of 37%) of Compound 4 was obtained using a method similar to the method of synthesizing Compound 1 in Synthesis Example 1, except that Compound 4C (4-isobutyl-2-(phenanthrene-2-yl)-5-(trimethylgermyl)pyridine) (1.0 g, 2.3 mmol) was used instead of Compound 1C. The obtained compound was identified by HRMS and HPLC analysis.

HRMS (MALDI) calcd for $C_{48}H_{44}GeIrN_3$: m/z: 927.75 Found: 929.30

Example 1

As an anode, an ITO-patterned glass substrate was cut to a size of 50 mm×50 mm×0.5 mm, sonicated with isopropyl alcohol and DI water, each for 5 minutes, and then cleaned by exposure to ultraviolet rays and ozone for 30 minutes. The resultant glass substrate was loaded onto a vacuum deposition apparatus.

Compounds HT3 and F12(p-dopant) were co-deposited by vacuum on the anode at a weight ratio of 98:2 to form a hole injection layer having a thickness of 100 Å, and Compound HT3 was vacuum-deposited on the hole injection layer to form a hole transport layer having a thickness of 1,650 Å.

Then, GH3 (host) and Compound 1 (dopant) were co-deposited at a weight ratio of 92:8 on the hole transport layer to form an emission layer having a thickness of 400 Å.

Then, Compound ET3 and LiQ (n-dopant) were co-deposited on the emission layer at a volume ratio of 50:50 to form an electron transport layer having a thickness of 350 Å, LiQ was vacuum-deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

HT3

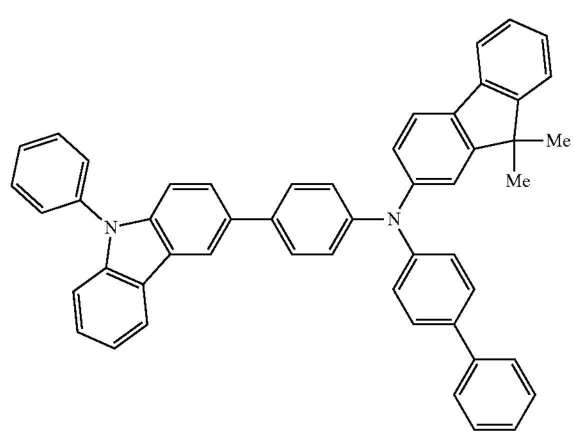

-continued

F12

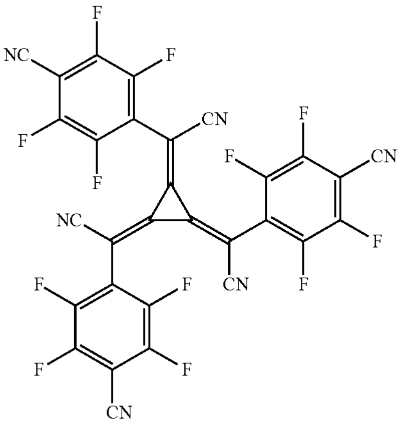

GH3

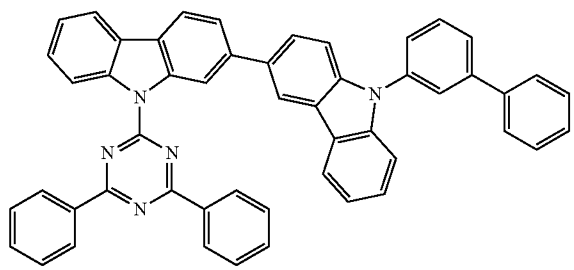

ET3

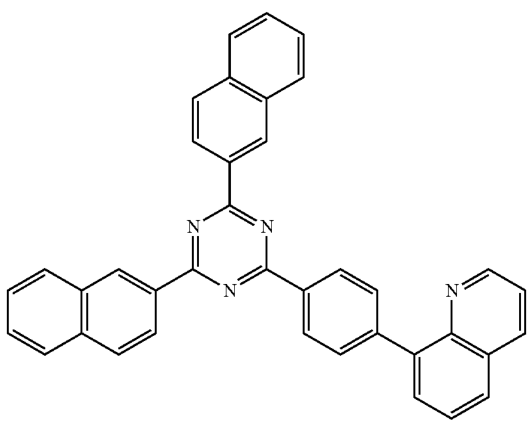

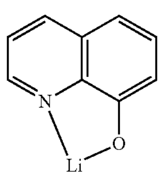

LiQ

Examples 2 to 4 and Comparative Examples 1 to 3

Organic light-emitting devices were manufactured in a manner similar to the method of manufacturing in Example 1, except that Compounds shown in Table 2 were each used instead of Compound 1 as a dopant in forming an emission layer.

The driving voltage (volts, V), external quantum efficiency (EQE, %), maximum emission wavelength ($\lambda_{max}$, nm), and FWHM (nm) of each of the organic light-emitting devices manufactured according to Examples 1 to 4 and Comparative Examples 1 to 3 were evaluated. Results thereof are shown in Table 2. A current-voltage meter (Keithley 2400) and a luminance meter (Minolta Cs-1000A) were used to obtain the data.

TABLE 2

| | Dopant in emission layer | Driving voltage (V) | External quantum efficiency (%) | Maximum emission wavelength (nm) | FWHM (nm) |
|---|---|---|---|---|---|
| Example 1 | Compound 1 | 4.2 | 21.5 | 524 | 78 |
| Example 2 | Compound 2 | 4.2 | 21.5 | 525 | 78 |
| Example 3 | Compound 3 | 4.2 | 20.5 | 515 | 76 |
| Example 4 | Compound 4 | 4.1 | 21.5 | 526 | 78 |
| Comparative Example 1 | Compound A | 4.3 | 21.0 | 529 | 80 |
| Comparative Example 2 | Compound B | 4.5 | 20.0 | 519 | 79 |
| Comparative Example 3 | Compound C | 4.3 | 21.0 | 538 | 82 |

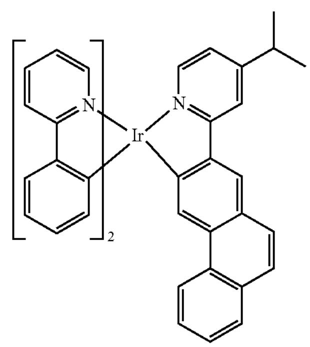

1

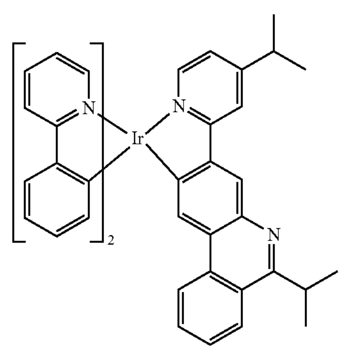

2

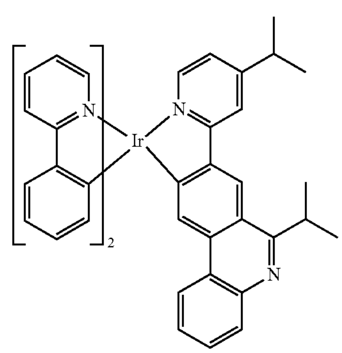

3

TABLE 2-continued

| Dopant in emission layer | Driving voltage (V) | External quantum efficiency (%) | Maximum emission wavelength (nm) | FWHM (nm) |
|---|---|---|---|---|
| 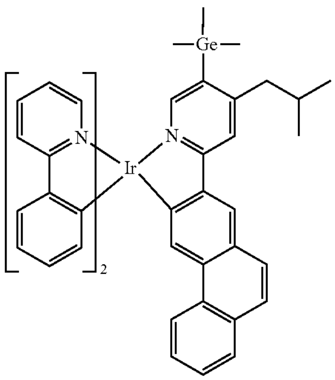 4 | | | | |
| 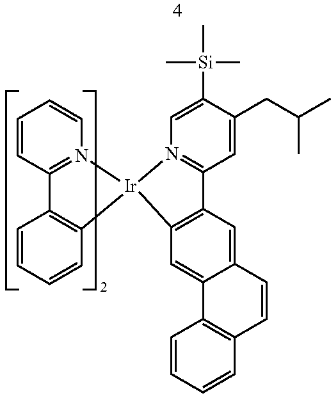 A | | | | |
| 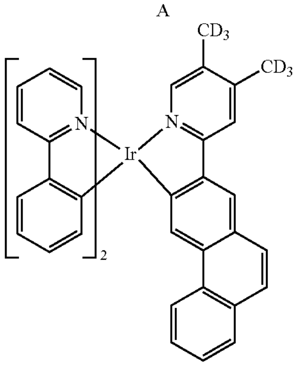 B | | | | |
| 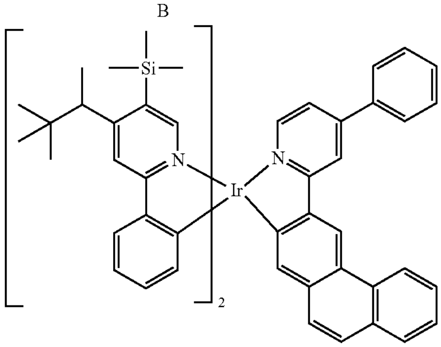 C | | | | |

Referring to Table 2, it has been shown that the organic light-emitting devices of Examples 1 to 4 have low driving voltage, narrow FWHM, and excellent characteristics in terms of external quantum efficiency. In addition, it can be seen that the organic light-emitting devices of Examples 1 to 4 have a lower driving voltage, a similar level of or narrower FWHM, higher current efficiency, and a similar level of or higher external quantum efficiency than the organic light-emitting devices of Comparative Examples 1 to 3.

The organometallic compounds have excellent electrical characteristics and thermal stability. The organometallic compounds have a high glass transition temperature so that crystallization thereof may be limited and electric mobility thereof may be improved. Accordingly, an electronic device using the organometallic compounds described herein, for example, an organic light-emitting device using the organometallic compounds described herein, has a low driving voltage, high efficiency, a long lifespan, reduced roll-off ratio, and a relatively narrow EL spectrum emission peak FWHM.

Thus, due to the use of the organometallic compounds as described herein, a high-quality organic light-emitting device may be provided. Such organometallic compounds as described herein have excellent phosphorescent luminescent characteristics, and thus, when used for a diagnostic composition, a diagnostic composition having a high diagnostic efficiency may be provided.

It should be understood that exemplary embodiments described herein should e considered in a descriptive sense only and not for purposes of limitation. Descriptions of features or aspects within each exemplary embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$M_1(Ln_1)_{n1}(Ln_2)_{n2} \qquad \text{Formula 1}$$

wherein, in Formula 1, $M_1$ is a transition metal, $Ln_1$ is a ligand represented by Formula 1A, $Ln_2$ is a ligand represented by Formula 1B, n1 is 0, 1, or 2, and n2 is 1, 2, or 3, Formula 1A

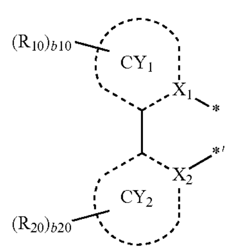

-continued

Formula 1B

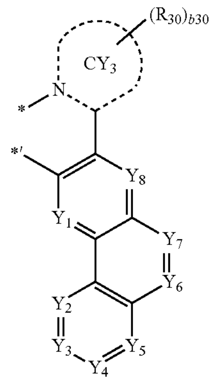

wherein, in Formulae 1A and 1B, $X_1$ is C or N, and $X_2$ is C or N, $Y_1$ is $C(R_{41})$ or N, $Y_2$ is $C(R_{42})$ or N, $Y_3$ is $C(R_{43})$ or N, $Y_4$ is $C(R_{44})$ or N, $Y_5$ is $C(R_{45})$ or N, $Y_6$ is $C(R_{46})$ or N, $Y_7$ is $C(R_{47})$ or N, $Y_8$ is $C(R_{48})$ or N, $CY_1$ and $CY_2$ are each independently a $C_5$-$C_{30}$ carbocyclic group or a $C_1$-$C_{30}$ heterocyclic group, $CY_3$ is a $C_1$-$C_{30}$ heterocyclic group comprising nitrogen, $R_{10}$, $R_{20}$, and $R_{41}$ to $R_{48}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—Ge(Q_1)(Q_2)(Q_3)$, $—N(Q_4)(Q_5)$, $—B(Q_6)(Q_7)$, $—P(Q_8)(Q_9)$, or $—P(=O)(Q_8)(Q_9)$, $R_{30}$ is hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_3$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $—Ge(Q_1)(Q_2)(Q_3)$, $—N(Q_4)(Q_5)$, $—B(Q_6)(Q_7)$, $—P(Q_8)(Q_9)$, or $—P(=O)(Q_8)(Q_9)$, two or more of a plurality of $R_{10}$(s) are optionally linked to each other to form a substituted or unsubstituted $C_5$-$C_{30}$ carbocyclic group or a substituted or unsubstituted $C_1$-$C_{30}$ heterocyclic group, two or more of a plurality of $R_{20}$(s) are optionally linked to each other to form a substituted or unsubstituted $C_5$-$C_{30}$ carbocyclic group or a substituted or unsubstituted $C_1$-$C_{30}$ heterocyclic group, two or more of a plurality of $R_{30}$(s) are optionally linked to each other to form a substituted or unsubstituted $C_5$-$C_{30}$ carbocyclic group or a substituted or unsubstituted $C_1$-$C_{30}$ heterocyclic group, two or more neighboring substituents of $R_{10}$, $R_{20}$, $R_{30}$, and $R_{41}$ to $R_{48}$ are optionally linked to each other to form a substituted or unsubstituted $C_5$-$C_{30}$ carbocyclic group or a substituted or unsubstituted $C_1$-$C_{30}$ heterocyclic group, b10, b20, and b30 are each independently 1, 2, 3, 4, 5, 6, 7, 8, 9, or 10, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_8$-$C_{60}$ aryl alkyl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_3$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), —B($Q_{16}$)($Q_{17}$), —P($Q_8$)($Q_9$), or —P(═O)($Q_{18}$)($Q_{19}$), a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with one or more of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P($Q_{28}$)($Q_{29}$), or —P(═O)($Q_{28}$)($Q_{29}$); or —Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), —P($Q_{38}$)($Q_{39}$), or —P(═O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group, and wherein * and *' each indicate a binding site to $M_1$.

2. The organometallic compound of claim 1, wherein $M_1$ is iridium (Ir), platinum (Pt), osmium (Os), titanium (Ti), zirconium (Zr), hafnium (Hf), europium (Eu), terbium (Tb), thulium (Tm), or rhodium (Rh).

3. The organometallic compound of claim 1, wherein $M_1$ is Ir, and the sum of n1 and n2 is 3.

4. The organometallic compound of claim 1, wherein $CY_1$ and $CY_2$ are each independently:

a substituted or unsubstituted cyclopentane group, a substituted or unsubstituted cyclohexane group, a substituted or unsubstituted cycloheptane group, a substituted or unsubstituted cyclopentene group, a substituted or unsubstituted cyclohexene group, a substituted or unsubstituted cycloheptene group, a substituted or unsubstituted phenyl group, a substituted or unsubstituted naphthalene group, a substituted or unsubstituted 1,2,3,4-tetrahydronaphthalene group, a substituted or unsubstituted anthracene group, a substituted or unsubstituted phenanthrene group, a substituted or unsubstituted triphenylene group, a substituted or unsubstituted pyrene group, a substituted or unsubstituted chrysene group, a substituted or unsubstituted cyclopentadiene group, a substituted or unsubstituted thiophene group, a substituted or unsubstituted furan group, a substituted or unsubstituted indole group, a substituted or unsubstituted benzoborole group, a substituted or unsubstituted benzophosphole group, a substituted or unsubstituted indene group, a substituted or unsubstituted benzosilole group, a substituted or unsubstituted benzogermole group, a substituted or unsubstituted benzothiophene group, a substituted or unsubstituted benzoselenophene group, a substituted or unsubstituted benzofuran group, a substituted or unsubstituted carbazole group, a substituted or unsubstituted dibenzoborole group, a substituted or unsubstituted dibenzophosphole group, a substituted or unsubstituted fluorene group, a substituted or unsubstituted dibenzosilole group, a substituted or unsubstituted dibenzogermole group, a substituted or unsubstituted dibenzothiophene group, substituted or unsubstituted a dibenzoselenophene group, a substituted or unsubstituted dibenzofuran group, a substituted or unsubstituted dibenzothiophene 5-oxide group, a substituted or unsubstituted 9H-fluoren-9-one group, a substituted or unsubstituted dibenzothiophene 5,5-dioxide group, a substituted or unsubstituted azaindole group, a substituted or unsubstituted azabenzoborole group, a substituted or unsubstituted azabenzophosphole group, a substituted or unsubstituted azaindene group, a substituted or unsubstituted azabenzosilole group, a substituted or unsubstituted azabenzogermole group, a substituted or unsubstituted azabenzothiophene group, a substituted or unsubstituted azabenzoselenophene group, a substituted or unsubstituted azabenzofuran group, a substituted or unsubstituted azacarbazole group, a substituted or unsubstituted azadibenzoborole group, a substituted or unsubstituted azadibenzophosphole group, a substituted or unsubstituted azafluorene group, a substituted or unsubstituted azadibenzosilole group, a substituted or unsubstituted azadibenzogermole group, a substituted or unsubstituted azadibenzothiophene group, a substituted or unsubstituted azadibenzoselenophene group, a substituted or unsubstituted azadibenzofuran group, a substituted or unsubstituted azadibenzothiophene 5-oxide group, a substituted or unsubstituted aza-9H-fluoren-9-one group, a substituted or unsubstituted azadibenzothiophene 5,5-dioxide group, a substituted or unsubstituted pyridine group, a substituted or unsubstituted pyrimidine group, a substituted or unsubstituted pyrazine group, a substituted or unsubstituted pyridazine group, a substituted or unsubstituted triazine group, a substituted or unsubstituted quinoline group, a substituted or unsubstituted isoquinoline group, a substituted or unsubstituted quinoxaline group, a substituted or unsubstituted quinazoline group, a substituted or unsubstituted phenanthroline group, a substituted or unsubstituted pyrrole group, a substituted or unsubstituted pyrazole group, a substituted or unsubstituted imidazole group, a substituted or unsubstituted triazole group, a substituted or unsubstituted oxazole group, a substituted or unsubstituted isoxazole group, a substituted or unsubstituted thiazole group, a substituted or unsubstituted isothiazole group, a substituted or unsubstituted oxadiazole group, a substituted or unsubstituted thiadiazole group, a substituted or unsubstituted benzopyrazole group, a substituted or unsubstituted benzimidazole group, a substituted or unsubstituted benzoxazole group, a substituted or unsubstituted benzothiazole group, a substituted or unsubstituted benzoxadiazole group, a substituted or unsubstituted benzothiadiazole group, a substituted or unsubstituted 5,6,7,8-tetrahydroisoquinoline group, or a substituted or unsubstituted 5,6,7,8-tetrahydroquinoline group; or a group represented by Formula 8-1 or 8-2:

Formula 8-1

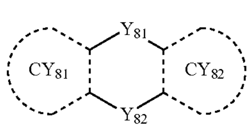

-continued

Formula 8-2

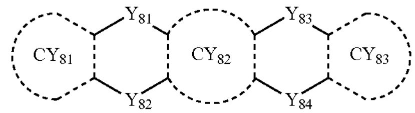

wherein, in Formulae 8-1 and 8-2, $Y_{81}$ to $Y_{84}$ are each independently a single bond, O, S, $N(R_{81})$, $C(R_{81})(R_{82})$, $Si(R_{81})(R_{82})$, C(=O), S(=O), $S(=O)_2$, $B(R_{81})$, $P(R_{81})$, or $P(=O)(R_{81})$, $CY_{81}$ to $CY_{83}$ are each independently a substituted or unsubstituted phenyl group, a substituted or unsubstituted naphthalene group, a substituted or unsubstituted 1,2,3,4-tetrahydronaphthalene group, a substituted or unsubstituted phenanthrene group, a substituted or unsubstituted pyridine group, a substituted or unsubstituted pyrimidine group, a substituted or unsubstituted pyrazine group, a substituted or unsubstituted triazine group, a substituted or unsubstituted quinoline group, a substituted or unsubstituted isoquinoline group, a substituted or unsubstituted quinoxaline group, a substituted or unsubstituted quinazoline group, a substituted or unsubstituted phenanthroline group, a substituted or unsubstituted benzofuran group, a substituted or unsubstituted benzothiophene group, a substituted or unsubstituted fluorene group, a substituted or unsubstituted carbazole group, a substituted or unsubstituted dibenzofuran group, a substituted or unsubstituted dibenzothiophene group, a substituted or unsubstituted dibenzosilole group, a substituted or unsubstituted azafluorene group, a substituted or unsubstituted azacarbazole group, a substituted or unsubstituted azadibenzofuran group, a substituted or unsubstituted azadibenzothiophene group, or a substituted or unsubstituted azadibenzosilole group, and $R_{81}$ and $R_{82}$ are each independently as described in connection with $R_{10}$ and $R_{20}$ in claim 1.

5. The organometallic compound of claim 1, wherein $CY_3$ is a substituted or unsubstituted pyridine group, a substituted or unsubstituted pyrimidine group, a substituted or unsubstituted pyrazine group, a substituted or unsubstituted triazine group, a substituted or unsubstituted quinoline group, a substituted or unsubstituted isoquinoline group, a substituted or unsubstituted quinoxaline group, or a substituted or unsubstituted quinazoline group.

6. The organometallic compound of claim 1, wherein $R_{10}$, $R_{20}$, and $R_{41}$ to $R_{48}$ are each independently: hydrogen, deuterium, —F, —Cl, —Br, —I, $—CD_3$, $—CD_2H$, $—CDH_2$, $—CF_3$, $—CF_2H$, $—CFH_2$, a $C_1$-$C_{60}$ alkyl group, a $C_2$-$C_{60}$ alkenyl group, a $C_2$-$C_{60}$ alkynyl group, a $C_1$-$C_{60}$ alkoxy group, $—Si(Q_1)(Q_2)(Q_3)$, or $—Ge(Q_1)(Q_2)(Q_3)$, or a group represented by one of Formulae 9-1 to 9-61, 9-201 to 9-237, 10-1 to 10-141, or 10-201 to 10-350:

9-1

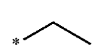

9-2

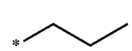

9-3

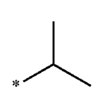

-continued
9-4
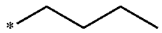
9-5
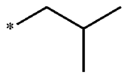
9-6
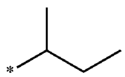
9-7
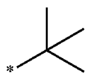
9-8
9-9
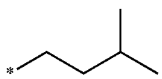
9-10
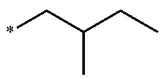
9-11
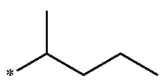
9-12
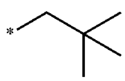
9-13
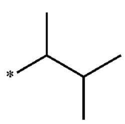
9-14
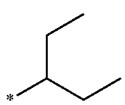
9-15
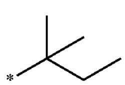
9-16
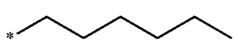
9-17
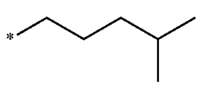
9-18
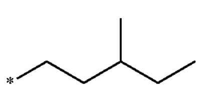
9-19
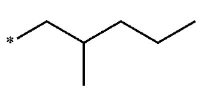
9-20
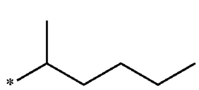
9-21
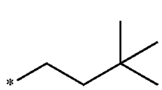
-continued
9-22
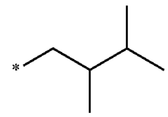
9-23
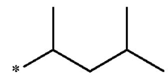
9-24
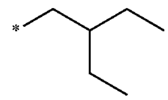
9-25
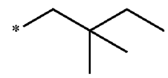
9-26
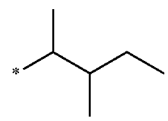
9-27
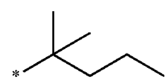
9-28
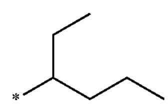
9-29
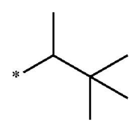
9-30
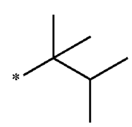
9-31
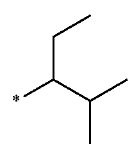
9-32
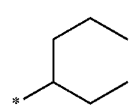
9-33
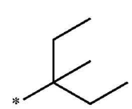
9-34
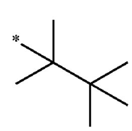

9-35
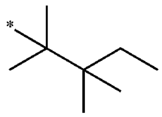
9-36
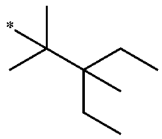
9-37
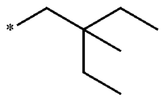
9-38
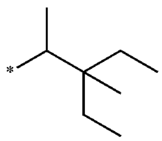
9-39
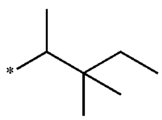
9-40
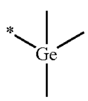
9-41
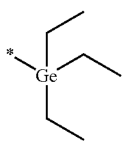
9-42
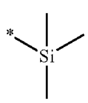
9-43
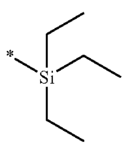
9-44
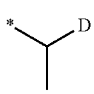
9-45
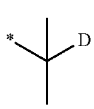
9-46
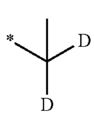
9-47
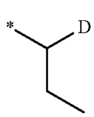
9-48
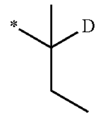
9-49
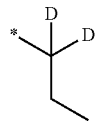
9-50
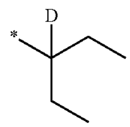
9-51
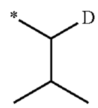
9-52
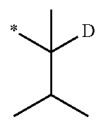
9-53
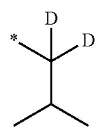
9-54
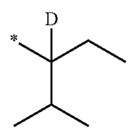
9-55
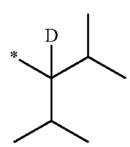
9-56
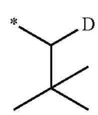
9-57
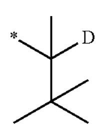
9-58
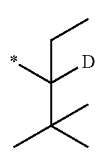
9-59
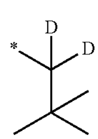

-continued
9-60
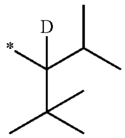
9-61
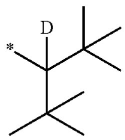
9-201
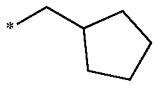
9-202
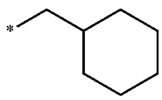
9-203
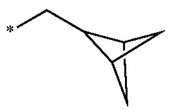
9-204
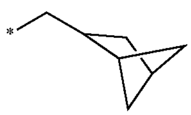
9-205
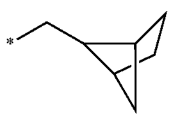
9-206
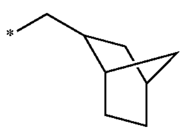
9-207
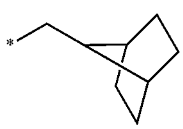
9-208
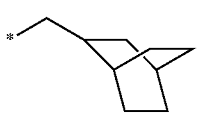
9-209
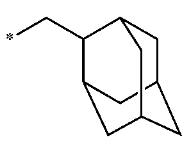
9-210
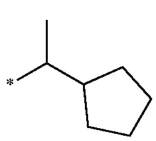
-continued
9-211
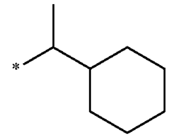
9-212
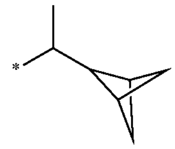
9-213
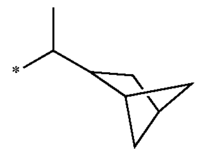
9-214
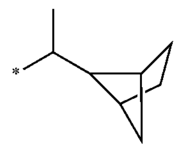
9-215
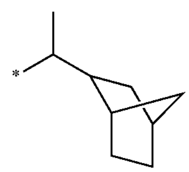
9-216
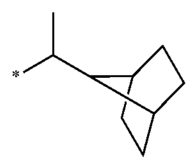
9-217
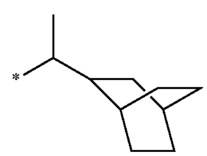
9-218
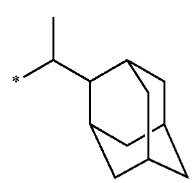
9-219
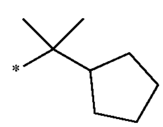
9-220
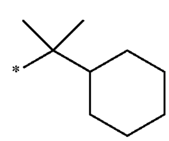

-continued
9-221
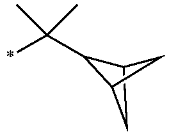
9-222
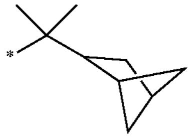
9-223
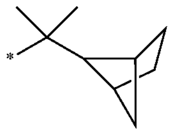
9-224
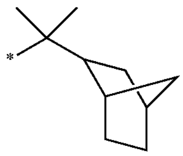
9-225
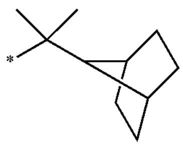
9-226
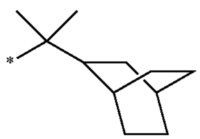
9-227
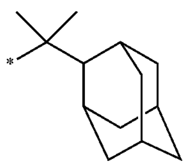
9-228
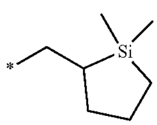
9-229
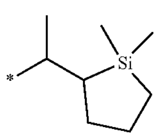
9-230
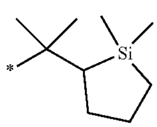
9-231
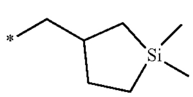
-continued
9-232
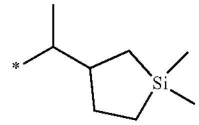
9-233
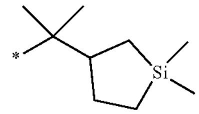
9-234
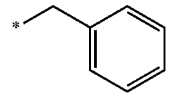
9-235
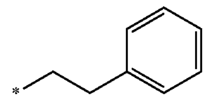
9-236
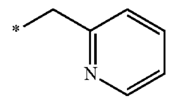
9-237
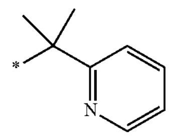
10-1
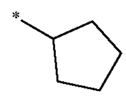
10-2
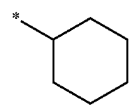
10-3
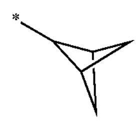
10-4
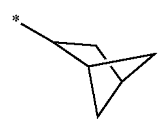
10-5
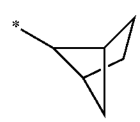
10-6
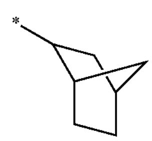
10-7
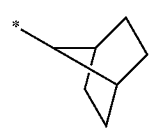

-continued
10-8
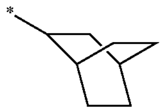
10-9
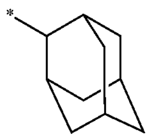
10-10
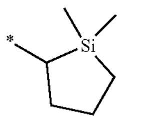
10-11
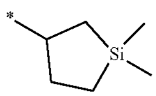
10-12
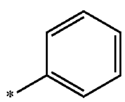
10-13
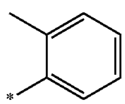
10-14
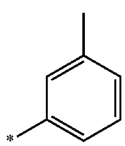
10-15
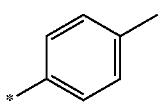
10-16
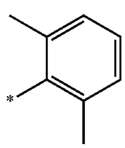
10-17
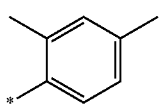
10-18
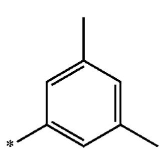
10-19
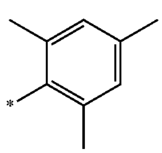
-continued
10-20
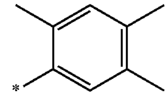
10-21
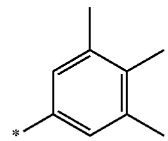
10-22
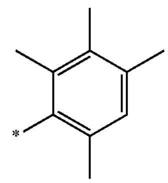
10-23
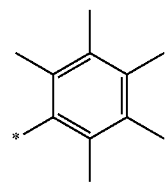
10-24
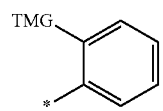
10-25
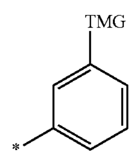
10-26
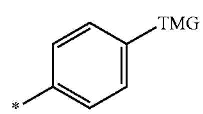
10-27
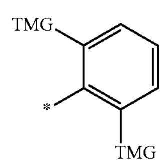
10-28
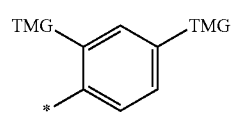
10-29
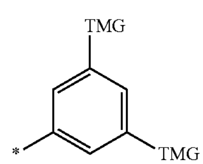
10-30
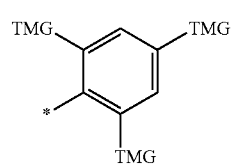

-continued
10-31
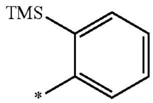
10-32
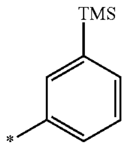
10-33
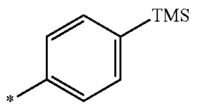
10-34
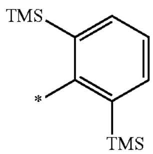
10-35
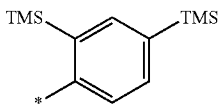
10-36
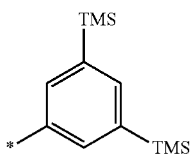
10-37
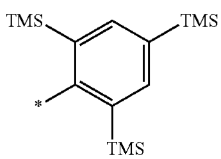
10-38
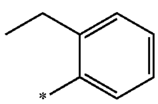
10-39
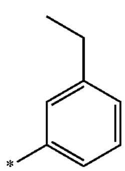
10-40
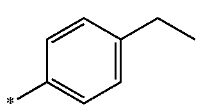
10-41
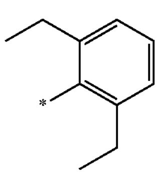
-continued
10-42
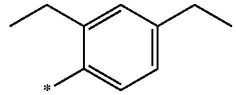
10-43
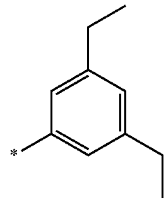
10-44
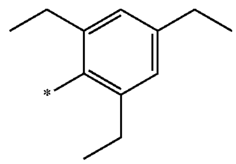
10-45
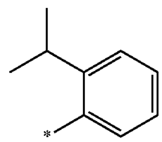
10-46
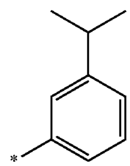
10-47
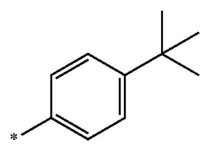
10-48
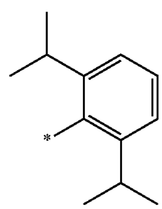
10-49
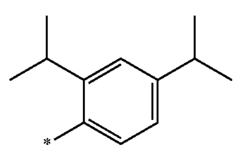
10-50
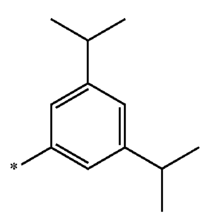

-continued
10-51
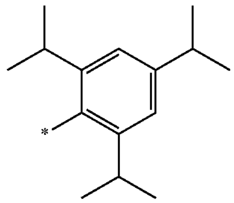
10-52
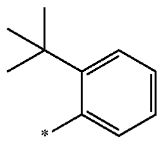
10-53
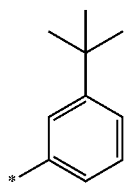
10-54
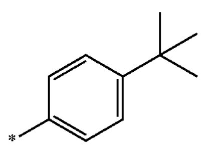
10-55
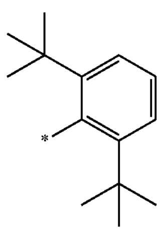
10-56
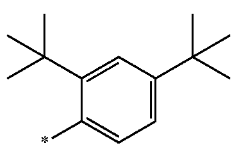
10-57
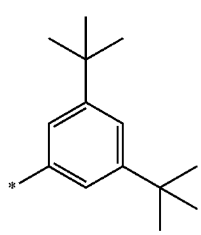
10-58
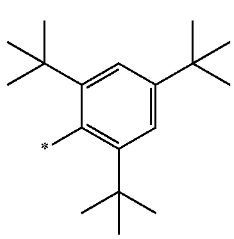
-continued
10-59
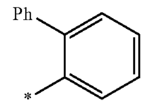
10-60
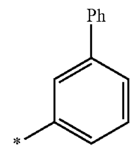
10-61
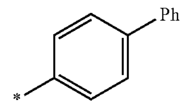
10-62
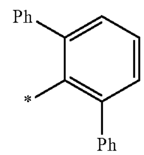
10-63
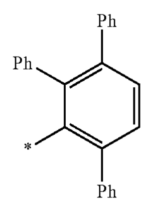
10-64
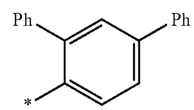
10-65
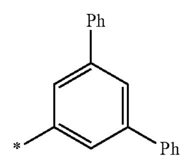
10-66
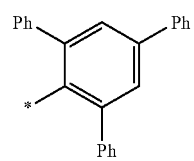
10-67
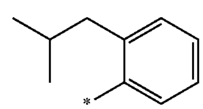
10-68
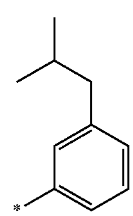
10-69
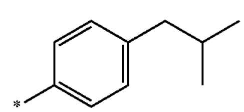

-continued
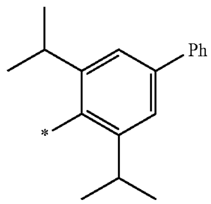
10-70
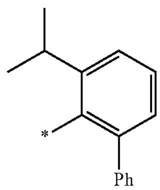
10-71
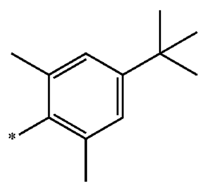
10-72
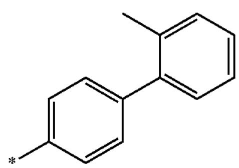
10-73
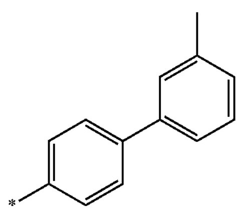
10-74
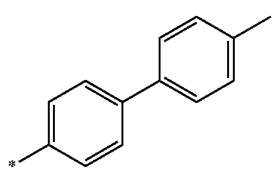
10-75
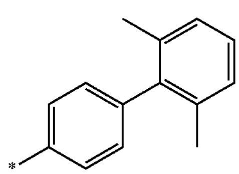
10-76
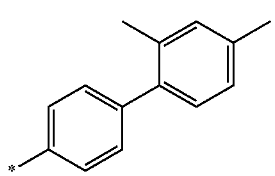
10-77
-continued
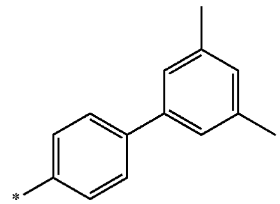
10-78
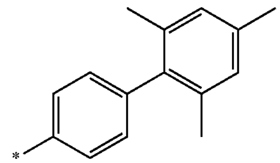
10-79
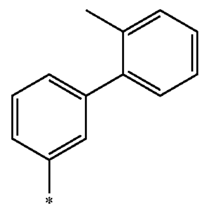
10-80
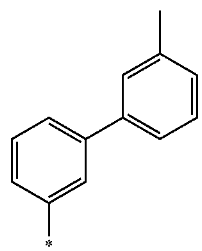
10-81
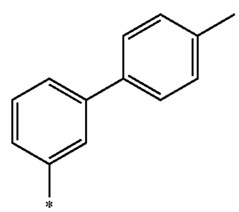
10-82
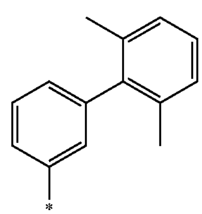
10-83
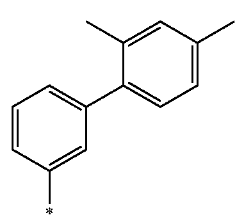
10-84

-continued
10-85
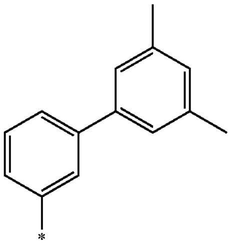
10-86
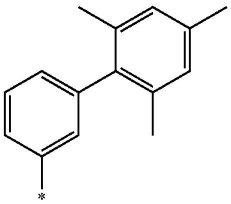
10-87
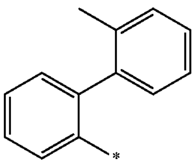
10-88
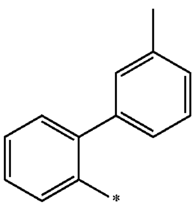
10-89
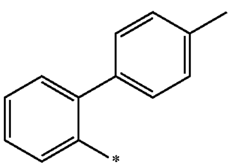
10-90
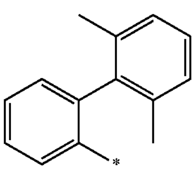
10-91
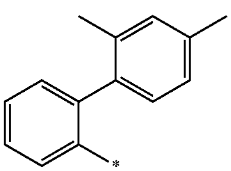
10-92
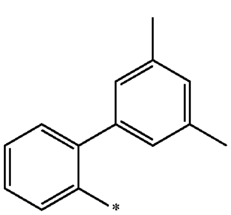
-continued
10-93
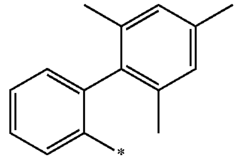
10-94
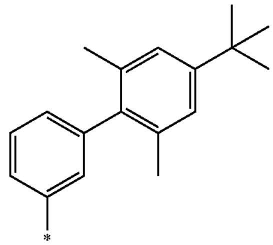
10-95
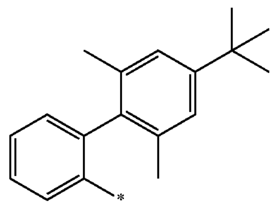
10-96
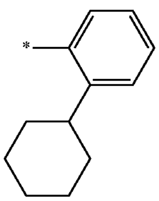
10-97
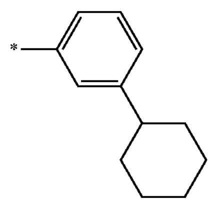
10-98
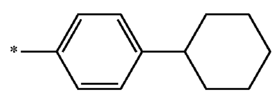
10-99
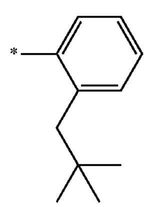
10-100
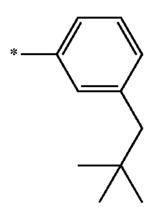

-continued
10-101
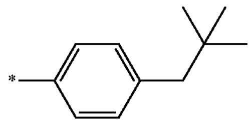
10-102
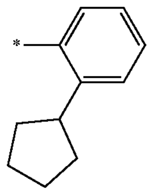
10-103
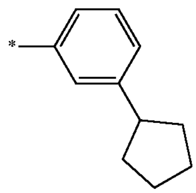
10-104
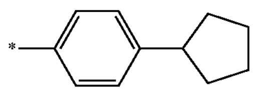
10-105
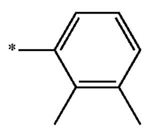
10-106
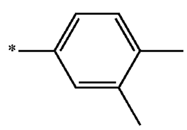
10-107
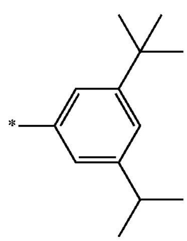
10-108
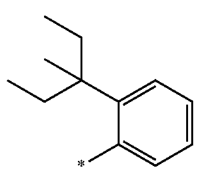
10-109
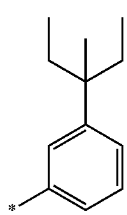
10-110
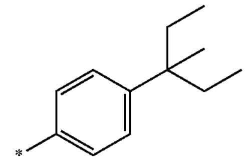
10-111
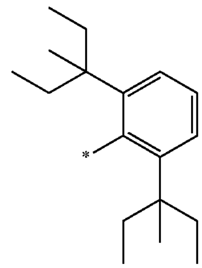
10-112
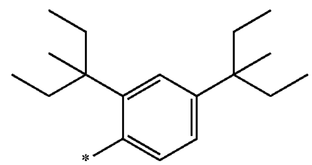
10-113
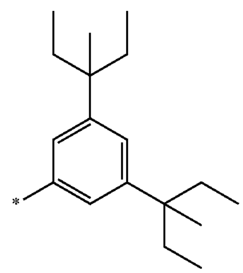
10-114
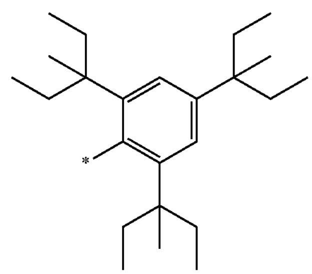
10-115
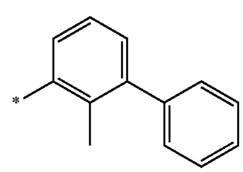
10-116
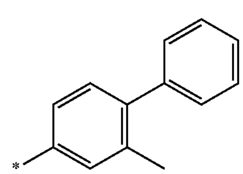

-continued
10-117
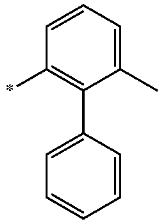
10-118
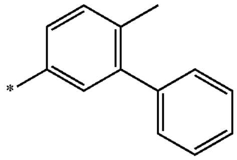
10-119
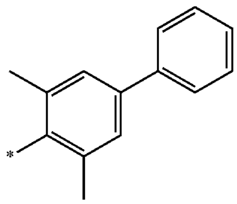
10-120
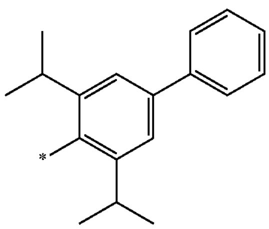
10-121
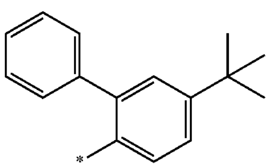
10-122
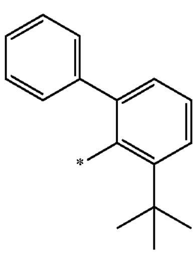
10-123
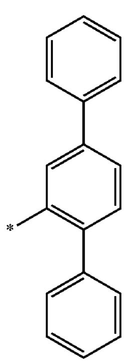
-continued
10-124
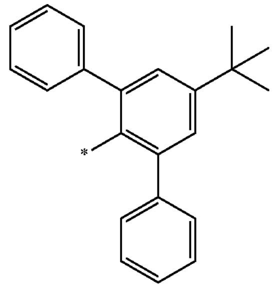
10-125
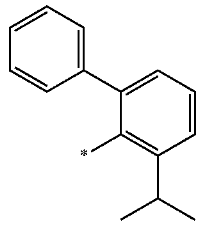
10-126
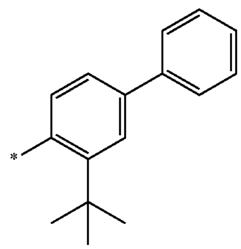
10-127
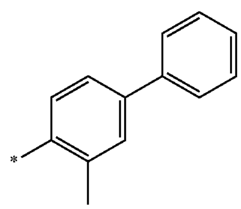
10-128
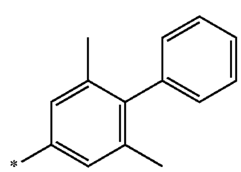
10-129
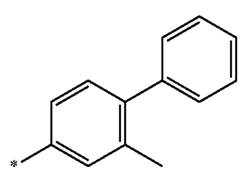
10-130
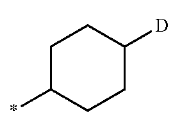
10-131
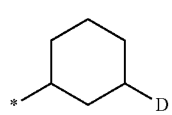

-continued
10-132
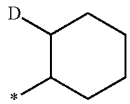
10-133
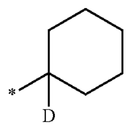
10-134
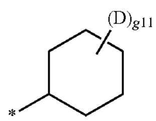
10-135
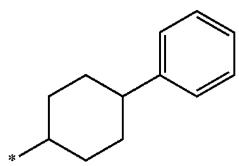
10-136
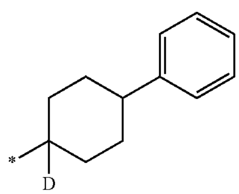
10-137
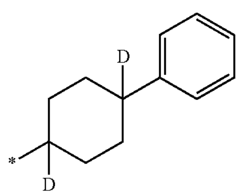
10-138
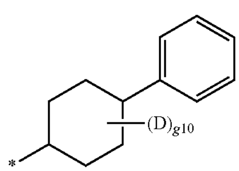
10-139
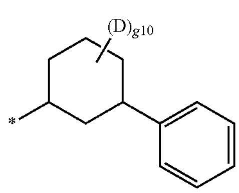
10-140
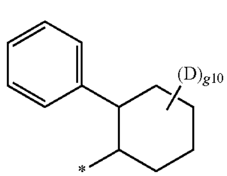
10-141
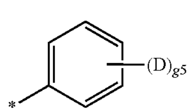
-continued
10-201
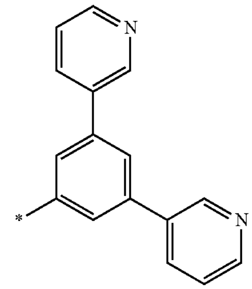
10-202
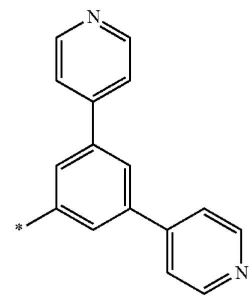
10-203
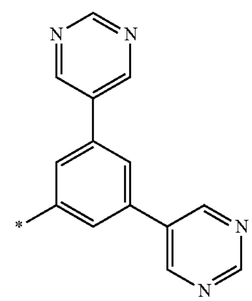
10-204
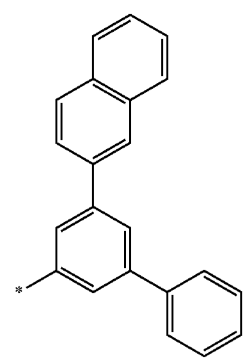
10-205
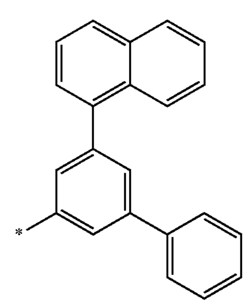

10-206
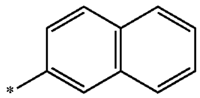
10-207
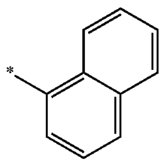
10-208
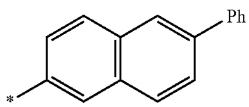
10-209
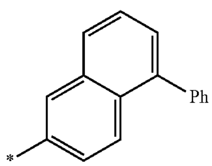
10-210
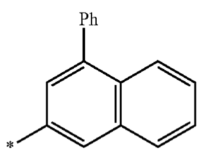
10-211
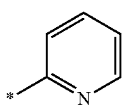
10-212
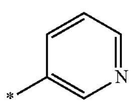
10-213
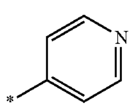
10-214
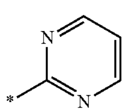
10-215
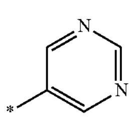
10-216
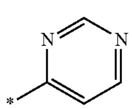
10-217
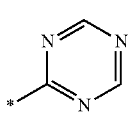
10-218
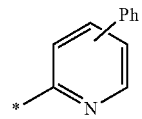
10-219
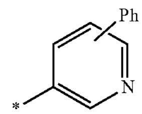
10-220
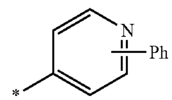
10-221
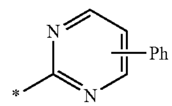
10-222
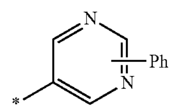
10-223
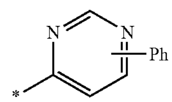
10-224
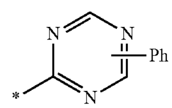
10-225
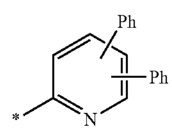
10-226
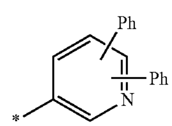
10-227
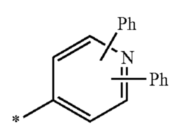
10-228
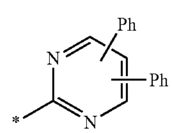
10-229
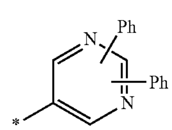
10-230
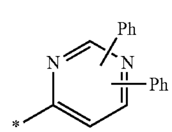

10-231
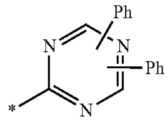
10-232
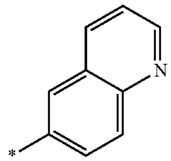
10-233
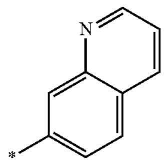
10-234
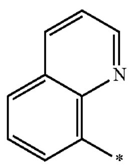
10-235
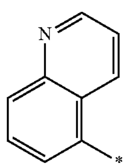
10-236
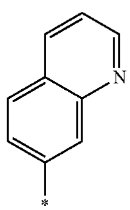
10-237
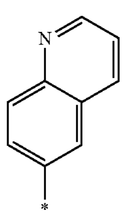
10-238
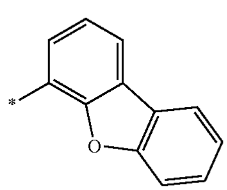
10-239
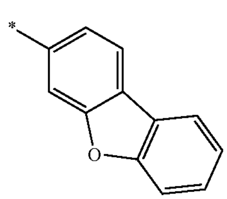
10-240
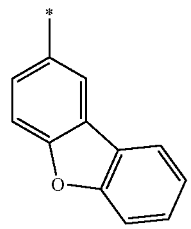
10-241
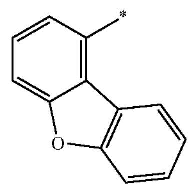
10-242
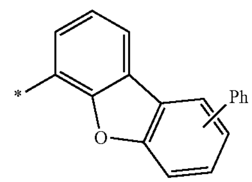
10-243
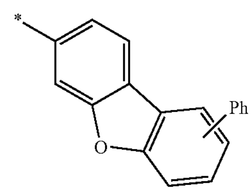
10-244
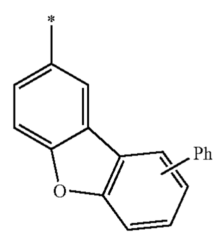
10-245
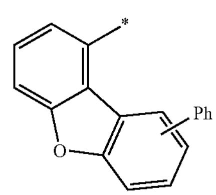
10-246
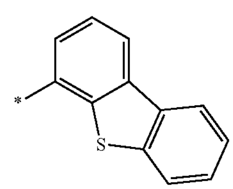
10-247
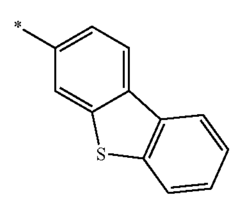

-continued
10-248
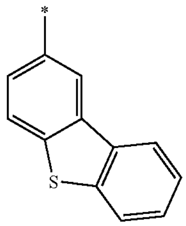
10-249
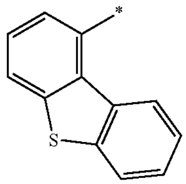
10-250
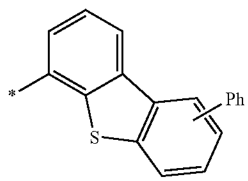
10-251
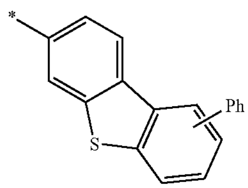
10-252
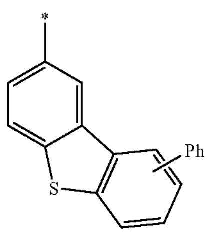
10-253
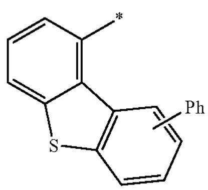
10-254
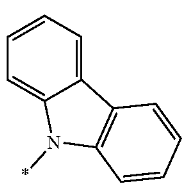
10-255
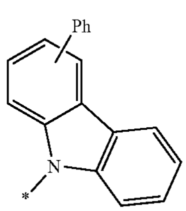
-continued
10-256
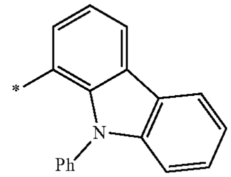
10-257
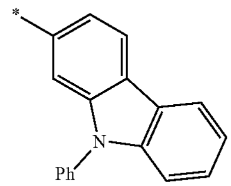
10-258
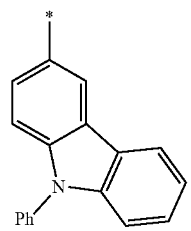
10-259
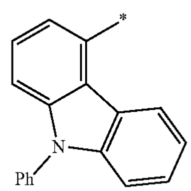
10-260
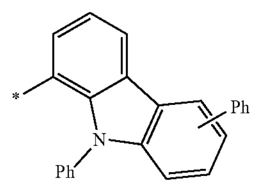
10-261
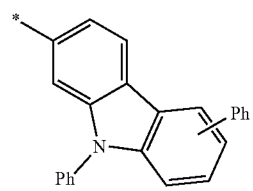
10-262
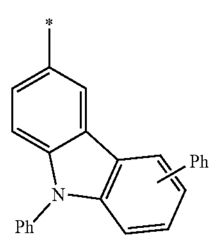
10-263
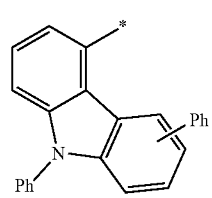

-continued
10-264
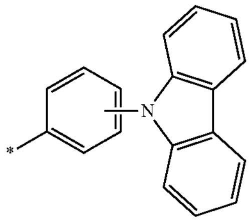
10-265
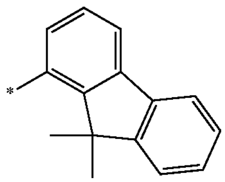
10-266
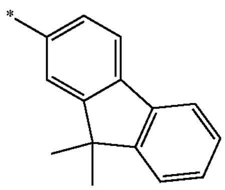
10-267
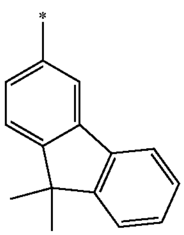
10-268
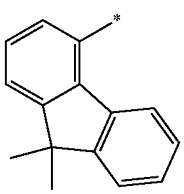
10-269
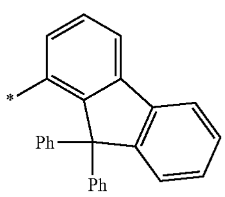
10-270
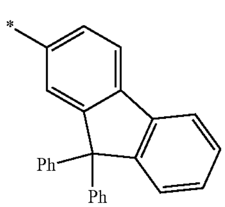
-continued
10-271
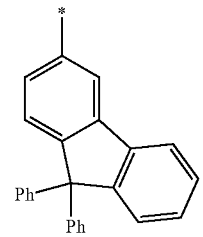
10-272
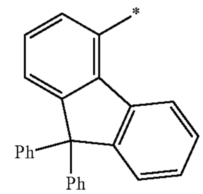
10-273
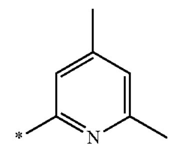
10-274
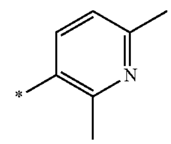
10-275
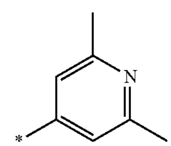
10-276
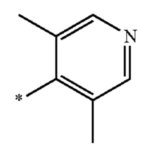
10-277
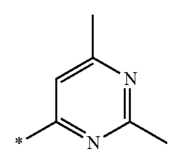
10-278
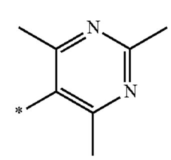
10-279
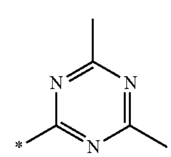

-continued
10-280
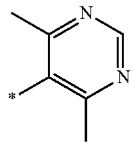
10-281
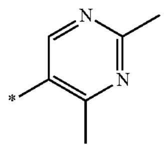
10-282
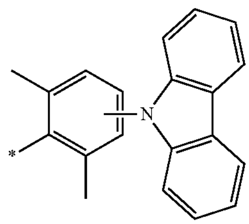
10-283
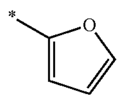
10-284
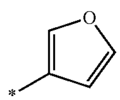
10-285
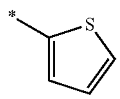
10-286
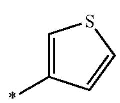
10-287
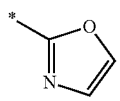
10-288
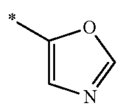
10-289
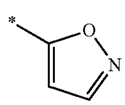
10-290
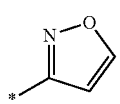
10-291
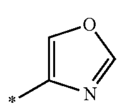
10-292
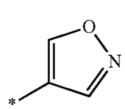
-continued
10-293
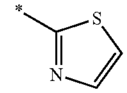
10-294
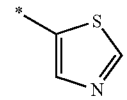
10-295
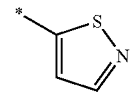
10-296
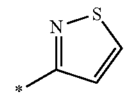
10-297
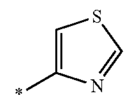
10-298
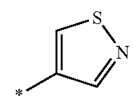
10-299
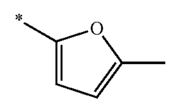
10-300
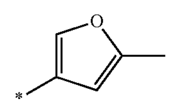
10-301
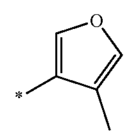
10-302
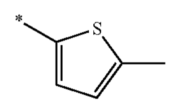
10-303
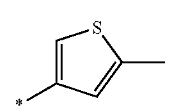
10-304
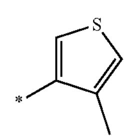
10-305
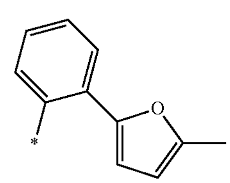

-continued
10-306
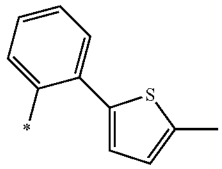
10-307
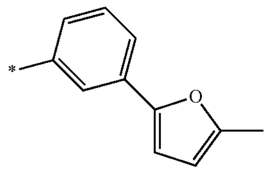
10-308
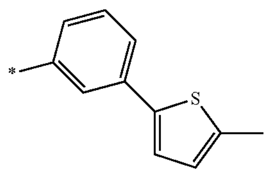
10-309
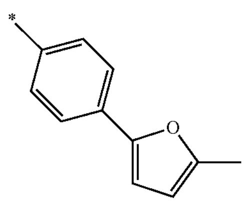
10-310
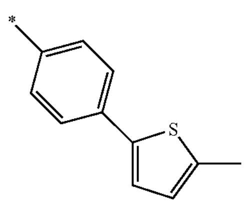
10-311
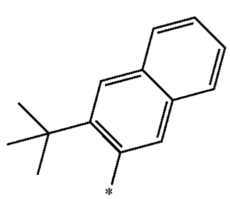
10-312
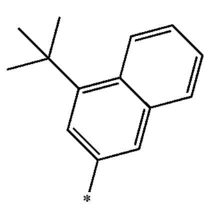
10-313
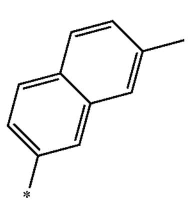
-continued
10-314
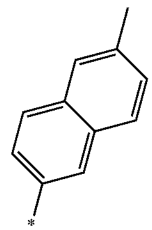
10-315
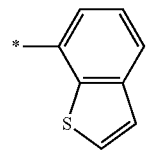
10-316
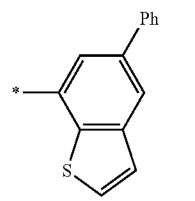
10-317
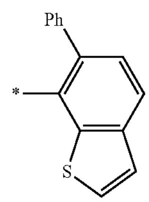
10-318
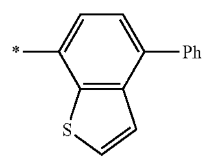
10-319
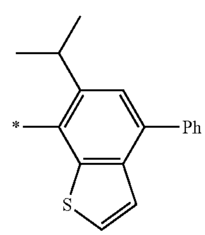
10-320
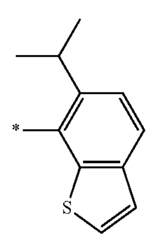

-continued
10-321
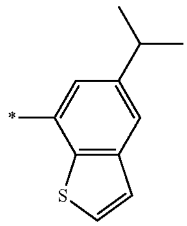
10-322
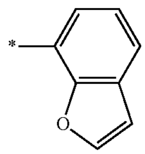
10-323
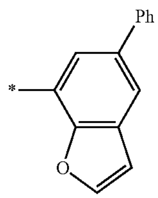
10-324
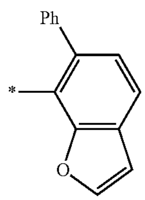
10-325
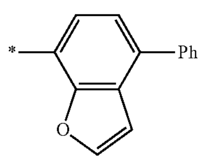
10-326
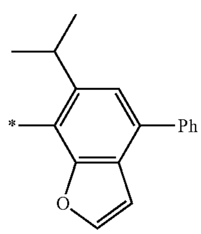
10-327
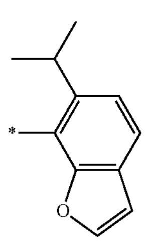
-continued
10-328
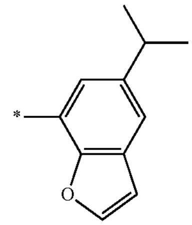
10-329
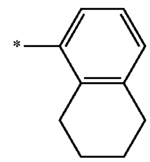
10-330
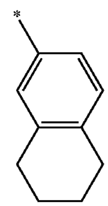
10-331
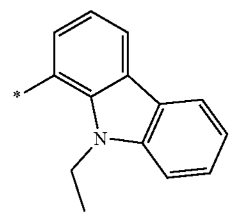
10-332
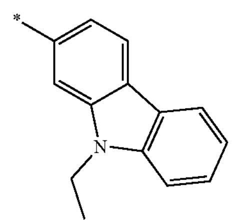
10-333
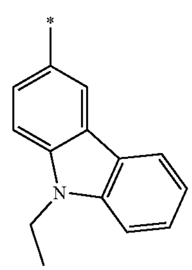
10-334
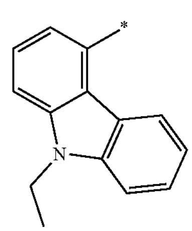

-continued 10-335

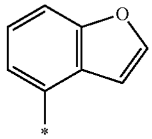

10-336

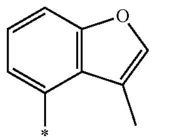

10-337

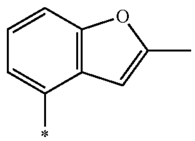

10-338

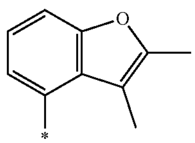

10-339

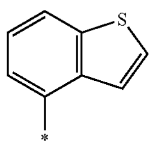

10-340

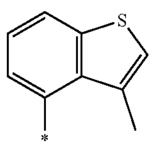

10-341

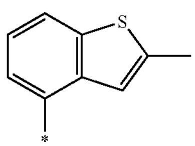

10-342

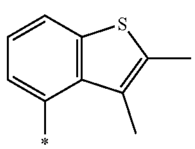

10-343

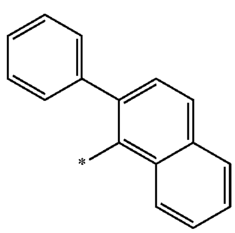

10-344

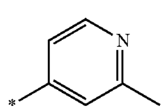

-continued 10-345

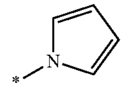

10-346

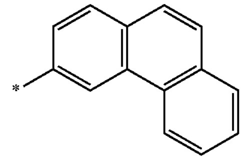

10-347

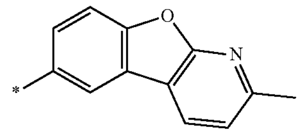

10-348

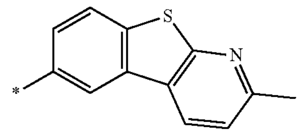

10-349

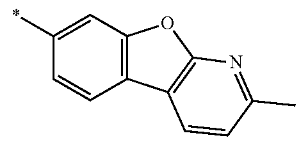

10-350

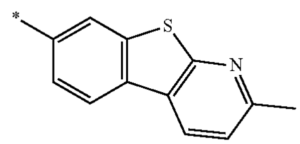

wherein, in Formulae 9-1 to 9-61, 9-201 to 9-237, 10-1 to 10-141, or 10-201 to 10-350,

* indicates a binding site to a neighboring atom,

Ph is a phenyl group,

TMS is a trimethylsilyl group,

TMG is a trimethylgermyl group, g5 is an integer from 1 to 5, g10 is an integer from 1 to 10, and g11 is an integer from 2 to 11.

7. The organometallic compound of claim 1, wherein $R_{30}$ is hydrogen, deuterium, —F, —Cl, —Br, —I, a $C_2$-$C_{60}$ alkyl group, a $C_2$-$C_{60}$ alkenyl group, a $C_2$-$C_{60}$ alkynyl group, a $C_1$-$C_{60}$ alkoxy group, or —Ge($Q_1$)($Q_2$)($Q_3$), or a group represented by one of Formulae 9-1 to 9-61, 9-201 to 9-237, 10-1 to 10-141, or 10-201 to 10-350:

9-1

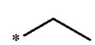

9-2

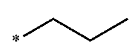

9-3

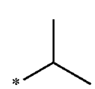

9-4

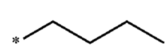

9-5
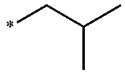
9-6
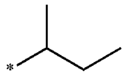
9-7
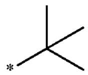
9-8
9-9
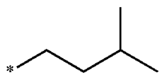
9-10
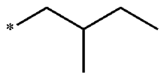
9-11
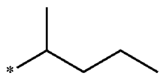
9-12
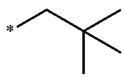
9-13
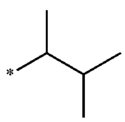
9-14
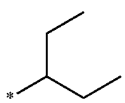
9-15
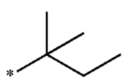
9-16
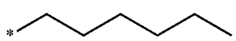
9-17
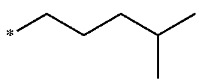
9-18
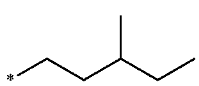
9-19
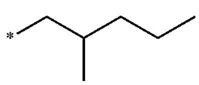
9-20
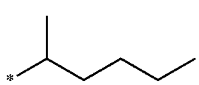
9-21
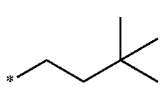
9-22
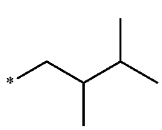
9-23
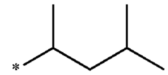
9-24
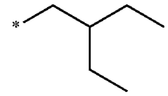
9-25
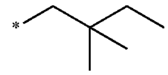
9-26
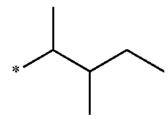
9-27
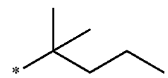
9-28
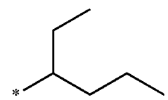
9-29
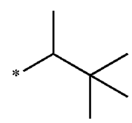
9-30
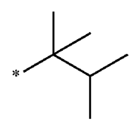
9-31
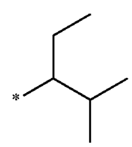
9-32
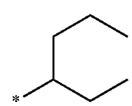
9-33
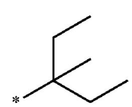
9-34
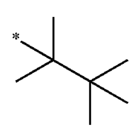
9-35
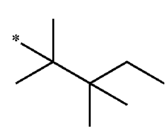

9-36
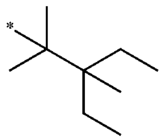
9-37
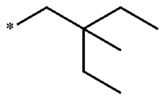
9-38
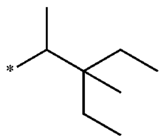
9-39
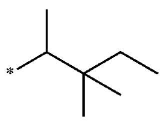
9-40
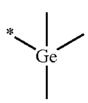
9-41
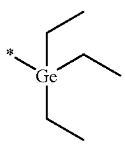
9-44
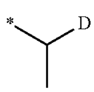
9-45
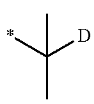
9-46
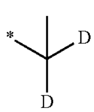
9-47
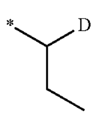
9-48
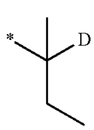
9-49
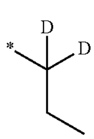
9-50
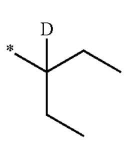
9-51
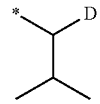
9-52
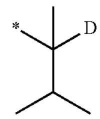
9-53
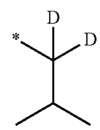
9-54
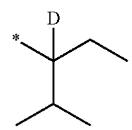
9-55
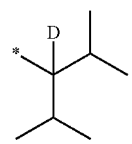
9-56
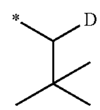
9-57
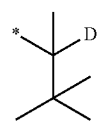
9-58
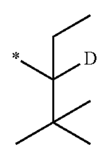
9-59
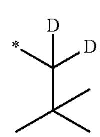
9-60
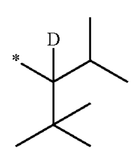
9-61
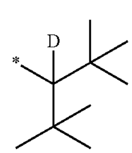
9-201
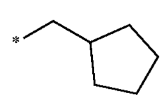

-continued
9-202
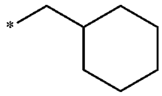
9-203
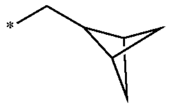
9-204
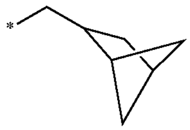
9-205
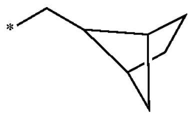
9-206
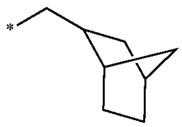
9-207
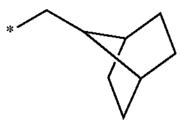
9-208
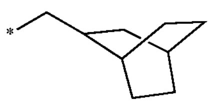
9-209
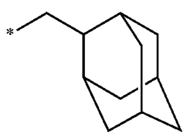
9-210
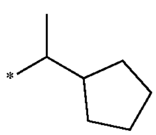
9-211
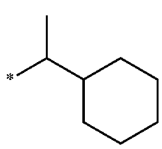
9-212
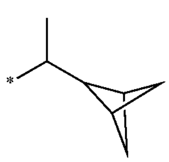
-continued
9-213
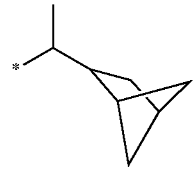
9-214
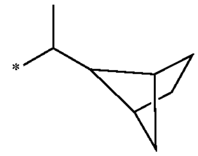
9-215
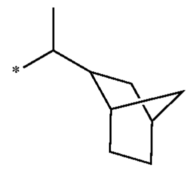
9-216
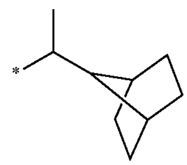
9-217
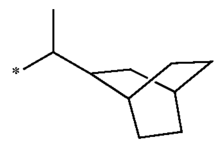
9-218
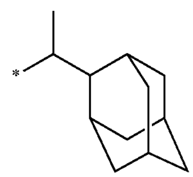
9-219
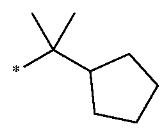
9-220
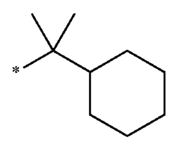
9-221
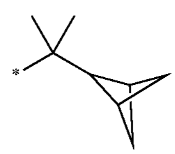
9-222
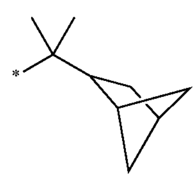

-continued
9-223
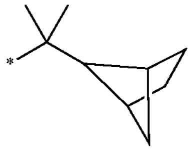
9-224
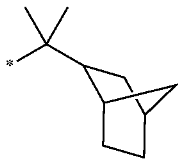
9-225
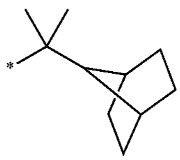
9-226
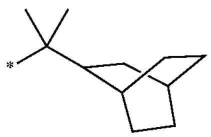
9-227
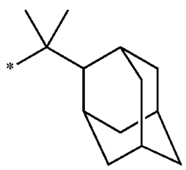
9-228
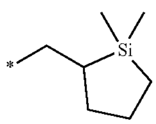
9-229
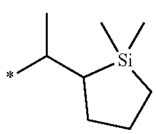
9-230
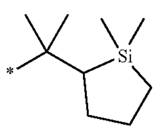
9-231
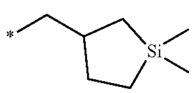
9-232
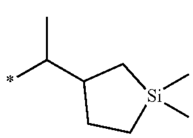
9-233
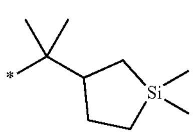
-continued
9-234
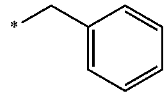
9-235
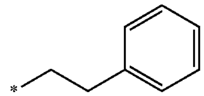
9-236
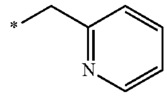
9-237
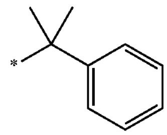
10-1
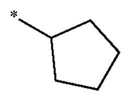
10-2
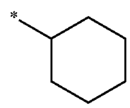
10-3
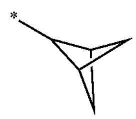
10-4
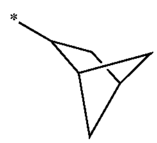
10-5
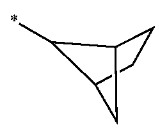
10-6
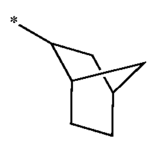
10-7
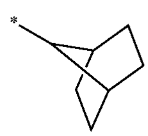
10-8
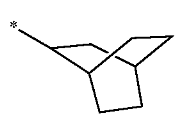

-continued
10-9
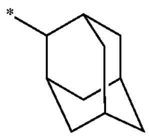
10-10
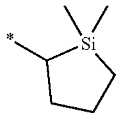
10-11
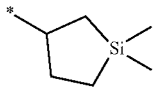
10-12
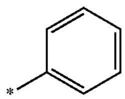
10-13
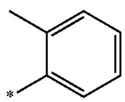
10-14
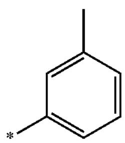
10-15
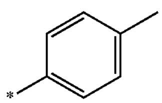
10-16
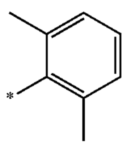
10-17
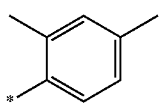
10-18
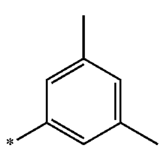
10-19
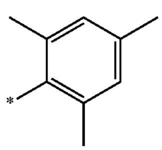
10-20
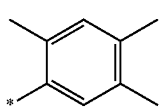
-continued
10-21
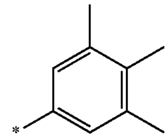
10-22
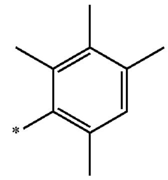
10-23
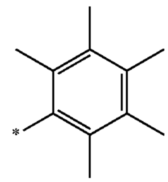
10-24
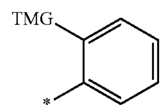
10-25
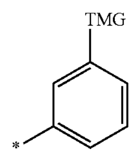
10-26
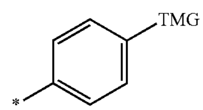
10-27
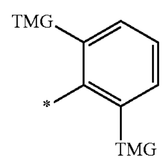
10-28
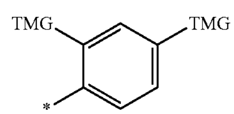
10-29
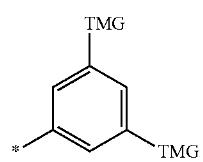
10-30
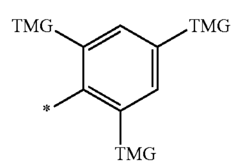
10-31
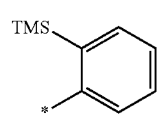

-continued
10-32
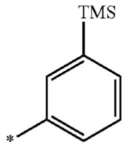
10-33
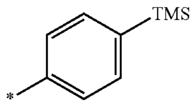
10-34
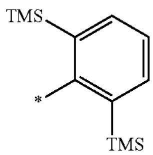
10-35
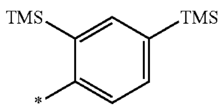
10-36
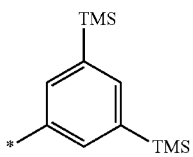
10-37
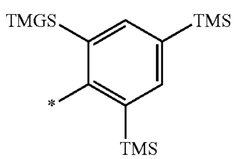
10-38
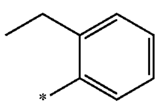
10-39
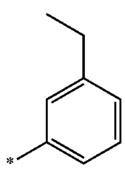
10-40
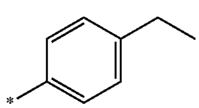
10-41
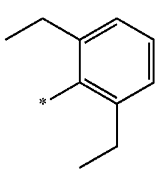
10-42
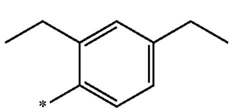
-continued
10-43
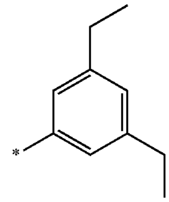
10-44
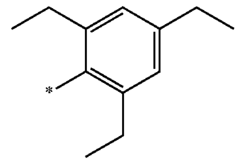
10-45
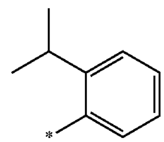
10-46
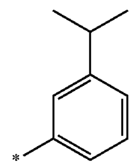
10-47
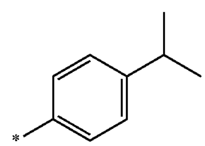
10-48
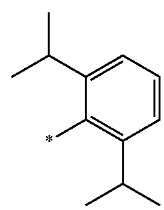
10-49
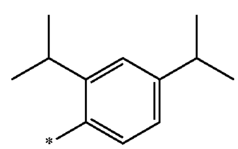
10-50
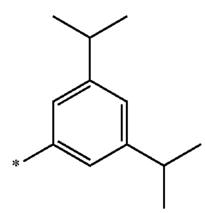
10-51
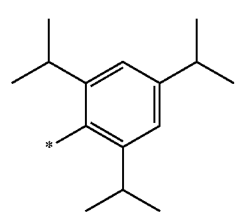

10-52
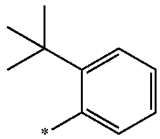
10-53
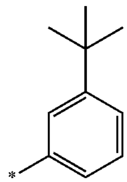
10-54
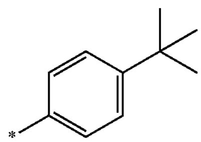
10-55
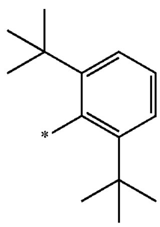
10-56
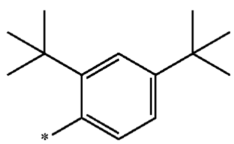
10-57
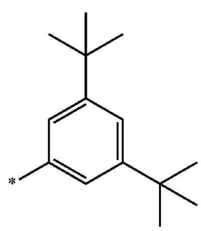
10-58
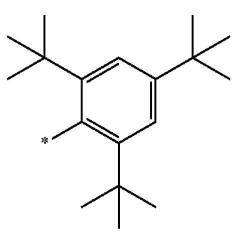
10-59
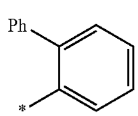
10-60
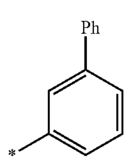
10-61
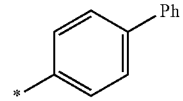
10-62
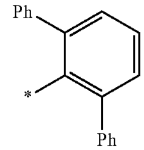
10-63
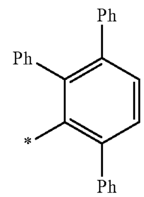
10-64
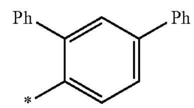
10-65
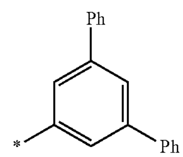
10-66
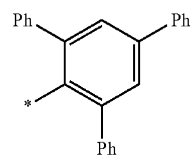
10-67
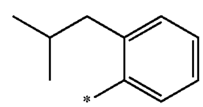
10-68
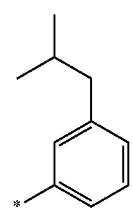
10-69
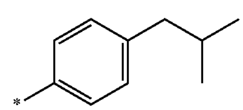
10-70
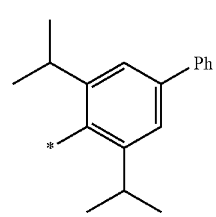

10-71
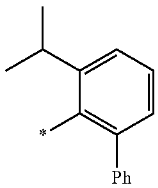
10-72
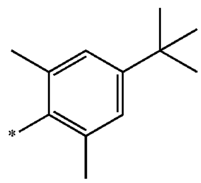
10-73
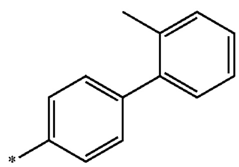
10-74
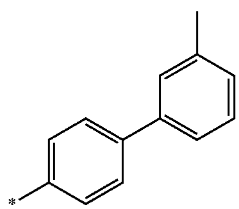
10-75
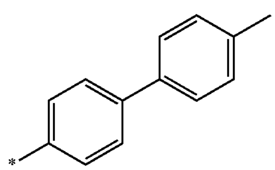
10-76
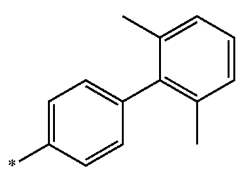
10-77
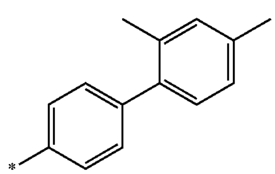
10-78
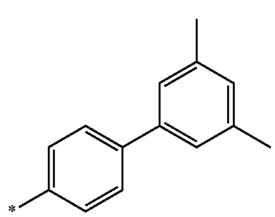
10-79
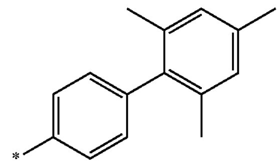
10-80
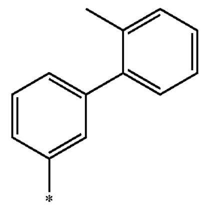
10-81
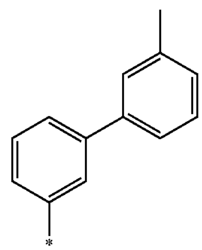
10-82
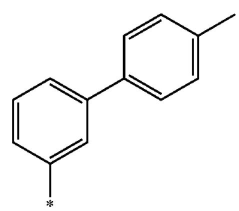
10-83
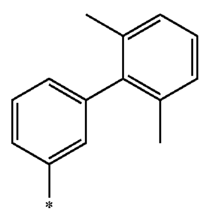
10-84
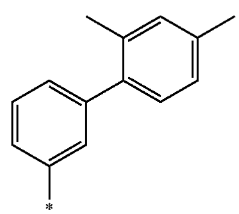
10-85
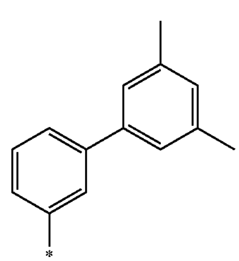

-continued
10-86
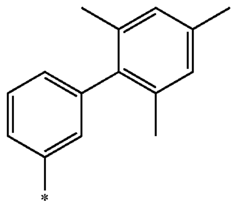
10-87
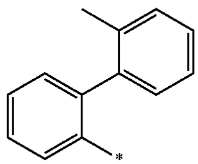
10-88
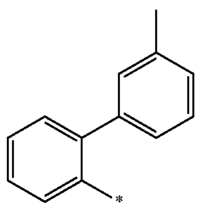
10-89
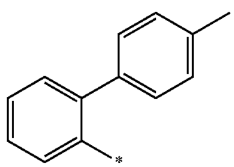
10-90
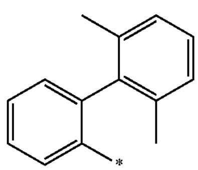
10-91
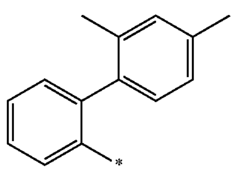
10-92
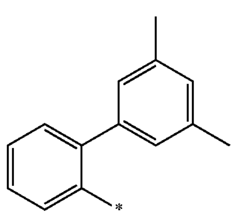
10-93
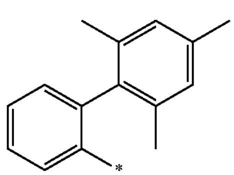
-continued
10-94
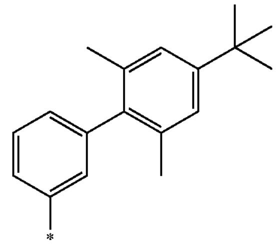
10-95
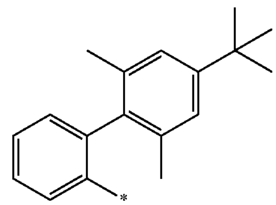
10-96
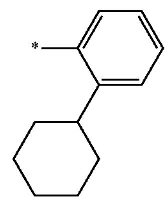
10-97
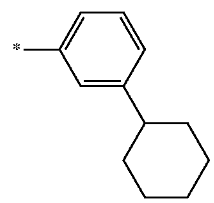
10-98
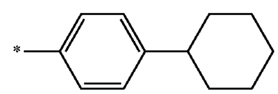
10-99
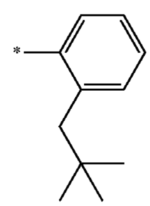
10-100
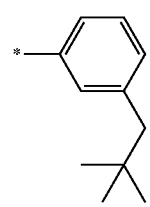
10-101
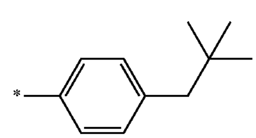

-continued
10-102
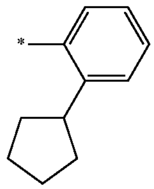
10-103
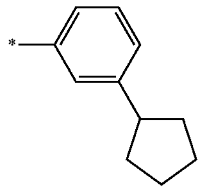
10-104
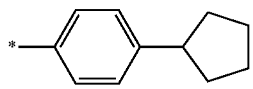
10-105
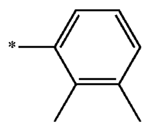
10-106
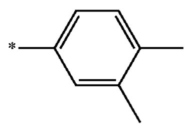
10-107
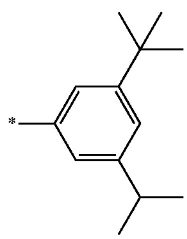
10-108
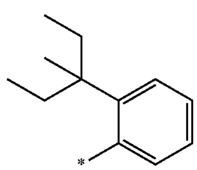
10-109
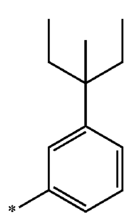
10-110
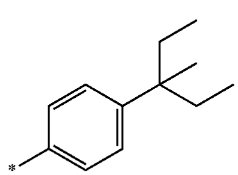
-continued
10-111
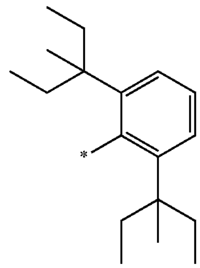
10-112
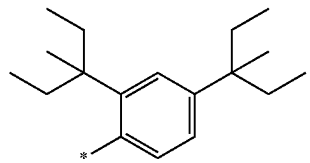
10-113
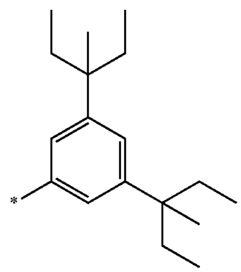
10-114
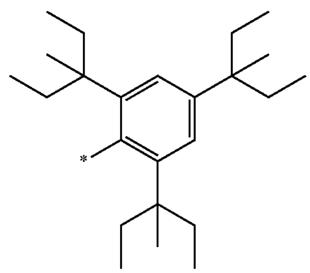
10-115
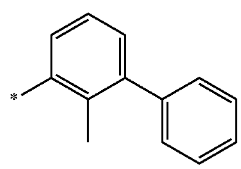
10-116
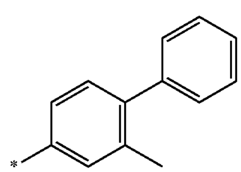
10-117
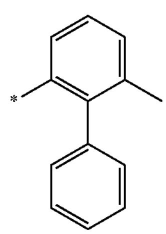

-continued
10-118
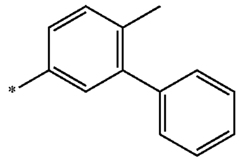
10-119
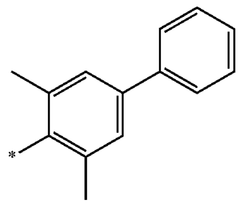
10-120
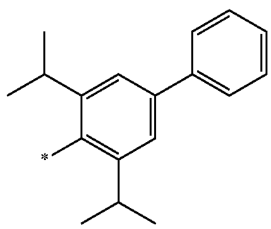
10-121
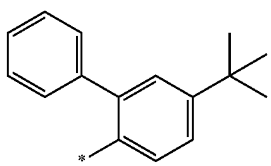
10-122
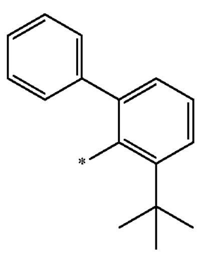
10-123
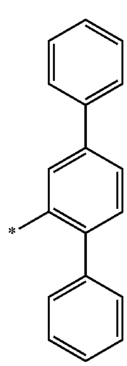
-continued
10-124
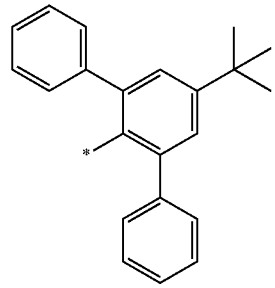
10-125
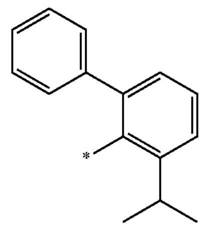
10-126
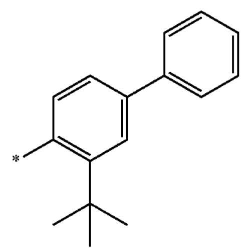
10-127
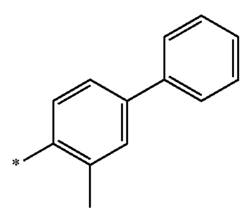
10-128
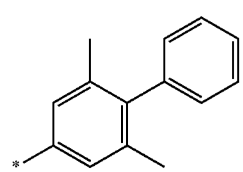
10-129
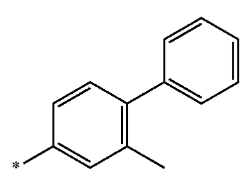
10-130
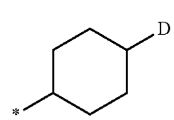
10-131
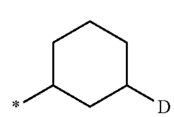

-continued
10-132
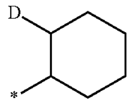
10-133
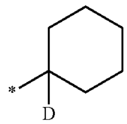
10-134
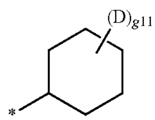
10-135
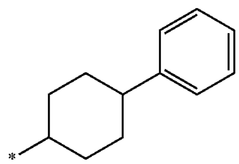
10-136
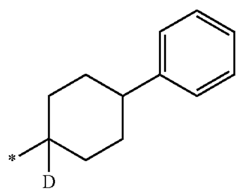
10-137
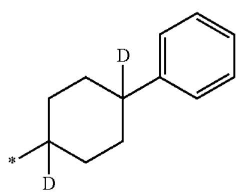
10-138
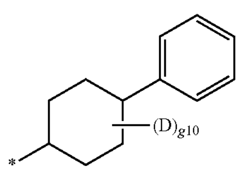
10-139
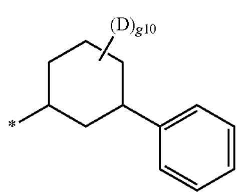
10-140
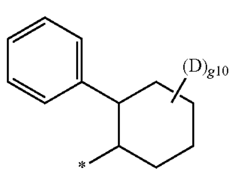
10-141
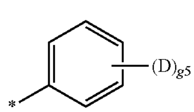
-continued
10-201
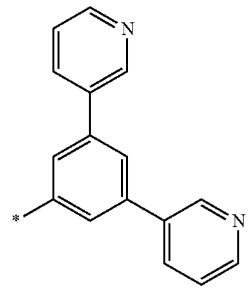
10-202
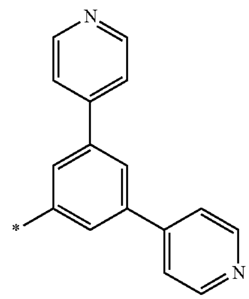
10-203
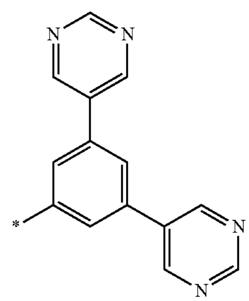
10-204
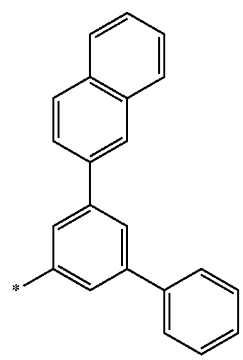
10-205
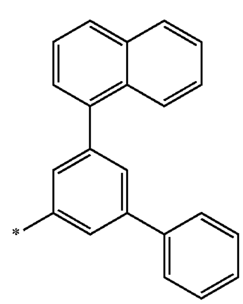

-continued
10-206
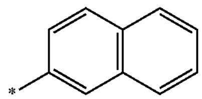
10-207
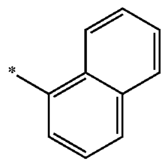
10-208
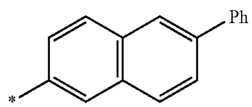
10-209
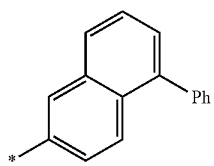
10-210
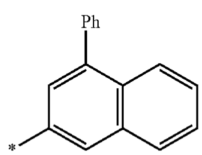
10-211
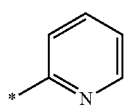
10-212
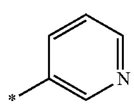
10-213
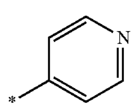
10-214
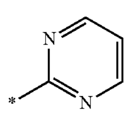
10-215
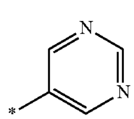
10-216
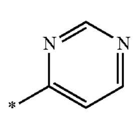
10-217
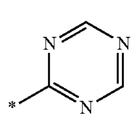
-continued
10-218
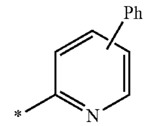
10-219
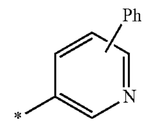
10-220
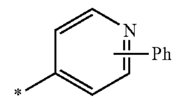
10-221
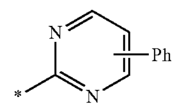
10-222
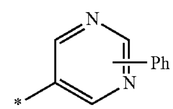
10-223
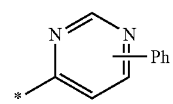
10-224
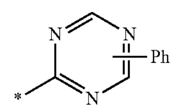
10-225
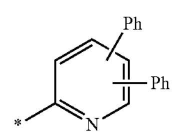
10-226
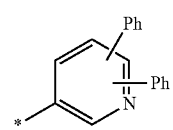
10-227
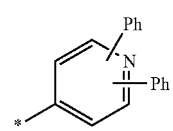
10-228
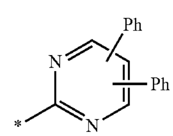
10-229
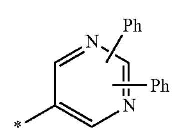
10-230
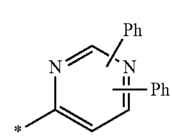

-continued
10-231
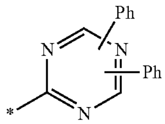
10-232
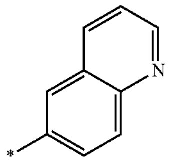
10-233
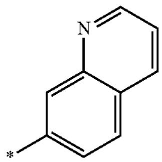
10-234
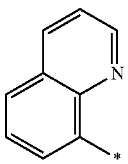
10-235
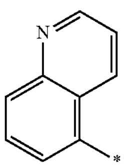
10-236
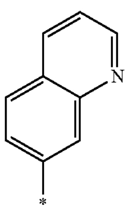
10-237
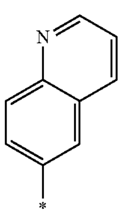
10-238
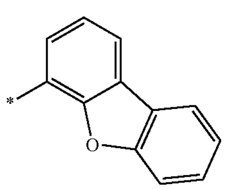
10-239
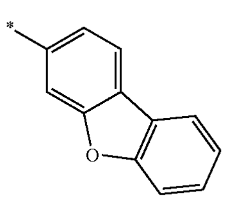
-continued
10-240
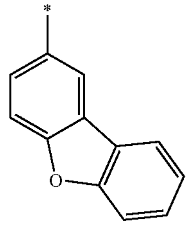
10-241
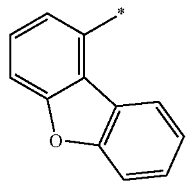
10-242
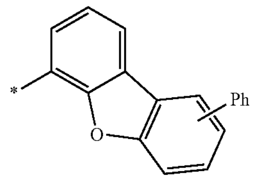
10-243
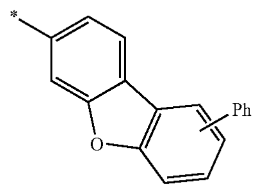
10-244
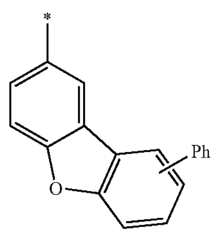
10-245
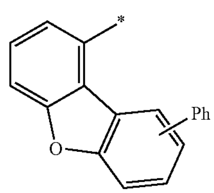
10-246
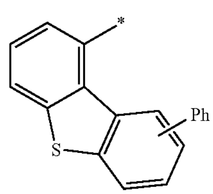
10-247
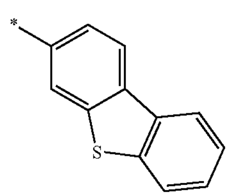

-continued
10-248
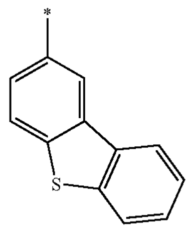
10-249
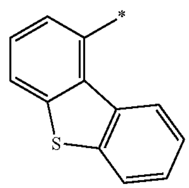
10-250
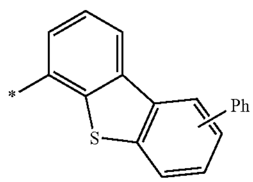
10-251
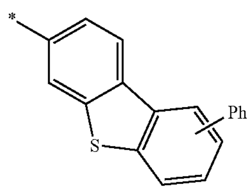
10-252
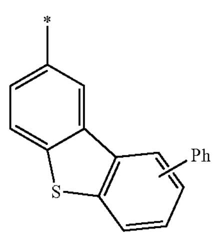
10-253
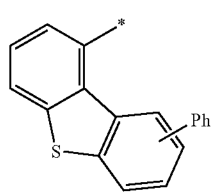
10-254
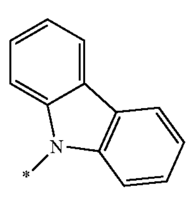
10-255
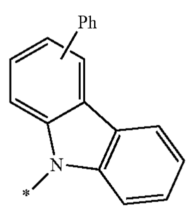
-continued
10-256
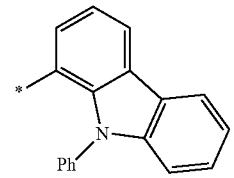
10-257
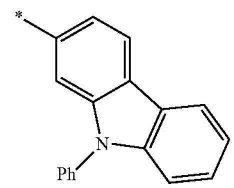
10-258
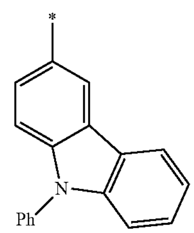
10-259
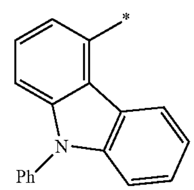
10-260
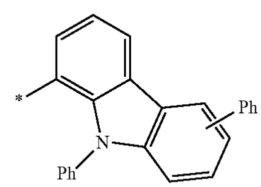
10-261
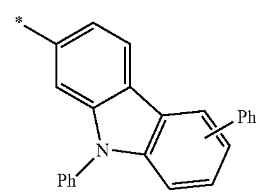
10-262
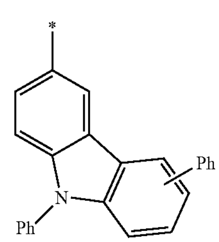
10-263
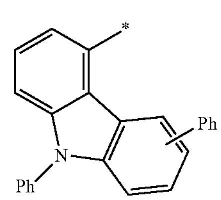

-continued
10-264
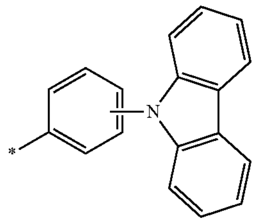
10-265
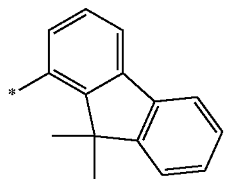
10-266
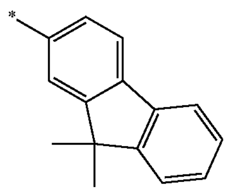
10-267
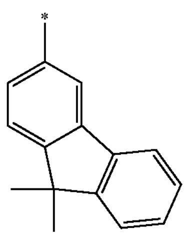
10-268
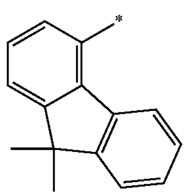
10-269
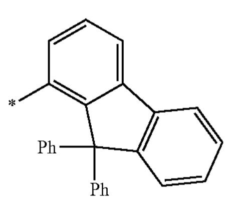
10-270
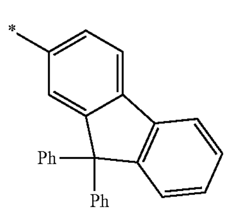
-continued
10-271
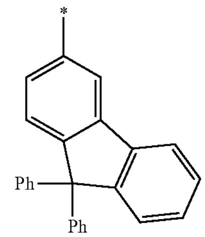
10-272
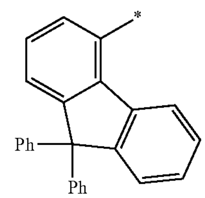
10-273
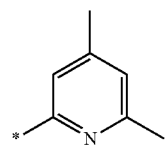
10-274
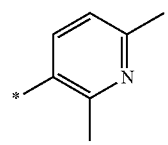
10-275
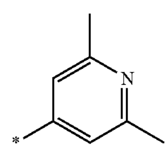
10-276
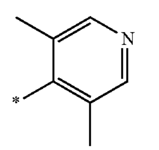
10-277
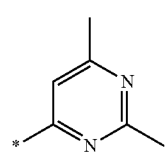
10-278
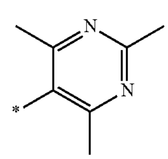
10-279
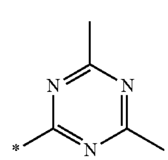

-continued
10-280
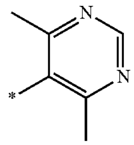
10-281
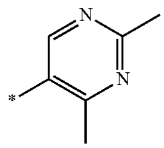
10-282
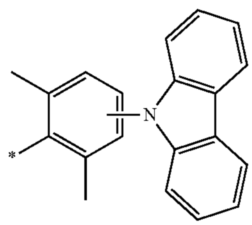
10-283
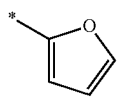
10-284
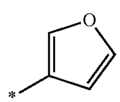
10-285
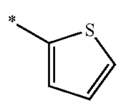
10-286
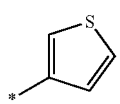
10-287
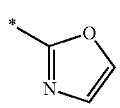
10-288
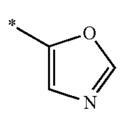
10-289
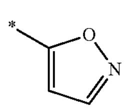
10-290
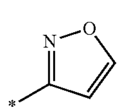
10-291
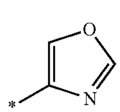
10-292
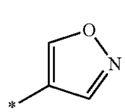
-continued
10-293
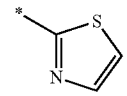
10-294
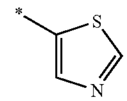
10-295
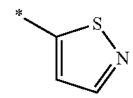
10-296
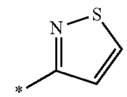
10-297
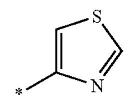
10-298
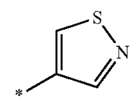
10-299
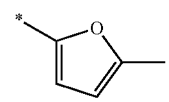
10-300
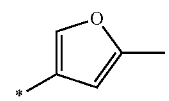
10-301
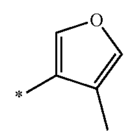
10-302
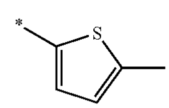
10-303
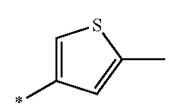
10-304
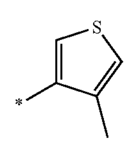
10-305
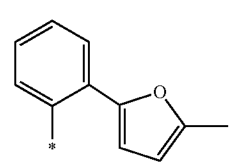

-continued
10-306
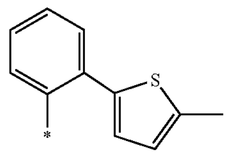
10-307
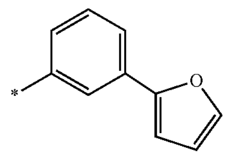
10-308
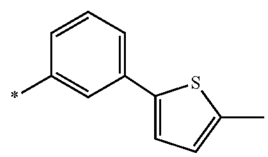
10-309
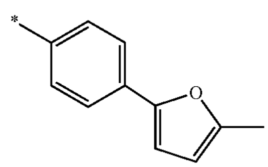
10-310
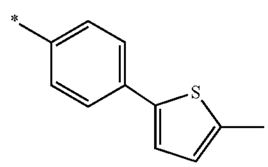
10-311
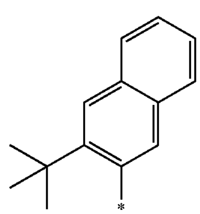
10-312
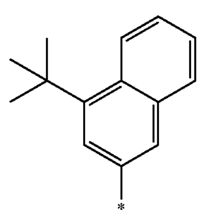
10-313
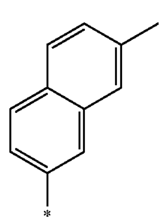
-continued
10-314
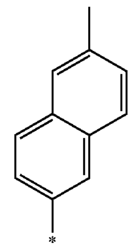
10-315
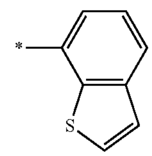
10-316
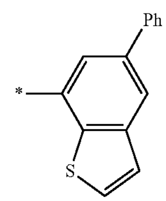
10-317
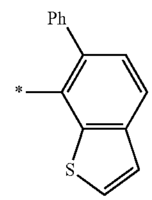
10-318
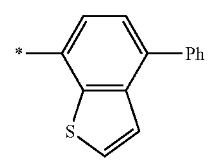
10-319
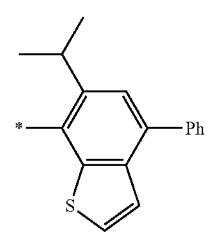
10-320
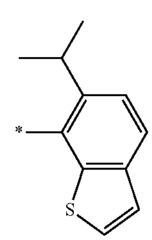

-continued
10-321
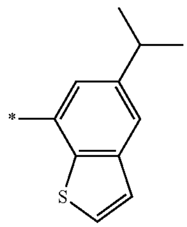
10-322
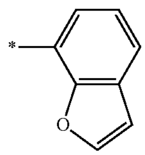
10-323
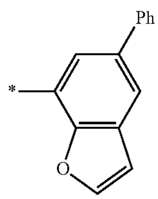
10-324
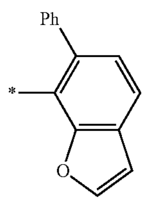
10-325
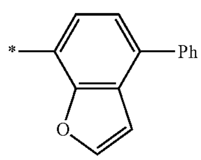
10-326
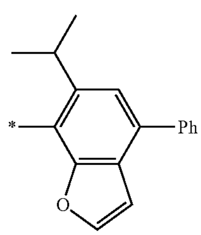
10-327
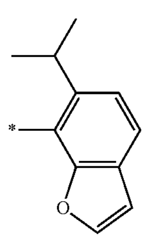
-continued
10-328
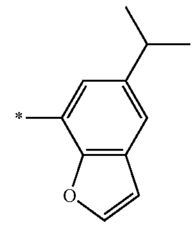
10-329
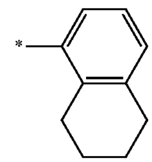
10-330
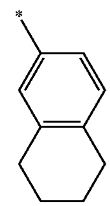
10-331
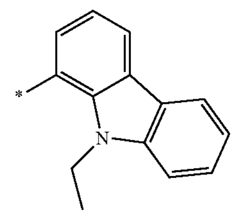
10-332
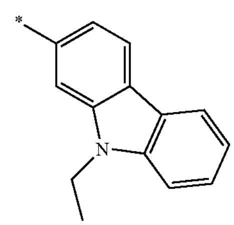
10-333
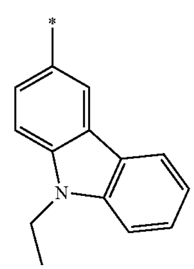
10-334
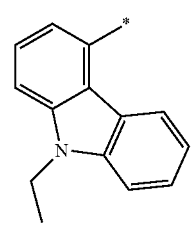

-continued
10-335
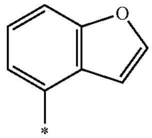
10-336
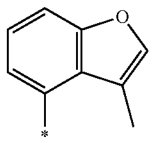
10-337
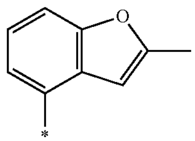
10-338
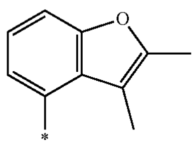
10-339
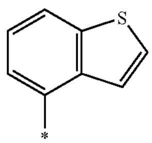
10-340
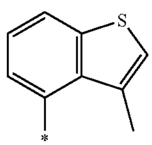
10-341
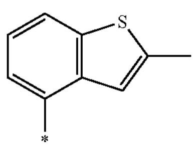
10-342
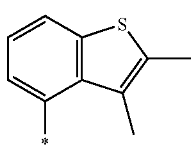
10-343
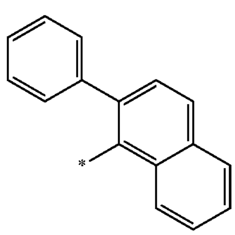
10-344
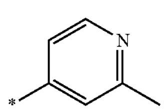
-continued
10-345
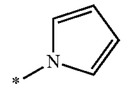
10-346
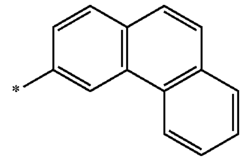
10-347
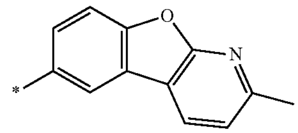
10-348
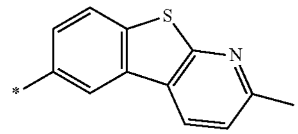
10-349
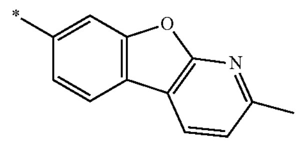
10-350
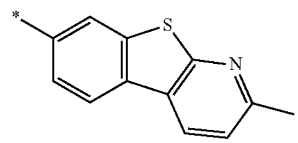
wherein, in Formulae 9-1 to 9-61, 9-201 to 9-237, 10-1 to 10-141, and 10-201 to 10-350,
* indicates a binding site to a neighboring atom,
Ph is a phenyl group,
TMS is a trimethylsilyl group,
TMG is a trimethylgermyl group,
g5 is an integer from 1 to 5,
g10 is an integer from 1 to 10, and
g11 is an integer from 2 to 11.
8. The organometallic compound of claim 1, wherein $CY_1$ is represented by one of Formulae 1-1 to 1-16:
1-1
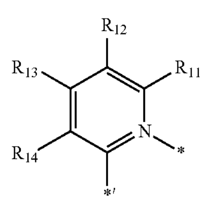
1-2
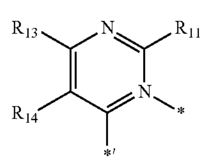

-continued
1-3
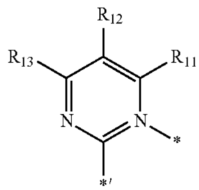
1-4
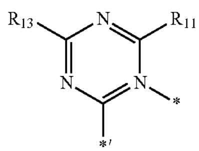
1-5
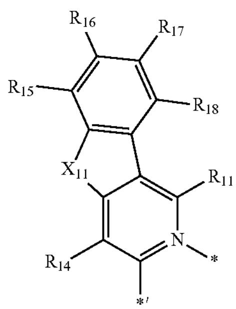
1-6
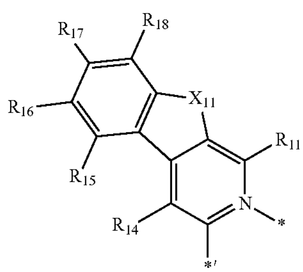
1-7
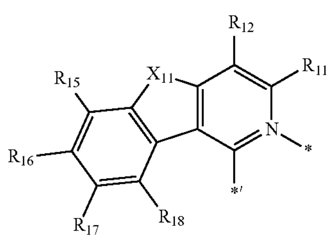
1-8
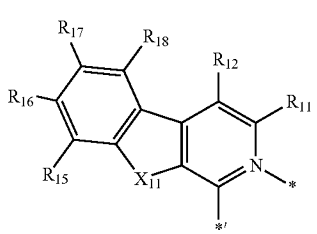
-continued
1-9
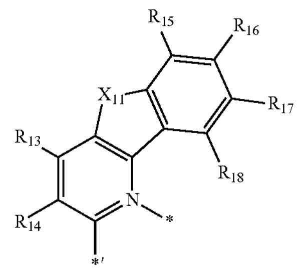
1-10
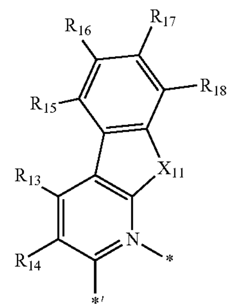
1-11
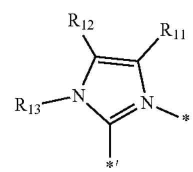
1-12
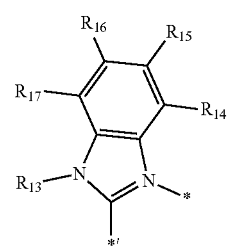
1-13
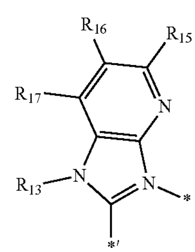
1-14
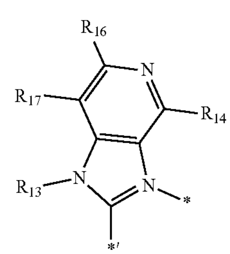

-continued 1-15

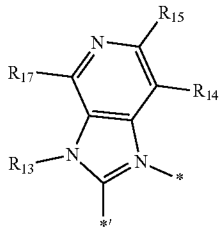

1-16

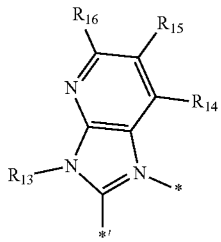

wherein, in Formulae 1-1 to 1-16, $X_{11}$ is O, S, $N(R_{19a})$, $C(R_{19a})(R_{19b})$, or $Si(R_{19a})(R_{19b})$, $R_{11}$ to $R_{18}$, $R_{19a}$, and $R_{19b}$ are each independently as described in connection with $R_{10}$ in claim 1, two or more neighboring substituents of $R_{11}$ to $R_{18}$, $R_{19a}$, or $R_{19b}$ are optionally linked to each other to form a substituted or unsubstituted $C_5$-$C_{30}$ carbocyclic group or a substituted or unsubstituted $C_1$-$C_{30}$ heterocyclic group, and wherein, when $R_{11}$ to $R_{18}$, $R_{19a}$, or $R_{19b}$ is —$Si(Q_1)(Q_2)(Q_3)$ or —$Ge(Q_1)(Q_2)(Q_3)$, to $Q_3$ are each independently:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with one or more of deuterium, a $C_1$-$C_{10}$ alkyl group, or a phenyl group,

* indicates a binding site to $M_1$, and

*' indicates a binding site to $CY_2$.

9. The organometallic compound of claim 1, wherein $CY_2$ is represented by one of Formulae 2-1 to 2-22:

2-1

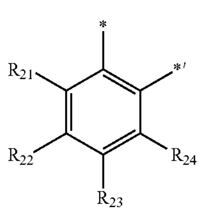

-continued 2-2

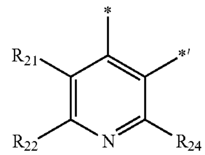

2-3

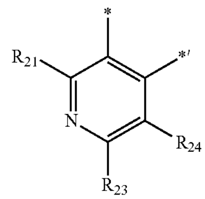

2-4

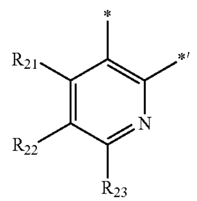

2-5

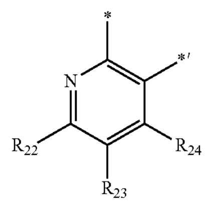

2-6

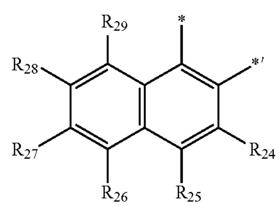

2-7

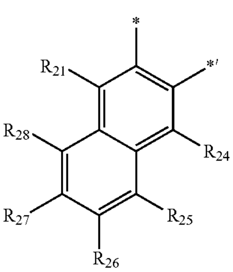

2-8

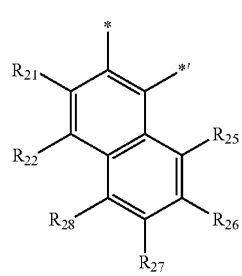

-continued
2-9
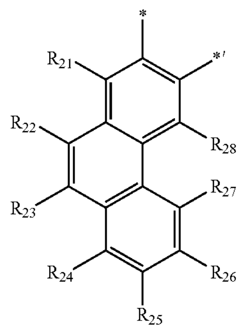
2-10
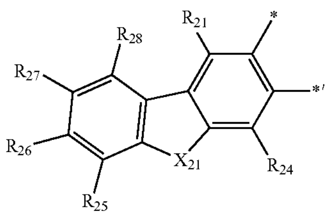
2-11
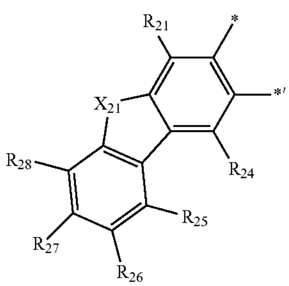
2-12
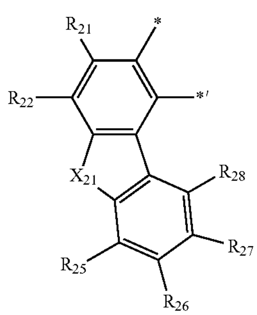
2-13
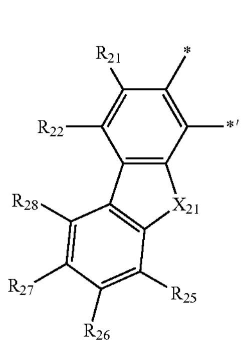
-continued
2-14
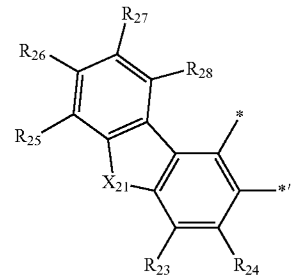
2-15
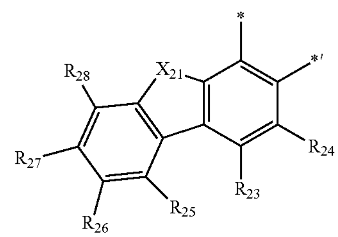
2-16
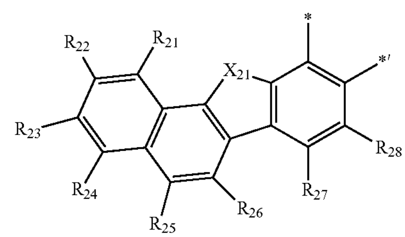
2-17
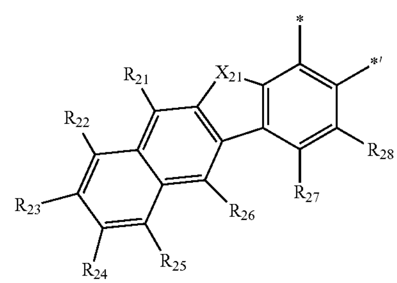
2-18
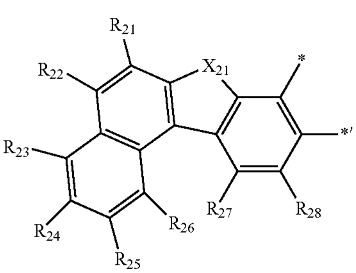
2-19
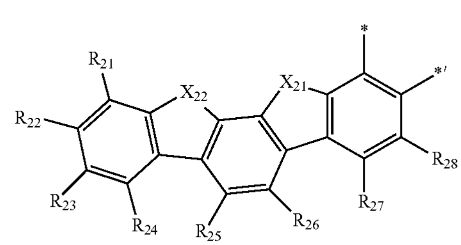

-continued 2-20

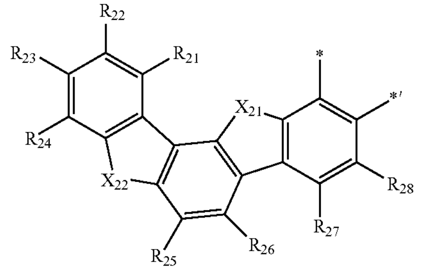

2-21

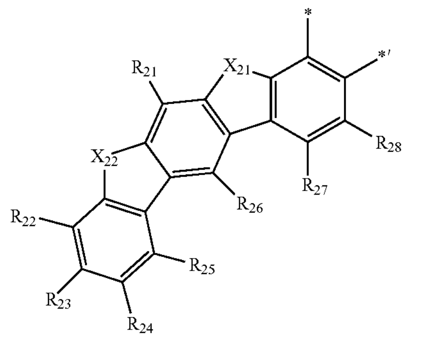

2-22

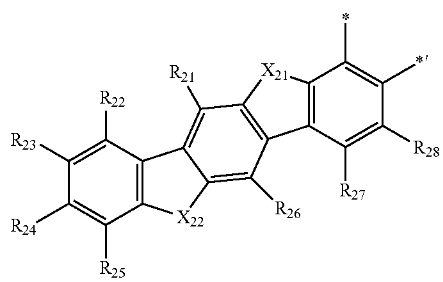

wherein, in Formulae 2-1 to 2-22, $X_{21}$ and $X_{22}$ are each independently O, S, $N(R_{29a})$, $C(R_{29a})(R_{29b})$, or $Si(R_{29a})(R_{29b})$, $R_{21}$ to $R_{28}$, $R_{20a}$, and $R_{29b}$ are each independently as described in connection with $R_{20}$ in claim 1, and two or more neighboring substituents of $R_{21}$ to $R_{28}$, $R_{29a}$, and $R_{29a}$ are optionally linked to each other to form a substituted or unsubstituted $C_5$-$C_{30}$ carbocyclic group or a substituted or unsubstituted $C_1$-$C_{30}$ heterocyclic group, wherein, when $R_{21}$ to $R_{28}$, $R_{29a}$, or $R_{29b}$ is —$Si(Q_1)(Q_2)(Q_3)$ or —$Ge(Q_1)(Q_2)(Q_3)$, $Q_1$ to $Q_3$ are each independently:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with one or more of deuterium, a $C_1$-$C_{10}$ alkyl group, or a phenyl group,

* indicates a binding site to $CY_1$, and

*' indicates a binding site to $M_1$.

10. The organometallic compound of claim 1, wherein $CY_3$ is represented by one of Formulae 3-1 to 3-16:

3-1

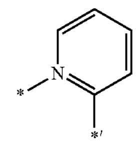

3-2

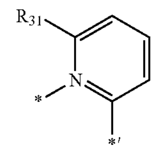

3-3

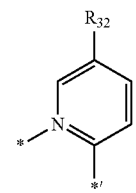

3-4

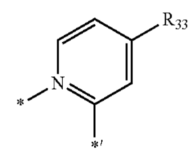

3-5

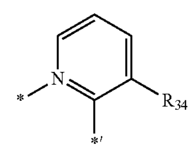

3-6

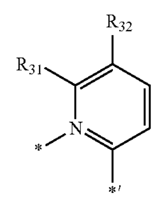

3-7

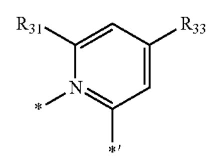

3-8

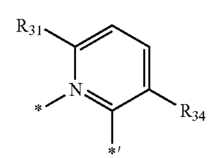

3-9

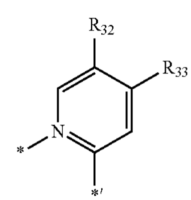

-continued 3-10

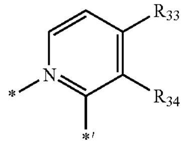

3-11

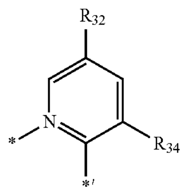

3-12

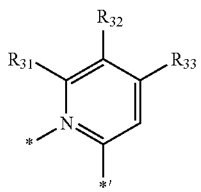

3-13

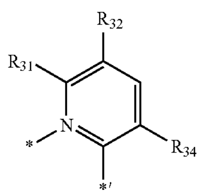

3-14

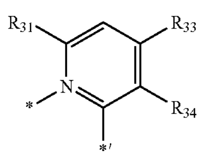

3-15

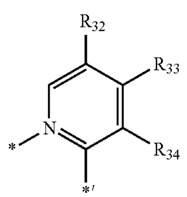

3-16

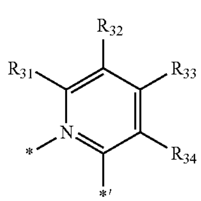

wherein, in Formulae 3-1 to 3-16, $R_{31}$ to $R_{34}$ are each independently as described in connection with $R_{30}$ in claim 1, and

* indicates a binding site to $M_1$, and

*' indicates a binding site to a neighboring atom.

11. The organometallic compound of claim 1, wherein the organometallic compound is a compound represented by Formula 11-1:

Formula 11-1

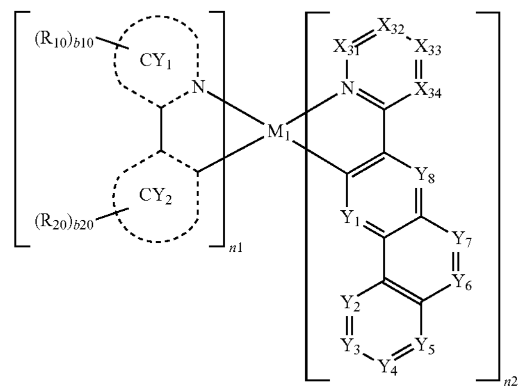

wherein, in Formula 11-1, $M_1$, n1, n2, $CY_1$, $CY_2$, $Y_1$ to $Y_8$, $R_{10}$, $R_{20}$, b10, and b20 each are as described in claim 1, $X_{31}$ is $C(R_{31})$ or N, $X_{32}$ is $C(R_{32})$ or N, $X_{33}$ is $C(R_{33})$ or N, and $X_{34}$ is $C(R_{34})$ or N, $R_{31}$ to $R_{34}$ are each independently as described in connection with $R_{30}$ in claim 1, and two or more of $R_{31}$ to $R_{34}$ are optionally linked to form a substituted or unsubstituted $C_5$-$C_{30}$ carbocyclic group or a substituted or unsubstituted $C_1$-$C_{30}$ heterocyclic group.

12. The organometallic compound of claim 1, wherein the organometallic compound is a compound represented by Formula 12-1:

Formula 12-1

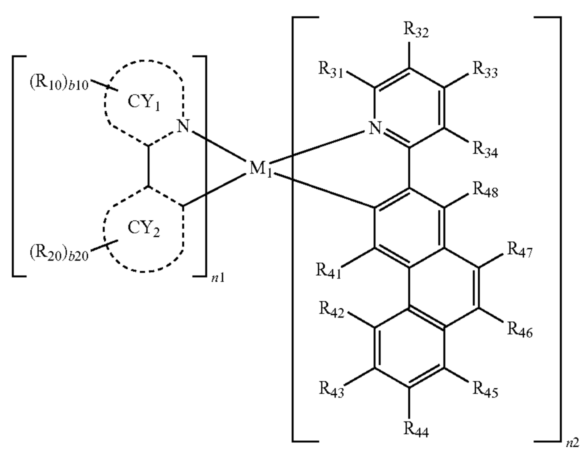

wherein, in Formula 12-1, $M_1$, n1, n2, $CY_1$, $CY_2$, $R_{10}$, $R_{20}$, b10, b20, and $R_{41}$ to $R_{48}$ are each as described in claim 1, and $R_{31}$ to $R_{34}$ are each independently as described in connection with $R_{30}$ in claim 1.

13. The organometallic compound of claim 1, wherein the organometallic compound is electrically neutral.

14. The organometallic compound of claim 1, wherein the organometallic compound is one of Compounds 1 to 179:
1
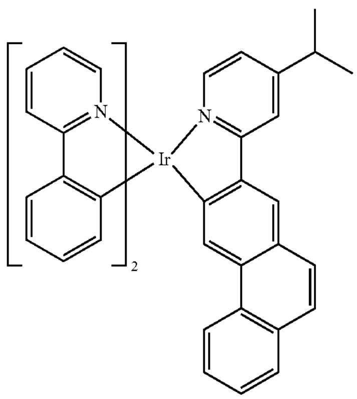
2
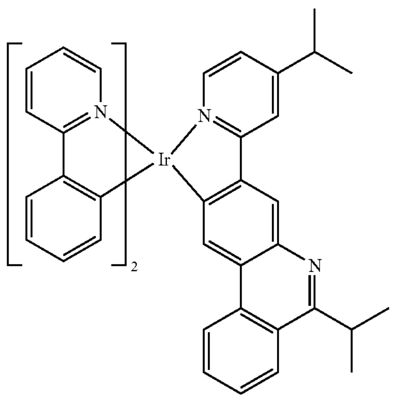
3
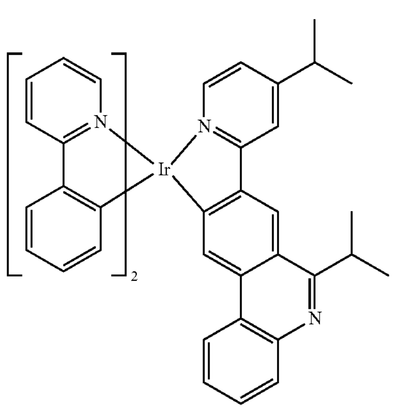
-continued
4
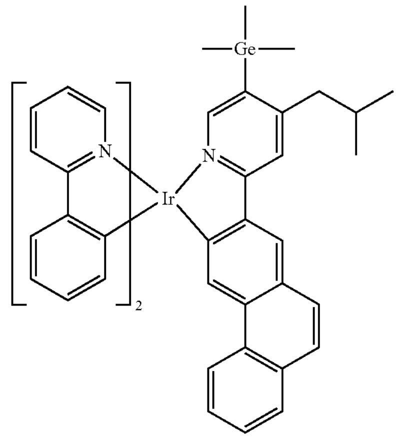
5
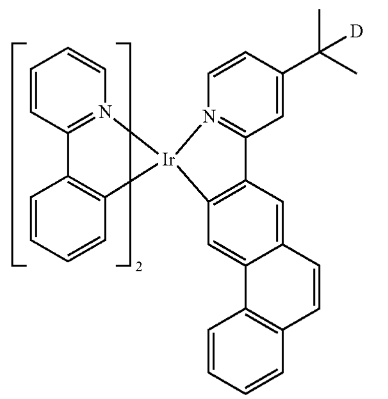
6
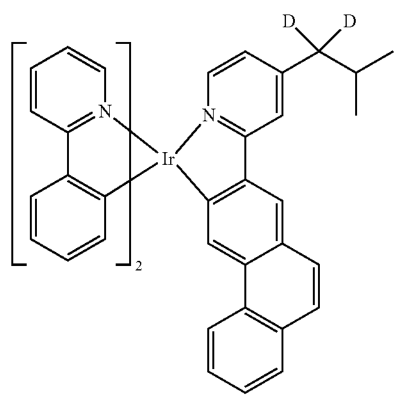
7
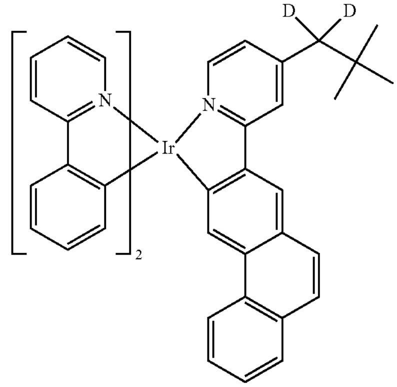

-continued
8
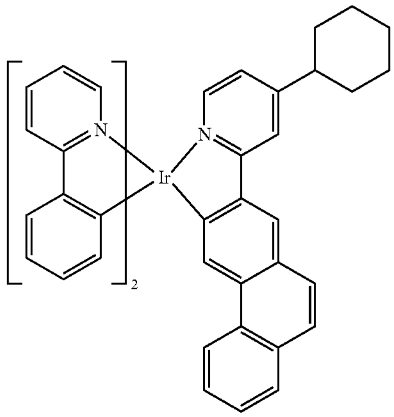
9
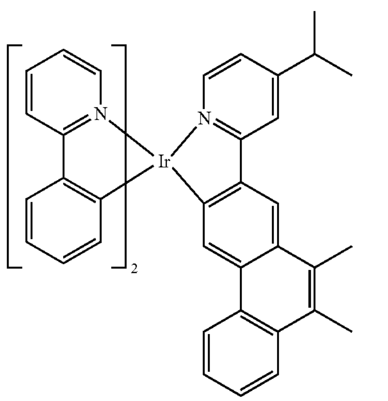
10
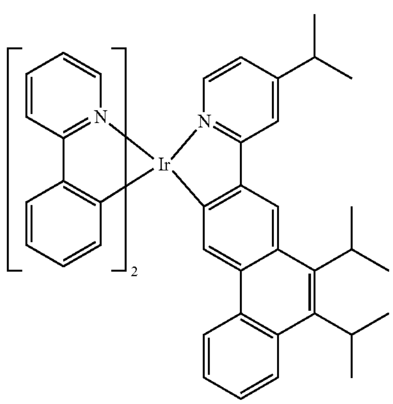
11
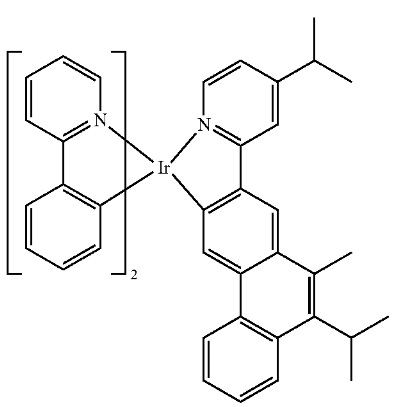
-continued
12
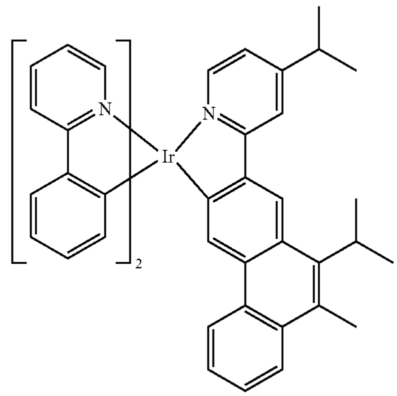
13
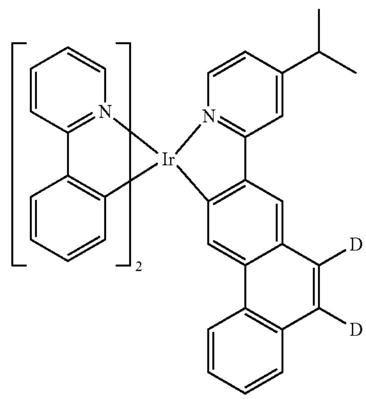
14
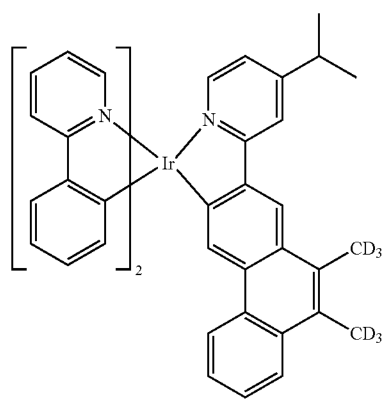
15
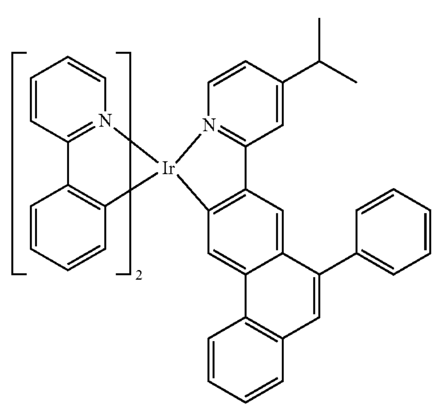

-continued
16
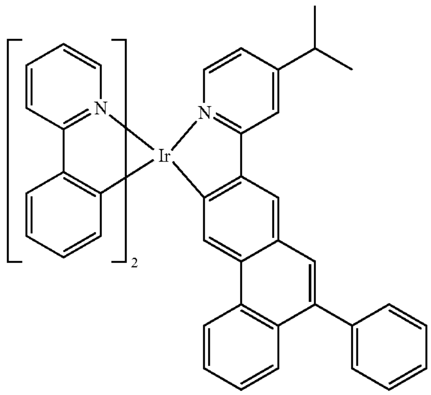
17
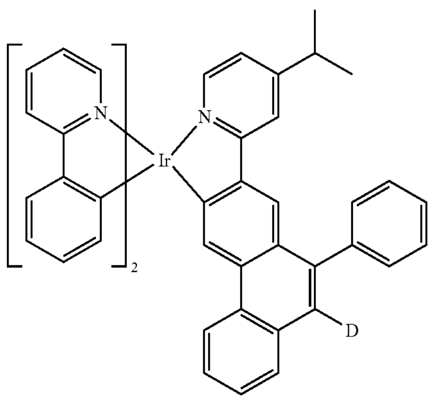
18
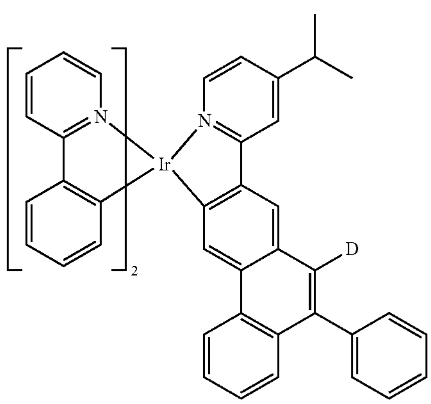
19
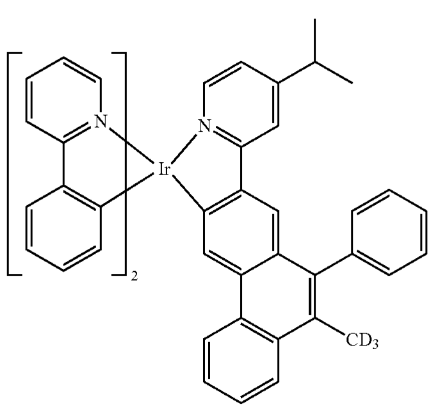
-continued
20
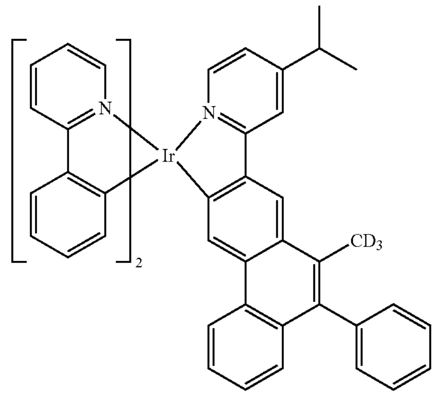
21
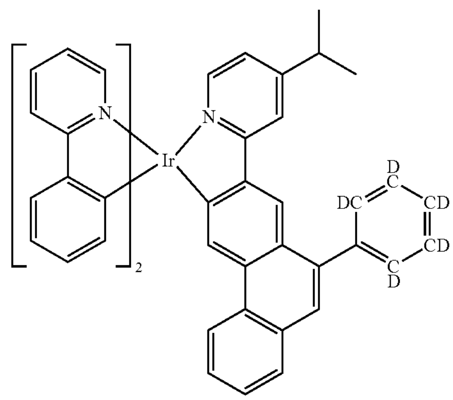
22
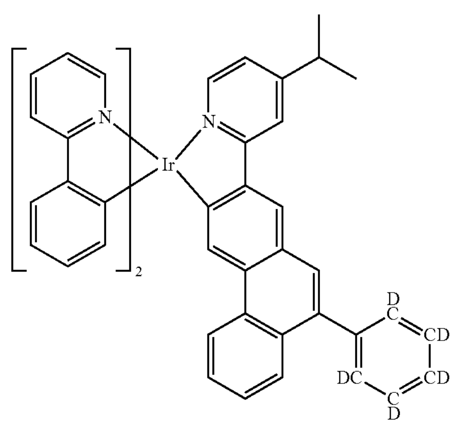
23
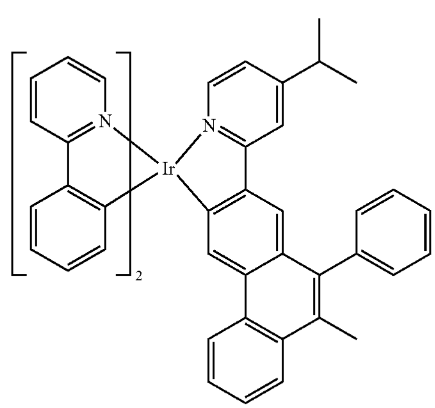

-continued
24
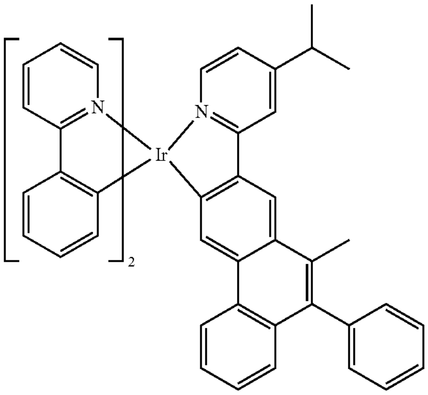
25
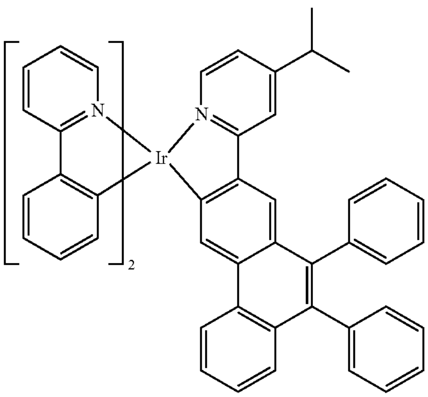
26
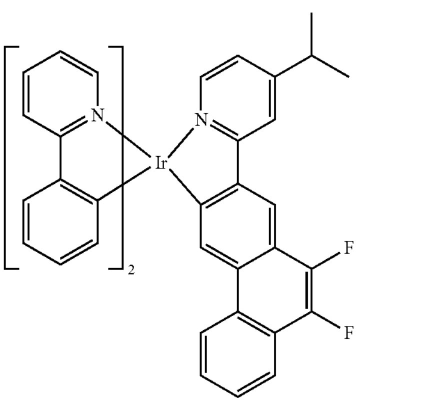
27
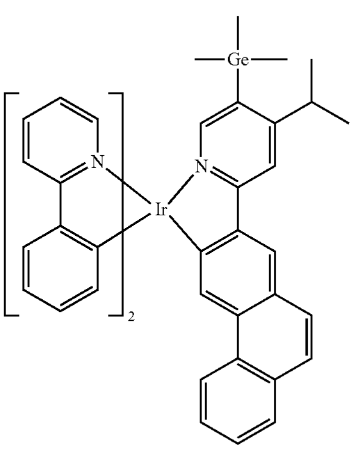
-continued
28
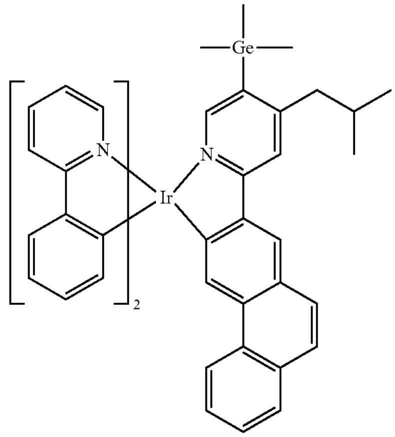
29
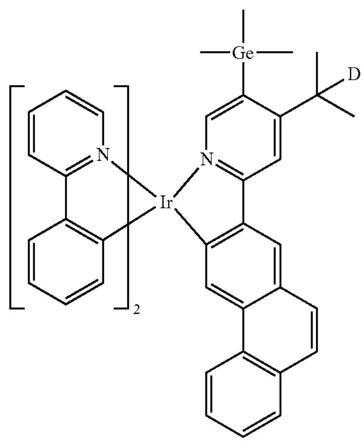
30
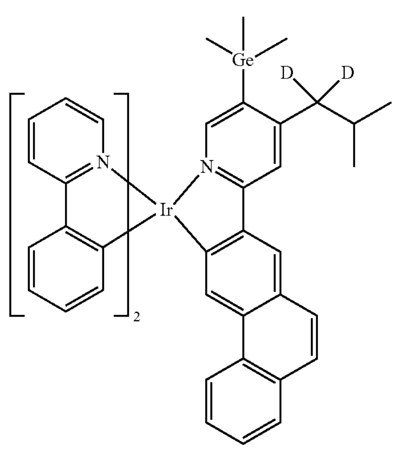

-continued
31
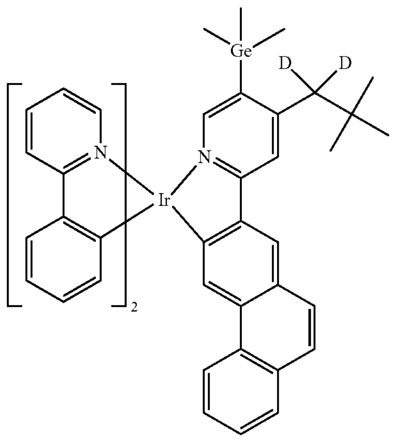
32
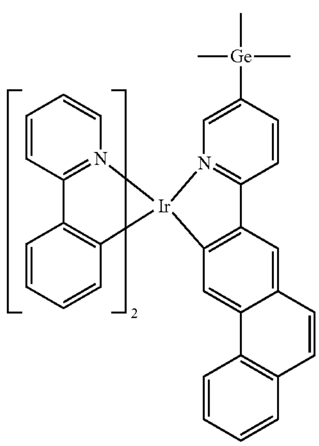
33
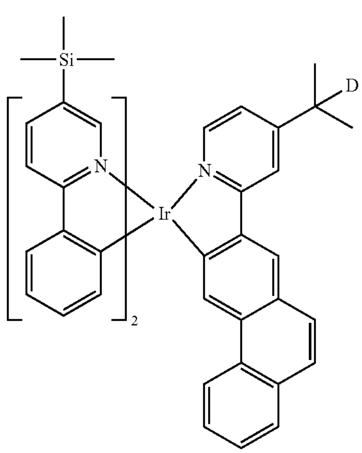
-continued
34
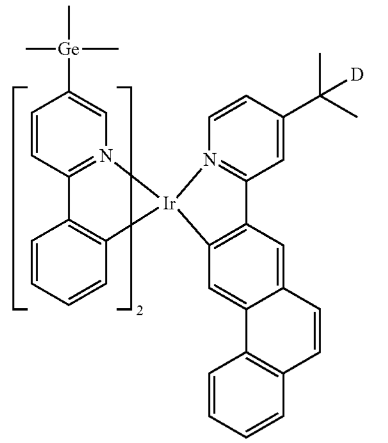
35
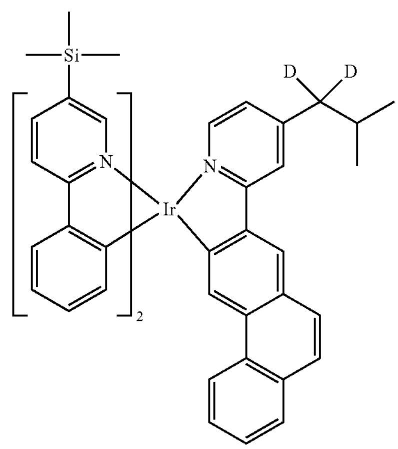
36
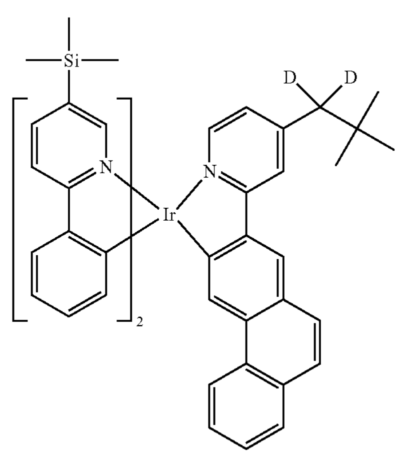

-continued
37
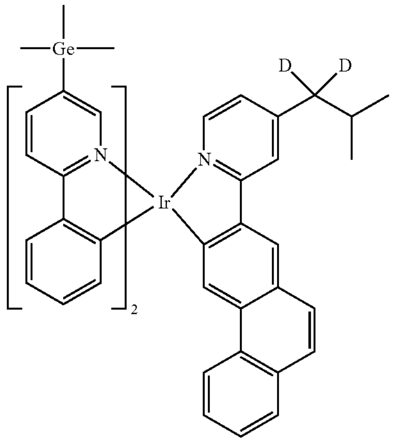
38
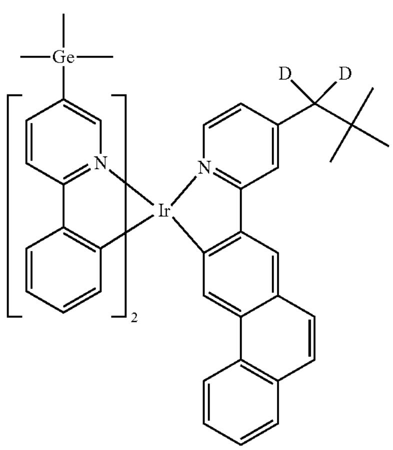
39
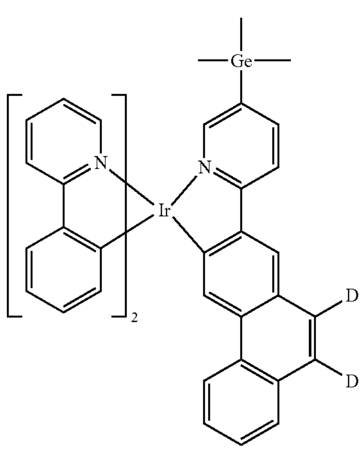
-continued
40
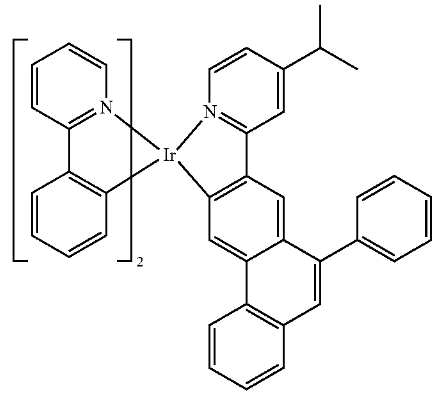
41
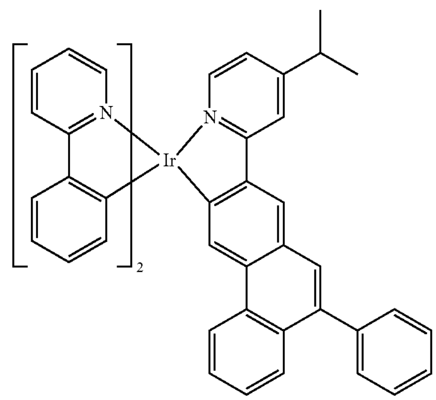
42
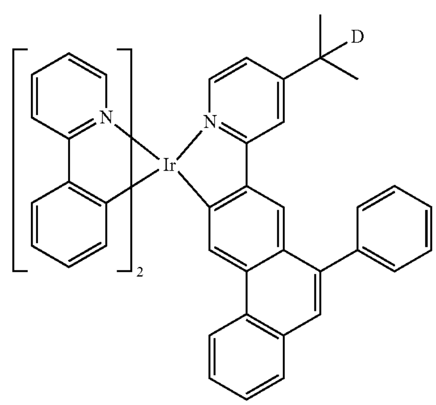
43
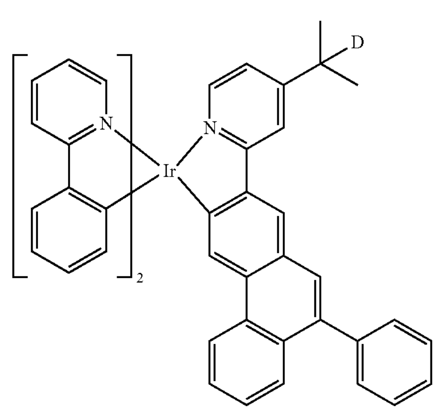

-continued
44
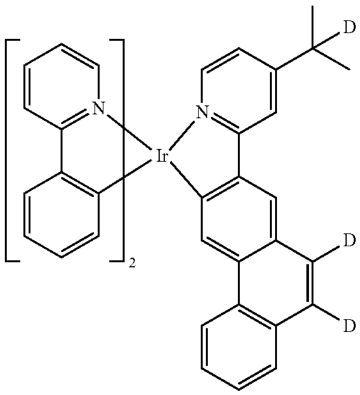
45
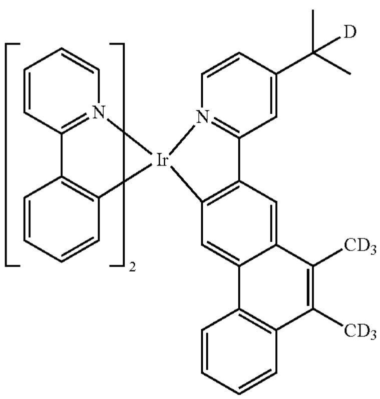
46
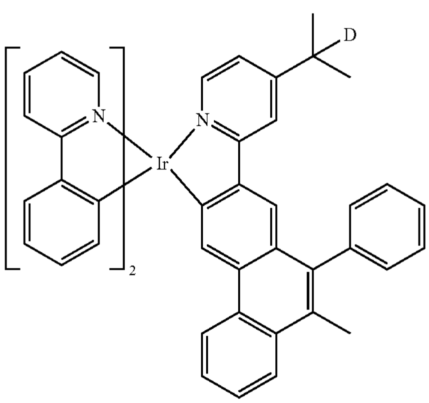
47
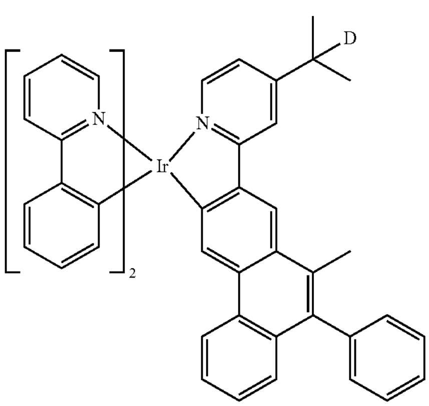
-continued
48
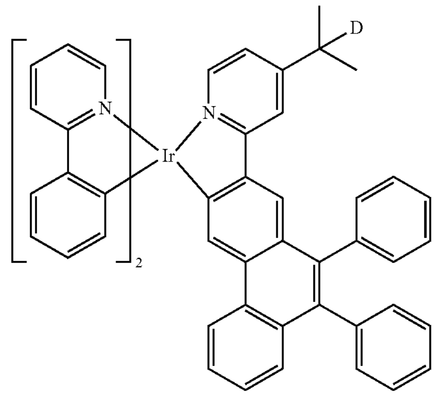
49
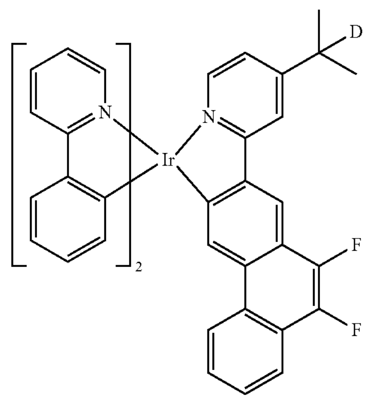
50
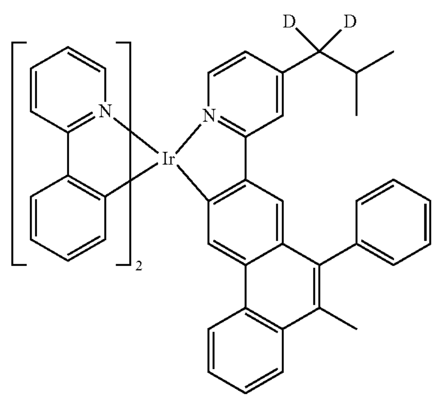
51
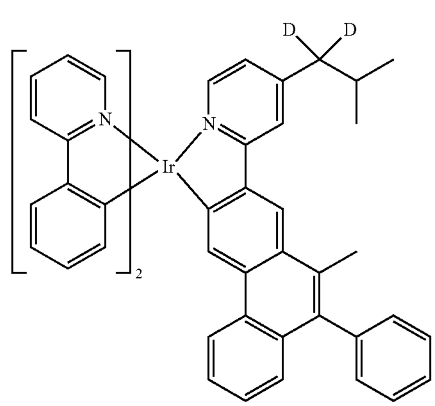

-continued
52
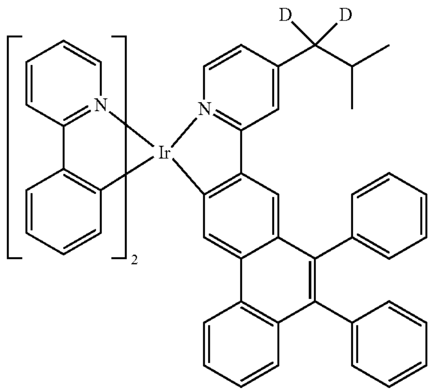
53
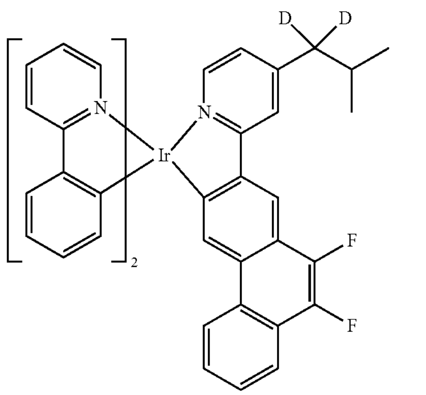
54
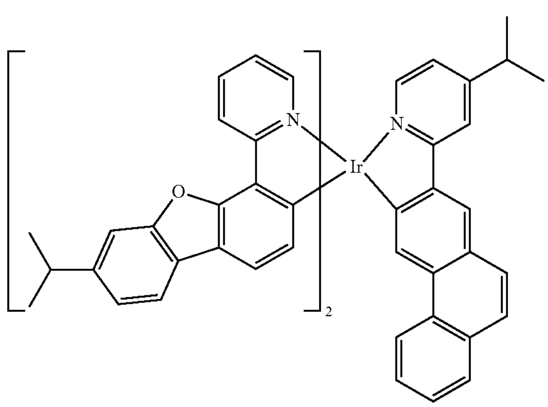
55
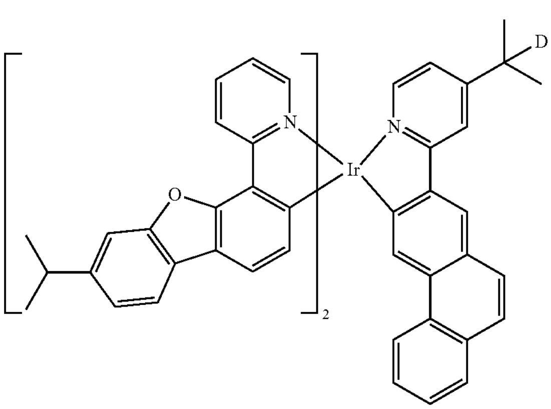
-continued
56
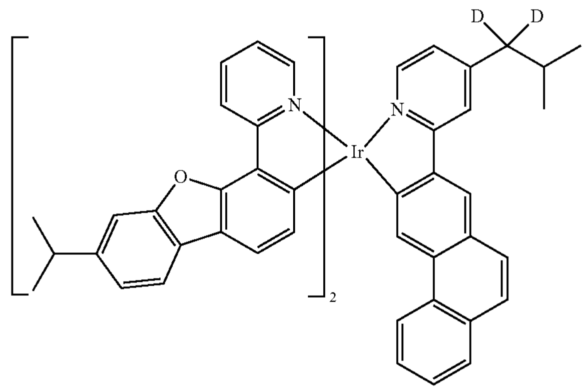
57
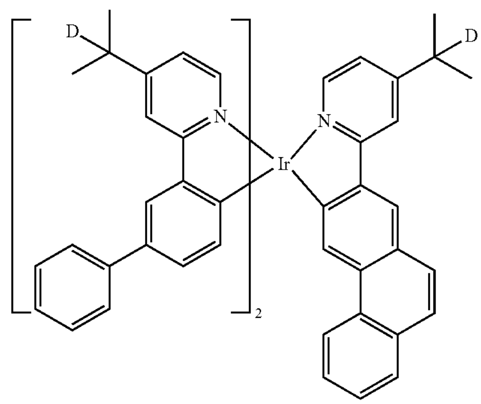
58
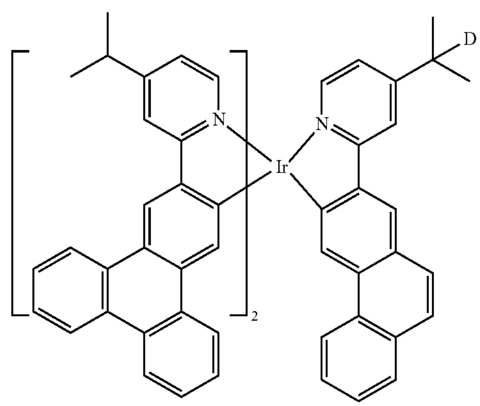
59
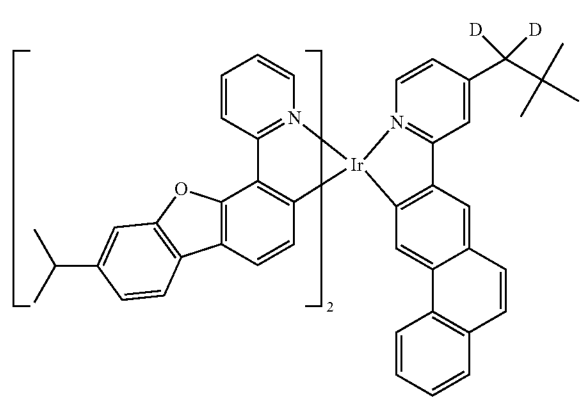

-continued
60
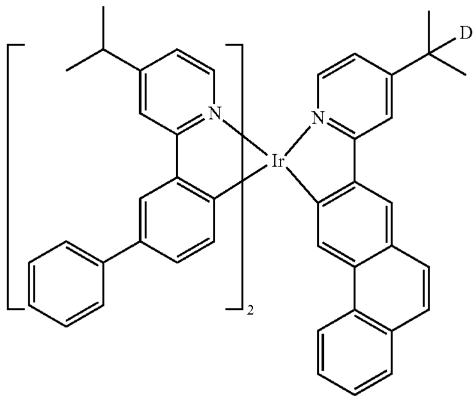
61
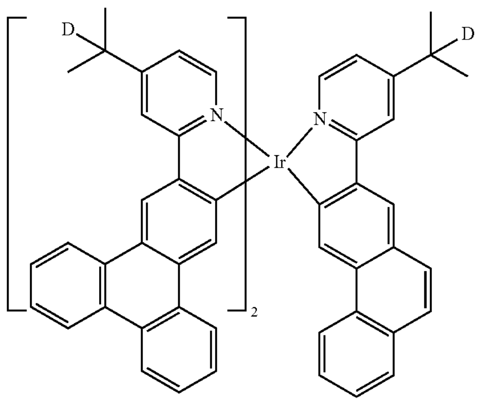
62
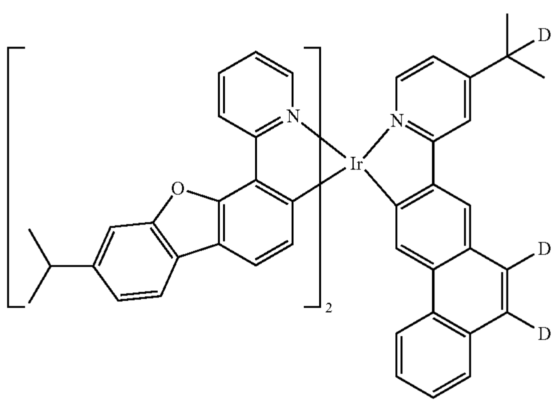
63
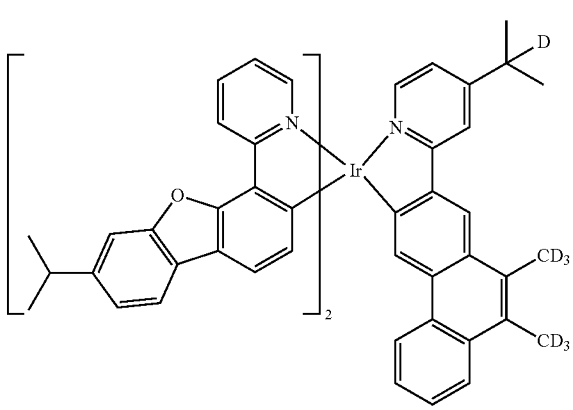
-continued
64
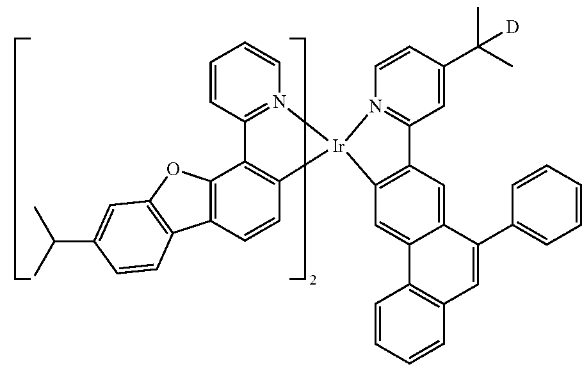
65
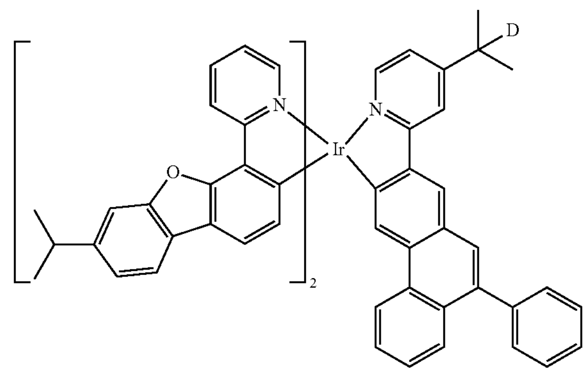
66
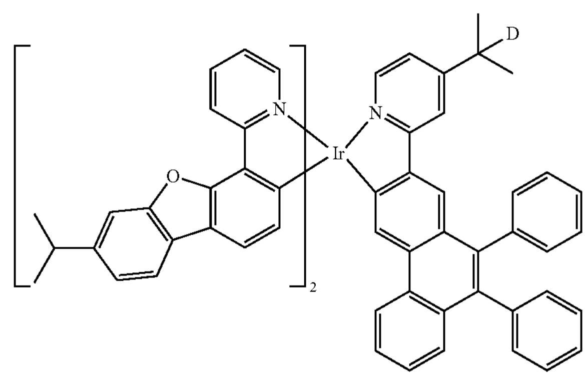
67
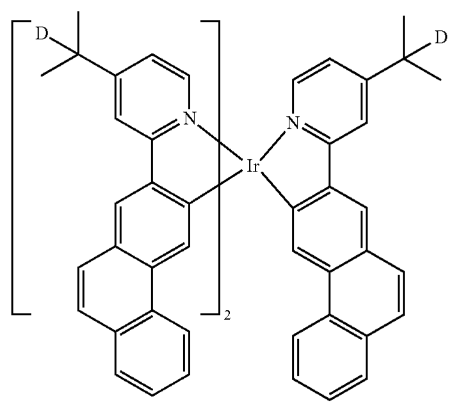

68
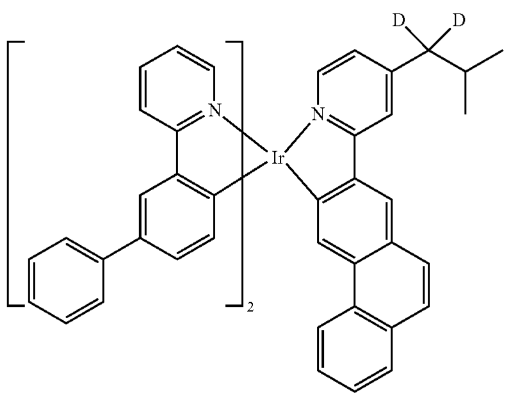
69
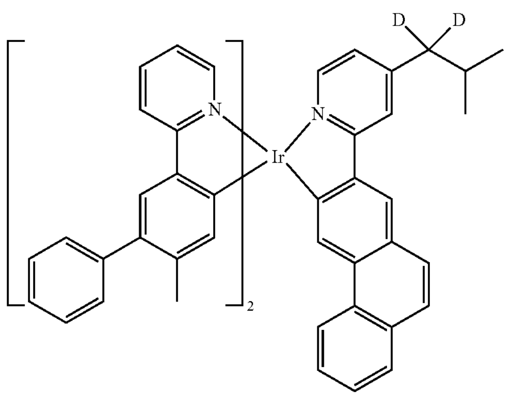
70
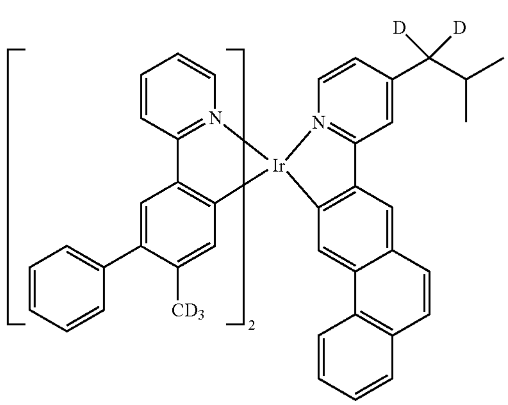
71
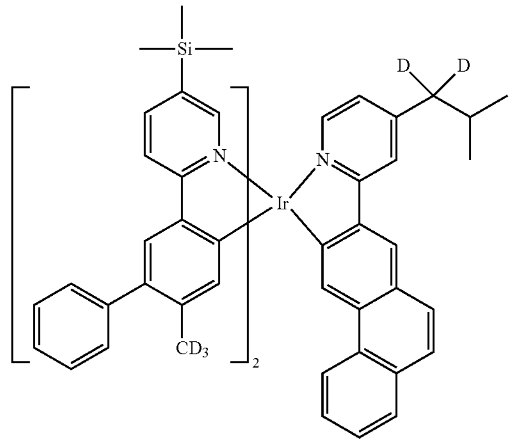
72
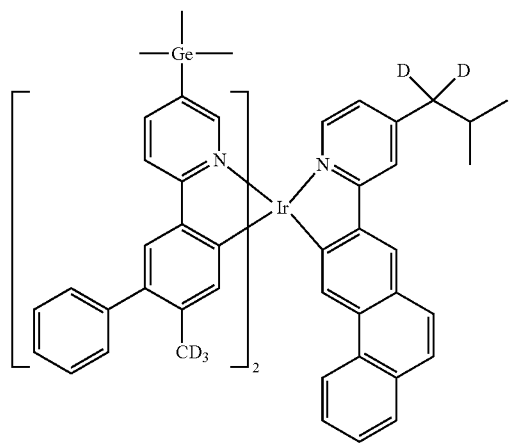
73
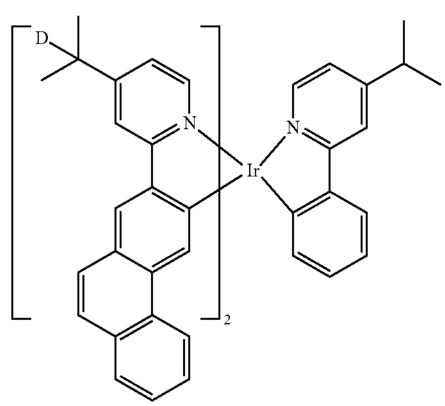

-continued
74
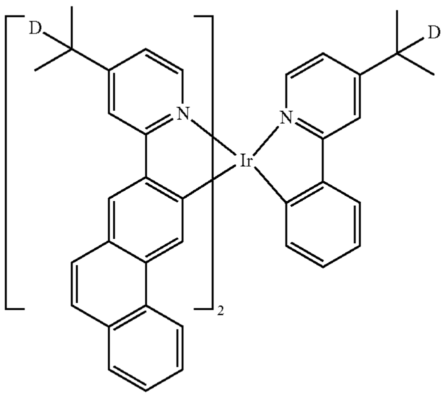
75
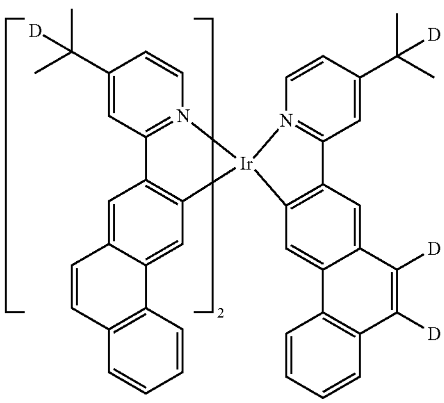
76
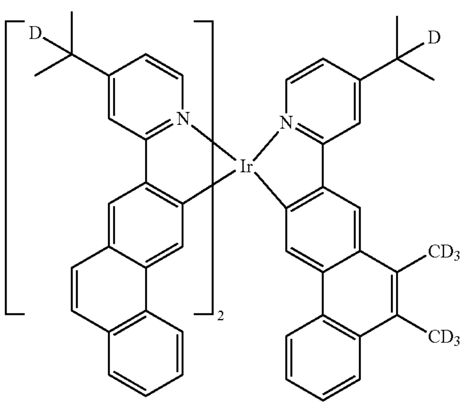
77
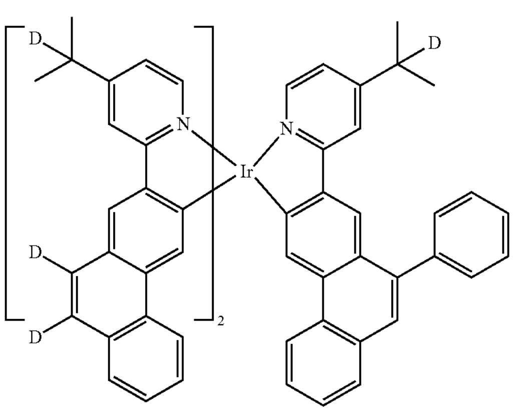
-continued
78
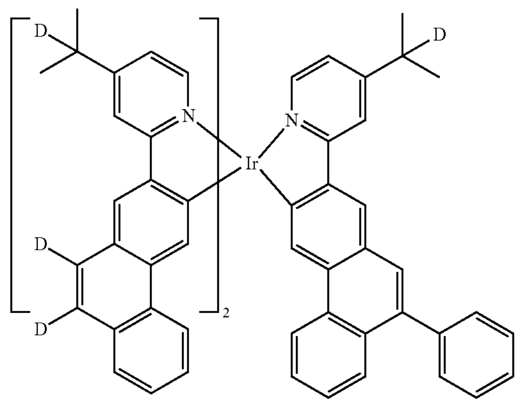
79
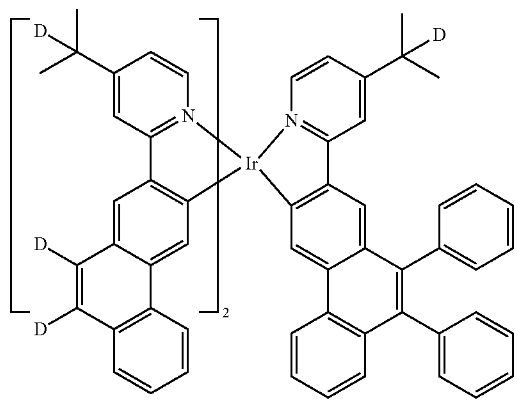
80
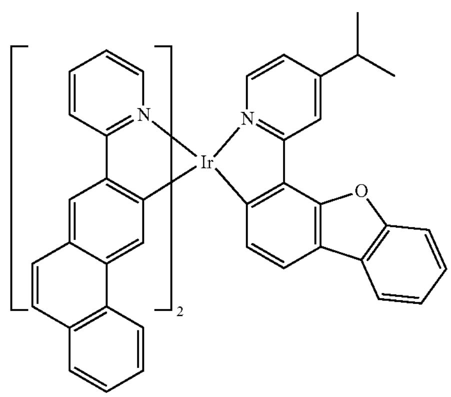
81
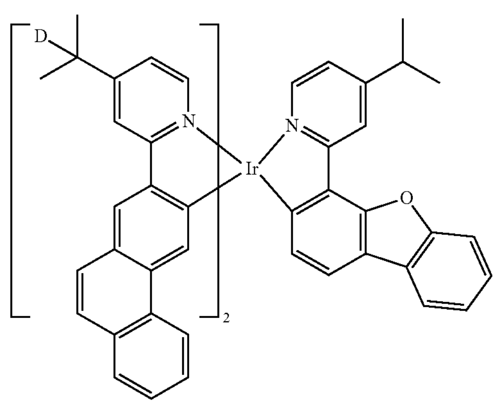

-continued
82
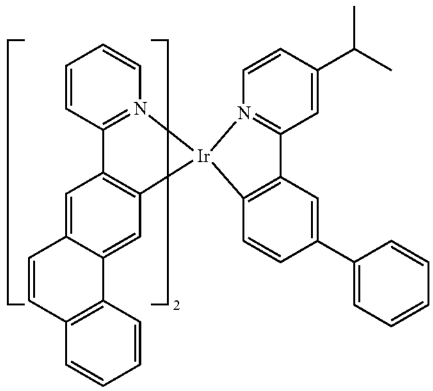
83
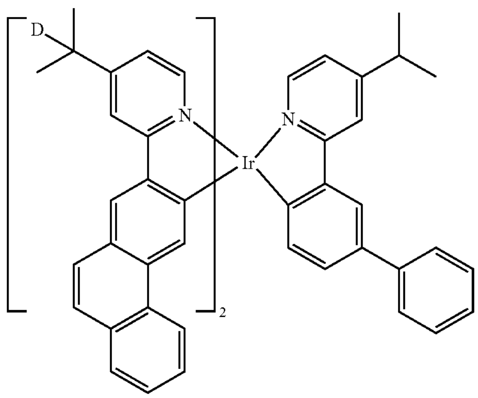
84
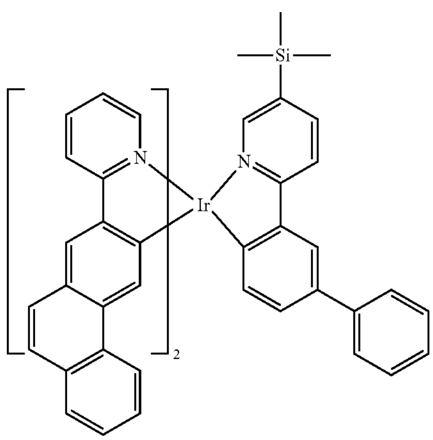
85
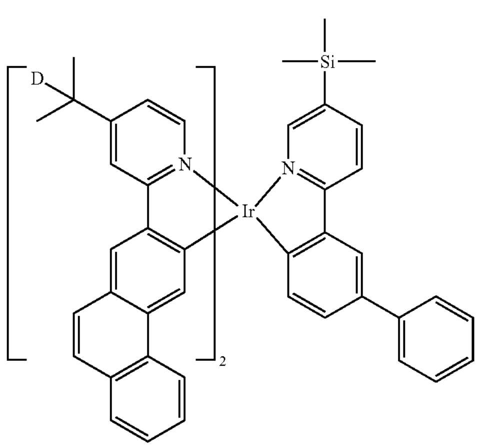
-continued
86
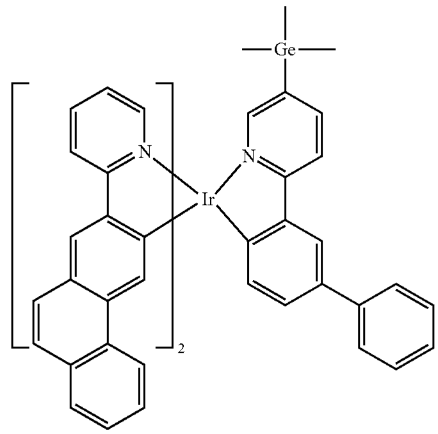
87
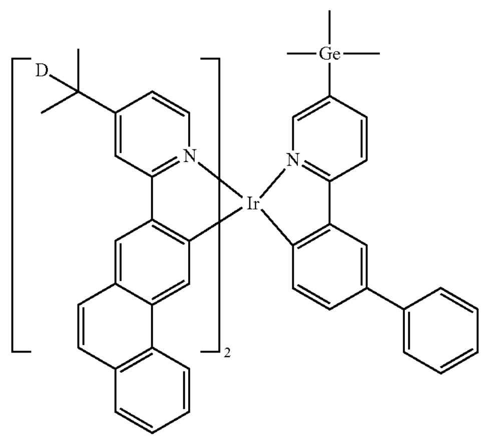
88
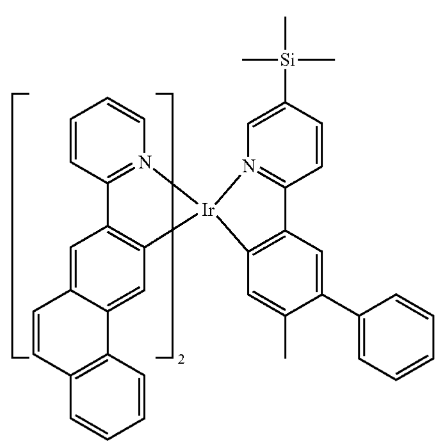

-continued
89
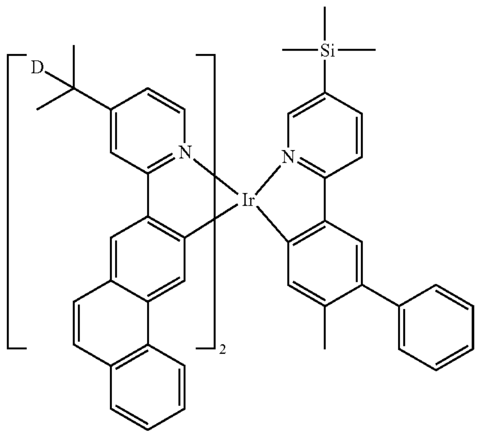
90
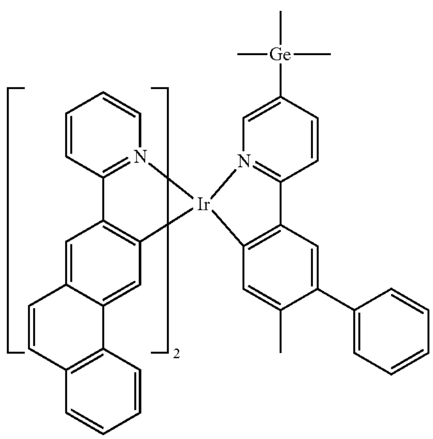
91
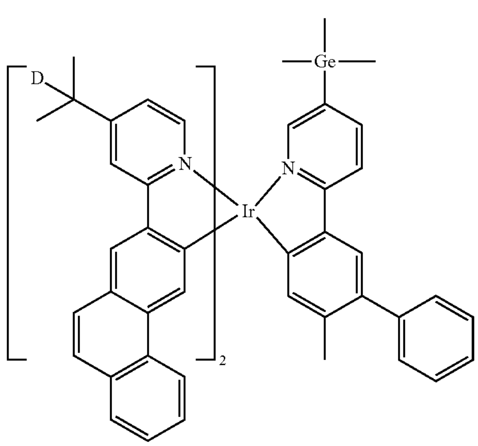
-continued
92
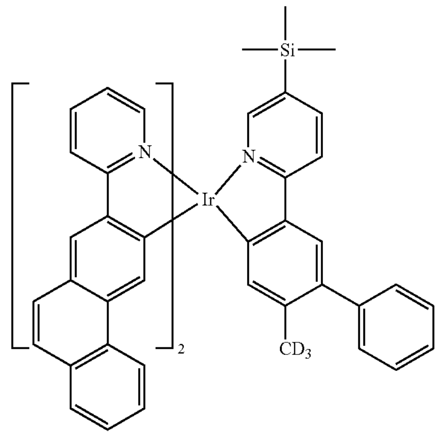
93
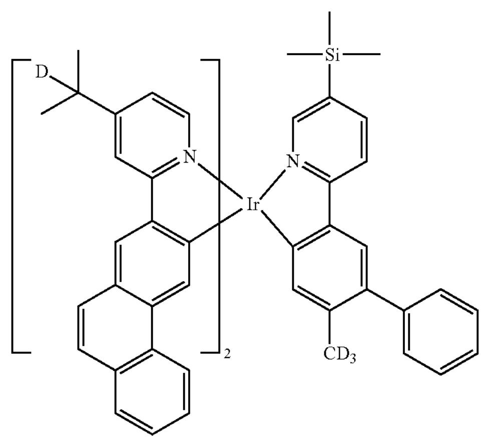
94
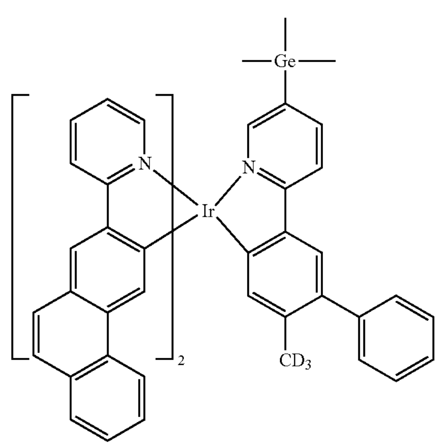

-continued
95
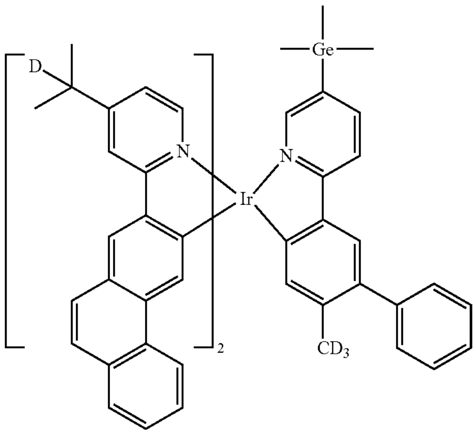
96
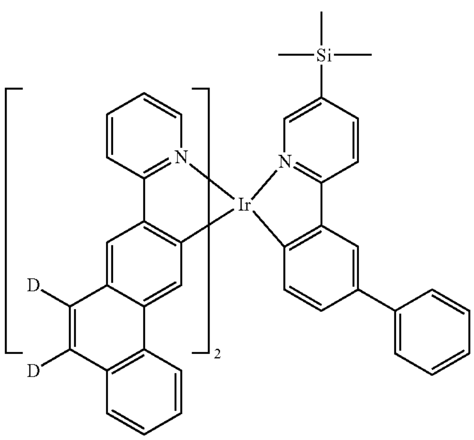
97
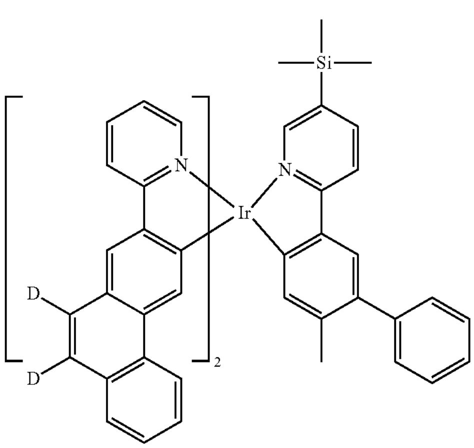
-continued
98
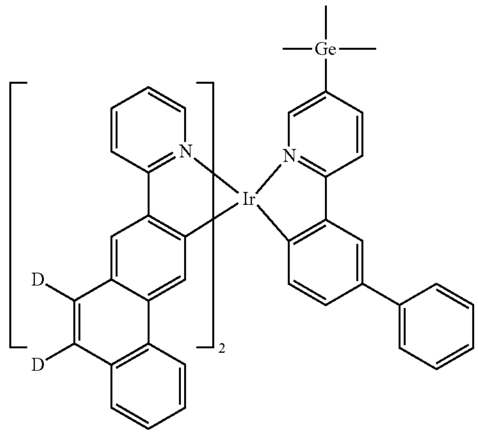
99
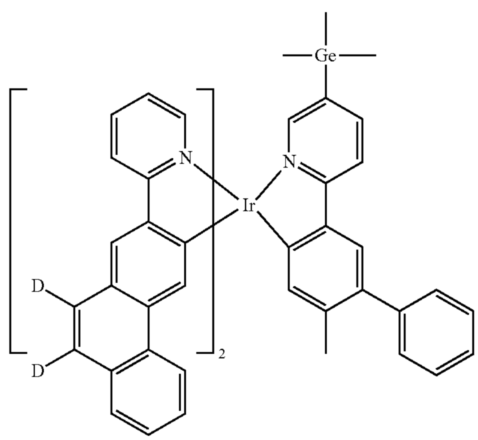
100
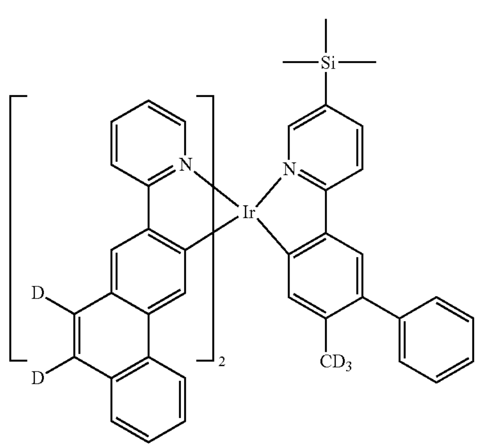

101
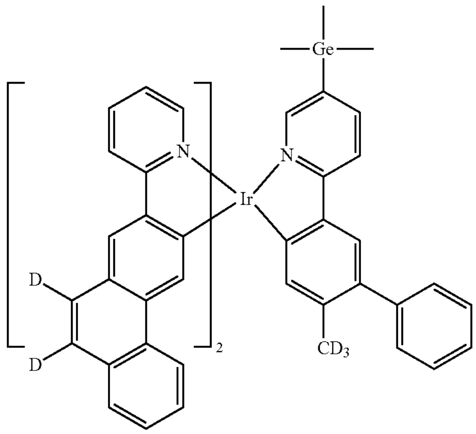
102
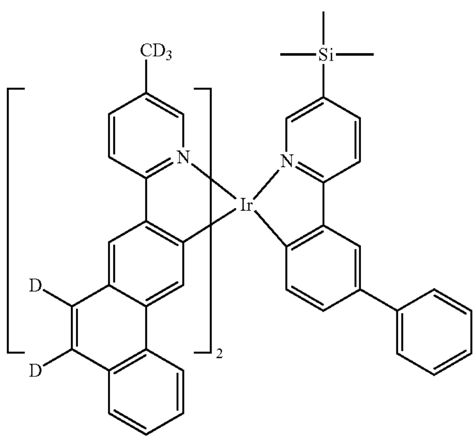
103
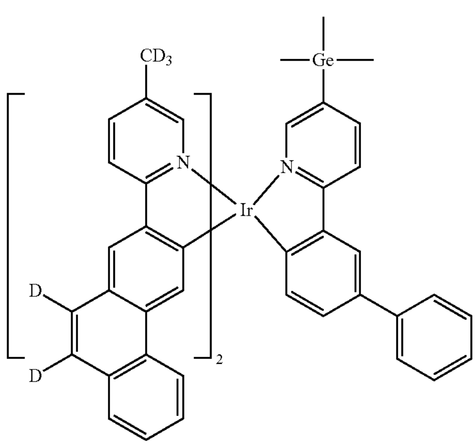
104
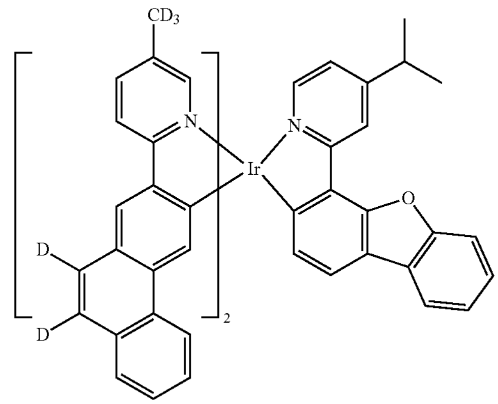
105
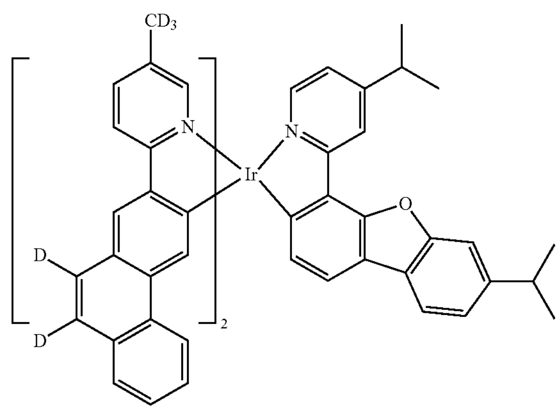
106
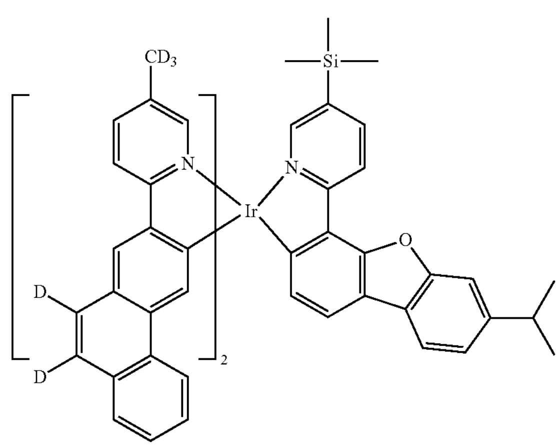

-continued
107
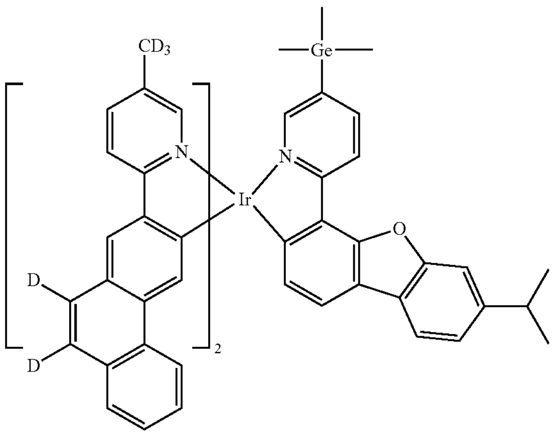
108
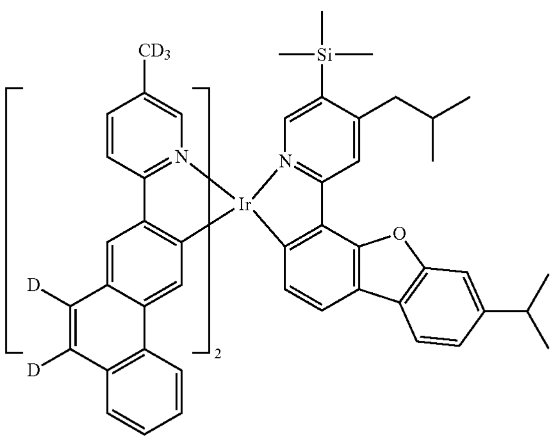
109
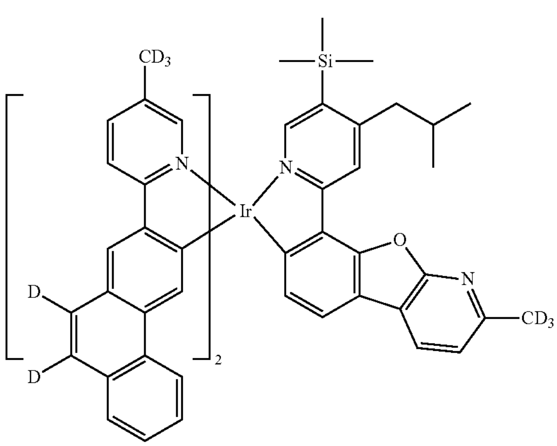
-continued
110
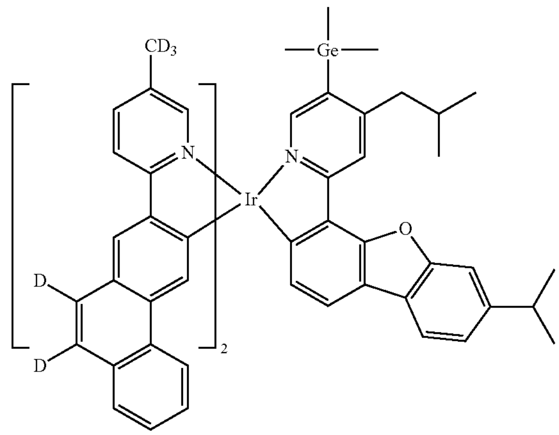
111
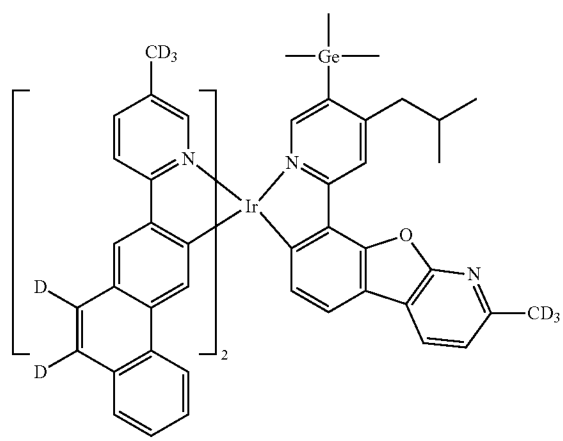
112
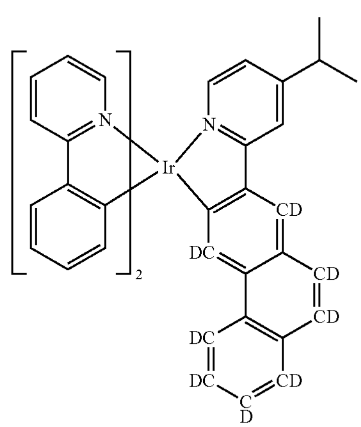

-continued
113
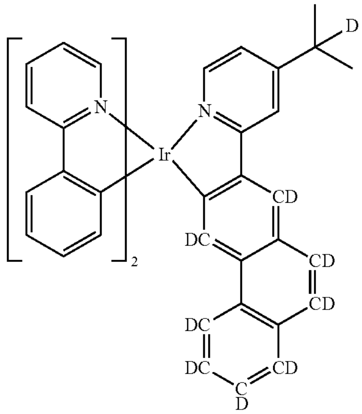
114
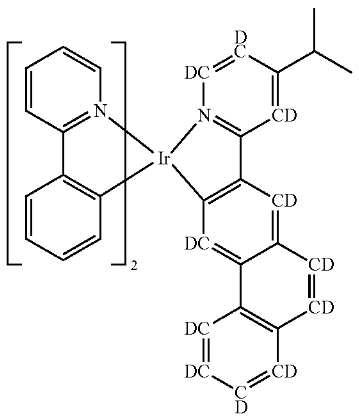
115
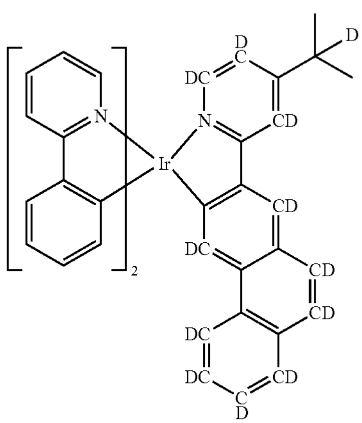
116
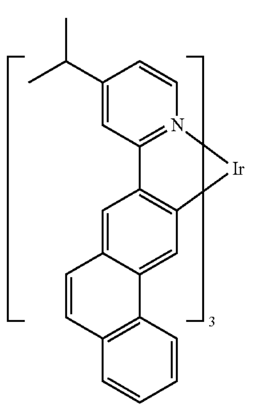
-continued
117
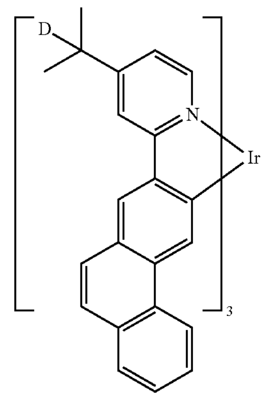
118
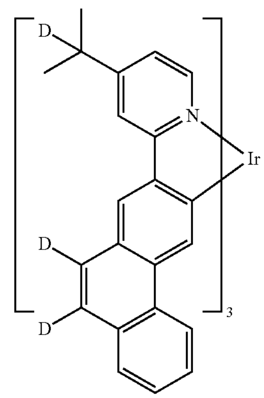
119
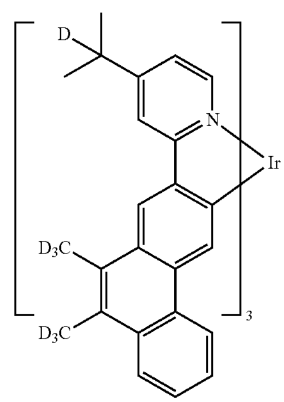
120
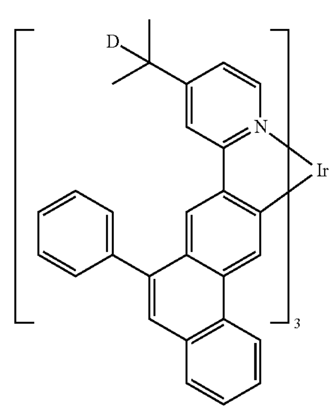

-continued
121
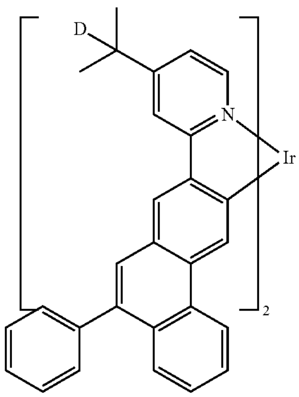
122
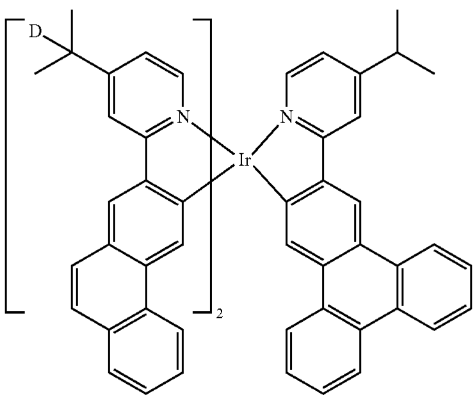
123
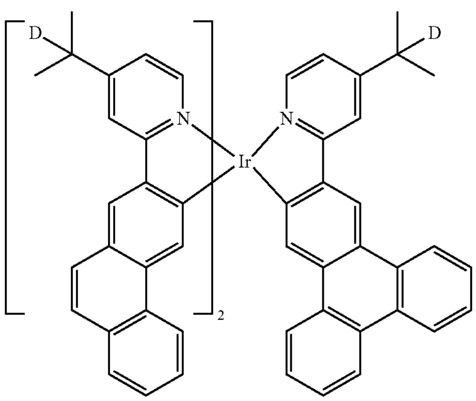
124
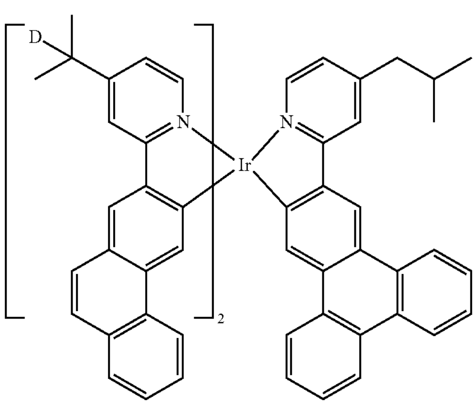
-continued
125
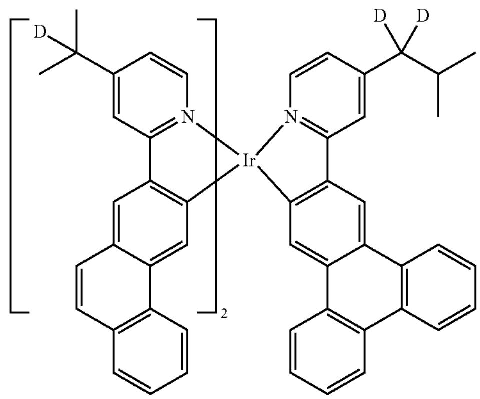
126
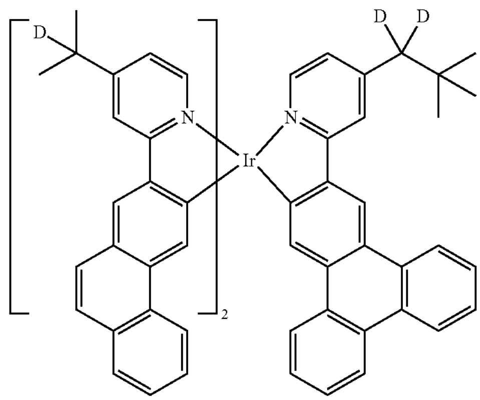
127
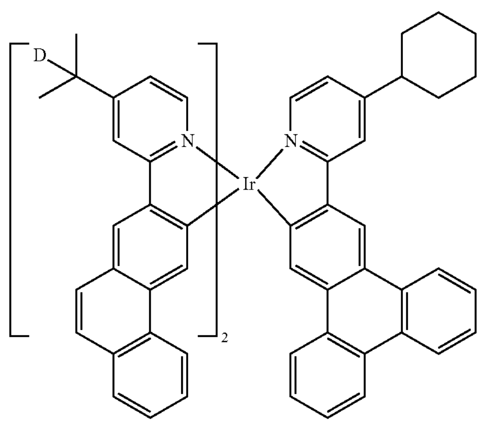
128
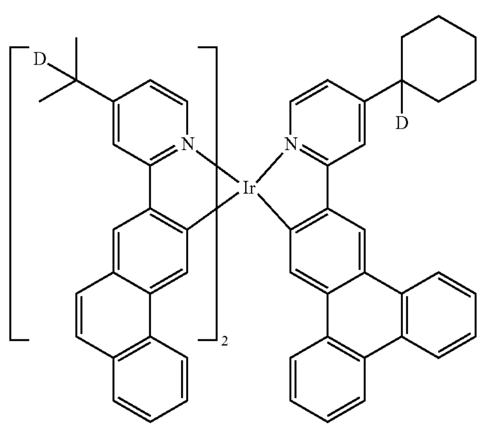

-continued
129
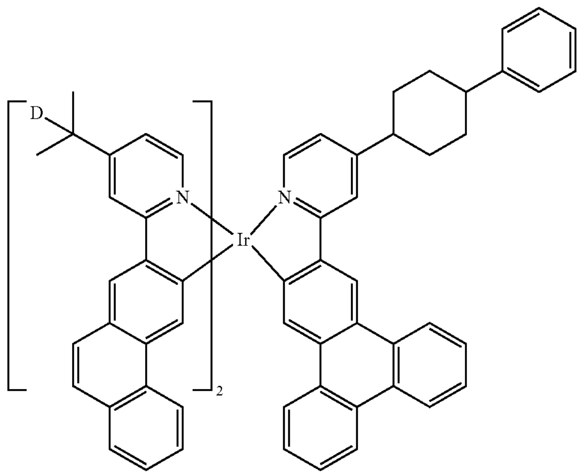
130
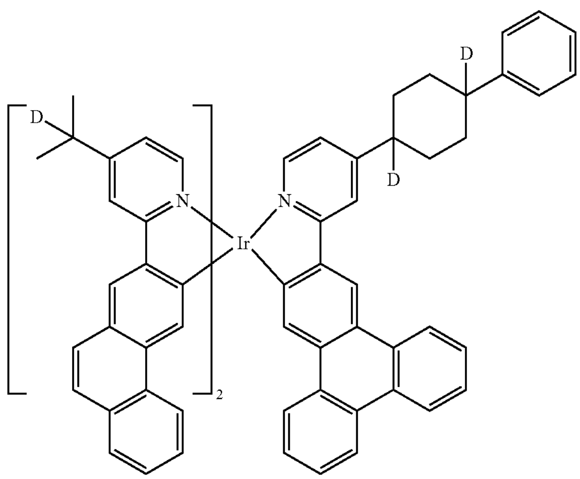
131
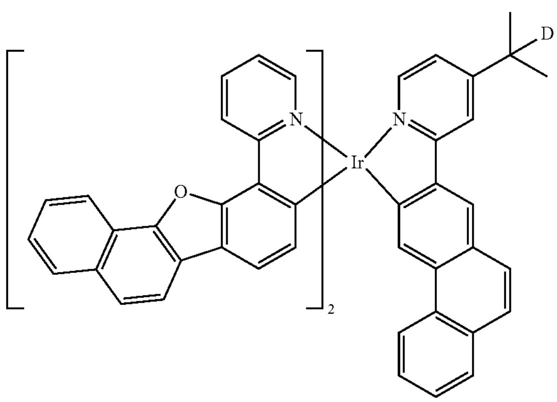
-continued
132
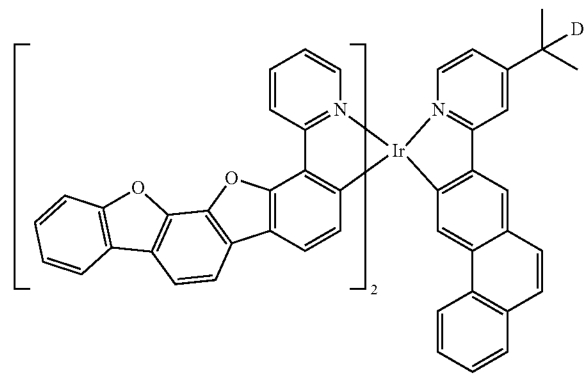
133
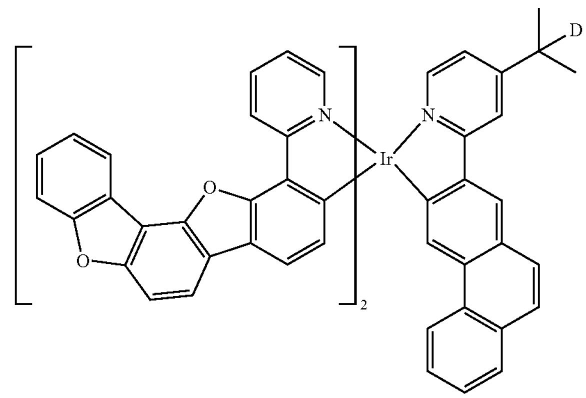
134
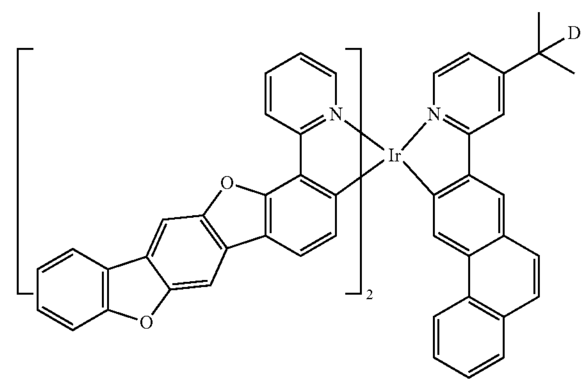
135
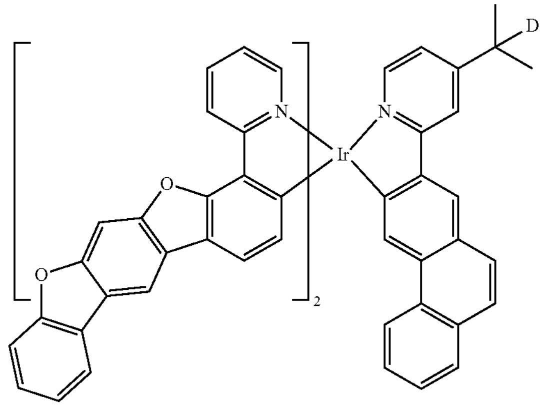

136
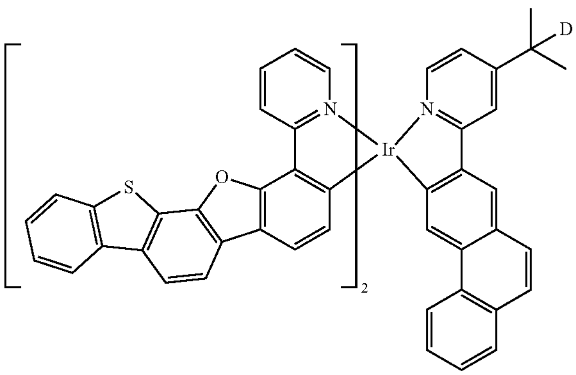
137
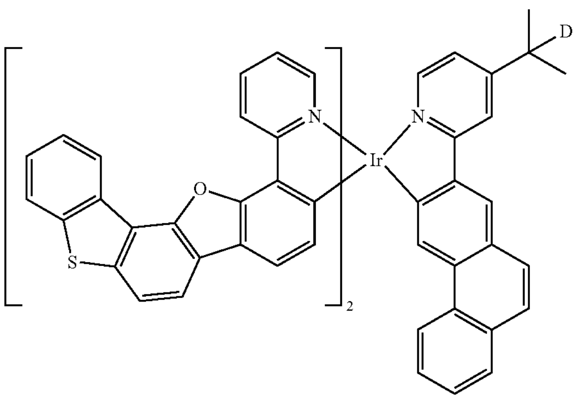
138
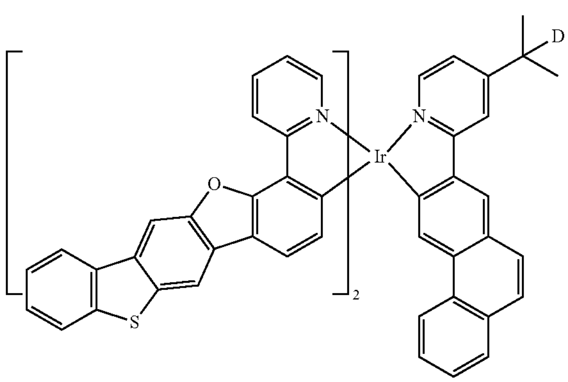
139
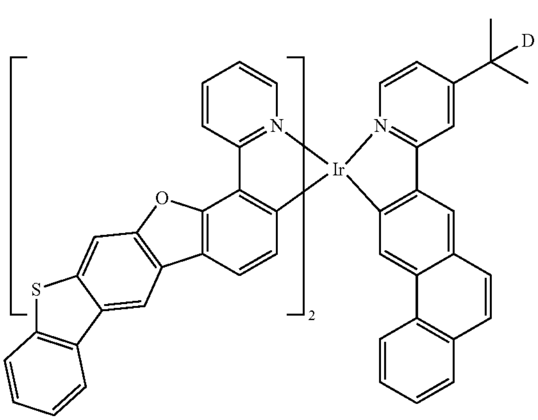
140
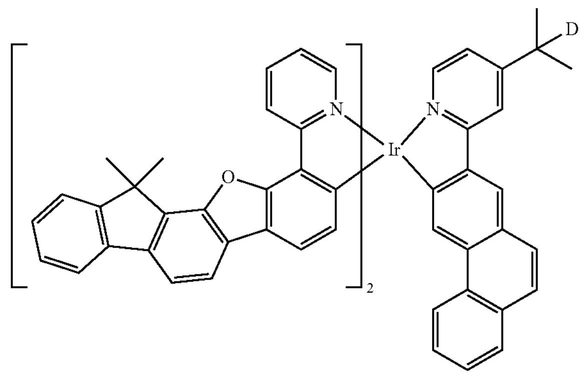
141
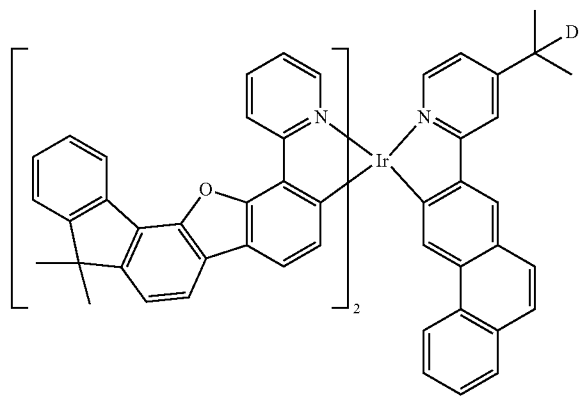
142
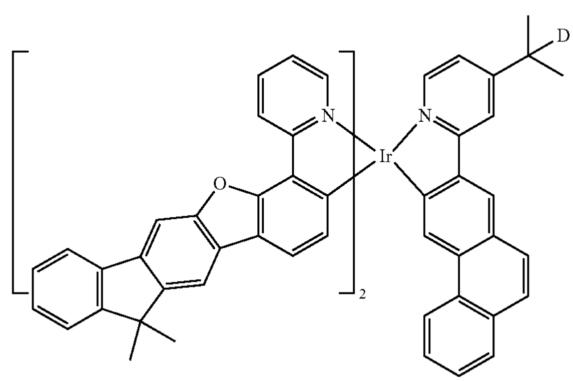
143
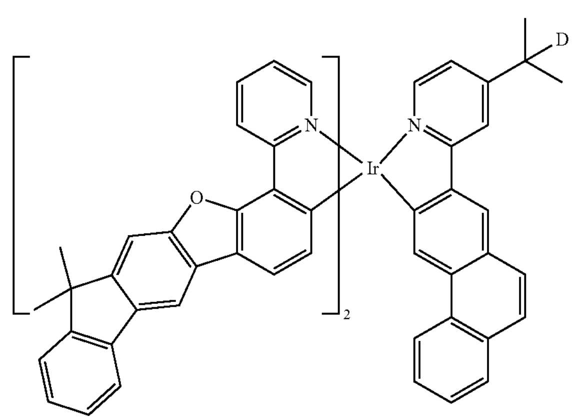

-continued
144
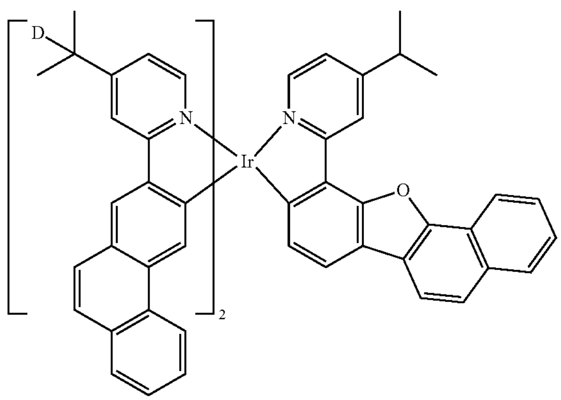
145
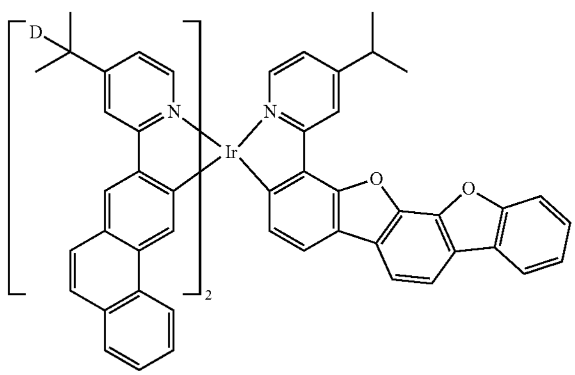
146
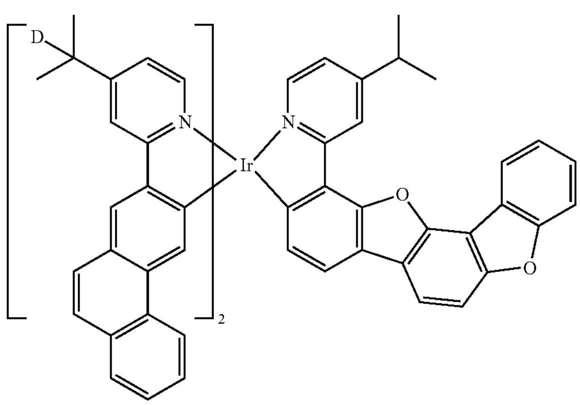
147
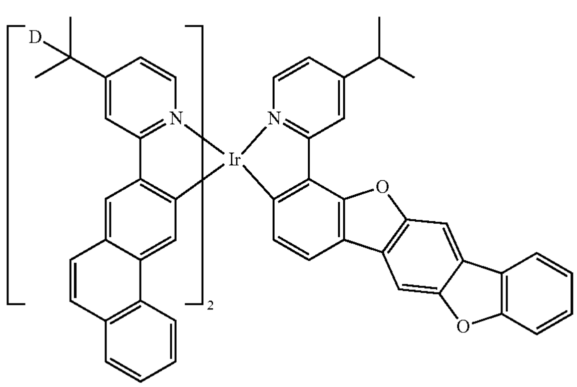
148
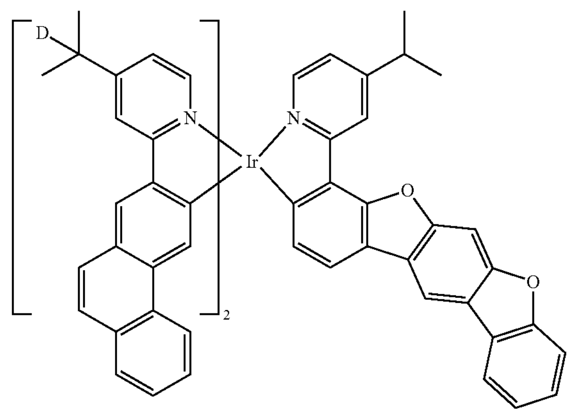
149
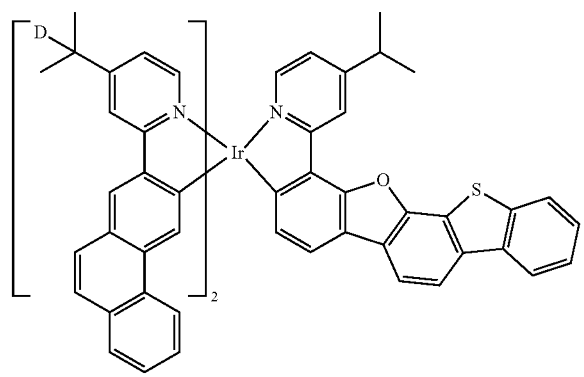
150
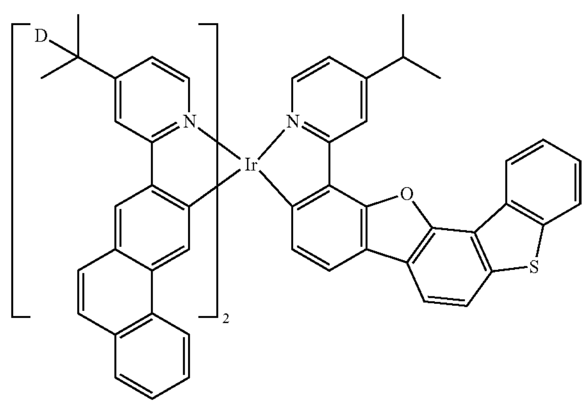
151
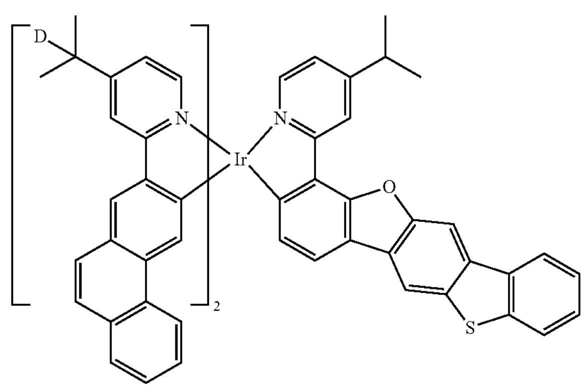

-continued
152
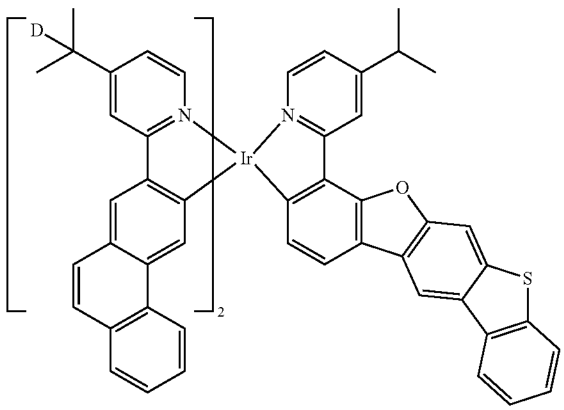
153
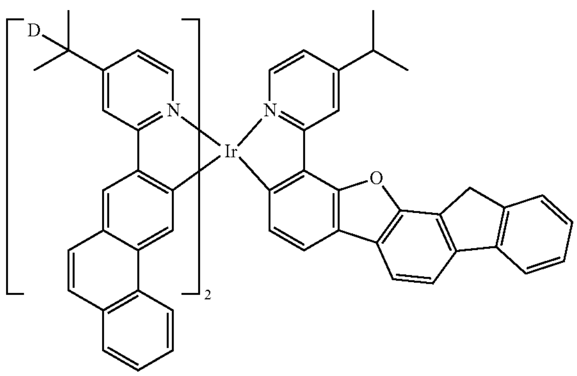
154
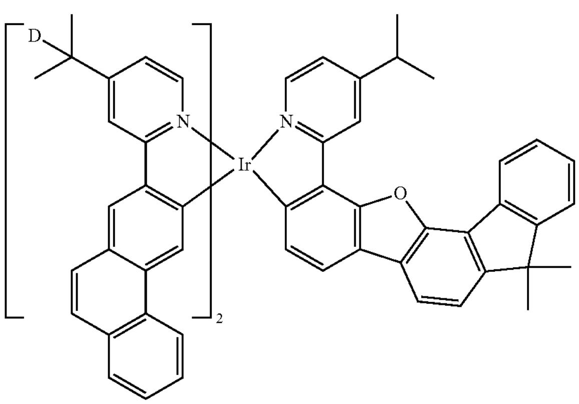
155
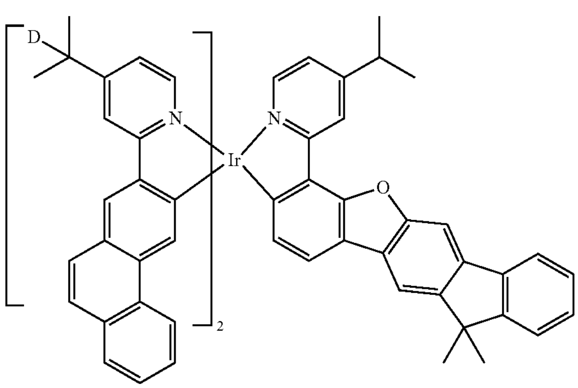
-continued
156
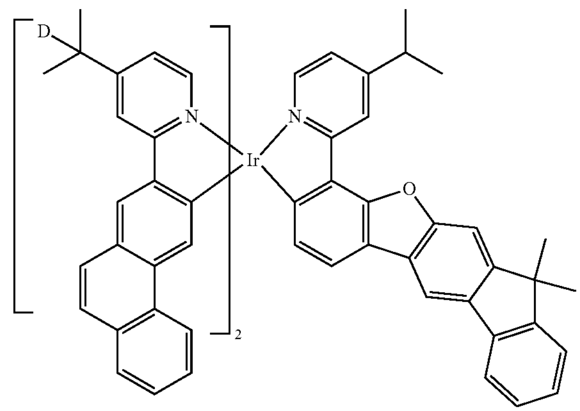
157
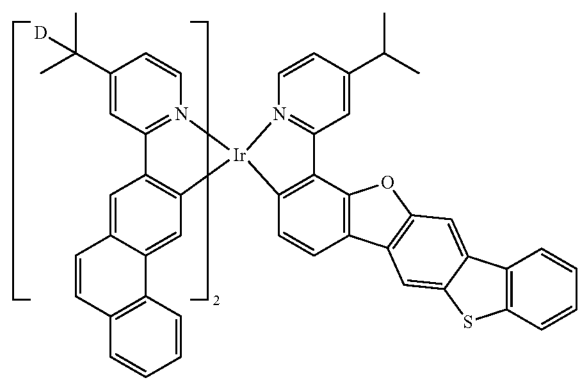
158
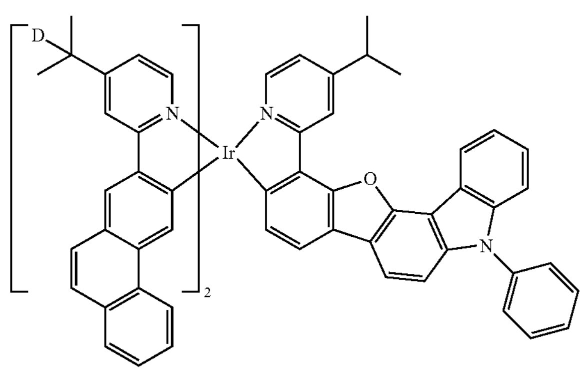

-continued
159
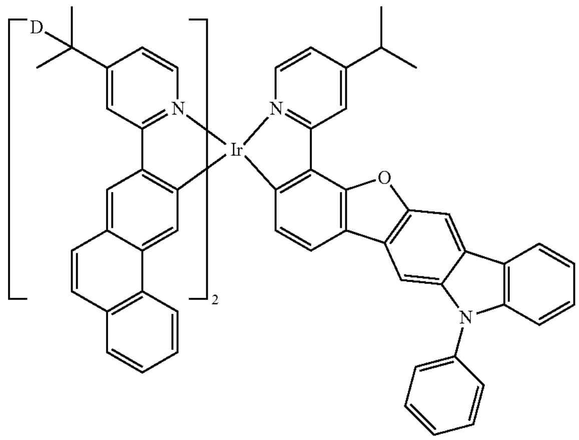
160
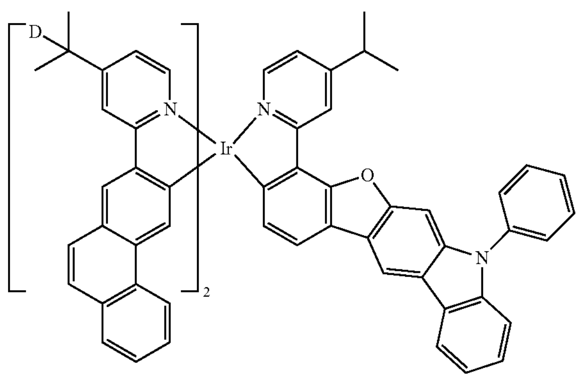
161
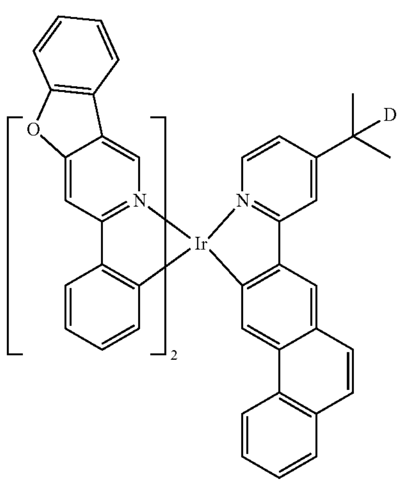
-continued
162
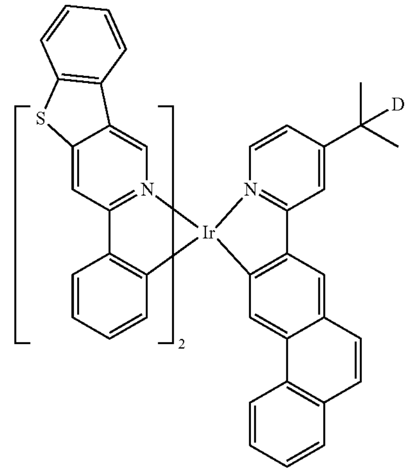
163
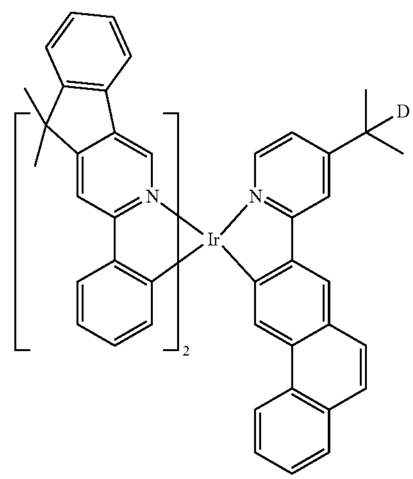
164
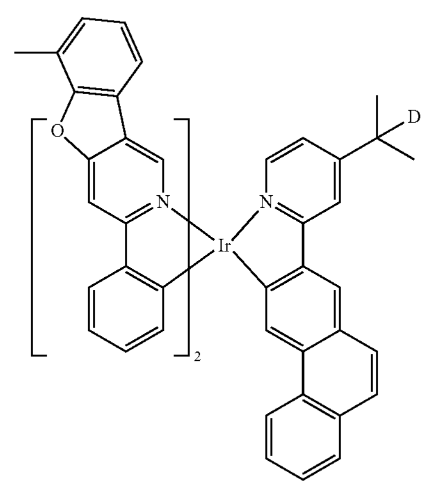

-continued
165
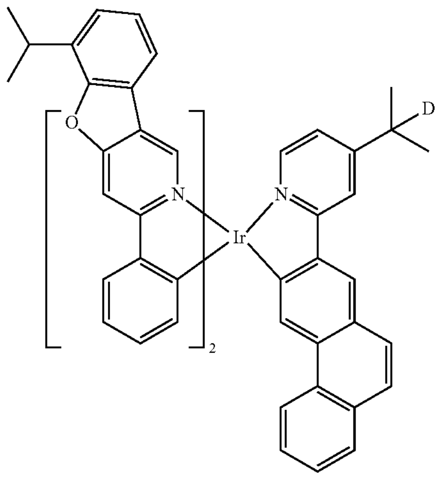
166
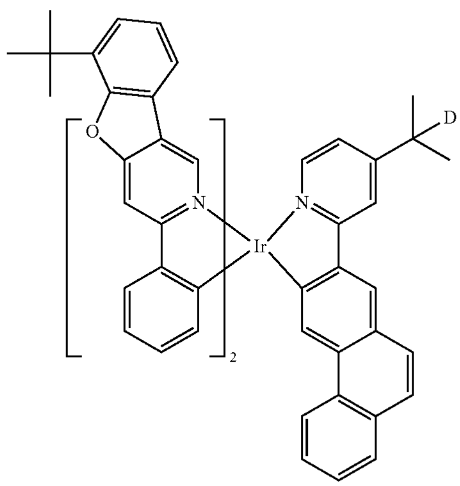
167
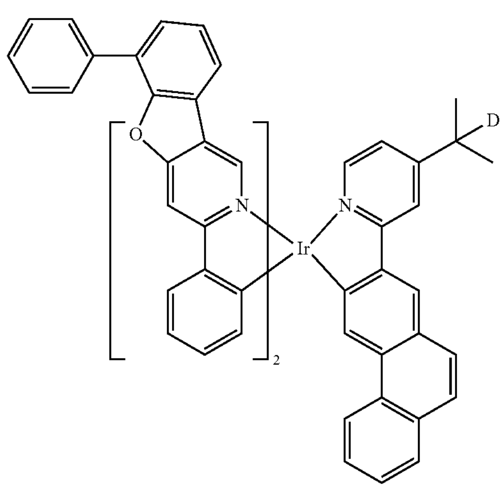
-continued
168
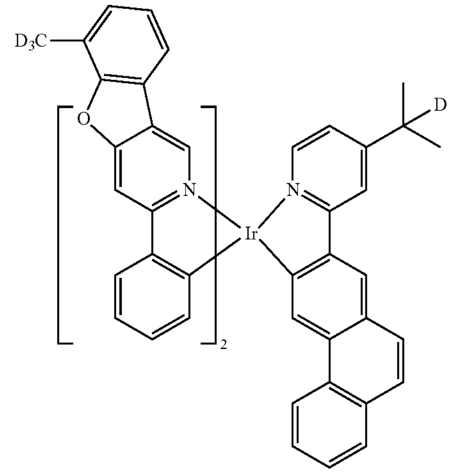
169
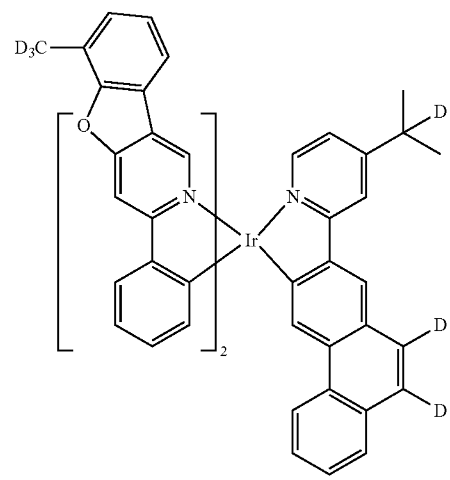
170
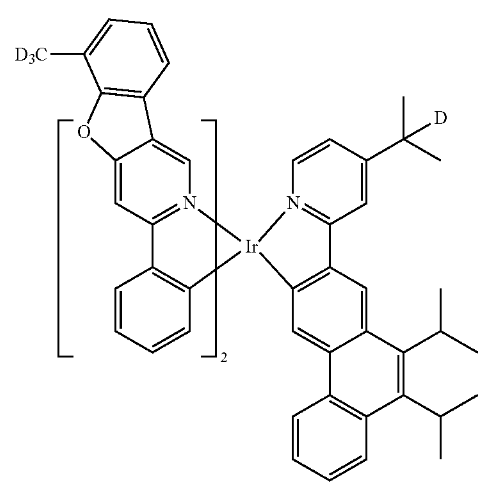

-continued
171
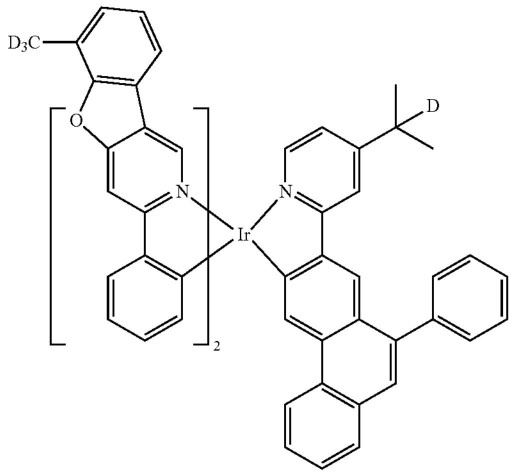
172
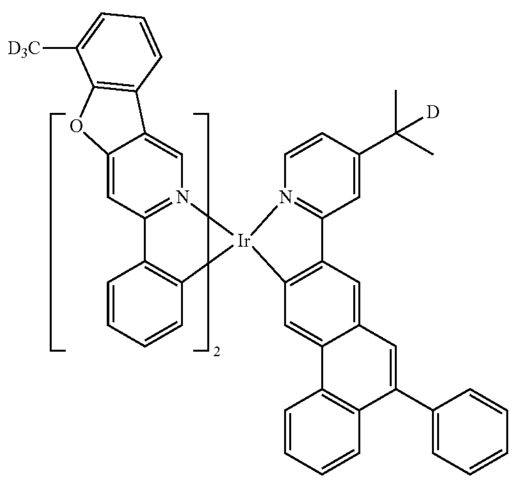
173
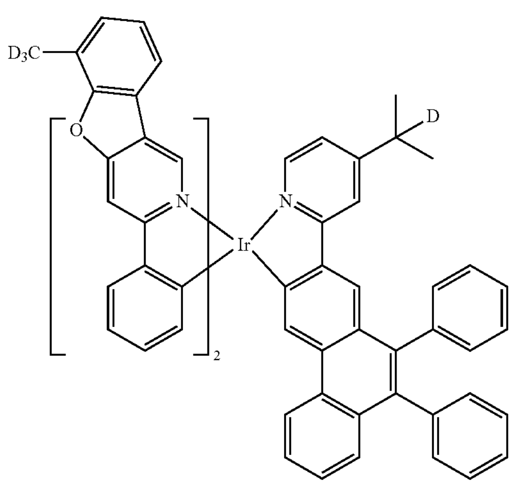
-continued
174
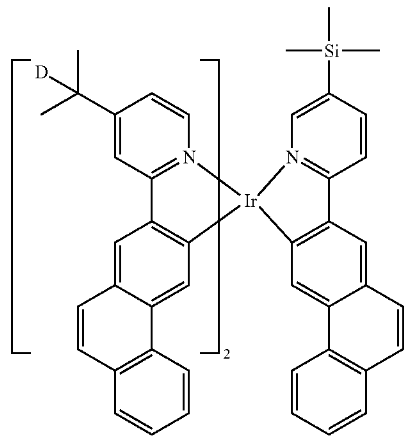
175
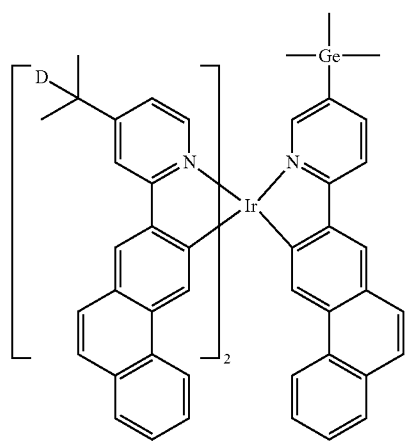
176
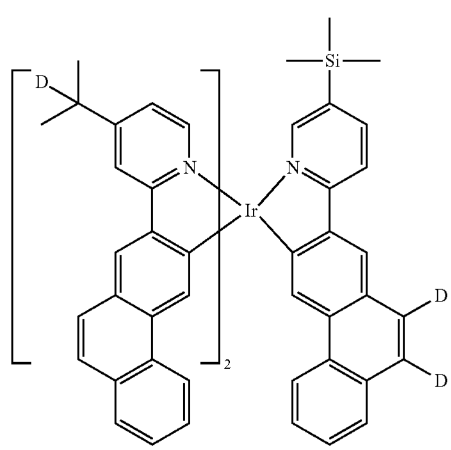

-continued

177

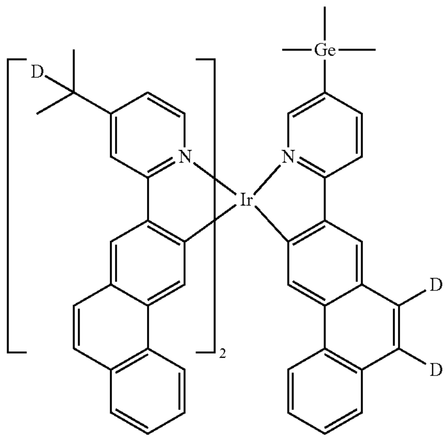

178

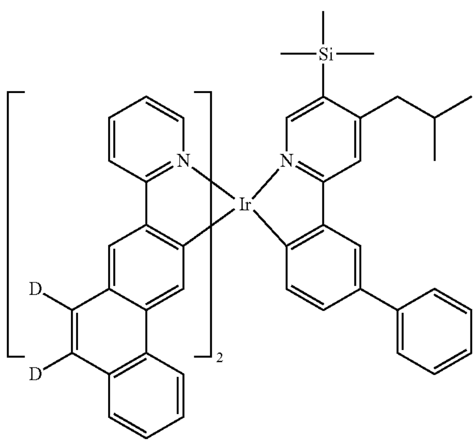

179

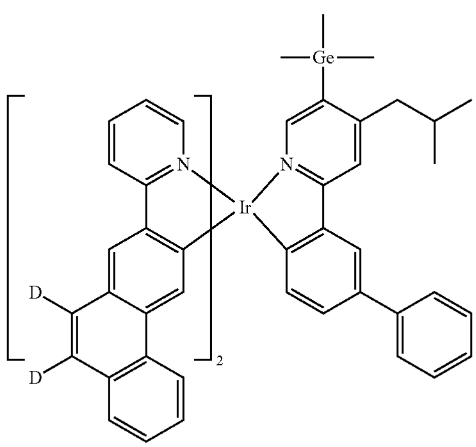

15. An organic light-emitting device, comprising:

a first electrode;

a second electrode; and an organic layer located between the first electrode and the second electrode, wherein the organic layer comprises an emission layer, and wherein the organic layer comprises at least one of the organometallic compound of claim 1.

16. The organic light-emitting device of claim 15, wherein the emission layer comprises the at least one organometallic compound.

17. The organic light-emitting device of claim 16, wherein the emission layer further comprises a host, and the amount of the host in the emission layer is greater than the amount of the at least one organometallic compound in the emission layer.

18. The organic light-emitting device of claim 17, wherein the emission layer emits green light having a maximum emission wavelength of about 500 nanometers to about 600 nanometers.

19. The organic light-emitting device of claim 16, wherein the first electrode is an anode, the second electrode is a cathode, the organic layer further comprises a hole transport region located between the first electrode and the emission layer, and an electron transport region located between the emission layer and the second electrode, wherein the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

20. A diagnostic composition comprising at least one of the organometallic compound of claim 1.

* * * * *